(12) United States Patent
Tanigaki et al.

(10) Patent No.: US 10,983,436 B2
(45) Date of Patent: *Apr. 20, 2021

(54) NEGATIVE-TYPE PHOTOSENSITIVE RESIN COMPOSITION, CURED FILM, DISPLAY DEVICE PROVIDED WITH CURED FILM, AND PRODUCTION METHOD THEREFOR

(71) Applicant: TORAY INDUSTRIES, INC., Tokyo (JP)

(72) Inventors: Yugo Tanigaki, Otsu (JP); Satoshi Kamemoto, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 130 days.

This patent is subject to a terminal disclaimer.

(21) Appl. No.: 16/084,866

(22) PCT Filed: Mar. 17, 2017

(86) PCT No.: PCT/JP2017/011048
§ 371 (c)(1),
(2) Date: Sep. 13, 2018

(87) PCT Pub. No.: WO2017/159876
PCT Pub. Date: Sep. 21, 2017

(65) Prior Publication Data
US 2019/0072851 A1 Mar. 7, 2019

(30) Foreign Application Priority Data

Mar. 18, 2016 (JP) .............................. JP2016-054982

(51) Int. Cl.
*G03F 7/32* (2006.01)
*G03F 7/038* (2006.01)
(Continued)

(52) U.S. Cl.
CPC .......... *G03F 7/0387* (2013.01); *G02F 1/1368* (2013.01); *G02F 1/13394* (2013.01);
(Continued)

(58) Field of Classification Search
CPC ........................................................ G03F 7/00
See application file for complete search history.

(56) References Cited

U.S. PATENT DOCUMENTS

2003/0072017 A1* 4/2003 Sato ...................... G03F 7/2022
358/1.9
2008/0108723 A1* 5/2008 Taniguchi ............. G03F 7/0757
522/152
(Continued)

FOREIGN PATENT DOCUMENTS

CN 103946747 A 7/2014
JP 2002-91343 A 3/2002
(Continued)

OTHER PUBLICATIONS

International Search Report (PCT/ISA/210) issued in PCT/JP2017/011048, dated Jun. 20, 2017.
(Continued)

*Primary Examiner* — Chanceity N Robinson
(74) *Attorney, Agent, or Firm* — Birch, Stewart, Kolasch & Birch, LLP

(57) ABSTRACT

The present invention provides a negative type photosensitive resin composition having high sensitivity, excellent halftone characteristics, capability to form a small tapered pattern shape, and alkali-developability. The negative type photosensitive resin composition includes, as an alkali-soluble resin (A), at least a weakly acidic group-containing resin (A1) and an unsaturated group-containing resin (A2), the weakly acidic group-containing resin (A1) containing an acidic group having an acid dissociation constant in the
(Continued)

range of 13.0 to 23.0 in dimethyl sulfoxide, and the unsaturated group-containing resin (A2) containing an ethylenically unsaturated double bond group.

20 Claims, 5 Drawing Sheets

(51) Int. Cl.

| | | |
|---|---|---|
| G03F 7/075 | (2006.01) | |
| G03F 7/037 | (2006.01) | |
| G02F 1/1335 | (2006.01) | |
| G02F 1/1339 | (2006.01) | |
| G02F 1/1368 | (2006.01) | |
| G03F 7/023 | (2006.01) | |
| G03F 7/16 | (2006.01) | |
| G03F 7/20 | (2006.01) | |
| G03F 7/40 | (2006.01) | |
| H01L 21/027 | (2006.01) | |
| H01L 27/12 | (2006.01) | |
| H01L 51/56 | (2006.01) | |
| H01L 51/00 | (2006.01) | |
| H01L 51/52 | (2006.01) | |
| H01L 21/02 | (2006.01) | |
| H01L 21/311 | (2006.01) | |
| G02F 1/1362 | (2006.01) | |
| H01L 27/32 | (2006.01) | |

(52) U.S. Cl.
CPC ...... G02F 1/133512 (2013.01); G03F 7/0236 (2013.01); G03F 7/037 (2013.01); G03F 7/038 (2013.01); G03F 7/0381 (2013.01); G03F 7/0385 (2013.01); G03F 7/0388 (2013.01); G03F 7/0757 (2013.01); G03F 7/16 (2013.01); G03F 7/168 (2013.01); G03F 7/2004 (2013.01); G03F 7/322 (2013.01); G03F 7/40 (2013.01); H01L 21/0274 (2013.01); H01L 27/1248 (2013.01); H01L 27/1288 (2013.01); H01L 51/56 (2013.01); G02F 1/13398 (2021.01); G02F 1/13625 (2021.01); G02F 1/136236 (2021.01); G02F 1/136286 (2013.01); G02F 1/136295 (2021.01); G02F 2202/023 (2013.01); H01L 21/02118 (2013.01); H01L 21/311 (2013.01); H01L 27/124 (2013.01); H01L 27/3246 (2013.01); H01L 27/3258 (2013.01); H01L 27/3276 (2013.01); H01L 51/0052 (2013.01); H01L 51/0058 (2013.01); H01L 51/0059 (2013.01); H01L 51/0072 (2013.01); H01L 51/0085 (2013.01); H01L 51/5284 (2013.01); H01L 2227/323 (2013.01)

(56) References Cited

U.S. PATENT DOCUMENTS

| | | |
|---|---|---|
| 2008/0111961 A1 | 5/2008 | Tien et al. |
| 2013/0012648 A1* | 1/2013 | Fujie .............. C09B 69/101 524/547 |
| 2016/0195709 A1 | 7/2016 | Kinoshita et al. |
| 2016/0327859 A1* | 11/2016 | Idei .............. C09B 69/109 |

FOREIGN PATENT DOCUMENTS

| | | | |
|---|---|---|---|
| JP | 2005-075965 A | | 3/2005 |
| JP | 2005075965 A | * | 3/2005 |
| JP | 2005-322564 A | | 11/2005 |
| JP | 2006-139971 A | | 6/2006 |
| JP | 2006139971 A | * | 6/2006 |
| JP | 2008-292677 A | | 12/2008 |
| JP | 2008292677 A | * | 12/2008 |
| JP | 2009-003442 A | | 1/2009 |
| JP | 2009-020246 A | | 1/2009 |
| JP | 2009003442 A | * | 1/2009 |
| JP | 2009-042422 A | | 2/2009 |
| JP | 2015-093986 A | | 5/2015 |
| JP | 2015093986 A | * | 5/2015 |
| KR | 10-2015-0066816 A | | 6/2015 |
| TW | 200821713 | | 5/2008 |
| TW | 200827933 A | | 7/2008 |
| WO | WO 2016/017190 A1 | | 2/2016 |

OTHER PUBLICATIONS

Written Opinion (PCT/ISA/237) issued in PCT/JP2017/011048, dated Jun. 20, 2017.

* cited by examiner

46: glass substrate
47: first electrode
48: auxiliary electrode
49: insulation layer
50: organic EL layer
51: second electrode

NEGATIVE-TYPE PHOTOSENSITIVE RESIN COMPOSITION, CURED FILM, DISPLAY DEVICE PROVIDED WITH CURED FILM, AND PRODUCTION METHOD THEREFOR

TECHNICAL FIELD

The present invention relates to a negative type photosensitive resin composition, and a cured film and a display device produced therefrom, as well as a production method therefor.

BACKGROUND ART

In recent years, many display products, such as mobile phones, tablet PCs, and TV sets, incorporating thin organic electroluminescence (hereinafter abbreviated as "EL") display devices have been developed.

In general, an organic EL display device has a transparent electrode of, for example, indium tin oxide (hereinafter abbreviated as ITO) on the light extraction side of the light emitting element and a metal electrode of, for example, an alloy of magnesium and silver on the other side than the light extraction side of the light emitting element. Furthermore, in order to divide pixels of the light emitting element, an insulating layer called a pixel dividing layer is formed between the transparent electrode layer and the metal electrode layer. After forming the pixel dividing layer, a film of a light emitting material is formed by vapor deposition through a deposition mask to produce a light emitting layer in a region, which will act as a pixel region, where an opening is formed in the pixel dividing layer expose the lower layer which is either a transparent electrode or a metal electrode. The transparent electrode or the metal electrode is normally formed by sputtering, but in order to prevent disconnection of the transparent electrode or the metal electrode formed, the pixel dividing layer is required to have a small-tapered pattern shape.

An organic EL display is a self-luminous element that emits light using energy generated from recombination of electrons injected from the cathode and holes injected from the anode. Therefore, if there exists a substance that inhibits the movement of the electrons or holes or a substance working to form an energy level that inhibits the recombination of the electrons and holes, the luminous efficiency of the light emitting element will deteriorate or the light emitting material will be deactivated, leading to a shortened life of the light emitting element. The pixel dividing layer is formed at a position neighboring to the light emitting element, and accordingly degassing from the pixel dividing layer or an outflow of ion components can cause a decrease in the life of the organic EL display. Therefore, the pixel dividing layer needs to have high heat resistance. A known technique for forming a highly heat resistant pixel dividing layer having a small-tapered cross-sectional pattern is the use of a positive type photosensitive resin composition containing polyimide (see, for example, Patent document 1). To develop positive type photosensitivity, it is necessary to incorporate a naphthoquinone diazide compound, but this compound, contained in the pixel dividing layer, is decomposed by light and/or heat to cause degasification, which can lead to shortening of the life of the light emitting element.

In a common manufacturing process for panels of organic EL display devices, a large glass substrate is used and a plurality of panels are produced from one glass substrate in order to achieve an improved production efficiency. A good method for further improving the production efficiency by shortening of the process time is to reduce the light exposure in the patterning exposure step to decrease the tact time in the patterning exposure step. To achieve this, the photosensitive resin composition used to form a pixel dividing layer is required to have high sensitivity to allow a pattern to be formed under a small light exposure.

When forming a light emitting layer, vapor deposition is performed with a vapor deposition mask held in contact with the pixel dividing layer, and accordingly a large contact area between the pixel dividing layer and the vapor deposition mask can lead to a decrease in the panel production yield due to the formation of particles. In addition, the pixel dividing layer can be damaged by deposits on the vapor deposition mask, possibly resulting in moisture intrudes that cause degradation of the light emitting element. Therefore, a conceivable method to reduce the contact area of the pixel dividing layer is to form a two-tier pixel dividing layer in which the second tier is smaller in size, but this requires a complicated process, leading to an increase in process time or a decrease in the panel production yield. A method proposed for solving these problems is to use a halftone photomask as the photomask form a pattern (see, for example, Patent document 2). This is intended to form a step-shaped pixel dividing layer in a single layer production process so that the contact area with the vapor deposition mask will be decreased without an increase in the process time. To form a step-shaped pixel dividing layer, however, it is necessary to use a positive type photosensitive resin composition containing a naphthoquinone diazide compound, which can cause the problem of degasification as described above.

A technique proposed for forming a pixel dividing layer using a resin composition that contains no naphthoquinone diazide compound is the use of a negative type photosensitive resin composition such as those used for producing color filters for liquid crystal display devices (see, for example, Patent document 3). In general, however, an acrylic resin is used as the negative type photosensitive resin composition, leading to poor heat resistance and resulting in a light emitting element with a decreased reliability. To provide a photosensitive resin composition with an increasing the sensitivity, it is known that the use of a negative type photosensitive is essentially more advantageous than the use of a positive type photosensitive from the viewpoint of the photosensitivity development mechanism. Accordingly, a negative type photosensitive resin composition is generally used to increase the sensitivity. However, since the surface of the film is photo-cured first according to the negative type photosensitivity mechanism, a rectangular or a backward tapered pattern shape tends to be formed while those regions where the exposure is small tend to fail to be photo-cured sufficiently, frequently resulting in the absence of patterns being left after the alkaline development step. Therefore, it is difficult for a negative type photosensitive resin composition to form a step-shaped pixel dividing layer having a sufficient thickness difference between the thick parts and the thin parts even when a halftone photomask is used. A known method for producing a negative photosensitive resin composition with an increased sensitivity is to increase the content of a compound having a plurality of ethylenically unsaturated double bond groups in the molecule, but this can lead to a pattern shape having a rectangular or backward tapered cross section. Thus, there has been a call for a highly sensitive negative type photosensitive resin composition that has excellent characteristics helpful to form a step-shaped pattern in a batch process using a halftone photomask (hereinafter referred to as halftone characteristics) and serves to produce a small-tapered pattern shape.

PRIOR ART DOCUMENTS

Patent Documents

[Patent document 1] Japanese Unexamined Patent Publication (Kokai) No. 2002-091343
[Patent document 2] Japanese Unexamined Patent Publication (Kokai) No. 2005-322564
[Patent document 3] Japanese Unexamined Patent Publication (Kokai) No. 2015-093986

SUMMARY OF THE INVENTION

Problems to be Solved by the Invention

However, none of the conventionally known photosensitive resin compositions have required characteristics to serve as a material for forming a step-shaped pixel dividing layer of an organic EL display device. Specifically, they are inferior in terms of sensitivity, halftone characteristics, or pattern shape.

Thus, an object of the present invention is to provide a negative type photosensitive resin composition having high sensitivity, excellent halftone characteristics, capability to form a small-tapered pattern shape, and alkali-developability.

As another problem, it is difficult for the conventionally known negative type photosensitive resin compositions to form a step-shaped pixel dividing layer and accordingly a contact between the vapor deposition mask and the pixel dividing layer can result in a light emitting element with a poor reliability.

Thus, another object of the present invention is to provide an organic EL display device containing a step-shaped pixel dividing layer with a sufficiently large thickness difference between the thick parts and the thin parts and enabling the production of a light emitting element with high reliability.

As still another problem, a complicated process is necessary in some cases to produce a step-shaped pixel dividing layer from a negative type photosensitive resin composition.

Thus, still another object of the present invention is to provide a method to form a step-shaped pattern in a batch process using a halftone photomask and a process using it to produce an organic EL display device.

Means of Solving the Problems

The negative type photosensitive resin composition according to the present invention includes, as an alkali-soluble resin (A), at least a weakly acidic group-containing resin (A1) and an unsaturated group-containing resin (A2), the weakly acidic group-containing resin (A1) containing an acidic group having an acid dissociation constant of 13.0 to 23.0 in dimethyl sulfoxide, and the unsaturated group-containing resin (A2) containing an ethylenically unsaturated double bond group.

Advantageous Effect of the Invention

The present invention can provide a negative type photosensitive resin composition having high sensitivity, excellent halftone characteristics, capability to form a small-tapered pattern shape, and alkali-developability. The use of this negative type photosensitive resin composition serves to form a step-shaped cured film with a sufficiently large thickness difference between the thick parts and the thin parts and accordingly serves to produce a light emitting element with an increased reliability. The use of the resin composition, furthermore, serves to form a step-shaped pattern in a batch process using a halftone photomask and accordingly serves to decrease the process time.

DESCRIPTION OF PREFERRED EMBODIMENTS

Figure 1:
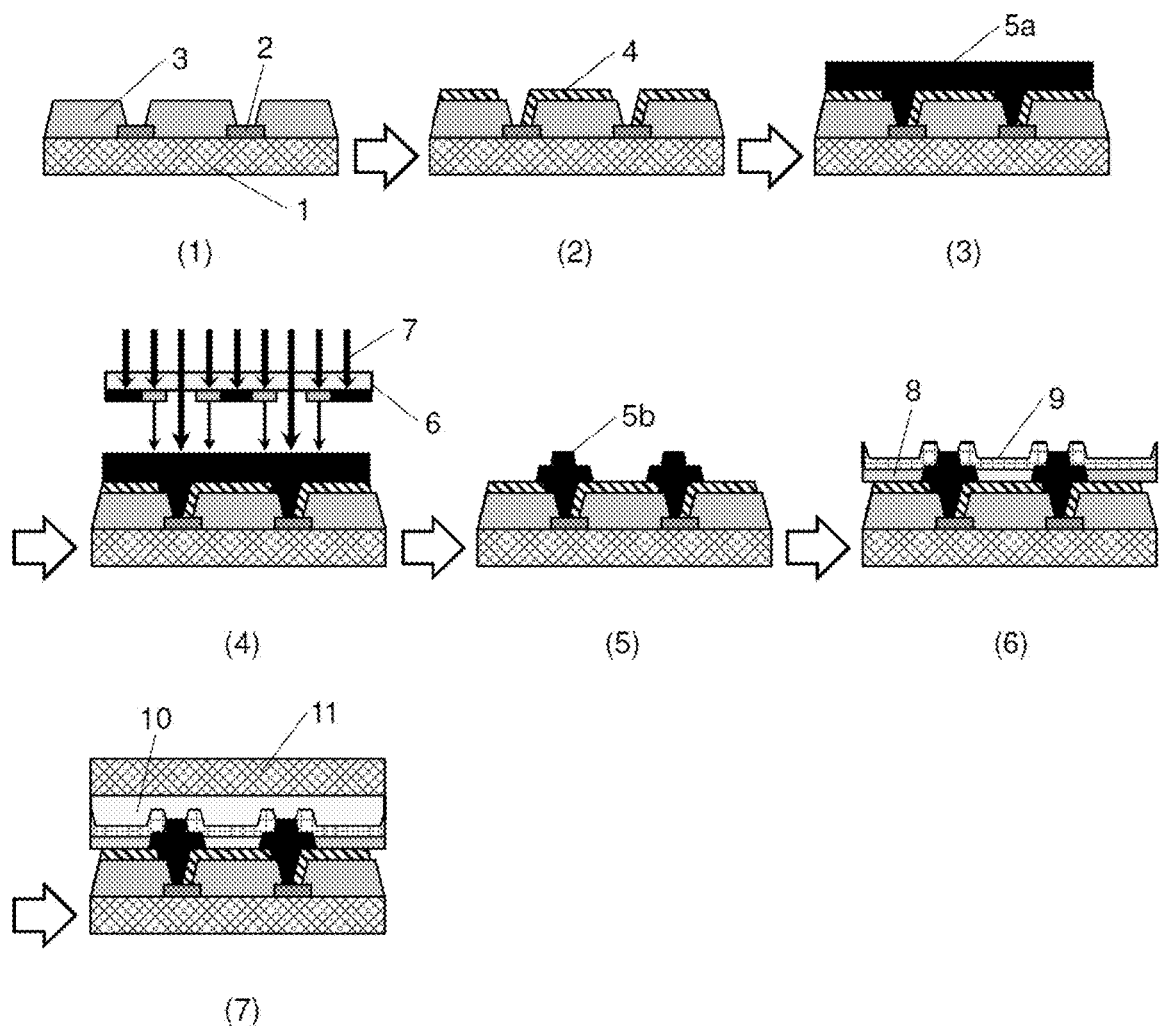
FIGS. 1 (1) to (7) show a flow chart illustrating schematic cross sections in a typical production process for an organic EL display device using a cured film of the negative type photosensitive resin composition according to the present invention.

The negative type photosensitive resin composition according to the present invention includes, as an alkali-soluble resin (A), at least a weakly acidic group-containing resin (A1) and an unsaturated group-containing resin (A2), the weakly acidic group-containing resin (A1) containing an acidic group having an acid dissociation constant of 13.0 to 23.0 in dimethyl sulfoxide, and the unsaturated group-containing resin (A2) containing an ethylenically unsaturated double bond group.

<Weakly Acidic Group-Containing Resin (A1) and Unsaturated Group-Containing Resin (A2)>

The negative type photosensitive resin composition according to the present invention includes, as an alkali-soluble resin (A), at least a weakly acidic group-containing resin (A1) and an unsaturated group-containing resin (A2).

The weakly acidic group-containing resin (A1) is an alkali-soluble resin containing, as an alkali-soluble group, an acidic group having an acid dissociation constant (hereinafter $pK_a$) of 13.0 to 23.0 in dimethyl sulfoxide.

The incorporation of a weakly acidic group-containing resin (A1) serves to improve the halftone characteristics. Regarding this, it is inferred that the resin containing a weakly acidic group has a moderate solubility in the alkaline developer, serving to decrease the difference in the speed of dissolution in the alkaline developer between the part cured in the light exposure step and the halftone-exposed part. More specifically, it is possible in the alkali development step to control the film loss in the halftone-exposed part where the film is not cured completely and it is thought that a film loss gradient occurs between the cured part and the halftone-exposed part, enabling easy formation of a stepped shape.

Examples of such an acidic group having a $pK_a$ value of 13.0 to 23.0 in dimethyl sulfoxide include, for example, those groups having an acidity as Broensted acid lower than that of the carboxyl group.

Major compounds having an acidity as Broensted acid nearly equal to that of the carboxyl group include those containing a carboxyl group and, for example, acetic acid ($pK_a$=12.3) and benzoic acid ($pK_a$=11.1) have appropriate $pK_a$ values, serving as indicator of acidity, in dimethyl sulfoxide.

Weakly acidic groups that show a $pK_a$ value in the range of 13.0 to 23.0 in dimethyl sulfoxide include phenolic hydroxyl group, silanol group, hydroxyimide group, hydroxyamide group, mercapto group, and methylene groups containing two or more carbonyl groups or ester groups, of which phenolic hydroxyl group, silanol group, hydroxyimide group, and hydroxyamide group are preferable and phenolic hydroxyl group and silanol group are more preferable from the viewpoint of the pattern processability and usability of the compounds in an alkaline developer. More specifically, it is preferable for the weakly acidic group-containing resin (A1) to contain one or more acidic groups selected from phenolic hydroxyl group, silanol group, hydroxyimide group, and hydroxyamide group, and it is more preferable to contain phenolic hydroxyl group and/or silanol group.

Major compounds containing weakly acidic groups and the $pK_a$ values, serving as indicator of weak acidity, of those compounds in dimethyl sulfoxide are, for example, as follows: phenol ($pK_a$=18.0), benzohydroxamic acid ($pK_a$=13.7), n-butane thiol ($pK_a$=17.0), acetylacetone ($pK_a$=13.3), acetoethyl acetate ($pK_a$=14.2), and diethyl malonate ($pK_a$=15.7).

The alkali-soluble group in the weakly acidic group-containing resin (A1) preferably has a $pK_a$ value of 13.0 or more, more preferably 13.5 or more, still more preferably 14.0 or more, still more preferably 14.5 or more, and particularly preferably 15.0 or more, in dimethyl sulfoxide. A $pK_a$ value in the above range ensures improved halftone characteristics. On the other hand, the $pK_a$ value is preferably 23.0 or less, more preferably 22.5 or less, still more preferably 22.0 or less, still more preferably 21.5 or less, and particularly preferably 21.0 or less. A $pK_a$ value in the above range ensures an improved resolution after the development step.

It is preferable for the weakly acidic group-containing resin (A1) not to contain an ethylenically unsaturated double bond group. The absence of an ethylenically unsaturated double bond group ensures improved halftone characteristics. Regarding this, it is inferred that when using a halftone photomask in the light exposure step, there is a small difference in the degree of UV curing between the cured part and the halftone-exposed part, leading to a gradient in film loss in the alkali development step.

It is preferable for the weakly acidic group-containing resin (A1) to include one or more components selected from the following as described later: polyimide (A1a-1), polyimide precursor (A1a-2), carboxylic acid-modified polysiloxane (A1a-3), carboxylic acid-modified novolac resin (A1a-4), carboxylic acid-modified polyhydroxystyrene (A1a-5), polybenzoxazole (A1b-1), polybenzoxazole precursor (A1b-2), polysiloxane (A1b-3), novolac resin (A1b-4), and polyhydroxystyrene (A1b-5). It is more preferable to include one or more selected from the group consisting of polyimide (A1a-1), polyimide precursor (A1a-2), carboxylic acid-modified polysiloxane (A1a-3), polybenzoxazole (A1b-1), polybenzoxazole precursor (A1b-2), and polysiloxane (A1b-3).

The negative type photosensitive resin composition according to the present invention further contains an unsaturated group-containing resin (A2) as a component of the alkali-soluble resin (A).

The unsaturated group-containing resin (A2) is an alkali-soluble resin containing an ethylenically unsaturated double bond group as a radical-polymerizable group. As the alkali-soluble group, it is preferable to contain one or more selected from the group consisting of phenolic hydroxyl group, silanol group, hydroxyimide group, hydroxyamide group, carboxyl group, and carboxylic anhydride group.

The incorporation of an unsaturated group-containing resin (A2) serves to improve the sensitivity in the light exposure step. Regarding this, it is inferred that the resin containing an ethylenically unsaturated double bond group works to promote the UV curing in the light exposure step, leading to accelerated curing in the light exposed part.

It is preferable for the unsaturated group-containing resin (A2) to contain, as the alkali-soluble group, one or more selected from the group consisting of phenolic hydroxyl group, silanol group, hydroxyimide group, and hydroxyamide group. The existence of these alkali-soluble groups ensures improved halftone characteristics. Regarding this, it is inferred that since the solubility in the alkaline developer can be adjusted appropriately, it is possible to decrease the difference in the speed of dissolution in the alkaline developer between the part cured in the light exposure step and the halftone-exposed part.

It is also preferable for the unsaturated group-containing resin (A2) to contain, as the alkali-soluble group, a carboxyl group and/or a carboxylic anhydride group. The existence of these alkali-soluble groups ensures improved resolution after the development step. Regarding these, it is inferred that the acidic group works to increase the solubility in the alkaline developer, serving to depress the residue generation in the alkali development step.

It is preferable for the unsaturated group-containing resin (A2) to include one or more components selected from the following as described later: unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), unsaturated group-containing polysiloxane (A2b-3), polycyclic side chain-containing aromatic resin (A2c-1), acrylic resin (A2c-2), and carboxylic acid-modified epoxy resin (A2c-3). It is more preferable to include one or more selected from the group consisting of unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), unsaturated group-containing polysiloxane (A2b-3), polycyclic side chain-containing aromatic resin (A2c-1), and carboxylic acid-modified epoxy resin (A2c-3). It is still more preferable to include one or more selected from the group consisting of unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), and unsaturated group-containing polysiloxane (A2b-3).

In the weakly acidic group-containing resin (A1), structural units that contain one or more selected from the group consisting of phenolic hydroxyl group, silanol group, hydroxyimide group, and hydroxyamide group preferably account for 10 to 100 mol %, more preferably 20 to 100 mol %, and still more preferably 30 to 100 mol %, of the total number of structural units. A content in the above range ensures improved halftone characteristics and an improved resolution after the development step.

It is preferable for the weakly acidic group-containing resin (A1) to have an acid equivalent of 200 g/mol or more, more preferably 220 g/mol or more, still more preferably 280 g/mol or more, and particularly preferably 310 g/mol or more. An acid equivalent in the above range ensures a decreased film loss in the alkali development step. On the other hand, it is preferable for the weakly acidic group-containing resin (A1) to have an acid equivalent of 1,200 g/mol or less, more preferably 1,100 g/mol or less, still more preferably 1,000 g/mol or less, and particularly preferably 800 g/mol or less. A content in the above range ensures improved halftone characteristics and an improved resolution after the development step.

From the viewpoint of improving the halftone characteristics, it is more preferable for the acid equivalent to be attributed to one or more selected from the group consisting of phenolic hydroxyl group, silanol group, hydroxyimide group, and hydroxyamide group.

It is preferable for the unsaturated group-containing resin (A2) to have an acid equivalent of 200 g/mol or more, more preferably 220 g/mol or more, still more preferably 280 g/mol or more, and particularly preferably 310 g/mol or more. An acid equivalent in the above range ensures a decreased film loss in the alkali development step. On the other hand, it is preferable for the unsaturated group-containing resin (A2) to have an acid equivalent of 1,200 g/mol or less, more preferably 1,100 g/mol or less, still more preferably 1,000 g/mol or less, and particularly preferably 800 g/mol or less. A content in the above range ensures improved halftone characteristics and an improved resolution after the development step.

From the viewpoint of improving the halftone characteristics, it is preferable for the acid equivalent to be attributed to one or more selected from the group consisting of phenolic hydroxyl group, silanol group, hydroxyimide group, and hydroxyamide group. From the viewpoint of improving the resolution after the development step, it is preferable for the acid equivalent to be attributed to a carboxyl group and/or a carboxylic anhydride group.

The acid equivalent referred to herein is the mass of a resin per mole of acidic groups and expressed in g/mol. A value of acid equivalent serves to calculate the number of acidic groups in the resin. The acid equivalent can be calculated from the acid value.

The acid value referred to herein is the mass of potassium hydroxide that reacts with 1 g of a resin and expressed in mgKOH/g. It can be determined by titrating 1 g of the resin with an aqueous potassium hydroxide solution.

It is preferable for the unsaturated group-containing resin (A2) to have a double bond equivalent of 250 g/mol or more, more preferably 300 g/mol or more, and still more preferably 350 g/mol or more. A double bond equivalent in the above range ensures improved halftone characteristics and improved adhesion to the underlying substrate. On the other hand, it is preferable for the unsaturated group-containing resin (A2) to have a double bond equivalent of 5,000 g/mol or less, more preferably 2,000 g/mol or less, and still more preferably 1,500 g/mol or less. A double bond equivalent in the above range ensures improved sensitivity in the light exposure step.

The double bond equivalent referred to herein is the mass of a resin per mole of ethylenically unsaturated double bond groups and expressed in g/mol. A value of double bond equivalent serves to calculate the number of ethylenically unsaturated double bond groups in the resin. The double bond equivalent can be calculated from the iodine value.

The iodine value referred to herein is the quantity of halogen, calculated as the mass of iodine, that reacts with 100 g of the resin and expressed in gI/100 g. After reacting 100 g of the resin with iodine monochloride, unreacted iodine is captured with an aqueous potassium iodide solution and the iodine value is determined by titrating the unreacted iodine with an aqueous sodium thiosulfate solution.

In the negative type photosensitive resin composition according to the present invention, it is preferable for the weakly acidic group-containing resin (A1) to account for 30 mass % or more, more preferably 50 mass % or more, still more preferably 60 mass % or more, still more preferably 70 mass % or more, and particularly preferably 80 mass % or more, of the alkali-soluble resin (A). A content in the above range ensures improved halftone characteristics. On the other hand, it is preferable for the weakly acidic group-containing resin (A1) to account for 99 mass % or less, more preferably 98 mass % or less, still more preferably 97 mass % or less, and particularly preferably 95 mass % or less. A content in the above range ensures an improved sensitivity in the light exposure step and an improved resolution after the development step.

In the negative type photosensitive resin composition according to the present invention, it is preferable for the unsaturated group-containing resin (A2) to account for 1 mass % or more, more preferably 2 mass % or more, still more preferably 3 mass % or more, and particularly preferably 5 mass % or more, of the alkali-soluble resin (A). A content in the above range ensures an improved sensitivity in the light exposure step and an improved resolution after the development step. On the other hand, it is preferable for the unsaturated group-containing resin (A2) to account for 70 mass % or less, more preferably 50 mass % or less, still more preferably 40 mass % or less, still more preferably 30 mass % or less, and particularly preferably 20 mass % or less. A content in the above range ensures improved halftone characteristics.

If the contents of the weakly acidic group-containing resin (A1) and the unsaturated group-containing resin (A2) are in the above ranges in the negative type photosensitive resin composition according to the present invention, it ensures an improved sensitivity and improved halftone characteristics in the light exposure step. Accordingly, a step-shaped cured film with a sufficiently large difference in film thickness between the thick parts and the thin parts can be formed while maintaining a high sensitivity in a batch process using a halftone photomask. Thus, a cured film produced from the negative type photosensitive resin composition according to the present invention can be used suitably in components that require a stepped shape such as insulation layers in, for example, pixel dividing layers of organic EL display devices.

<Double Acidic Group-Containing Resin (A1a)>

It is preferable for the weakly acidic group-containing resin (A1) to contain a double acidic group-containing resin (A1a).

A double acidic group-containing resin (A1a) is an alkali-soluble resin that contains, as alkali-soluble groups, one or more weakly acidic groups selected from the group consisting of phenolic hydroxyl group, silanol group, hydroxyimide group, and hydroxyamide group, and another acidic group that differs in acidity.

Examples of such an acidic group that differs in acidity include for example, carboxyl group, carboxylic anhydride group, and sulfonic acid group, of which carboxyl group and carboxylic anhydride group are preferred from the viewpoint of ensuring an improved resolution after the development step.

The incorporation of a double acidic group-containing resin (A1a) serves to improve not only the halftone characteristics, but also the resolution after the development step. Regarding this, it is inferred that the acidic group that differs in acidity works to increase the solubility in the alkaline developer, serving to depress the residue generation in the alkali development step.

It is preferable for the double acidic group-containing resin (A1a) to include one or more selected from the group consisting of the following as described later: polyimide (A1a-1), polyimide precursor (A1a-2), carboxylic acid-modified polysiloxane (A1a-3), carboxylic acid-modified novolac resin (A1a-4), and carboxylic acid-modified polyhydroxystyrene (A1a-5).

<Weakly acidic group-containing second resin (A1b)>

It is preferable for the weakly acidic group-containing resin (A1) to include a weakly acidic group-containing second resin (A1b).

A weakly acidic group-containing second resin (A1b) is an alkali-soluble resin that contains, as alkali-soluble groups, one or more weakly acidic groups selected from the group consisting of phenolic hydroxyl group, silanol group, hydroxyimide group, and hydroxyamide group, and that is a different resin from the double acidic group-containing resin (A1a).

The incorporation of a weakly acidic group-containing second resin (A1b) serves to improve the halftone characteristics.

It is preferable for the weakly acidic group-containing resin (A1) to include a double acidic group-containing resin (A1a) and a weakly acidic group-containing second resin (A1b).

The incorporation of a double acidic group-containing resin (A1a) and a weakly acidic group-containing second resin (A1b) serves to improve the halftone characteristics. Regarding this, it is inferred that since the solubility in the alkaline developer can be adjusted appropriately as a result of increasing the content of weakly acidic groups, it is possible to decrease the difference in the speed of dissolution in the alkaline developer between the part cured in the light exposure step and the halftone-exposed part.

In the negative type photosensitive resin composition according to the present invention, it is preferable for the double acidic group-containing resin (A1a) to account for 50 mass % or more, more preferably 60 mass % or more, still more preferably 70 mass % or more, and particularly preferably 80 mass % or more, of the weakly acidic group-containing resin (A1). A content in the above range ensures not only improved halftone characteristics, but also an improved resolution after the development step. On the other hand, it is preferable for the double acidic group-containing resin (A1a) to account for 99 mass % or less, more preferably 98 mass % or less, still more preferably 97 mass % or less, and particularly preferably 95 mass % or less. A content in the above range ensures improved halftone characteristics.

In the negative type photosensitive resin composition according to the present invention, it is preferable for the weakly acidic group-containing second resin (A1b) to account for 1 mass % or more, more preferably 2 mass % or more, still more preferably 3 mass % or more, and particularly preferably 5 mass % or more, of the weakly acidic group-containing resin (A1). A content in the above range ensures improved halftone characteristics. On the other hand, it is preferable for the weakly acidic group-containing second resin (A1b) to account for 50 mass % or less, more preferably 40 mass % or less, still more preferably 30 mass % or less, and particularly preferably 20 mass % or less. A content in the above range ensures not only improved halftone characteristics, but also an improved resolution after the development step.

It is preferable for the weakly acidic group-containing second resin (A1b) to include one or more selected from the group consisting of the following as described later: polybenzoxazole (A1b-1), polybenzoxazole precursor (A1b-2), polysiloxane (A1b-3), novolac resin (A1b-4), and polyhydroxystyrene (A1b-5).

<Double Acidic Group- and Unsaturated Group-Containing Resin (A2a)>

It is preferable for the unsaturated group-containing resin (A2) to include a double acidic group- and unsaturated group-containing resin (A2a).

A double acidic group- and unsaturated group-containing resin (A2a) is an alkali-soluble resin that contains, as radical-polymerizable group, an ethylenically unsaturated double bond group and also contains, as alkali-soluble groups, one or more weakly acidic groups selected from the group consisting of phenolic hydroxyl group, silanol group, hydroxyimide group, and hydroxyamide group, and another acidic group that differs in acidity.

Examples of such an acidic group that differs in acidity include for example, carboxyl group, carboxylic anhydride group, and sulfonic acid group, of which carboxyl group and carboxylic anhydride group are preferred from the viewpoint of ensuring an improved resolution after the development step.

The incorporation of a double acidic group- and unsaturated group-containing resin (A2a) serves to improve not only the sensitivity in the light exposure step, but also the halftone characteristics and the resolution after the development step.

It is preferable for the double acidic group- and unsaturated group-containing resin (A2a) to include one or more selected from the group consisting of the following as described later: unsaturated group-containing polyimide (A2a-1), unsaturated group-containing polyimide precursor (A2a-2) and carboxylic acid-modified unsaturated group-containing polysiloxane (A2a-3).

<Weakly Acidic Group- and Unsaturated Group-Containing Resin (A2b)>

It is preferable for the unsaturated group-containing resin (A2) to include a weakly acidic group- and unsaturated group-containing resin (A2b).

A weakly acidic group- and unsaturated group-containing resin (A2b) is an alkali-soluble resin that contains, as radical-polymerizable group, an ethylenically unsaturated double bond group and also contains, as alkali-soluble groups, one or more weakly acidic groups selected from the group consisting of phenolic hydroxyl group, silanol group, hydroxyimide group, and hydroxyamide group. Here, note that the weakly acidic group- and unsaturated group-containing resin (A2b) is different from the double acidic group- and unsaturated group-containing resin (A2a).

The incorporation of a weakly acidic group- and unsaturated group-containing resin (A2b) serves to improve not only the sensitivity in the light exposure step, but also the halftone characteristics.

It is preferable for the weakly acidic group- and unsaturated group-containing resin (A2b) to include one or more selected from the group consisting of the following as described later: unsaturated group-containing polybenzoxazole (A2b-1), unsaturated group-containing polybenzoxazole precursor (A2b-2), and unsaturated group-containing polysiloxane (A2b-3).

<Acidic Group- and Unsaturated Group-Containing Resin (A2c)>

It is preferable for the unsaturated group-containing resin (A2) to include an acidic group- and unsaturated group-containing resin (A2c).

The acidic group- and unsaturated group-containing resin (A2c) is an alkali-soluble resin that contains, as radical-polymerizable group, an ethylenically unsaturated double bond group and also contains, as alkali-soluble group, a carboxyl group and/or a carboxylic anhydride group.

The incorporation of an acidic group- and unsaturated group-containing resin (A2c) serves to improve not only the sensitivity in the light exposure step, but also the resolution after the development step.

It is preferable for the acidic group- and unsaturated group-containing resin (A2c) to include one or more selected from the group consisting of the following as described later: polycyclic side chain-containing aromatic resin (A2c-1), acrylic resin (A2c-2) and carboxylic acid-modified epoxy resin (A2c-3).

<Polyimide and Polyimide Precursor>

For the negative type photosensitive resin composition according to the present invention, the polyimide (A1a-1) is a common polyimide as described below.

For the negative type photosensitive resin composition according to the present invention, the polyimide precursor (A1a-2) is a common polyimide precursor as described below.

Examples of the polyimide precursor (A1a-2) include products of a reaction between a tetracarboxylic acid or a corresponding tetracarboxylic acid dianhydride, a tetracarboxylic acid diester dichloride, or the like and a diamine or a corresponding diisocyanate compound, trimethyl-silylated diamine, or the like, which contain a tetracarboxylic acid residue and/or a derivative residue thereof and also contain a diamine residue and/or a derivative residue thereof. Examples of the polyimide precursor (A1a-2) include polyamic acid, polyamic acid ester, polyamic acid amide, or polyisoimide.

Examples of the polyimide (A1a-1) include compounds formed by subjecting the aforementioned polyamic acid, polyamic acid ester, polyamic acid amide, or polyisoimide to dehydration and cyclization by heating or through a reaction using an acid or base, which contain a tetracarboxylic acid residue and/or a derivative residue thereof and also contain a diamine residue and/or a derivative residue thereof.

The polyimide precursor (A1a-2) is a thermosetting resin that can be converted into a polyimide (A1a-1) by heat-curing at a high temperature to cause dehydration and cyclization, thereby forming highly heat resistant imide bonds. Accordingly, the incorporation of a polyimide (A1a-1), which contains highly heat resistant imide bonds, in the resin composition ensures the production of a cured film having a considerably improved heat resistance. Therefore, such a cured film is suited to applications that require high heat resistance. Furthermore, since the polyimide precursor (A1a-2) is a resin that increases in heat resistance when dehydrated and cyclized, such a resin is preferred when a precursor having a structure with particular characteristics before dehydration and cyclization and forming a cured film with high heat resistance thereafter is desired.

In addition, the polyimide (A1a-1) and polyimide precursor (A1a-2) have an imide bond and/or an amide bond that have polarity. Accordingly, if a pigment (D1) in particular is added as the coloring agent (D) which will be described later, these polar bonds interact strongly with the pigment (D1) to improve the dispersion stability of the pigment (D1).

The polyimide (A1a-1) and the polyimide precursor (A1a-2) used for the present invention contain a phenolic hydroxyl group and a carboxyl group as alkali-soluble groups. The existence of a phenolic hydroxyl group ensures improved halftone characteristics. The existence of a carboxyl group ensures not only improved halftone characteristics, but also an improved resolution after the development step. In addition to the phenolic hydroxyl group, one or more weakly acidic groups selected from the group consisting of silanol group, hydroxyimide group, and hydroxyamide group may also be contained.

The unsaturated group-containing polyimide (A2a-1) and the unsaturated group-containing polyimide precursor (A2a-2) used for the present invention contain an ethylenically unsaturated double bond group as a radical-polymerizable group. The existence of an ethylenically unsaturated double bond group ensures an improved sensitivity in the light exposure step. It is preferable for the unsaturated group-containing polyimide (A2a-1) and the unsaturated group-containing polyimide precursor (A2a-2) to be products of a reaction of part of the phenolic hydroxyl groups and/or the carboxyl groups of a polyimide (A1a-1) or a polyimide precursor (A1a-2) with a compound having an ethylenically unsaturated double bond group. The above reaction allows an ethylenically unsaturated double bond group to be introduced into side chains of the resin.

From the viewpoint of obtaining a cured film having an improved heat resistance, it is preferable for a polyimide used for the present invention to contain a structural unit as represented by general formula (1):

[Chemical formula 1]

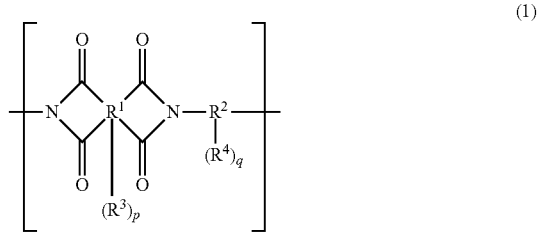

(In general formula (1), $R^1$ is a tetravalent to decavalent tetracarboxylic acid residue and/or a derivative residue thereof and $R^2$ is a divalent to decavalent diamine residue and/or a derivative residue thereof. $R^3$ and $R^4$ are independently a phenolic hydroxyl group, a sulfonic acid group, a mercapto group, or a substituent group as represented by general formula (5) or general formula (6). Furthermore, p is an integer of 0 to 6 and q is an integer of 0 to 8.)

In general formula (1), $R^1$ is a tetracarboxylic acid residue and/or a derivative residue thereof and $R^2$ is a diamine residue and/or a derivative residue thereof. Examples of such a tetracarboxylic acid derivative include tetracarboxylic acid dianhydride, tetracarboxylic acid dichloride, and tetracarboxylic acid active diester. Examples of such a diamine derivative include diisocyanate compounds and trimethyl-silylated diamine.

In general formula (1), $R^1$ is a tetravalent to decavalent tetracarboxylic acid residue and/or a derivative residue thereof and $R^2$ is a divalent to decavalent diamine residue and/or a derivative residue thereof. $R^3$ and $R^4$ are independently a phenolic hydroxyl group, a sulfonic acid group, a mercapto group, or a substituent group as represented by general formula (5) or general formula (6). Furthermore, p is an integer of 0 to 6 and q is an integer of 0 to 8. In general formula (1), $R^1$, which is a tetracarboxylic acid residue and/or a derivative residue thereof, is preferably a tetravalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a tetravalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^2$, which is a diamine residue and/or a derivative residue thereof, is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. Furthermore, q is preferably 1 to 8. The aforementioned aliphatic structures, alicyclic structures, and aromatic structures may each contain a heteroatom and may each be a substitution product or a non-substitution product.

[Chemical formula 2]

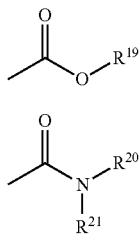

In general formulas (5) and (6), $R^{19}$ to $R^{21}$ each independently denote a hydrogen atom, an alkyl group containing 1 to 10 carbon atoms, an acyl group containing 2 to 6 carbon atoms, or an aryl group containing 6 to 15 carbon atoms. In general formulae (5) and (6), it is preferable that $R^{19}$ to $R^{21}$ each independently denote a hydrogen atom, an alkyl group containing 1 to 6 carbon atoms, an acyl group containing 2 to 4 carbon atoms, or an aryl group containing 6 to 10 carbon atoms. The above alkyl group, acyl group, and aryl group may each be either a substitution product or a non-substitution product.

It is preferable for the polyimide (A1a-1) to contain a structural unit as represented by general formula (1) as primary component, and it is preferable for the structural units as represented by general formula (1) to account for 50 to 100 mol %, more preferably 60 to 100 mol %, and still more preferably 70 to 100 mol %, of all structural units derived from carboxylic acids or derivatives thereof in the polyimide. A content in the above range ensures the production of a cured film having an improved heat resistance.

From the viewpoint of obtaining a cured film with an improved heat resistance and ensuring an improved resolution after the development step, it is preferable for the polyimide precursor (A1a-2) used for the present invention to contain a structural unit as represented by general formula (3):

[Chemical formula 3]

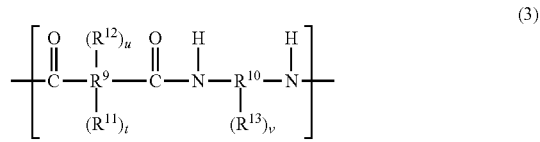

(In general formula (3), $R^9$ is a tetravalent to decavalent tetracarboxylic acid residue and/or a derivative residue thereof and $R^{2}$ is a divalent to decavalent diamine residue and/or a derivative residue thereof. $R^{11}$ is a substituent group as represented by general formula (5) or general formula (6) given above; $R^{12}$ is a phenolic hydroxyl group, a sulfonic acid group, or a mercapto group; and $R^{13}$ is a phenolic hydroxyl group, a sulfonic acid group, a mercapto group, or a substituent group as represented by general formula (5) given above or general formula (6) given above. Furthermore, t is an integer of 2 to 8; u is an integer of 0 to 6; v is an integer of 0 to 8; and $2 \leq t+u \leq 8$.)

In general formula (3), $R^9$ is a tetracarboxylic acid residue and/or a derivative residue thereof and $R^{10}$ is a diamine residue and/or a derivative residue thereof. Examples of such a tetracarboxylic acid derivative include tetracarboxylic acid dianhydride, tetracarboxylic acid dichloride, and tetracarboxylic acid active diester. Examples of such a diamine derivative include diisocyanate compounds and trimethyl-silylated diamine.

In general formula (3), $R^9$ is a tetravalent to decavalent tetracarboxylic acid residue and/or a derivative residue thereof and $R^{10}$ is a divalent to decavalent diamine residue and/or a derivative residue thereof. $R^{11}$ is a substituent group as represented by general formula (5) or general formula (6) given above; $R^{12}$ is a phenolic hydroxyl group, a sulfonic acid group, or a mercapto group; and $R^{13}$ is a phenolic hydroxyl group, a sulfonic acid group, a mercapto group, or a substituent group as represented by general formula (5) given above or general formula (6) given above. Furthermore, t is an integer of 2 to 8; u is an integer of 0 to 6; v is an integer of 0 to 8; and $2 \leq t+u \leq 8$. In general formula (3), $R^9$, which is a tetracarboxylic acid residue and/or a derivative residue thereof, is preferably a tetravalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a tetravalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^{10}$, which is a diamine residue and/or a derivative residue thereof, is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. Furthermore, v is preferably 1 to 8. The aforementioned aliphatic structures, alicyclic structures, and aromatic structures may each contain a heteroatom and may each be a substitution product or a non-substitution product.

It is preferable for the polyimide precursor (A1a-2) to contain a structural unit as represented by general formula (3) as primary component, and it is preferable for the structural units as represented by general formula (3) to account for 50 to 100 mol %, more preferably 60 to 100 mol %, and still more preferably 70 to 100 mol %, of all structural units derived from carboxylic acids or derivatives thereof in the polyimide precursor. A content in the above range ensures an improved resolution.

<Polybenzoxazole and Polybenzoxazole Precursor>

For the negative type photosensitive resin composition according to the present invention, the polybenzoxazole (A1b-1) is a common polybenzoxazole as described below.

For the negative type photosensitive resin composition according to the present invention, the polybenzoxazole precursor (A1b-2) is a common polybenzoxazole precursor as described below.

Examples of the polybenzoxazole precursor (A1b-2) include products of a reaction between dicarboxylic acid, or a corresponding dicarboxylic acid dichloride, dicarboxylic acid active diester, or the like and a diamine such as a bisaminophenol compound, which contain a dicarboxylic acid residue and/or a derivative residue thereof and also contain a bisaminophenol compound residue and/or a derivative residue thereof. Examples of the polybenzoxazole precursor (A1b-2) include polyhydroxyamide.

Examples of the polybenzoxazole (A1b-1) include compounds produced by dehydrating and cyclizing dicarboxylic acid and a bisaminophenol compound, used as diamine, through a reaction using polyphosphoric acid and those produced by dehydrating and cyclizing the aforementioned polyhydroxyamide by heating or through a reaction using phosphoric acid anhydride, a base, or a carbodiimide compound, which contain a dicarboxylic acid residue and/or a derivative residue thereof and also contain a bisaminophenol compound residue and/or a derivative residue thereof.

The polybenzoxazole precursor (A1b-2) is a thermosetting resin that can be converted into a polybenzoxazole (A1b-1) by heat-curing at a high temperature to cause dehydration and cyclization, thereby forming highly heat resistant rigid benzoxazole rings. Accordingly, the incorporation of polybenzoxazole (A1b-1), which contains highly heat resistant rigid benzoxazole rings, in the resin composition ensures the production of a cured film having a considerably improved heat resistance. Therefore, such a cured film is suited to applications that require high heat resistance. Furthermore, since the polybenzoxazole precursor (A1b-2) is a resin that increases in heat resistance when dehydrated and cyclized, such a resin is preferred when a precursor having a structure with particular characteristics before dehydration and cyclization and forming a cured film with high heat resistance thereafter is desired.

In addition, the polybenzoxazole (A1b-1) and polybenzoxazole precursor (A1b-2) have an oxazole bond and/or an amide bond that have polarity. Accordingly, if a pigment (D1) in particular is added as the coloring agent (D) which will be described later, these polar bonds interact strongly with the pigment (D1) to improve the dispersion stability of the pigment (D1).

The polybenzoxazole (A1b-1) and polybenzoxazole precursor (A1b-2) used for the present invention contain a phenolic hydroxyl group as an alkali-soluble group. The existence of a phenolic hydroxyl group ensures improved halftone characteristics. In addition to the phenolic hydroxyl group, one or more weakly acidic groups selected from the group consisting of silanol group, hydroxyimide group, and hydroxyamide group may also be contained.

The unsaturated group-containing polybenzoxazole (A2b-1) and unsaturated group-containing polybenzoxazole precursor (A2b-2) used for the present invention contain an ethylenically unsaturated double bond group as a radical-polymerizable group. The existence of an ethylenically unsaturated double bond group ensures an improved sensitivity in the light exposure step. It is preferable for the unsaturated group-containing polybenzoxazole (A2b-1) and unsaturated group-containing polybenzoxazole precursor (A2b-2) to be products of a reaction of part of the phenolic hydroxyl groups and/or the carboxyl groups of a polybenzoxazole (A1b-1) and polybenzoxazole precursor (A1b-2) with a compound having an ethylenically unsaturated double bond group. The above reaction allows an ethylenically unsaturated double bond group to be introduced into side chains of the resin.

From the viewpoint of obtaining a cured film having an improved heat resistance, it is preferable for a polybenzoxazole (A1b-1) used for the present invention to contain a structural unit as represented by general formula (2):

[Chemical formula 4]

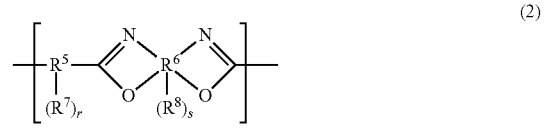

(2)

(In general formula (2), $R^5$ is a divalent to decavalent dicarboxylic acid residue and/or a derivative residue thereof and $R^6$ is a tetravalent to decavalent bisaminophenol compound residue having an aromatic structure and/or a derivative residue thereof. $R^7$ and $R^8$ are independently a phenolic hydroxyl group, a sulfonic acid group, a mercapto group, or a substituent group as represented by general formula (5) given above or general formula (6) given above. Furthermore, r is an integer of 0 to 8 and s is an integer of 0 to 6.)

In general formula (2), $R^5$ is a dicarboxylic acid residue and/or a derivative residue thereof and $R^6$ is a bisaminophenol compound residue and/or a derivative residue thereof. Examples of the dicarboxylic acid derivatives include dicarboxylic acid anhydride, dicarboxylic acid chloride, dicarboxylic acid active ester, tricarboxylic acid anhydride, tricarboxylic acid chloride, tricarboxylic acid active ester, and diformyl compounds.

In general formula (2), $R^5$ is a divalent to decavalent dicarboxylic acid residue and/or a derivative residue thereof and $R^6$ is a tetravalent to decavalent bisaminophenol compound residue having an aromatic structure and/or a derivative residue thereof. $R^7$ and $R^8$ are independently a phenolic hydroxyl group, a sulfonic acid group, a mercapto group, or a substituent group as represented by general formula (5) given above or general formula (6) given above. Furthermore, r is an integer of 0 to 8 and s is an integer of 0 to 6. In general formula (2), $R^5$, which is a dicarboxylic acid residue and/or a derivative residue thereof, is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^6$, which is a bisaminophenol compound residue and/or a derivative residue thereof, is preferably a tetravalent to decavalent organic group having an aromatic structure containing 6 to 30 carbon atoms, more preferably a tetravalent to decavalent organic group having an aromatic structure containing carbon atoms 6 to 25. Furthermore, s is preferably 1 to 8. The aforementioned aliphatic structures, alicyclic structures, and aromatic structures may each contain a heteroatom and may each be a substitution product or a non-substitution product.

It is preferable for the polybenzoxazole (A1b-1) to contain a structural unit as represented by general formula (2) as primary component, and it is preferable for the structural units as represented by general formula (2) to account for 50 to 100 mol %, more preferably 60 to 100 mol %, and still more preferably 70 to 100 mol %, of all structural units derived from amines or derivatives thereof in the polybenzoxazole. A content in the above range ensures the production of a cured film having an improved heat resistance.

From the viewpoint of obtaining a cured film with an improved heat resistance and ensuring an improved resolution after the development step, it is preferable for the polybenzoxazole precursor (A1b-2) used for the present invention to contain a structural unit as represented by general formula (4):

[Chemical formula 5]

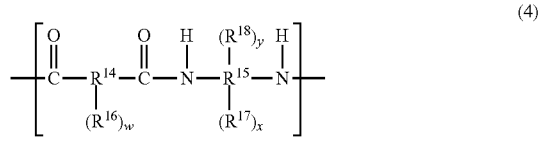

(4)

(In general formula (4), $R^{14}$ is a divalent to decavalent dicarboxylic acid residue and/or a derivative residue thereof and $R^{15}$ is a tetravalent to decavalent bisaminophenol compound residue having an aromatic structure and/or a derivative residue thereof. $R^{16}$ is a phenolic hydroxyl group, a sulfonic acid group, a mercapto group, or a substituent group as represented by general formula (5) or general formula (6) given above; $R^{17}$ is a phenolic hydroxyl group; and $R^{18}$ is a sulfonic acid group, a mercapto group, or a substituent group as represented by general formula (5) given above or general formula (6) given above. Furthermore, w is an integer of 0 to 8; x is an integer of 2 to 8; y is an integer of 0 to 6; and $2 \leq x+y \leq 8$.)

In general formula (4), $R^{14}$ is a dicarboxylic acid residue and/or a derivative residue thereof and $R^{15}$ is a bisaminophenol compound residue and/or a derivative residue thereof. Examples of the dicarboxylic acid derivatives include dicarboxylic acid anhydride, dicarboxylic acid chloride, dicarboxylic acid active ester, tricarboxylic acid anhydride, tricarboxylic acid chloride, tricarboxylic acid active ester, and diformyl compounds.

In general formula (4), $R^{14}$ is a divalent to decavalent dicarboxylic acid residue and/or a derivative residue thereof and $R^{15}$ is a tetravalent to decavalent bisaminophenol compound residue having an aromatic structure and/or a derivative residue thereof. $R^{16}$ is a phenolic hydroxyl group, a sulfonic acid group, a mercapto group, or a substituent group as represented by general formula (5) or general formula (6) given above; $R^{17}$ is a phenolic hydroxyl group; and $R^{18}$ is a sulfonic acid group, a mercapto group, or a substituent group as represented by general formula (5) given above or general formula (6) given above. Furthermore, w is an integer of 0 to 8; x is an integer of 2 to 8; y is an integer of 0 to 6; and $2 \leq x+y \leq 8$. In general formula (4), $R^{14}$, which is a dicarboxylic acid residue and/or a derivative residue thereof, is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^{15}$, which is a bisaminophenol compound residue and/or a derivative residue thereof, is preferably a tetravalent to decavalent organic group having an aromatic structure containing 6 to 30 carbon atoms, more preferably a tetravalent to decavalent organic group having an aromatic structure containing carbon atoms 6 to 25. The aforementioned aliphatic structures, alicyclic structures, and aromatic structures may each contain a heteroatom and may each be a substitution product or a non-substitution product.

It is preferable for the polybenzoxazole precursor (A1b-2) to contain a structural unit as represented by general formula (4) as primary component, and it is preferable for the structural units as represented by general formula (4) to account for 50 to 100 mol %, more preferably 60 to 100 mol %, and still more preferably 70 to 100 mol %, of all structural units derived from amines or derivatives thereof in the polybenzoxazole precursor. A content in the above range ensures an improved resolution.

<Tetracarboxylic Acid, Tricarboxylic Acid, Dicarboxylic Acid, and Derivative Thereof>

The polyimide (A1a-1) and/or the polyimide precursor (A1a-2) may contain a tetracarboxylic acid and/or a derivative thereof as described below. Examples of the tetracarboxylic acid include aromatic tetracarboxylic acid, alicyclic tetracarboxylic acid, and aliphatic tetracarboxylic acid. These tetracarboxylic acids may contain a non-oxygen heteroatom in addition to the oxygen atoms in the carboxyl group.

Examples of the aromatic tetracarboxylic acid and a derivative thereof include 1,2,4,5-benzenetetracarboxylic acid (pyromellitic acid), 3,3',4,4'-biphenyltetracarboxylic acid, 2,3,3',4'-biphenyltetracarboxylic acid, 2,2',3,3'-biphenyltetracarboxylic acid, 1,2,5,6-naphthalenetetracarboxylic acid, 1,4,5,8-naphthalenetetracarboxylic acid, 2,3,6,7-naphthalenetetracarboxylic acid, 3,3',4,4'-benzophenonetetracarboxylic acid, 2,2',3,3'-benzophenonetetracarboxylic acid, bis(3,4-dicarboxyphenyl) methane, bis(2,3-dicarboxyphenyl) methane, 1,1-bis(3,4-dicarboxyphenyl) ethane, 1,1-bis(2,3-dicarboxyphenyl) ethane, 2,2-bis(3,4-dicarboxyphenyl) propane, 2,2-bis(2,3-dicarboxyphenyl) propane, 2,2-bis[4-(3,4-dicarboxyphenoxy) phenyl] propane, 2,2-bis(3,4-dicarboxyphenyl) hexafluoropropane, 2,2-bis(2,3-dicarboxyphenyl) hexafluoropropane, bis(3,4-dicarboxyphenyl) sulfone, bis(3,4-dicarboxyphenyl) ether, 2,3,5,6-pyridinetetracarboxylic acid, 3,4,9,10-perylenetetracarboxylic acid, N,N'-bis[5,5'-hexafluoropropane-2,2-diyl-bis(2-hydroxyphenyl)] bis(3,4-dicarboxybenzoic acid amide), and other similar compounds having structures as described below, as well as tetracarboxylic acid dianhydrides thereof, tetracarboxylic acid dichlorides thereof, and tetracarboxylic acid active diesters thereof.

Examples of the aromatic dicarboxylic acid and a derivative thereof include phthalic acid, isophthalic acid, terephthalic acid, 4,4'-dicarboxybiphenyl, 2,2'-bis(trifluoromethyl)-4,4'-dicarboxybiphenyl, 4,4'-benzophenonedicarboxylic acid, 2,2-bis(4-carboxyphenyl) hexafluoropropane, 2,2-bis(3-carboxyphenyl) hexafluoropropane, and 4,4'-dicarboxydiphenyl ether, as well as dicarboxylic acid anhydrides thereof, dicarboxylic acid chlorides thereof, dicarboxylic acid active esters thereof, and diformyl compounds thereof.

Examples of the aromatic tricarboxylic acid and a derivative thereof include 1,2,4-benzenetricarboxylic acid, 1,3,5-benzenetricarboxylic acid, 2,4,5-benzophenonetricarboxylic acid, 2,4,4'-biphenyltricarboxylic acid, and 3,3',4'-tricarboxydiphenyl ether, as well as tricarboxylic acid anhydrides

[Chemical formula 6]

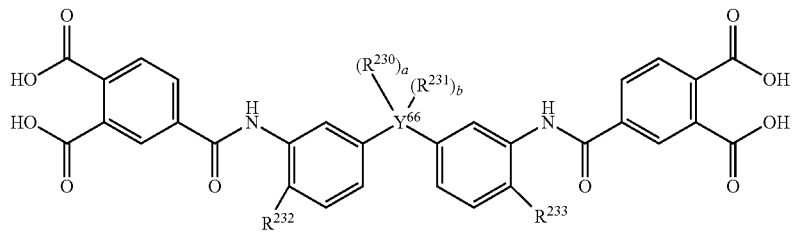

In the compounds having structures given above, $Y^{66}$ is a direct bond, an oxygen atom, or an alkylene chain containing 1 to 4 carbon atoms. When $Y^{66}$ is a direct bond or oxygen atom, a and b are 0. When $Y^{66}$ is an alkylene chain containing 1 to 4 carbon atoms, $R^{230}$ and $R^{231}$ are each independently a hydrogen atom, an alkyl group containing 1 to 4 carbon atoms, an alkyl group containing 1 to 4 carbon atoms and 1 to 8 fluorine atoms. $R^{232}$ and $R^{233}$ are each independently a hydrogen atom, an alkyl group containing 1 to 4 carbon atoms, or a hydroxyl group. Furthermore, a and b are each independently an integer of 0 to 4. The above alkylene chains and alkyl groups may each be either a substitution product or a non-substitution product.

Examples of the alicyclic tetracarboxylic acid and a derivative thereof include bicyclo[2.2.2]octane-7-ene-2,3,5,6-tetracarboxylic acid, 1,2,4,5-cyclohexanetetracarboxylic acid, 1,2,3,4-cyclopentanetetracarboxylic acid, 1,2,3,4-cyclobutanetetracarboxylic acid, and 2,3,4,5-tetrahydrofurantetracarboxylic acid, as well as tetracarboxylic acid dianhydrides thereof, tetracarboxylic acid dichlorides thereof, and tetracarboxylic acid active diesters thereof.

Examples of the aliphatic tetracarboxylic acid and a derivative thereof include butane-1,2,3,4-tetracarboxylic acid, tetracarboxylic acid dianhydrides thereof, tetracarboxylic acid dichlorides thereof, and tetracarboxylic acid active diesters thereof.

A tricarboxylic acid and/or a derivative thereof may be used as the dicarboxylic acid and a derivative thereof in the polybenzoxazole (A1b-1) and polybenzoxazole precursor (A1b-2).

Examples of the dicarboxylic acid and the tricarboxylic acid include aromatic dicarboxylic acid, aromatic tricarboxylic acid, alicyclic dicarboxylic acid, alicyclic tricarboxylic acid, aliphatic dicarboxylic acid, and aliphatic tricarboxylic acid. These dicarboxylic acids and tricarboxylic acids may contain a non-oxygen heteroatom in addition to the oxygen atoms in the carboxyl group.

thereof, tricarboxylic acid chlorides thereof, tricarboxylic acid active esters thereof, and diformyl monocarboxylic acids thereof.

Examples of the alicyclic dicarboxylic acid and a derivative thereof include 1,4-cyclohexanedicarboxylic acid and 1,2-cyclohexanedicarboxylic acid, as well as dicarboxylic acid anhydrides thereof, dicarboxylic acid chlorides thereof, dicarboxylic acid active esters thereof, and diformyl compounds thereof.

Examples of the alicyclic tricarboxylic acid and a derivative thereof include 1,2,4-cyclohexanetricarboxylic acid and 1,3,5-cyclohexanetricarboxylic acid, as well as tricarboxylic acid anhydrides thereof, tricarboxylic acid chlorides thereof, tricarboxylic acid active esters thereof, and diformylmonocarboxylic acids thereof.

Examples of the aliphatic dicarboxylic acid and a derivative thereof include hexane-1,6-dicarboxylic acid and succinic acid, as well as dicarboxylic acid anhydrides thereof, dicarboxylic acid chlorides thereof, dicarboxylic acid active esters thereof, and diformyl compounds thereof.

Examples of the aliphatic tricarboxylic acid and a derivative thereof include hexane-1,3,6-tricarboxylic acid and propane-1,2,3-tricarboxylic acid, as well as tricarboxylic acid anhydrides thereof, tricarboxylic acid chlorides thereof, tricarboxylic acid active esters thereof, and diformylmonocarboxylic acids thereof.

<Diamine and Derivative Thereof>

Examples of diamines and derivatives thereof include aromatic diamine, bisaminophenol compounds, alicyclic diamine, alicyclic dihydroxydiamine, aliphatic diamine, and aliphatic dihydroxydiamine. These diamines and derivatives thereof may contain a heteroatom in addition to the nitrogen atoms and oxygen atoms in the amino groups or derivatives thereof.

Examples of the aromatic diamine, bisaminophenol compounds, and derivatives include m-phenylene diamine, p-phenylene diamine, 1,4-bis(4-aminophenoxy) benzene, 4,4'-diaminobiphenyl, bis(4-aminophenoxy) biphenyl, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-bis(trifluoromethyl)-4,4'-diaminobiphenyl, 3,3'-diamino-4,4'-biphenol, 1,5-naphthalene diamine, 2,6-naphthalene diamine, 9,9-bis(3-amino-4-hydroxyphenyl) fluorene, 3,4'-diaminodiphenyl methane, 4,4'-diaminodiphenyl methane, bis(3-amino-4-hydroxyphenyl) methane, 1,1-bis(3-amino-4-hydroxyphenyl) ethane, 2,2-bis(3-amino-4-hydroxyphenyl) propane, 2,2-bis(4-aminophenyl) hexafluoropropane, 2,2-bis(3-amino-4-hydroxyphenyl) hexafluoropropane, 3,4'-diaminodiphenyl sulfone, 4,4'-diaminodiphenyl sulfone, bis(4-aminophenoxy phenyl) sulfone, bis(3-aminophenoxyphenyl) sulfone, bis(3-amino-4-hydroxyphenyl) sulfone, 3,4'-diaminodiphenyl sulfide, 4,4'-diaminodiphenyl sulfide, 3,4'-diaminodiphenyl ether, 4,4'-diaminodiphenyl ether, bis[4-(4-aminophenoxy) phenyl] ether, bis(3-amino-4-hydroxyphenyl) ether, 3-sulfonic 4,4'-diaminodiphenyl ether, dimercaptophenylene diamine, N,N'-bis[5,5'-hexafluoropropane-2,2-diyl-bis(2-hydroxyphenyl)] bis(3-aminobenzoic acid amide), and similar compounds having structures as described below, as well as diisocyanate compounds thereof and trimethyl-silylated diamines thereof.

[Chemical formula 7]

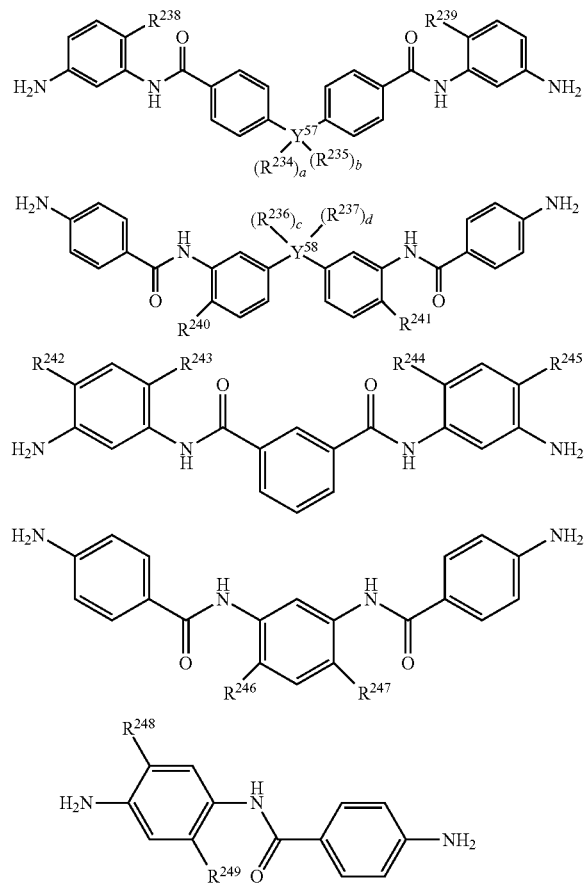

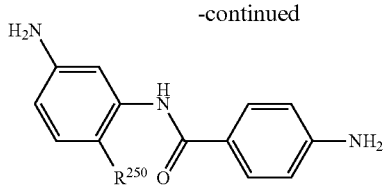

In the compounds having structures given above, $Y^{67}$ and $Y^{68}$ are each independently a direct bond, an oxygen atom, or an alkylene chain containing 1 to 4 carbon atoms. When $Y^{67}$ and $Y^{68}$ are each a direct bond or an oxygen atom, a, b, c, and d are 0. When $Y^{67}$ and $Y^{68}$ are each an alkylene chain containing 1 to 4 carbon atoms, $R^{234}$ and $R^{237}$ are each independently a hydrogen atom, an alkyl group containing 1 to 4 carbon atoms, or an alkyl group containing 1 to 4 carbon atoms and 1 to 8 fluorine atoms. $R^{238}$ and $R^{250}$ are each independently a hydrogen atom, an alkyl group containing 1 to 4 carbon atoms, or a hydroxyl group. Furthermore, a, b, c, and d are each independently an integer of 0 to 4. The above alkylene chains and alkyl groups may each be either a substitution product or a non-substitution product.

Examples of the alicyclic diamines, alicyclic dihydroxydiamines, and derivative thereof include compounds produced by substituting an alkyl group containing 1 to 10 carbon atoms, a fluoroalkyl group, or a halogen atom for part of the hydrogen atoms in the aromatic rings in an aromatic diamine or a bisaminophenol compound, and 1,2-cyclohexane diamine, 1,4-cyclohexane diamine, bis(4-aminocyclohexyl) methane, 3,6-dihydroxy-1,2-cyclohexane diamine, 2,5-dihydroxy-1,4-cyclohexane diamine, and bis (3-hydroxy-4-aminocyclohexyl) methane, as well as diisocyanate compounds thereof and trimethyl-silylated diamines.

Examples of the aliphatic diamines, aliphatic dihydroxydiamines, and derivatives thereof include 1,6-hexamethylene diamine and 2,5-dihydroxy-1,6-hexamethylene diamine, as well as diisocyanate compounds thereof and trimethyl-silylated diamines.

<Structural Unit Containing Fluorine Atom>

It is preferable for one or more selected from the polyimide (A1a-1), polybenzoxazole (A1b-1), polyimide precursor (A1a-2), and polybenzoxazole precursor (A1b-2) to contain a structural unit having a fluorine atom. The incorporation of a structural unit having a fluorine atom in one or more selected from the polyimide, polybenzoxazole, polyimide precursor, and polybenzoxazole precursor ensures an improved transparency and an improved sensitivity in the light exposure step. This also works to allow the film surface to have water repellency and depress the infiltration through the film surface in the alkali development step. The light exposure referred to here means the application of active actinic ray (radiation), such as the application of, for example, visible light, ultraviolet ray, electron beam, or X-ray. In view of generally used light sources, it is preferable to use an ultra-high pressure mercury lamp type light source that emits visible light, ultraviolet ray, etc., more preferably a light source that emits j-line (wavelength 313 nm), i-line (wavelength 365 nm), h-line (wavelength 405 nm), or g-line (wavelength 436 nm). Hereinafter, the term exposure means the application of active actinic ray (radiation).

In general, when a polyimide (A1a-1), polybenzoxazole (A1b-1), polyimide precursor (A1a-2), or polybenzoxazole precursor (A1b-2) is adopted, it is necessary to use a high polarity solvent such as N-methyl-2-pyrrolidone, dimethyl sulfoxide, N,N-dimethyl formamide, and γ-butyrolactone, as the solvent described later. However, if a pigment (D1) in particular is added as the coloring agent (D) which will be described later, these high polarity solvents interact strongly with the pigment (D1), possibly deteriorating the dispersion stability improving effect of the weakly acidic group-containing resin (A1), unsaturated group-containing resin (A2), or the dispersant (E) described later.

If one or more selected from the polyimide (A1a-1), polybenzoxazole (A1b-1), polyimide precursor (A1a-2), and polybenzoxazole precursor (A1b-2) have a structural unit containing a fluorine atom, it can work to improve the solubility in the solvent. Accordingly, this makes it possible to dissolve these resins with a reduced quantity of the aforementioned high polarity solvent or without using the high polarity solvent, serving to improve the dispersion stability of the pigment (D1).

Examples of such a structural unit having a fluorine atom contained in a polyimide (A1a-1) and/or polyimide precursor (A1a-2) include a structural unit derived from a tetracarboxylic acid having a fluorine atom and/or a derivative thereof, and a structural unit derived from a diamine having a fluorine atom and/or a derivative thereof.

Examples of such a structural unit having a fluorine atom contained in a polybenzoxazole (A1b-1) and/or polybenzoxazole precursor (A1b-2) include a structural unit derived from a dicarboxylic acid having a fluorine atom and/or a derivative thereof, and a structural unit derived from a bisaminophenol compound having a fluorine atom and/or a derivative thereof.

Examples of the tetracarboxylic acid having a fluorine atom and a derivative thereof include 2,2-bis(3,4-dicarboxyphenyl) hexafluoropropane, 2,2-bis(2,3-dicarboxyphenyl) hexafluoropropane, and N,N'-bis[5,5'-hexafluoropropane-2,2-diyl-bis(2-hydroxyphenyl)] bis(3,4-dicarboxybenzoic acid amide), as well as tetracarboxylic acid dianhydrides thereof, tetracarboxylic acid dichlorides thereof, and tetracarboxylic acid active diesters thereof.

Examples of the dicarboxylic acid having a fluorine atom and a derivative thereof include 2,2'-bis(trifluoromethyl)-4,4'-dicarboxybiphenyl, 2,2-bis(4-carboxyphenyl) hexafluoropropane, and 2,2-bis(3-carboxyphenyl) hexafluoropropane, as well as dicarboxylic acid anhydrides thereof, dicarboxylic acid chlorides thereof, dicarboxylic acid active esters thereof, and diformyl compounds thereof.

Examples of the diamine or bisaminophenol compound having a fluorine atom and a derivative thereof include 2,2'-bis(trifluoromethyl)-4,4'-diaminobiphenyl, 2,2-bis(4-aminophenyl) hexafluoropropane, 2,2-bis(3-amino-4-hydroxyphenyl) hexafluoropropane, and N,N'-bis[5,5'-hexafluoropropane-2,2-diyl-bis(2-hydroxyphenyl)] bis(3-aminobenzoic acid amide), as well as diisocyanate compounds thereof and trimethyl-silylated diamines thereof.

In the one or more resins selected from the group consisting of the polyimide (A1a-1), polybenzoxazole (A1b-1), polyimide precursor (A1a-2), and polybenzoxazole precursor (A1b-2), those structural units derived from one or more selected from the group consisting of tetracarboxylic acid having a fluorine atom, tetracarboxylic acid derivative having a fluorine atom, dicarboxylic acid having a fluorine atom, and dicarboxylic acid derivative having a fluorine atom preferably account for 30 to 100 mol %, more preferably 50 to 100 mol %, and still more preferably 70 to 100 mol %, of all structural units derived from a carboxylic acid or a derivative thereof. A content in the above range ensures improved sensitivity in the light exposure step.

In the one or more resins selected from the group consisting of the polyimide (A1a-1), polybenzoxazole (A1b-1), polyimide precursor (A1a-2), and polybenzoxazole precursor (A1b-2), those structural units derived from one or more selected from the group consisting of diamine having a fluorine atom, diamine derivative having a fluorine atom, bisaminophenol compound having a fluorine atom, and bisaminophenol compound derivative having a fluorine atom preferably account for 30 to 100 mol %, more preferably 50 to 100 mol %, and still more preferably 70 to 100 mol %, of all structural units derived from an amine or a derivative thereof. A content in the above range ensures improved sensitivity in the light exposure step.

<Structural Units Derived from One or More Selected from the Group Consisting of Tetracarboxylic Acid Having a Fluorine Atom, Tetracarboxylic Acid Derivative Having a Fluorine Atom, Dicarboxylic Acid Having a Fluorine Atom, and Dicarboxylic Acid Derivative Having a Fluorine Atom>

The polyimide (A1a-1) and/or the polyimide precursor (A1a-2) preferably contain, as a structural unit derived from a tetracarboxylic acid having a fluorine atom or a derivative thereof, a structural unit as represented by general formula (16) and/or a structural unit as represented by general formula (17).

For the polyimide (A1a-1) and/or the polyimide precursor (A1a-2), it is more preferable that $R^1$ in general formula (1) or $R^9$ in general formula (3) contains a structural unit as represented by general formula (16) and/or a structural unit as represented by general formula (17).

[Chemical formula 8]

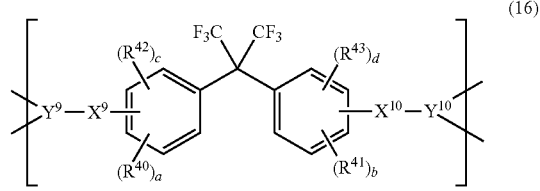

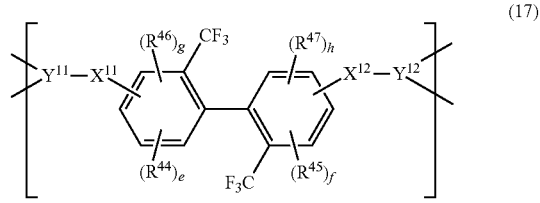

In general formulae (16) and (17), $R^{40}$, $R^{41}$, $R^{44}$, and $R^{45}$ are each independently a substituent group as represented by general formula (5) given above or general formula (6) given above, and $R^{42}$, $R^{43}$, $R^{46}$, and $R^{47}$ are each independently an alkyl group containing 1 to 10 carbon atoms, a cycloalkyl group containing 4 to 10 carbon atoms, an aryl group containing 6 to 15 carbon atoms, a phenolic hydroxyl group, a sulfonic acid group, or a mercapto group. $X^9$ to $X^{12}$ are each independently a direct bond, an oxygen atom, or a bond as represented by general formula (20). When $X^9$ to $X^{12}$ are direct bonds, $Y^9$ to $Y^{12}$ are each independently a direct bond, an alkylene chain containing 1 to 10 carbon atoms, a cycloalkylene chain containing 4 to 10 carbon atoms, or an arylene chain containing 6 to 15 carbon atoms. When $X^9$ to $X^{12}$ are each an oxygen atom or a bond as represented by general formula (20), $Y^9$ to $Y^{12}$ are each independently an alkylene chain containing 1 to 10 carbon atoms, a cycloalkylene chain containing 4 to 10 carbon atoms, or an arylene chain containing 6 to 15 carbon atoms. Here, a to d are each independently an integer of 0 to 4; e to h are each independently an integer of 0 to 3; 0≤a+c≤4; 0≤b+d≤4; 0≤e+g≤3; and 0≤f+h≤3. In general formulas (16) and (17), it is preferable that $R^{42}$, $R^{43}$, $R^{46}$, and $R^{47}$ are each independently an alkyl group containing 1 to 6 carbon atoms, a cycloalkyl group containing 4 to 7 carbon atoms, an aryl group containing 6 to 10 carbon atoms, a phenolic hydroxyl group, a sulfonic acid group, or a mercapto group. It is preferable that $Y^9$ to $Y^{12}$ are each independently a direct bond, an alkylene chain containing 1 to 6 carbon atoms, a cycloalkylene chain containing 4 to 7 carbon atoms, or an arylene chain containing 6 to 10 carbon atoms. The above alkyl group, cycloalkyl group, aryl group, alkylene chain, cycloalkylene chain, and arylene chain may each be either a substitution product or a non-substitution product.

[Chemical formula 9]

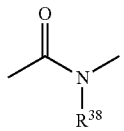

(20)

In general formula (20), $R^{38}$ is a hydrogen atom, an alkyl group having 1 to 10 carbon atoms, an acyl group having 2 to 6 carbon atoms, or an aryl group having 6 to 15 carbon atoms. In general formula (20), $R^{38}$ is a hydrogen atom, an alkyl group having 1 to 6 carbon atoms, an acyl group having 2 to 4 carbon atoms, or an aryl group having 6 to 10 carbon atoms. The above alkyl group, acyl group, and aryl group may each be either a substitution product or a non-substitution product.

The polybenzoxazole (A1b-1) and/or the polybenzoxazole precursor (A1b-2) preferably contain, as a structural unit derived from a dicarboxylic acid having a fluorine atom or a derivative thereof, a structural unit as represented by general formula (18) and/or a structural unit as represented by general formula (19).

For the polybenzoxazole (A1b-1) and/or the polybenzoxazole precursor (A1b-2), it is more preferable that $R^5$ in general formula (2) or $R^{14}$ in general formula (4) contains a structural unit as represented by general formula (18) and/or a structural unit as represented by general formula (19).

[Chemical formula 10]

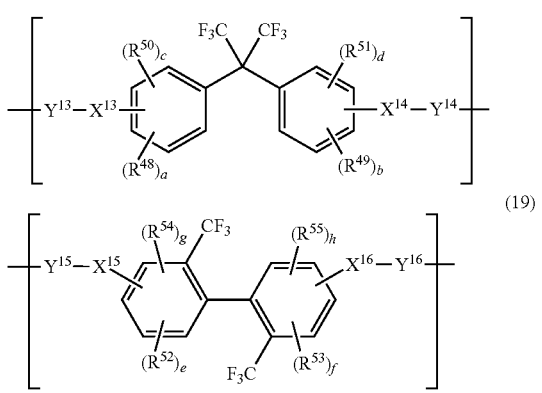

In general formulae (18) and (19), $R^{48}$, $R^{49}$, $R^{52}$, and $R^{53}$ are each independently a substituent group as represented by general formula (5) given above or general formula (6) given above, and $R^{50}$, $R^{51}$, $R^{54}$, and $R^{55}$ are each independently an alkyl group containing 1 to 10 carbon atoms, a cycloalkyl group containing 4 to 10 carbon atoms, an aryl group containing 6 to 15 carbon atoms, a phenolic hydroxyl group, a sulfonic acid group, or a mercapto group. $X^{13}$ to $X^{16}$ are each independently a direct bond, an oxygen atom, or a bond as represented by general formula (20) given above. When $X^{13}$ to $X^{16}$ are direct bonds, $Y^{13}$ to $Y^{16}$ are each independently a direct bond, an alkylene chain containing 1 to 10 carbon atoms, a cycloalkylene chain containing 4 to 10 carbon atoms, or an arylene chain containing 6 to 15 carbon atoms. When $X^{13}$ to $X^{16}$ are each an oxygen atom or a bond as represented by general formula (20) given above, $Y^{13}$ to $Y^{16}$ are each independently an alkylene chain containing 1 to 10 carbon atoms, a cycloalkylene chain containing 4 to 10 carbon atoms, or an arylene chain containing 6 to 15 carbon atoms. Here, a to d are each independently an integer of 0 to 4; e to h are each independently an integer of 0 to 3; 0≤a+c≤4; 0≤b+d≤4; 0≤e+g≤3; and 0≤f+h≤3. In general formulas (18) and (19), it is preferable that $R^{50}$, $R^{51}$, $R^{54}$, and $R^{55}$ are each independently an alkyl group containing 1 to 6 carbon atoms, a cycloalkyl group containing 4 to 7 carbon atoms, an aryl group containing 6 to 10 carbon atoms, a phenolic hydroxyl group, a sulfonic acid group, or a mercapto group. It is preferable that $Y^{13}$ to $Y^{16}$ are each independently a direct bond, an alkylene chain containing 1 to 6 carbon atoms, a cycloalkylene chain containing 4 to 7 carbon atoms, or an arylene chain containing 6 to 10 carbon atoms. The above alkyl group, cycloalkyl group, aryl group, alkylene chain, cycloalkylene chain, and arylene chain may each be either a substitution product or a non-substitution product.

<Structural Units Derived from One or More Selected from the Group Consisting of Diamine Having a Fluorine Atom, Diamine Derivative Having a Fluorine Atom, Bisaminophenol Compound Having a Fluorine Atom, and Bisaminophenol Compound Derivative Having a Fluorine Atom>

The polyimide (A1a-1) and/or the polyimide precursor (A1a-2) preferably contain, as a structural unit derived from a diamine having a fluorine atom or a derivative thereof, a structural unit as represented by general formula (12) and/or a structural unit as represented by general formula (13).

For the polyimide (A1a-1) and/or the polyimide precursor (A1a-2), it is more preferable that $R^2$ in general formula (1) or $R^{10}$ in general formula (3) contains a structural unit as represented by general formula (12) and/or a structural unit as represented by general formula (13).

[Chemical formula 11]

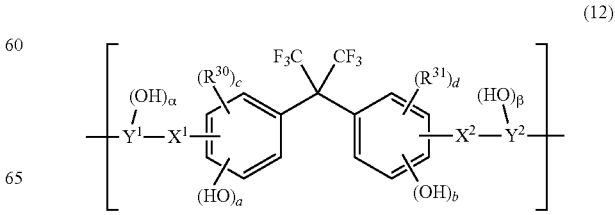

(12)

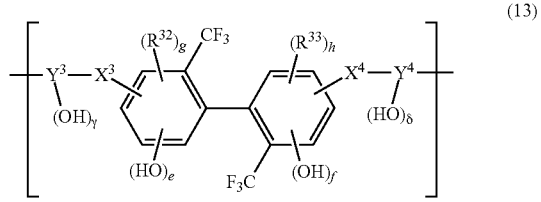

(13)

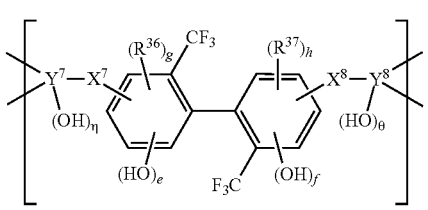

(15)

In general formulas (12) and (13), $R^{30}$ to $R^{33}$ are each independently an alkyl group containing 1 to 10 carbon atoms, a cycloalkyl group containing 4 to 10 carbon atoms, an aryl group containing 6 to 15 carbon atoms, a sulfonic acid group, a carboxyl group, or a mercapto group. $X^1$ to $X^4$ are each independently a direct bond, an oxygen atom, or a bond as represented by general formula (20) given above. When $X^1$ to $X^4$ are direct bonds, $Y^1$ to $Y^4$ are each independently a direct bond, an alkylene chain containing 1 to 10 carbon atoms, a cycloalkylene chain containing 4 to 10 carbon atoms, or an arylene chain containing 6 to 15 carbon atoms. When $X^1$ to $X^4$ are each an oxygen atom or a bond as represented by general formula (20) given above, $Y^1$ to $Y^4$ are each independently an alkylene chain containing 1 to 10 carbon atoms, a cycloalkylene chain containing 4 to 10 carbon atoms, or an arylene chain containing 6 to 15 carbon atoms. Here, a to d and α to δ are each independently an integer of 0 to 4; e to h are each independently an integer of 0 to 3; 0≤a+c≤4; 0≤b+d≤4; 0≤e+g≤3; and 0≤f+≤h 3. When $Y^1$ to $Y^4$ are each a direct bond, α to δ are each 0. In general formulas (12) and (13), it is preferable that $R^{30}$ to $R^{33}$ are each independently an alkyl group containing 1 to 6 carbon atoms, a cycloalkyl group containing 4 to 7 carbon atoms, an aryl group containing 6 to 10 carbon atoms, a sulfonic acid group, a carboxyl group, or a mercapto group. It is preferable that $Y^1$ to $Y^4$ are each independently a direct bond, an alkylene chain containing 1 to 6 carbon atoms, a cycloalkylene chain containing 4 to 7 carbon atoms, or an arylene chain containing 6 to 10 carbon atoms. Furthermore, it is preferable that a and b are each independently an integer of 1 to 4. Furthermore, it is preferable that e and f are each independently an integer of 1 to 3. The above alkyl group, cycloalkyl group, aryl group, alkylene chain, cycloalkylene chain, and arylene chain may each be either a substitution product or a non-substitution product.

The polybenzoxazole (A1b-1) and/or the polybenzoxazole precursor (A1b-2) preferably contain, as a structural unit derived from a bisaminophenol compound having a fluorine atom or a derivative thereof, a structural unit as represented by general formula (14) and/or a structural unit as represented by general formula (15).

For the polybenzoxazole (A1b-1) and/or the polybenzoxazole precursor (A1b-2), it is more preferable that $R^6$ in general formula (2) or $R^{15}$ in general formula (4) contains a structural unit as represented by general formula (14) and/or a structural unit as represented by general formula (15).

[Chemical formula 12]

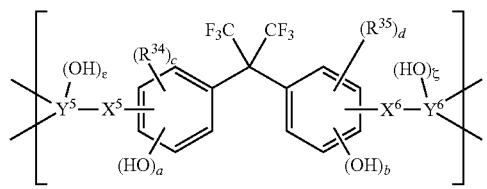

(14)

In general formulas (14) and (15), $R^{34}$ to $R^{37}$ are each independently an alkyl group containing 1 to 10 carbon atoms, a cycloalkyl group containing 4 to 10 carbon atoms, an aryl group containing 6 to 15 carbon atoms, a sulfonic acid group, a carboxyl group, or a mercapto group. $X^5$ to $X^8$ are each independently a direct bond, an oxygen atom, or a bond as represented by general formula (20) given above. When $X^5$ to $X^8$ are direct bonds, $Y^5$ to $Y^8$ are each independently a direct bond, an alkylene chain containing 1 to 10 carbon atoms, a cycloalkylene chain containing 4 to 10 carbon atoms, or an arylene chain containing 6 to 15 carbon atoms. When $X^5$ to $X^8$ are each an oxygen atom or a bond as represented by general formula (20) given above, $Y^5$ to $Y^8$ are each independently an alkylene chain containing 1 to 10 carbon atoms, a cycloalkylene chain containing 4 to 10 carbon atoms, or an arylene chain containing 6 to 15 carbon atoms. Here, a to d and ε to θ are each independently an integer of 0 to 4; e to h are each independently an integer of 0 to 3; 0≤a+c≤4; 0≤b+d≤4; 0≤e+g≤3; and 0≤f+h≤3. When $Y^5$ to $Y^8$ are each a direct bond, to 8 are each 0. In general formulas (14) and (15), it is preferable that $R^{34}$ to $R^{37}$ are each independently an alkyl group containing 1 to 6 carbon atoms, a cycloalkyl group containing 4 to 7 carbon atoms, an aryl group containing 6 to 10 carbon atoms, a sulfonic acid group, a carboxyl group, or a mercapto group. It is preferable that $Y^5$ to $Y^8$ are each independently a direct bond, an alkylene chain containing 1 to 6 carbon atoms, a cycloalkylene chain containing 4 to 7 carbon atoms, or an arylene chain containing 6 to 10 carbon atoms. Furthermore, it is preferable that a and b are each independently an integer of 1 to 4. Furthermore, it is preferable that e and f are each independently an integer of 1 to 3. The above alkyl group, cycloalkyl group, aryl group, alkylene chain, cycloalkylene chain, and arylene chain may each be either a substitution product or a non-substitution product.

<Structural Unit Derived from Aromatic, Alicyclic, or Aliphatic Carboxylic Acid or Derivative Thereof>

The polyimide (A1a-1) and/or polyimide precursor (A1a-2) preferably contains a structural unit derived from an aromatic tetracarboxylic acid and/or a derivative thereof. If the polyimide (A1a-1) and/or the polyimide precursor (A1a-2) contains a structural unit derived from an aromatic carboxylic acid and/or a derivative thereof, the heat resistance of the aromatic group serves to produce a cured film with an improved heat resistance. The aromatic carboxylic acid and a derivative thereof are preferably an aromatic tetracarboxylic acid and/or a derivative thereof.

It is preferable for the structural units derived from aromatic tetracarboxylic acids and/or derivatives thereof to account for 50 to 100 mol %, more preferably 60 to 100 mol %, and still more preferably 70 to 100 mol %, of all structural units derived from carboxylic acids or derivatives thereof in the polyimide (A1a-1). A content in the above range ensures the production of a cured film having an improved heat resistance.

It is preferable for the structural units derived from aromatic tetracarboxylic acids and/or derivatives thereof to account for 50 to 100 mol %, more preferably 60 to 100 mol %, and still more preferably 70 to 100 mol %, of all structural units derived from carboxylic acids or derivatives thereof in the polyimide precursor (A1a-2). A content in the above range ensures the production of a cured film having an improved heat resistance.

The polyimide (A1a-1) and/or the polyimide precursor (A1a-2) may contains a structural unit derived from alicyclic carboxylic acid or aliphatic carboxylic acid and/or a derivative thereof. The alicyclic carboxylic acid, aliphatic carboxylic acid, and/or a derivative thereof is preferably alicyclic tetracarboxylic acid or aliphatic tetracarboxylic acid and/or a derivative thereof.

The polybenzoxazole (A1b-1) and/or the polybenzoxazole precursor (A1b-2) preferably contains a structural unit derived from aromatic carboxylic acid and/or a derivative thereof. If the polybenzoxazole (A1b-1) and/or the polybenzoxazole precursor (A1b-2) contains a structural unit derived from an aromatic carboxylic acid and/or a derivative thereof, the heat resistance of the aromatic group serves to produce a cured film with an improved heat resistance. The aromatic carboxylic acid and/or a derivative thereof is preferably aromatic dicarboxylic acid or aromatic tricarboxylic acid and/or a derivative thereof, of which aromatic dicarboxylic acid and/or a derivative thereof are more preferable.

It is preferable for the structural units derived from aromatic carboxylic acids and/or derivatives thereof to account for 50 to 100 mol %, more preferably 60 to 100 mol %, and still more preferably 70 to 100 mol %, of all structural units derived from carboxylic acids or derivatives thereof in the polybenzoxazole (A1b-1). A content in the above range ensures the production of a cured film having an improved heat resistance.

It is preferable for the structural units derived from aromatic carboxylic acids and/or derivatives thereof to account for 50 to 100 mol %, more preferably 60 to 100 mol %, and still more preferably 70 to 100 mol %, of all structural units derived from carboxylic acids or derivatives thereof in the polybenzoxazole precursor (A1b-2). A content in the above range ensures the production of a cured film having an improved heat resistance.

The polybenzoxazole (A1b-1) and/or the polybenzoxazole precursor (A1b-2) may contains a structural unit derived from alicyclic carboxylic acid, aliphatic carboxylic acid, and/or a derivative thereof. The alicyclic carboxylic acid or aliphatic carboxylic acid and a derivative thereof are preferably alicyclic dicarboxylic acid, aliphatic dicarboxylic acid, alicyclic tricarboxylic acid, or aliphatic tricarboxylic acid, and/or a derivative thereof, of which alicyclic dicarboxylic acid or aliphatic dicarboxylic acid and/or a derivative thereof are more preferable.

<Structural Unit Derived from Aromatic, Alicyclic, or Aliphatic Amine and Derivative Thereof>

It is preferable for one or more selected from the polyimide (A1a-1), polybenzoxazole (A1b-1), polyimide precursor (A1a-2), and polybenzoxazole precursor (A1b-2) to contain a structural unit derived from an aromatic amine and/or a derivative thereof. If one or more selected from the polyimide (A1a-1), polybenzoxazole (A1b-1), polyimide precursor (A1a-2), and polybenzoxazole precursor (A1b-2) contains a structural unit derived from an aromatic amine and/or a derivative thereof, the heat resistance of the aromatic group serves to produce a cured film with an improved heat resistance. The aromatic amine or a derivative thereof is preferably aromatic diamine, bisaminophenol compound, aromatic triamine, or tris-aminophenol compound, and/or a derivative thereof, of which aromatic diamine or bisaminophenol compound and/or a derivative thereof are more preferable.

It is preferable for the structural units derived from aromatic amines and/or derivatives thereof to account for 50 to 100 mol %, more preferably 60 to 100 mol %, and still more preferably 70 to 100 mol %, of all structural units derived from amines or derivatives thereof in the one or more resins selected from the group consisting of the polyimide (A1a-1), polybenzoxazole (A1b-1), polyimide precursor (A1a-2), and polybenzoxazole precursor (A1b-2). A content in the above range ensures the production of a cured film having an improved heat resistance.

One or more selected from the polyimide (A1a-1), polybenzoxazole (A1b-1), polyimide precursor (A1a-2), and polybenzoxazole precursor (A1b-2) may contains a structural unit derived from an alicyclic amine or an aliphatic amine and/or a derivative thereof. The alicyclic amine or aliphatic amine and a derivative thereof are preferably alicyclic diamine, alicyclic dihydroxydiamine, aliphatic diamine, or aliphatic dihydroxydiamine and/or a derivative thereof.

<Structural Unit Derived from Diamine Having Silyl Group or Siloxane Bond or Derivative Thereof>

It is preferable for one or more selected from the polyimide (A1a-1), polybenzoxazole (A1b-1), polyimide precursor (A1a-2), and polybenzoxazole precursor (A1b-2) to contain a structural unit derived from a diamine having a silyl group or a siloxane bond and/or a derivative thereof. If one or more selected from the polyimide (A1a-1), polybenzoxazole (A1b-1), polyimide precursor (A1a-2), and polybenzoxazole precursor (A1b-2) contains a structural unit derived from a diamine having a silyl group or a siloxane bond and/or a derivative thereof, it leads to increased interaction at the interface between the cured film of the resin composition and the underlying substrate, and the cured film will have an improved adhesion to the underlying substrate and a high chemical resistance.

Examples of the diamine having a silyl group or a siloxane bond and a derivative thereof include 1,3-bis(3-aminopropyl) tetramethyl disiloxane and 1,9-bis(4-aminophenyl) octamethyl pentasiloxane.

It is preferable for the structural units derived from a diamine having a silyl group or a siloxane bond and/or a derivative thereof to account for 0.1 mol % or more, more preferably 0.5 mol % or more, and still more preferably 1 mol % or more, of all structural units derived from amines or derivatives thereof in the one or more resins selected from the group consisting of the polyimide (A1a-1), polybenzoxazole (A1b-1), polyimide precursor (A1a-2), and polybenzoxazole precursor (A1b-2). A content in the above range ensures an improved adhesion to the underlying substrate and the production of a cured film with an improved chemical resistance. On the other hand, it is preferable for the structural units derived from a diamine having a silyl group or a siloxane bond and/or a derivative thereof to account for 30 mol % or less, more preferably 20 mol % or less, and still more preferably 10 mol % or less. A content in the above range ensures the production of a cured film having an improved heat resistance.

<Structural Unit Derived from Amine Having Oxyalkylene Structure and a Derivative Thereof>

It is preferable for one or more selected from the polyimide (A1a-1), polybenzoxazole (A1b-1), polyimide precursor (A1a-2), and polybenzoxazole precursor (A1b-2) to contain a structural unit derived from an amine having an oxyalkylene structure and/or a derivative thereof. If one or more selected from the polyimide (A1a-1), polybenzoxazole (A1b-1), polyimide precursor (A1a-2), and polybenzoxazole precursor (A1b-2) contains a structural unit derived from an amine having an oxyalkylene structure and/or a derivative thereof, it will be possible to form a small-tapered pattern shape and produce a cured film having improved mechanical characteristics.

The amine having an oxyalkylene structure or a derivative thereof is preferably a diamine having an oxyalkylene structure or a triamine having an oxyalkylene structure and/or a derivative thereof.

It is preferable for one or more selected from the polyimide (A1a-1), polybenzoxazole (A1b-1), polyimide precursor (A1a-2), and polybenzoxazole precursor (A1b-2) to contain a structural unit as represented by general formula (21) as a structural unit derived from a diamine having an oxyalkylene structure and/or a derivative thereof.

For the polyimide (A1a-1) and/or the polyimide precursor (A1a-2), it is more preferable that $R^2$ in general formula (1) or $R^{10}$ in general formula (3) contains a structural unit as represented by general formula (21) given below.

[Chemical formula 13]

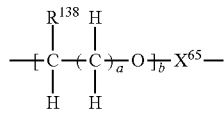

(21)

In general formula (21), $X^{65}$ is a direct bond or an alkylene chain containing 1 to 10 carbon atoms. $R^{138}$ is a hydrogen atom, an alkyl group having 1 to 10 carbon atoms, a cycloalkyl group having 4 to 10 carbon atoms, or an aryl group having 6 to 15 carbon atoms. Furthermore, a and b are each independently an integer of 1 to 10. In general formula (21), $X^{65}$ is preferably a direct bond or an alkylene chain containing 1 to 6 carbon atoms. $R^{138}$ is preferably a hydrogen atom, an alkyl group having 1 to 6 carbon atoms, a cycloalkyl group having 4 to 7 carbon atoms, or an aryl group having 6 to 10 carbon atoms. Furthermore, a is preferably an integer of 1 to 6. The above alkylene chain, alkyl group, cycloalkyl group, and aryl group may each be either a substitution product or a non-substitution product.

The triamine having an oxyalkylene structure or a derivative thereof is preferably a compound as represented by general formula (22) given below.

[Chemical formula 14]

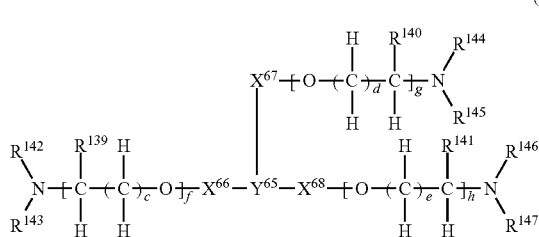

(22)

In general formula (22), $X^{66}$ to $X^{68}$ are each independently a direct bond or an alkylene chain containing 1 to 10 carbon atoms, and $Y^{65}$ is a methine group, an alkane-1,1,1-triyl group containing 1 to 10 carbon atoms, a cycloalkane-triyl group containing 4 to 10 carbon atoms, or an arene-triyl group containing 6 to 15 carbon atoms. $R^{139}$ to $R^{147}$ are each independently a hydrogen atom or an alkyl group containing 1 to 10 carbon atoms. Furthermore, c, d, e, f, g, and h are each independently an integer of 1 to 10. In general formula (22), it is preferable that $X^{66}$ to $X^{68}$ are each independently a direct bond or an alkylene chain containing 1 to 6 carbon atoms. $Y^{65}$ is a methine group, an alkane-1,1,1-triyl group containing 1 to 6 carbon atoms, a cycloalkane-triyl group containing 4 to 7 carbon atoms, or an arene-triyl group containing 6 to 10 carbon atoms. It is preferable that $R^{139}$ to $R^{147}$ are each independently a hydrogen atom or an alkyl group containing 1 to 6 carbon atoms. Furthermore, c, d, and e are each independently an integer of 1 to 6. The above alkyl group, alkylene chain, alkane-1,1,1-triyl group, cycloalkane-triyl group, and arene-triyl group may each be either a substitution product or a non-substitution product.

Examples of the diamine having an oxyalkylene structure and a derivative thereof include Jeffamine (registered trademark) D-230, D-400, D-2000, D-4000, HK-511, ED-600, ED-900, ED-2003, EDR-148, EDR-176, SD-231, SD-401, SD-2001, THF-100, THF-140, THF-170, XTJ-582, XTJ-578, XTJ-542, XTJ-548, and XTJ-559; and Elastamine (registered trademark) RP-405, RP-409, RP-2005, RP-2009, RT-1000, RE-600, RE-900, RE-2000, HE-150, HE-180, HE-1700, HT-1700, RE1-1000, RE1-2005, RE1-2007, RP3-400, and RP3-5000 (all manufactured by Huntsman Corporation).

Examples of the triamine having an oxyalkylene structure and a derivative thereof include Jeffamine (registered trademark) T-403, T-3000, T-5000, and ST-404 (all manufactured by Huntsman Corporation).

It is preferable for the structural units derived from an amine having an oxyalkylene structure and/or a derivative thereof to account for 1 mol % or more, more preferably 5 mol % or more, and still more preferably 10 mol % or more, of all structural units derived from amines or derivatives thereof in the one or more resins selected from the group consisting of the polyimide (A1a-1), polybenzoxazole (A1b-1), polyimide precursor (A1a-2), and polybenzoxazole precursor (A1b-2). A content in the above range ensures the formation of a small-tapered pattern shape and the production of a cured film with improved mechanical characteristics. On the other hand, it is preferable for the structural units derived from an amine having an oxyalkylene structure and/or a derivative thereof to account for 60 mol % or less, more preferably 50 mol % or less, and still more preferably 40 mol % or less. A content in the above range ensures the production of a cured film having an improved heat resistance.

<End-Capping Agent>

One or more selected from the polyimide (A1a-1), polybenzoxazole (A1b-1), polyimide precursor (A1a-2), and polybenzoxazole precursor (A1b-2) may have a chain end capped with an end-capping agent such as monoamine, dicarboxylic acid anhydride, monocarboxylic acid, monocarboxylic acid chloride, or monocarboxylic acid active ester. If one or more selected from the polyimide (A1a-1), polybenzoxazole (A1b-1), polyimide precursor (A1a-2), and polybenzoxazole precursor (A1b-2) have a chain end capped with an end-capping agent, a coating liquid of a resin composition containing them will have improved storage stability.

Examples of monoamines that can be used as end-capping agents include 5-amino-8-hydroxyquinoline, 1-hydroxy-7- aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxypyrimidine, 2-aminophenol, 3-aminophenol, 4-aminophenol, 2-aminothiophenol, 3-aminothiophenol, and 4-aminothiophenol.

Examples of dicarboxylic acid anhydrides that can be used as end-capping agents include phthalic acid anhydride, maleic acid anhydride, succinic acid anhydride, 5-norbornene-2,3-dicarboxylic acid anhydride, cyclohexanedicarboxylic acid anhydride, or 3-hydroxyphthalic acid anhydride.

Examples of monocarboxylic acids and monocarboxylic acid chlorides that can be used as end-capping agents include benzoic acid, 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzene sulfonic acid, 4-carboxybenzene sulfonic acid, and monocarboxylic acid chlorides thereof; and monocarboxylic acid chlorides of terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene.

Examples of monocarboxylic acid active esters that can be used as end-capping agents include those monocarboxylic acid active ester compounds obtainable through a reaction between an acid chloride as listed above and N-hydroxybenzotriazole or N-hydroxy-5-norbornene-2,3-dicarboxyimide.

It is preferable for the structural units derived from end-capping agents to account for 1 mol % or more, more preferably 3 mol % or more, and still more preferably 5 mol % or more, of all structural units derived from amines, carboxylic acids, or derivatives thereof in the one or more resins selected from the group consisting of the polyimide (A1a-1), polybenzoxazole (A1b-1), polyimide precursor (A1a-2), and polybenzoxazole precursor (A1b-2). A content in the above range ensures that a coating liquid of the resin composition has an improved storage stability. On the other hand, it is preferable for the structural units derived from end-capping agents to account for 30 mol % or less, more preferably 25 mol % or less, and still more preferably 20 mol % or less. A content in the above range ensures an improved resolution after the development step.

The content of the structural units derived from various carboxylic acids, amines, or derivatives thereof in the polyimide (A1a-1), polybenzoxazole (A1b-1), polyimide precursor (A1a-2), or polybenzoxazole precursor (A1b-2) can be determined by a combination of $^1$H-NMR, $^{13}$C-NMR, $^{15}$N-NMR, IR, TOF-MS, elementary analysis, ash content measurement, and the like.

<Introduction of Ethylenically Unsaturated Double Bond Group>

The unsaturated group-containing resin (A2) has an ethylenically unsaturated double bond group. It is preferable that the polyimide, polyimide precursor, polybenzoxazole, and polybenzoxazole precursor are subjected to an ethylenically unsaturated double bond group introduction reaction to introduce ethylenically unsaturated double bond groups into side chains of these resins.

It is preferable for the unsaturated group-containing polyimide (A2a-1), unsaturated group-containing polyimide precursor (A2a-2), unsaturated group-containing polybenzoxazole (A2b-1), or unsaturated group-containing polybenzoxazole precursor (A2b-2) used for the present invention to be products of a reaction of part of the phenolic hydroxyl groups and/or the carboxyl groups of a polyimide (A1a-1), polyimide precursor (A1a-2), polybenzoxazole (A1b-1), or polybenzoxazole precursor (A1b-2) with a compound having an ethylenically unsaturated double bond group. The above reaction allows an ethylenically unsaturated double bond group to be introduced into side chains of the resin.

From the viewpoint of reactivity, such a compound having an ethylenically unsaturated double bond group is preferably an electrophilic compound having an ethylenically unsaturated double bond group.

Examples of the electrophilic compound include isocyanate compounds, isothiocyanate compounds, epoxy compounds, aldehyde compounds, thioaldehyde compounds, ketone compounds, thioketone compounds, acetate compounds, carboxylic acid chlorides, carboxylic acid anhydrides, carboxylic acid active ester compounds, carboxylic acid compounds, alkyl halide compounds, alkyl azide compounds, alkyl triflate compounds, alkyl mesylate compounds, alkyl tosylate compounds, and alkyl cyanide compounds, of which isocyanate compounds, epoxy compound, aldehyde compounds, ketone compounds, and carboxylic acid anhydrides are preferable, and isocyanate compounds and epoxy compounds are more preferable, from the viewpoint of reactivity and usability of the compounds.

Preferable examples of the isocyanate compounds having ethylenically unsaturated double bond groups include compounds as represented by general formula (23) given below and compounds as represented by general formula (24).

[Chemical formula 15]

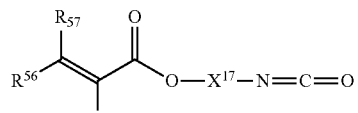

(23)

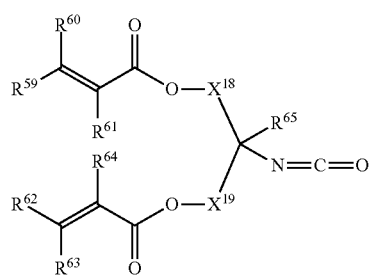

(24)

In general formula (23), $X^{17}$ is an alkylene chain containing 1 to 10 carbon atoms, a cycloalkylene chain containing 4 to 10 carbon atoms, or an arylene chain containing 6 to 15 carbon atoms. $R^{56}$ to $R^{58}$ are each independently a hydrogen atom or an alkyl group containing 1 to 10 carbon atoms. In general formula (23), $X^{17}$ is preferably an alkylene chain containing 1 to 6 carbon atoms, a cycloalkylene chain containing 4 to 7 carbon atoms, or an arylene chain containing 6 to 10 carbon atoms. It is preferable that $R^{56}$ to $R^{58}$ are each independently a hydrogen atom or an alkyl group containing 1 to 6 carbon atoms. In general formula (24), $X^{18}$ and $X^{19}$ are each an alkylene chain containing 1 to 10 carbon atoms, a cycloalkylene chain containing 4 to 10 carbon atoms, or an arylene chain containing 6 to 15 carbon atoms. $R^{59}$ to $R^{65}$ are each independently a hydrogen atom or an alkyl group containing 1 to 10 carbon atoms. In general formula (24), it is preferable that $X^{18}$ and $X^{19}$ are each an alkylene chain containing 1 to 6 carbon atoms, a cycloalkylene chain containing 4 to 7 carbon atoms, or an arylene chain containing 6 to 10 carbon atoms. It is preferable that $R^{59}$ to $R^{65}$ are each independently a hydrogen atom or an alkyl group containing 1 to 6 carbon atoms. The above alkylene chains, cycloalkylene chains, arylene chains, and alkyl groups may each be either a substitution product or a non-substitution product.

Preferable examples of the epoxy compounds having ethylenically unsaturated double bond groups include compounds as represented by general formula (25).

[Chemical formula 16]

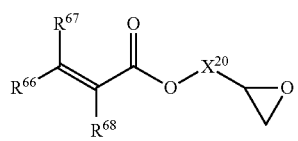

(25)

In general formula (25), $X^{20}$ is an alkylene chain containing 1 to 10 carbon atoms, a cycloalkylene chain containing 4 to 10 carbon atoms, or an arylene chain containing 6 to 15 carbon atoms. $R^{66}$ to $R^{68}$ are each independently a hydrogen atom or an alkyl group containing 1 to 10 carbon atoms. In general formula (25), $X^{20}$ is preferably an alkylene chain containing 1 to 6 carbon atoms, a cycloalkylene chain containing 4 to 7 carbon atoms, or an arylene chain containing 6 to 10 carbon atoms. It is preferable that $R^{66}$ to $R^{68}$ are each independently a hydrogen atom or an alkyl group containing 1 to 6 carbon atoms. The above alkylene chains, cycloalkylene chains, arylene chains, and alkyl groups may each be either a substitution product or a non-substitution product.

Preferable examples of the isocyanate compounds having ethylenically unsaturated double bond groups include (meth)acryloxymethyl isocyanate, 2-(meth)acryloxyethyl isocyanate, 4-(meth)acryloxy-n-butyl isocyanate, 4-(meth)acryloxycyclohexyl isocyanate, 4-(meth)acryloxyphenyl isocyanate, and 1,1-bis((meth)acryloxymethyl)ethyl isocyanate.

Preferable examples of the epoxy compounds having ethylenically unsaturated double bond groups include glycidyl (meth)acrylate, (α-ethyl)glycidyl (meth)acrylate, (3,4-epoxy)-n-butyl (meth)acrylate, (3,4-epoxy)heptyl (meth)acrylate, glycidyl 2-vinyl-acetate, glycidyl 2-vinyl-cyclohexane-carboxylate, glycidyl 2-vinyl-benzoate, allyl glycidyl ether, vinyl glycidyl ether, 2-vinylbenzyl glycidyl ether, and 2,3-bis(glycidyloxymethyl) styrene.

Preferable examples of the aldehyde compounds having ethylenically unsaturated double bond groups include acrylaldehyde, trans-crotonaldehyde, cis-crotonaldehyde, trans-cinnamaldehyde, and cis-cinnamaldehyde.

Preferable examples of the ketone compounds having ethylenically unsaturated double bond groups include methyl vinyl ketone, crotyl methyl ketone, cinnamyl methyl ketone, 2-cyclopentene-1-one, 2-cyclohexene-1-one, and 2-(2-acetoacetoxy)ethyl (meth)acrylate.

Preferable examples of the carboxylic acid anhydrides having ethylenically unsaturated double bond groups include (meth)acrylic acid anhydride, itaconic acid anhydride, maleic acid anhydride, 1,2,3,6-tetrahydrophthalic acid anhydride, and 3-methyl-1,2,3,6-tetrahydrophthalic acid anhydride.

Regarding the reaction conditions for introducing an ethylenically unsaturated double bond group, it is preferable that a reaction container is placed in air or sufficiently purged with nitrogen by bubbling, reduced pressure deaeration, etc., and then a polyimide (A1a-1), polyimide precursor (A1a-2), polybenzoxazole (A1b-1), or polybenzoxazole precursor (A1b-2) is added to a reaction solvent together with a compound having an ethylenically unsaturated double bond group, followed by continuing the reaction at 20° C. to 110° C. for 30 to 500 minutes. In addition, a polymerization terminator (such as a phenol compound), an acid catalyst, or a basic catalyst may be used as required.

Examples of the acid catalyst include hydrochloric acid, nitric acid, sulfuric acid, hydrofluoric acid, phosphoric acid, acetic acid, trifluoroacetic acid, formic acid, and multivalent carboxylic acids, as well as anhydrides and ion exchange resins thereof. Examples of the basic catalyst include triethyl amine, tri-n-propyl amine, tri-n-butyl amine, tri-n-pentyl amine, tri-n-hexyl amine, tri-n-heptyl amine, tri-n-octyl amine, diethyl amine, triethanol amine, diethanol amine, N,N-dimethyl-4-aminopyridine, sodium hydroxide, potassium hydroxide, and ion exchange resin.

<Physical Properties of Polyimide, Polybenzoxazole, Polyimide Precursor, and Polybenzoxazole Precursor>

For the one or more resins selected from the group consisting of the polyimide (A1a-1), polybenzoxazole (A1b-1), polyimide precursor (A1a-2), and polybenzoxazole precursor (A1b-2), the number of repetitions n of structural units is preferably 5 or more, more preferably 10 or more, still more preferably 15 or more. A number of repetitions n in the above range ensures an improved resolution after the development step. On the other hand, the number of repetitions n is preferably 1,000 or less, more preferably 500 or less, and still more preferably 100 or less. A number of repetitions n in the above range ensures an improved leveling property in the coating step and an improved pattern processability in an alkaline developer.

For the one or more resins selected from the group consisting of the polyimide (A1a-1), polybenzoxazole (A1b-1), polyimide precursor (A1a-2), and polybenzoxazole precursor (A1b-2), the polystyrene-based weight average molecular weight (hereinafter Mw) as determined by gel permeation chromatography (hereinafter GPC) is preferably 1,000 or more, more preferably 3,000 or more, and still more preferably 5,000 or more. A Mw in the above range ensures an improved resolution after the development step. On the other hand, the Mw is preferably 500,000 or less, more preferably 300,000 or less, and still more preferably 100,000 or less. A Mw in the above range ensures an improved leveling property in the coating step and an improved pattern processability in an alkaline developer.

The number average molecular weight (hereinafter Mn) is preferably 1,000 or more, more preferably 3,000 or more, and still more preferably 5,000 or more. A Mn in the above range ensures an improved resolution after the development step. On the other hand, the Mn is preferably 500,000 or less, more preferably 300,000 or less, and still more preferably 100,000 or less. A Mn in the above range ensures an improved leveling property in the coating step and an improved pattern processability in an alkaline developer.

The Mw and Mn the polyimide (A1a-1), polybenzoxazole (A1b-1), polyimide precursor (A1a-2), or polybenzoxazole precursor (A1b-2) can be easily determined as polystyrene-based values by GPC, light scattering, or X-ray small angle scattering. For the polyimide (A1a-1), polybenzoxazole (A1b-1), polyimide precursor (A1a-2), or polybenzoxazole precursor (A1b-2), the number of repetitions n of structural units can be determined from the relation n=Mw/M where M is the molecular weight of the structural unit and Mw is the weight average molecular weight of the resin.

For the one or more resins selected from the group consisting of the polyimide (A1a-1), polybenzoxazole (A1b-1), polyimide precursor (A1a-2), and polybenzoxazole precursor (A1b-2), the alkali dissolution rate is preferably 50 nm/min or more, more preferably 70 nm/min or more, and still more preferably 100 nm/min or more. An alkali dissolution rate in the above range ensures an improved resolution after the development step. On the other hand, the alkali dissolution rate is preferably 12,000 nm/min or less, more preferably 10,000 nm/min or less, and still more preferably 8,000 nm/min or less. An alkali dissolution rate in the above range ensures a decreased film loss in the alkali development step.

The alkali dissolution rate referred to herein means the decrease in film thickness that occurs in the following process: a solution prepared by dissolving a resin sample in γ-butyrolactone is spread over a Si wafer and prebaked at 120° C. for 4 minutes to form a prebaked film with a film thickness of 10 μm±0.5 μm, followed by immersing the prebaked film in a 2.38 mass % aqueous solution of tetramethyl ammonium hydroxide at 23±1° C. for 60 seconds and rinsing it with pure water for 30 seconds.

<Synthesize Method for Polyimide, Polybenzoxazole, Polyimide Precursor, and Polybenzoxazole Precursor>

The polyimide (A1a-1) and the polyimide precursor (A1a-2) can be synthesized by generally known methods. Examples include a method in which a tetracarboxylic acid dianhydride is reacted with a diamine (partly substituted by a monoamine as end-capping agent) at 80° C. to 200° C. in a polar solvent such as N-methyl-2-pyrrolidone and a method in which a tetracarboxylic acid dianhydride (partly substituted by dicarboxylic acid anhydride, monocarboxylic acid, monocarboxylic acid chloride, or monocarboxylic acid active ester as end-capping agent) is reacted with a diamine at 80° C. to 200° C.

The polybenzoxazole (A1b-1) and the polybenzoxazole precursor (A1b-2) can be synthesized by generally known methods. Examples include a method in which a dicarboxylic acid active diester is reacted with a bisaminophenol compound (partly substituted by a monoamine as end-capping agent) at 80° C. to 250° C. in a polar solvent such as N-methyl-2-pyrrolidone and a method in which a dicarboxylic acid active diester (partly substituted by dicarboxylic acid anhydride, monocarboxylic acid, monocarboxylic acid chloride, or monocarboxylic acid active ester as end-capping agent) is reacted with a bisaminophenol compound at 80° C. to 250° C.

For the one or more selected from the polyimide (A1a-1), polybenzoxazole (A1b-1), polyimide precursor (A1a-2), and polybenzoxazole precursor (A1b-2), the product of the polymerization reaction is preferably precipitated in methanol, water, etc., that are poor solvents for the one or more selected from the group consisting of polyimide, polybenzoxazole, polyimide precursor, and polybenzoxazole precursor, followed by washing and drying of the precipitate. The reprecipitation treatment serves to remove low molecular weight components and the like, thereby providing a cured film with largely improved mechanical characteristics.

Described below are specific methods for synthesizing the polyimide (A1a-1), polybenzoxazole (A1b-1), polyimide precursor (A1a-2), or polybenzoxazole precursor (A1b-2). First, a diamine or a bisaminophenol compound is dissolved in a reaction solvent, and a substantially equimolar quantity of a carboxylic acid anhydride is added gradually to the resulting solution. Using a mechanical stirrer, the mixed solution is stirred preferably at a temperature of 0° C. to 200° C., more preferably 40° C. to 150° C., preferably for 0.5 to 50 hours, more preferably 2 to 24 hours. In the case where an end-capping agent is used, a carboxylic acid anhydride is added and stirred at a predetermined temperature for a predetermined period and then an end-capping agent is added gradually and stirred.

Any reaction solvent may be used for the polymerization reaction as long as it can dissolve the diamine or the bisaminophenol compound and the carboxylic acid anhydride used as the starting materials, but it is preferably a polar solvent. Examples of the reaction solvent include amides such as N,N-dimethyl formamide, N,N-dimethyl acetamide, and N-methyl-2-pyrrolidone; cyclic esters such as γ-butyrolactone, γ-valerolactone, δ-valerolactone, γ-caprolactone, ε-caprolactone, and α-methyl-γ-butyrolactone; carbonates such as ethylene carbonate and propylene carbonate; glycols such as triethylene glycol; phenols such as m-cresol and p-cresol; and other solvents such as acetophenone, 1,3-dimethyl-2-imidazolidinone, sulfolane, and dimethyl sulfoxide. It is preferable for the reaction solvent to account for 100 to 1,900 parts by mass, more preferably 150 to 950 parts by mass, relative to the total quantity of the diamines or the bisaminophenol compounds and the carboxylic acid anhydrides, which accounts for 100 parts by mass.

For the polyimide (A1a-1) and the polyimide precursor (A1a-2), the imide ring closure rate (degree of imidization) can be determined easily by, for example, a method as described below. First, the infrared absorption spectrum of the resin is examined to confirm the existence of absorption peaks attributed to the imide bond in the polyimide structure (near 1,780 $cm^{-1}$ and 1,377 $cm^{-1}$). Then, the resin is heat-cured at 350° C. for 1 hour, followed by examining its infrared absorption spectrum. The peak strength near 1,780 $cm^{-1}$ or 1,377 $cm^{-1}$ is measured and compared with that measured before the heat-curing to determine the quantity of the imide bonds existing in the resin before the heat-curing, followed by converting it into the degree of imidization.

For the polybenzoxazole (A1b-1) or polybenzoxazole precursor (A1b-2), the oxazole ring closure rate (degree of oxazole formation) can be determined easily by, for example, a method as described below. First, the infrared absorption spectrum of the resin is examined to confirm the existence of absorption peaks attributed to the oxazole bond in the polybenzoxazole structure (near 1,574 $cm^{-1}$ and 1,557 $cm^{-1}$). Then, the resin is heat-cured at 350° C. for 1 hour, followed by examining its infrared absorption spectrum. The peak strength near 1,574 $cm^{-1}$ or 1,557 $cm^{-1}$ is measured and compared with that measured before the heat-curing to determine the quantity of the oxazole bonds existing in the resin before the heat-curing, followed by converting it into the degree of oxazole formation.

<Polysiloxane>

The negative type photosensitive resin composition according to the present invention may contain a polysiloxane (A1b-3) as a component of the weakly acidic group-containing resin (A1). The polysiloxane (A1b-3) is a common polysiloxane as described below.

Examples of the polysiloxane (A1b-3) used for the present invention include those polysiloxanes produced by hydrolyzing one or more selected from the group consisting of trifunctional organosilanes, tetrafunctional organosilanes, difunctional organosilanes, and monofunctional organosilanes, followed by dehydration and condensation.

The polysiloxane (A1b-3) is a thermosetting resin, and a highly heat resistant siloxane bond (Si—O) is formed when it is heat-cured at a high temperature to cause dehydration and condensation. Accordingly, the incorporation of a polysiloxane, which contains highly heat resistant siloxane bonds, in the resin composition ensures the production of a cured film having an improved heat resistance. Furthermore, since the resin increases in heat resistance when dehydrated and condensed, it is preferred when a resin having particular characteristics before dehydration and condensation and forming a cured film with high heat resistance thereafter is desired.

The polysiloxane (A1b-3) used for the present invention has a silanol group to act as an alkali-soluble group. The existence of a silanol group ensures improved halftone characteristics. In addition to the silanol group, one or more weakly acidic groups selected from the group consisting of phenolic hydroxyl group, hydroxyimide group, and hydroxyamide group may also be contained.

The unsaturated group-containing polysiloxane (A2b-3) used for the present invention has an ethylenically unsaturated double bond group to act as a radical-polymerizable group. The existence of an ethylenically unsaturated double bond group ensures an improved sensitivity in the light exposure step.

The carboxylic acid-modified polysiloxane (A1a-3) used for the present invention further has a carboxyl group and/or a carboxylic acid anhydride group, in addition to a silanol group, to act as alkali-soluble groups. The existence of a carboxyl group and/or a carboxylic acid anhydride group ensures not only improved halftone characteristics, but also an improved resolution after the development step.

The carboxylic acid-modified unsaturated group-containing polysiloxane (A2a-3) used for the present invention further has a carboxyl group and/or a carboxylic acid anhydride group, in addition to a silanol group, to act as alkali-soluble groups. The existence of a carboxyl group and/or a carboxylic acid anhydride group ensures not only improved halftone characteristics, but also an improved resolution after the development step. It also has an ethylenically unsaturated double bond group to act as a radical-polymerizable group. The existence of an ethylenically unsaturated double bond group ensures an improved sensitivity in the light exposure step.

Furthermore, the polysiloxane has a silanol group to act as a reactive group. Accordingly, if a pigment (D1) in particular is added as the coloring agent (D) which will be described later, the silanol group will be able to interact with and/or bond to the surface of the pigment (D1) and also able to interact with and/or bond to the surface-modifying group of the pigment (D1). Accordingly, this serves to improve the dispersion stability of the pigment (D1).

<Trifunctional Organosilane Unit, Tetrafunctional Organosilane Unit, Difunctional Organosilane Unit, and Monofunctional Organosilane Unit>

From the viewpoint of obtaining a cured film with an improved heat resistance and ensuring an improved resolution after the development step, it is preferable for the polysiloxane (A1b-3) used for the present invention to contain a trifunctional organosilane unit and/or a tetrafunctional organosilane unit. The trifunctional organosilane unit is preferably an organosilane unit as represented by general formula (7). The tetrafunctional organosilane unit is preferably an organosilane unit as represented by general formula (8).

The polysiloxane (A1b-3) used for the present invention may contain a difunctional organosilane unit from the viewpoint of obtaining a pattern shape with a smaller taper and a cured film with improved mechanical characteristics. The difunctional organosilane unit is preferably an organosilane unit as represented by general formula (9).

The polysiloxane (A1b-3) used for the present invention may contain a monofunctional organosilane unit from the viewpoint of allowing the resin composition to give a coating liquid having an improved storage stability. The monofunctional organosilane unit is preferably an organosilane unit as represented by general formula (10).

[Chemical formula 17]

In general formulae (7) to (10), $R^{22}$ to $R^{27}$ are each independently a hydrogen atom, an alkyl group, a cycloalkyl group, an alkenyl group, or an aryl group. In general formulae (7) to (10), it is preferable that $R^{22}$ to $R^{27}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms, more preferably a hydrogen atom, an alkyl group containing 1 to 6 carbon atoms, a cycloalkyl group containing 4 to 7 carbon atoms, an alkenyl group containing 2 to 8 carbon atoms, or an aryl group containing 6 to 10 carbon atoms. The above alkyl group, cycloalkyl group, alkenyl group, and aryl group may each have a heteroatom, and may each be either a substitution product or a non-substitution product.

Alkyl groups that serve as $R^{22}$ to $R^{27}$ in general formulae (7) to (10) include, for example, methyl group, ethyl group, n-propyl group, isopropyl group, n-butyl group, t-butyl group, n-hexyl group, and n-decyl group. Substituent groups therefor include, for example, halogen atom, epoxy group, glycidyl group, oxetanyl group, amino group, mercapto group, and isocyanate group. When the alkyl group is a substitution product, $R^{22}$ to $R^{27}$ may each be a trifluoro methyl group, a 3,3,3-trifluoro propyl group, a 3-glycidoxy propyl group, a 2-(3,4-epoxy cyclohexyl) ethyl group, a 3-[(3-ethyl-3-oxetanyl) methoxy] propyl group, a 3-aminopropyl group, a 3-mercaptopropyl group, a 3-isocyanate propyl group, or a substituent group having a structure as described below.

[Chemical formula 18]

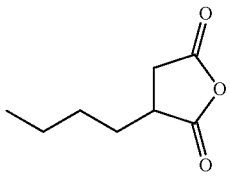

Cycloalkyl groups that serve as $R^{22}$ to $R^{27}$ in general formulae (7) to (10) include, for example, cyclopentyl group and cyclohexyl group. Substituent groups therefor include, for example, halogen atom, epoxy group, glycidyl group, oxetanyl group, amino group, mercapto group, and isocyanate group.

Alkenyl groups and substitution products thereof that serve as $R^{22}$ to $R^{27}$ in general formulae (7) to (10) include, for example, vinyl group, allyl group, 3-(meth)acryloxy propyl group, and 2-(meth)acryloxy ethyl group.

Aryl groups and substitution products thereof that serve as $R^{22}$ to $R^{27}$ in general formulae (7) to (10) include, for example, phenyl group, 4-tolyl group, 4-hydroxyphenyl group, 4-methoxyphenyl group, 4-t-butyl phenyl group, 1-naphthyl group, 2-naphthyl group, 4-styryl group, 2-phenyl ethyl group, 1-(4-hydroxyphenyl) ethyl group, 2-(4-hydroxyphenyl) ethyl group, and 4-hydroxy-5-(4-hydroxyphenylcarbonyloxy) pentyl group.

Organosilanes having organosilane units as represented by general formula (7) include, for example, trifunctional organosilanes such as methyl trimethoxysilane, methyl triethoxysilane, methyl tri-n-propoxy silane, ethyl trimethoxysilane, n-propyl trimethoxysilane, isopropyl trimethoxysilane, n-hexyl trimethoxysilane, n-decyl trimethoxysilane, cyclopentyl trimethoxysilane, cyclohexyl trimethoxysilane, 3-glycidoxypropyl trimethoxysilane, 2-(3,4-epoxycyclohexyl) ethyl trimethoxysilane, 3-[(3-ethyl-3-oxetanyl) methoxy] propyl trimethoxysilane, 3-aminopropyl trimethoxysilane, N-(2-aminoethyl)-3-aminopropyl trimethoxysilane, N-phenyl-3-aminopropyl trimethoxysilane, N-(vinylbenzyl)-2-aminoethyl-3-aminopropyl trimethoxysilane hydrochloride, 3-(4-aminophenyl) propyl trimethoxysilane, 1-[4-(3-trimethoxysilylpropyl) phenyl] urea, 1-(3-trimethoxysilylpropyl) urea, 3-triethoxysilyl-N-(1,3-dimethylbutylidene) propyl amine, 3-mercaptopropyl trimethoxysilane, 3-isocyanate propyl triethoxysilane, 1,3,5-tris-(3-trimethoxysilylpropyl) isocyanuric acid, N-t-butyl-2-(3-trimethoxysilylpropyl) succinimide, and N-t-butyl-2-(3-triethoxysilylpropyl) succinimide.

In the polysiloxane (A1b-3), organosilane units as represented by general formula (7) preferably account for 50 to 100 mol %, more preferably 60 to 100 mol %, and still more preferably 70 to 100 mol %, in terms of the molar ratio of Si atoms. A content in the above range ensures the production of a cured film having an improved heat resistance.

Organosilanes having organosilane units as represented by general formula (8) include, for example, tetrafunctional organosilanes such as tetramethoxy silane, tetraethoxysilane, tetra-n-propoxy silane, tetraisopropoxy silane, tetra-n-butoxy silane, and tetraacetoxy silane; and silicate compounds such as Methyl Silicate 51 (manufactured by Fuso Chemical Co., Ltd.), M Silicate 51, Silicate 40, and Silicate 45 (all manufactured by Tama Chemicals Co., Ltd.), and Methyl Silicate 51, Methyl Silicate 53A, Ethyl Silicate 40, and Ethyl Silicate 48 (all manufactured by Colcoat Co., Ltd.). From the viewpoint of obtaining a cured film with an improved heat resistance and an improved resolution after the development step, tetramethoxy silane, tetraethoxy silane, tetra-n-propoxy silane, Methyl Silicate 51 (manufactured by Fuso Chemical Co., Ltd.), M Silicate 51 (manufactured by Tama Chemicals Co., Ltd.), and Methyl Silicate 51 (manufactured by Colcoat Co., Ltd.) are preferable.

In the polysiloxane (A1b-3), organosilane units as represented by general formula (8) preferably account for 0 to 40 mol %, more preferably 0 to 30 mol %, and still more preferably 0 to 20 mol %, in terms of the molar ratio of Si atoms. A content in the above range ensures the production of a cured film with an improve heat resistance and an improved resolution after the development step.

Organosilanes having organosilane units as represented by general formula (9) include, for example, difunctional organosilanes such as dimethyl dimethoxysilane, dimethyl diethoxysilane, dimethyl diacetoxysilane, diethyl dimethoxysilane, diethyl diethoxysilane, di-n-propyl dimethoxysilane, di-n-butyl dimethoxysilane, dicyclopentyl dimethoxysilane, cyclohexylmethyl dimethoxysilane, 3-glycidoxypropylmethyl dimethoxysilane, N-(2-aminoethyl)-3-aminopropylmethyl dimethoxysilane, 3-mercaptopropylmethyl dimethoxysilane, and 3-isocyanate propylmethyl diethoxysilane; and difunctional organosilane oligomers such as 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, 1,1,3,3-tetraethyl-1,3-diethoxydisiloxane, and commercial products such as DMS-S12, DMS-S15, PDS-1615, and PDS-9931 (all manufactured by Gelest). From the viewpoint of obtaining a pattern shape with a smaller taper and a cured film with improved mechanical characteristics, dimethyl dimethoxysilane, dimethyl diethoxysilane, dimethyl diacetoxysilane, diethyl dimethoxysilane, diethyl diethoxysilane, diphenyl dimethoxysilane, diphenyl diethoxysilane, 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, and 1,1,3,3-tetraethyl-1,3-diethoxydisiloxane are preferable.

In the polysiloxane (A1b-3), organosilane units as represented by general formula (9) preferably account for 0 to 60 mol %, more preferably 0 to 50 mol %, and still more preferably 0 to 40 mol %, in terms of the molar ratio of Si atoms. A content in the above range ensures the production of a cured film with an improve heat resistance and an improved resolution after the development step.

Organosilanes having organosilane units as represented by general formula (10) include, for example, monofunctional organosilanes such as trimethyl methoxysilane, trimethyl ethoxysilane, triethyl methoxysilane, triethyl ethoxysilane, tri-n-propyl trimethoxysilane, tri-n-propyl triethoxysilane, tri-n-butyl trimethoxysilane, tri-n-butyl triethoxysilane, (3-glycidoxypropyl) dimethyl methoxysilane, or (3-glycidoxypropyl) dimethyl ethoxysilane.

In the polysiloxane (A1b-3), organosilane units as represented by general formula (10) preferably account for 0 to 20 mol %, more preferably 0 to 10 mol %, and still more preferably 0 to 5 mol %, in terms of the molar ratio of Si atoms. A content in the above range ensures the production of a cured film having an improved heat resistance.

Examples of the polysiloxane (A1b-3) used for the present invention include those polysiloxanes produced by hydrolyzing one or more selected from the group consisting of organosilanes as represented by general formula (7a), organosilanes as represented by general formula (8a), organosilanes as represented by general formula (9a), and organosilanes as represented by general formula (10a), followed by dehydration and condensation.

[Chemical formula 19]

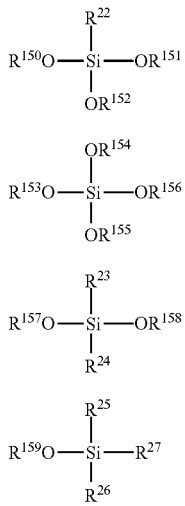

In general formulae (7a) to (10a), $R^{22}$ to $R^{27}$ are each independently a hydrogen atom, an alkyl group, a cycloalkyl group, an alkenyl group, or an aryl group, and $R^{150}$ to $R^{159}$ are each independently a hydrogen atom, an alkyl group, an acyl group, or an aryl group. In general formulae (7a) to (10a), it is preferable that $R^{22}$ to $R^{27}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms, more preferably a hydrogen atom, an alkyl group containing 1 to 6 carbon atoms, a cycloalkyl group containing 4 to 7 carbon atoms, an alkenyl group containing 2 to 8 carbon atoms, or an aryl group containing 6 to 10 carbon atoms. It is also preferable that $R^{150}$ to $R^{159}$ are each independently a hydrogen atom, an alkyl group containing 1 to 6 carbon atoms, an acyl group containing 2 to 6 carbon atoms, or an aryl group containing 6 to 15 carbon atoms, more preferably a hydrogen atom, an alkyl group containing 1 to 4 carbon atoms, an acyl group containing 2 to 4 carbon atoms, or an aryl group containing 6 to 10 carbon atoms. The above alkyl group, cycloalkyl group, alkenyl group, aryl group, and acyl group may each have a heteroatom, and may each be either a substitution product or a non-substitution product.

In the polysiloxane (A1b-3), organosilane units as represented by general formula (7), organosilane units as represented by general formula (8), organosilane units as represented by general formula (9), and organosilane units as represented by general formula (10) may be arrayed either regularly or irregularly. A regular array is formed by, for example, alternating copolymerization, periodic copolymerization, block copolymerization, or graft copolymerization. An irregular array is formed by, for example, random copolymerization.

In the polysiloxane (A1b-3), furthermore, organosilane units as represented by general formula (7), organosilane units as represented by general formula (8), organosilane units as represented by general formula (9), and organosilane units as represented by general formula (10) may be arrayed either two-dimensionally or three-dimensionally. A two-dimensional array is formed by, for example, linear chains. A three-dimensional array is formed by, for example, ladder-like, cage-like, or network-like chains.

<Organosilane Unit Having Fluorine Atom>

The polysiloxane to be used for the present invention preferably contains an organosilane unit having a fluorine atom. Such a polysiloxane is preferably one obtained by using an organosilane having a fluorine atom as the organosilane containing an organosilane unit as represented by general formula (7), general formula (9), or general formula (10). The use of a polysiloxane containing an organosilane unit having a fluorine atom ensures improved transparency and an improved sensitivity in the light exposure step. It also works to allow the film surface to have water repellency and depress the infiltration through the film surface in the alkali development step.

As the organosilane unit having a fluorine atom, the polysiloxane preferably contains one or more organosilane units selected from the group consisting of those represented by general formula (11a), general formula (11b), or general formula (11c).

[Chemical formula 20]

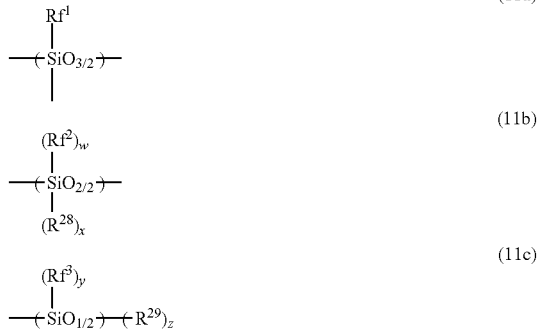

In general formulas (11a) to (11c), $Rf^1$ to $Rf^3$ are each independently an alkyl group containing 1 to 20 fluorine atoms and 1 to 10 carbon atoms, a cycloalkyl group containing 1 to 20 fluorine atoms and 4 to 10 carbon atoms, or an aryl group containing 1 to 20 fluorine atoms and 6 to 15 carbon atoms. $R^{28}$ and $R^{29}$ are each independently a hydrogen atom, alkyl group, cycloalkyl group, alkenyl group, or aryl group. Furthermore, w is an integer of 1 to 2; x is an integer of 0 to 1; and w+x=2. In addition, y is an integer of 1 to 3; z is an integer of 0 to 2; and y+z=3. In general formulas (11a) to (11c), it is preferable that $Rf^1$ to $Rf^3$ are each independently an alkyl group containing 1 to 12 fluorine atoms and 1 to 6 carbon atoms, a cycloalkyl group containing 1 to 12 fluorine atoms and 4 to 7 carbon atoms, or an aryl group containing 1 to 12 fluorine atoms and 6 to 10 carbon atoms. It is also preferable that $R^{28}$ and $R^{29}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms, more preferably a hydrogen atom, an alkyl group containing 1 to 6 carbon atoms, cycloalkyl group containing 4 to 7 carbon atoms, an alkenyl group containing 2 to 8 carbon atoms, or an aryl group containing 6 to 10 carbon atoms. The above alkyl group, cycloalkyl group, alkenyl group, and aryl group may each have a heteroatom, and may each be either a substitution product or a non-substitution product.

Examples of the organosilane containing an organosilane unit having a fluorine atom as represented by general formula (11a), general formula (11b), or general formula (11c) include trifunctional organosilanes such as trifluoromethyl trimethoxysilane, trifluoromethyl triethoxysilane, 3,3,3-trifluoropropyl trimethoxysilane, 3,3,3-trifluoropropyl triethoxysilane, trifluoromethoxypropyl trimethoxysilane, trifluoromethoxypropyl triethoxysilane, 3,3,3-trifluoropropyloxypropyl trimethoxysilane, 3,3,3-trifluoropropyloxypropyl triethoxysilane, 1,2,3,4,5-pentafluorophenyl trimethoxysilane, and 3-(1,2,3,4,5-pentafluorophenyl) propyl trimethoxysilane; difunctional organosilanes such as 3,3,3-trifluoropropylmethyl dimethoxysilane, 3,3,3-trifluoropropylmethyl dimethoxysilane, and trifluoromethoxypropylmethyl dimethoxysilane; monofunctional organosilanes such as 3,3,3-trifluoropropyldimethyl methoxysilane, 3,3,3-trifluoropropyldimethyl methoxysilane, and trifluoromethoxypropyldimethyl methoxysilane; and difunctional organosilane oligomers such as FS1265-300CS, FS1265-1000CS, and FS1265-10000CS (all manufactured by Dow Corning Toray Co., Ltd.).

In the polysiloxane, organosilane units having fluorine atoms preferably account for 5 mol % or more, more preferably 10 mol % or more, and still more preferably 15 mol % or more, in terms of the molar ratio of Si atoms. A content in the above range ensures improved sensitivity in the light exposure step. On the other hand, it is preferable for the organosilane units having fluorine atoms to account for 60 mol % or less, more preferably 50 mol % or less, and still more preferably 40 mol % or less. A content in the above range ensures the production of a cured film having improved mechanical characteristics. In particular, it is preferable that the molar ratio of Si atoms attributed to organosilane units having fluorine atoms as represented by general formula (7), general formula (9), or general formula (10) is in the above range.

<Organosilane Unit Having Aromatic Group>

The polysiloxane used for the present invention preferably contains an organosilane unit having an aromatic group. Such a polysiloxane is preferably one obtained by using an organosilane containing an aromatic group as the organosilane containing an organosilane unit as represented by general formula (7), general formula (9), or general formula (10). If the polysiloxane contains an organosilane unit having an aromatic group, the heat resistance of the aromatic group serves to produce a cured film with an improved heat resistance.

If a pigment (D1) in particular is added as the coloring agent (D) which will be described later, and if in that case the polysiloxane contains an organosilane unit having an aromatic group, the steric hindrance of the aromatic group serves to improve the dispersion stability of the pigment (D1). If the pigment (D1) is an organic pigment (D1-2), the aromatic group in the polysiloxane interacts with the aromatic group in the organic pigment (D1-2), thereby serving to improve the dispersion stability of the organic pigment (D1-2).

Examples of the organosilane containing an organosilane unit as represented by general formula (7), general formula (9), or general formula (10), and having an aromatic group include trifunctional organosilanes such as phenyl trimethoxysilane, phenyl triethoxysilane, 4-tolyl trimethoxysilane, 4-hydroxyphenyl trimethoxysilane, 4-methoxyphenyl trimethoxysilane, 4-t-butylphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, 1-(4-hydroxyphenyl) ethyl trimethoxysilane, 2-(4-hydroxyphenyl)ethyl trimethoxysilane, and 4-hydroxy-5-(4-hydroxyphenylcarbonyloxy)pentyl trimethoxysilane; and difunctional organosilanes such as diphenyl dimethoxysilane and diphenyl diethoxysilane. From the viewpoint of producing a cured film with improved heat resistance, phenyl trimethoxysilane, 4-tolyl trimethoxysilane, 4-hydroxyphenyl trimethoxysilane, 4-methoxyphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, diphenyl dimethoxysilane, and diphenyl diethoxysilane are preferable; phenyl trimethoxysilane, 1-naphthyl trimethoxysilane, 2-naphthyl trimethoxysilane, diphenyl dimethoxysilane, and diphenyl diethoxysilane are more preferable; and 1-naphthyl trimethoxysilane, 2-naphthyl trimethoxysilane, diphenyl dimethoxysilane, and diphenyl diethoxysilane are more preferable.

In the polysiloxane, organosilane units having aromatic groups preferably account for 5 mol % or more, more preferably 10 mol % or more, and still more preferably 15 mol % or more, in terms of the molar ratio of Si atoms. A content in the above range ensures the production of a cured film having an improved heat resistance. On the other hand, it is preferable for the organosilane units having aromatic groups to account for 80 mol % or less, more preferably 75 mol % or less, and still more preferably 70 mol % or less. A content in the above range ensures an improved pattern processability in an alkaline developer. In particular, it is preferable that the molar ratio of Si atoms attributed to organosilane units having aromatic groups as represented by general formula (7), general formula (9), or general formula (10) is in the above range.

Of the organosilanes as represented by general formula (7), general formula (9), or general formula (10) and having aromatic groups, phenyl trimethoxysilane, 4-tolyl trimethoxysilane, 4-hydroxyphenyl trimethoxysilane, 4-methoxyphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, diphenyl dimethoxysilane, and diphenyl diethoxysilane are preferable; phenyl trimethoxysilane, 1-naphthyl trimethoxysilane, 2-naphthyl trimethoxysilane, diphenyl dimethoxysilane, and diphenyl diethoxysilane are more preferable; and 1-naphthyl trimethoxysilane and 2-naphthyl trimethoxysilane are still more preferable; from the viewpoint of ensuring an improved pattern processability in an alkaline developer and an improved resolution after the development step.

<Organosilane Unit Having Ethylenically Unsaturated Double Bond Group>

It is also preferable that the polysiloxane contains an organosilane unit having an ethylenically unsaturated double bond group in such a manner that the ethylenically unsaturated double bond group is in side chains of the resin.

The polysiloxane used for the present invention preferably contains an organosilane unit having an ethylenically unsaturated double bond group. Such a polysiloxane is preferably one obtained by using an organosilane having an ethylenically unsaturated double bond group as the organosilane containing an organosilane unit as represented by general formula (7), general formula (9), or general formula (10). The use of a polysiloxane containing an organosilane unit having an ethylenically unsaturated double bond group ensures accelerated UV curing to improve the sensitivity in the light exposure step.

Examples of the organosilane containing an organosilane unit as represented by general formula (7), general formula (9), or general formula (10), and having an ethylenically unsaturated double bond group include trifunctional organosilanes such as vinyl trimethoxysilane, vinyl triethoxysilane, 3-methacryloxypropyl trimethoxysilane, 3-methacryloxypropyl triethoxysilane, 3-methacryloxypropylmethyl dimethoxysilane, 3-methacryloxypropylmethyl diethoxysilane, 3-acryloxypropyl trimethoxysilane, 3-acryloxypropyl triethoxysilane, 3-acryloxypropylmethyl dimethoxysilane, 3-acryloxypropylmethyl diethoxysilane, and 4-styryl trimethoxysilane; and difunctional organosilanes such as methylvinyl dimethoxysilane and divinyl diethoxysilane. From the viewpoint of ensuring an improved sensitivity in the light exposure step, vinyl trimethoxysilane, 3-methacryloxypropyl trimethoxysilane, 3-methacryloxypropylmethyl dimethoxysilane, 3-acryloxypropyl trimethoxysilane, 3-acryloxypropylmethyl dimethoxysilane, and 4-styryl trimethoxysilane are preferable.

The unsaturated group-containing polysiloxane (A2b-3) and the carboxylic acid-modified unsaturated group-containing polysiloxane (A2a-3) used for the present invention are preferably products obtained by hydrolyzing an organosilane containing an ethylenically unsaturated double bond group and other organosilanes, followed by dehydration, and condensation. The above reaction allows an ethylenically unsaturated double bond group to be introduced into side chains of the resin.

<Organosilane Unit Having Acidic Group>

It is also preferable that the polysiloxane has an organosilane unit containing an acidic group in such a manner that the acidic group is in side chains of the resin.

The polysiloxane used for the present invention preferably contains an organosilane unit having an acidic group. Such a polysiloxane is preferably one obtained by using an organosilane containing an acidic group as the organosilane containing an organosilane unit as represented by general formula (7), general formula (9), or general formula (10). If the polysiloxane contains an organosilane unit having an acidic group, it ensures an improved pattern processability in an alkaline developer and an improved resolution after the development step.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, hydroxyimide group, and hydroxyamide group. From the viewpoint of ensuring an improved pattern processability in an alkaline developer and an improved resolution after the development step, the carboxylic group, carboxylic acid anhydride group, phenolic hydroxyl group, and hydroxyimide group are preferable, and the carboxyl group and carboxylic acid anhydride group are more preferable. On the other hand, from the viewpoint of ensuring improved halftone characteristics, the phenolic hydroxyl group, hydroxyimide group, and hydroxyamide group are preferable.

Examples of the organosilane containing an organosilane unit as represented by general formula (7), general formula (9), or general formula (10) and having an acidic group include trifunctional organosilanes such as 2-(3-trimethoxysilylpropyl)-4-(N-t-butyl) amino-4-oxobutanoic acid, 3-(3-trimethoxysilylpropyl)-4-(N-t-butyl) amino-4-oxobutanoic acid, 3-trimethoxysilylpropyl succinic acid, 3-triethoxysilylpropyl succinic acid, 3-trimethoxysilyl propionic acid, 4-trimethoxysilyl butyric acid, 5-trimethoxysilyl valeric acid, 3-trimethoxysilylpropyl succinic acid anhydride, 3-triethoxysilylpropyl succinic acid anhydride, 4-(3-trimethoxysilylpropyl) cyclohexane-1,2-dicarboxylic acid anhydride, 4-(3-trimethoxysilylpropyl) phthalic acid anhydride, 4-hydroxyphenyl trimethoxysilane, 4-hydroxybenzyl trimethoxysilane, 1-(4-hydroxyphenyl)ethyl trimethoxysilane, 2-(4-hydroxyphenyl)ethyl trimethoxysilane, and 4-hydroxy-5-(4-hydroxyphenyl carbonyloxy)pentyl trimethoxysilane; difunctional organosilanes such as 3-methyldimethoxysilylpropyl succinic acid, 3-methyldimethoxysilyl propionic acid, and 3-methyldimethoxysilylpropyl succinic acid anhydride; and monofunctional organosilanes such as 3-dimethyl methoxysilylpropyl succinic acid, 3-dimethylmethoxysilyl propionic acid, and 3-dimethylmethoxysilylpropyl succinic acid anhydride. From the viewpoint of ensuring an improved pattern processability in an alkaline developer and an improved resolution after the development step, trifunctional organosilanes such as 2-(3-trimethoxysilylpropyl)-4-(N-t-butyl) amino-4-oxobutanoic acid, 3-(3-trimethoxysilylpropyl)-4-(N-t-butyl) amino-4-oxobutanoic acid, 3-trimethoxysilylpropyl succinic acid, 3-triethoxysilylpropyl succinic acid, 3-trimethoxysilyl propionic acid, 4-trimethoxysilyl butyric acid, 5-trimethoxysilyl valeric acid, 3-trimethoxysilylpropyl succinic acid anhydride, 3-triethoxysilylpropyl succinic acid anhydride, 4-(3-trimethoxysilylpropyl) cyclohexane-1,2-dicarboxylic acid anhydride, and 4-(3-trimethoxysilylpropyl) phthalic acid anhydride are preferable.

The carboxylic acid-modified polysiloxane (A1a-3) and the carboxylic acid-modified unsaturated group-containing polysiloxane (A2a-3) used for the present invention are preferably products obtained by hydrolyzing an organosilane containing a carboxyl group and/or a carboxylic acid anhydride group and other organosilanes, followed by dehydration, and condensation. The above reaction allows a carboxyl group and/or a carboxylic acid anhydride group to be introduced into side chains of the resin.

The content of various organosilane units in a polysiloxane can be determined by a combination of methods such as $^1$H-NMR, $^{13}$C-NMR, $^{29}$Si-NMR, IR, TOF-MS, elementary analysis, and ash content measurement.

<Properties of Polysiloxane>

The polysiloxane used for the present invention preferably has a polystyrene based Mw of 500 or more, more preferably 700 or more, and still more preferably 1,000 or more, as determined by GPC. A Mw in the above range ensures an improved resolution after the development step. On the other hand, the Mw is preferably 100,000 or less, more preferably 50,000 or less, and still more preferably 20,000 or less. A Mw in the above range ensures an improved leveling property in the coating step and an improved pattern processability in an alkaline developer.

<Synthesis Method for Polysiloxane>

Polysiloxane can be synthesized by a generally known method. For example, a good method is to hydrolyze an organosilane in a reaction solvent, followed by dehydration and condensation. To carry out hydrolysis, dehydration, and condensation of an organosilane, a reaction solvent, water, and a catalyst (if required) are added, for example, to a mixture containing the organosilane, followed by heating while stirring at 50° C. to 150° C., preferably 90° C. to 130° C., for about 0.5 to 100 hours. During the heating and stirring, hydrolysis by-products (alcohols such as methanol) and condensation by-products (water) may be evaporated by distillation if necessary.

<Polycyclic Side Chain-Containing Aromatic Resin>

The negative type photosensitive resin composition according to the present invention may contain a polycyclic side chain-containing aromatic resin (A2c-1) as an unsaturated group-containing resin (A2). The polycyclic side chain-containing aromatic resin (A2c-1) is a common polycyclic side chain-containing aromatic resin as described below.

Examples of the polycyclic side chain-containing aromatic resin (A2c-1) used for the present invention include (I) a polycyclic side chain-containing aromatic resin obtained through a reaction of a phenol compound, a carboxylic acid anhydride, and an epoxy compound, (II) a polycyclic side chain-containing aromatic resin obtained through a reaction of an epoxy compound, a carboxylic acid compound, and an epoxy compound, and (III) a polycyclic side chain-containing aromatic resin obtained through a reaction of an epoxy compound, a carboxylic acid compound, and carboxylic acid anhydride.

The polycyclic side chain-containing aromatic resin (A2c-1) is a thermosetting resin having a structure in which a backbone chain and a bulky side chain are connected through one atom and the bulky side chain has a ring structure such as fluorene ring which is highly heat resistant and rigid. Accordingly, if the resin composition to be used contains a polycyclic side chain-containing aromatic resin having a ring structure such as fluorene ring which is highly heat resistant and rigid, it ensures the production of a cured film having an improved heat resistance. Therefore, such a cured film is suited to applications that require heat resistance.

The polycyclic side chain-containing aromatic resin (A2c-1) used for the present invention has an ethylenically unsaturated double bond group. For the polycyclic side chain-containing aromatic resin (A2c-1), ethylenically unsaturated double bond groups can be introduced easily into side chains branched from the backbone chain of the resin. Having an ethylenically unsaturated double bond group, the polycyclic side chain-containing aromatic resin is a photo-curing resin which develops a three dimensional crosslinked structure of carbon-carbon bonds when cured by UV exposure. Accordingly, a resin composition that contains a polycyclic side chain-containing aromatic resin having an ethylenically unsaturated double bond group in side chains shows an improved sensitivity in the light exposure step. Furthermore, the three dimensional crosslinked structure formed has an alicyclic structure or an aliphatic structure as primary component and accordingly, the softening point of the resin is prevented from rising, allowing a small-tapered pattern shape to be formed and enabling the production of a cured film with improved mechanical characteristics. Therefore, such a cured film is suited to applications that require good mechanical characteristics.

The polycyclic side chain-containing aromatic resin (A2c-1) used for the present invention has a carboxyl group and/or a carboxylic acid anhydride group to act as alkali-soluble groups. The existence of a carboxyl group and/or a carboxylic acid anhydride group ensures an improved resolution after the development step.

From the viewpoint of producing a cured film with an improved heat resistance, the polycyclic side chain-containing aromatic resin (A2c-1) used for the present invention preferably contains one or more selected from the group consisting of a structural unit as represented by general formula (47), a structural unit as represented by general formula (48), a structural unit as represented by general formula (49), and a structural unit as represented by general formula (50). Furthermore, the polycyclic side chain-containing aromatic resin (A2c-1) used for the present invention has an ethylenically unsaturated double bond group, and from the viewpoint of ensuring an improved sensitivity in the light exposure step and producing a cured film with improved mechanical characteristics, it is preferable for an ethylenically unsaturated double bond group to be contained at one or more positions selected from the backbone chain, side chain, and chain end.

[Chemical formula 21]

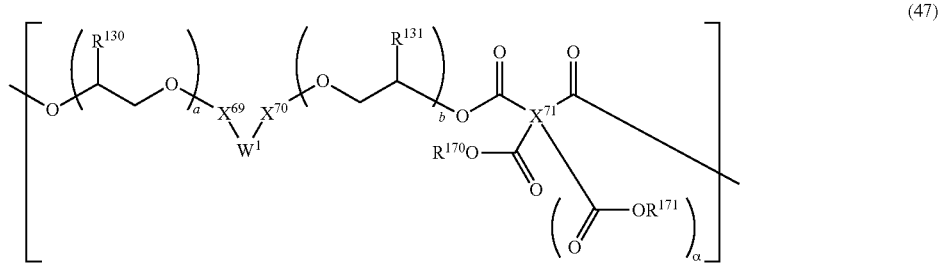

(47)

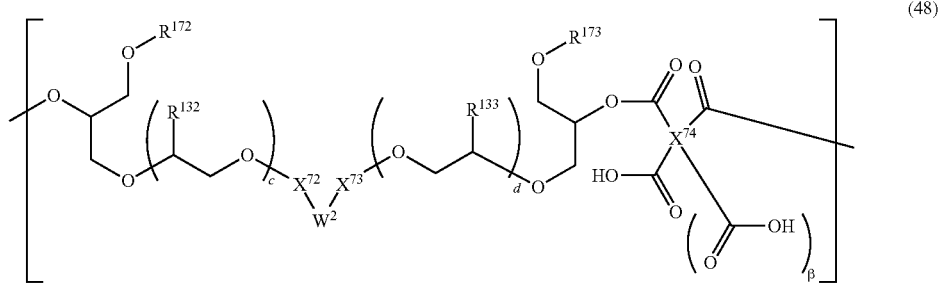

(48)

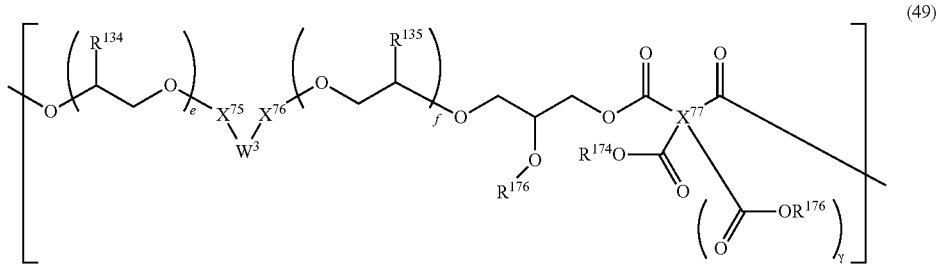

(49)

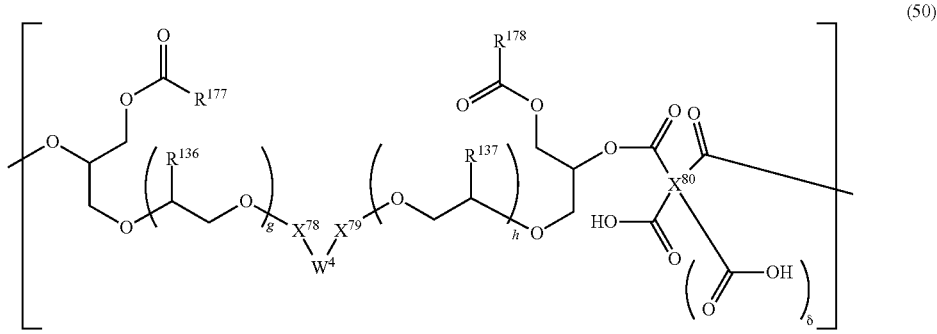

(50)

In general formula (47) to (50), $X^{69}$, $X^{70}$, $X^{72}$, $X^{73}$, $X^{75}$, $X^{76}$, $X^{78}$ and $X^{79}$ are each independently a monocyclic or fused polycyclic hydrocarbon ring. $X^{71}$, $X^{74}$, $X^{77}$ and $X^{80}$ are each independently a carboxylic acid and/or a derivative residue thereof in the form of a divalent to decavalent organic group. $W^1$ to $W^4$ are each independently an organic group having two or more aromatic groups. $R^{130}$ to $R^{137}$ are each independently a hydrogen atom or an alkyl group containing 1 to 6 carbon atoms, and $R^{170}$ to $R^{175}$, $R^{177}$ and $R^{178}$ are each independently a hydrogen atom or an organic group having an ethylenically unsaturated double bond group. $R^{176}$ is a hydrogen atom or an alkyl group containing 1 to 10 carbon atoms. Furthermore, a, b, c, d, e, f, g, and h are each independently an integer of 0 to 10, and α, β, γ, and δ are each independently an integer of 0 or 1. In general formula (47) to (50), it is preferable that $X^{69}$, $X^{70}$, $X^{72}$, $X^{73}$, $X^{75}$, $X^{76}$, $X^{78}$ and $X^{79}$ are each independently a monocyclic or fused polycyclic tetravalent to decavalent hydrocarbon ring containing 6 to 15 carbon atoms, more preferably a monocyclic or fused polycyclic tetravalent to decavalent hydrocarbon ring containing 6 to 10 carbon atoms. On the other hand, it is preferable that $X^{71}$, $X^{74}$, $X^{77}$ and $X^{80}$ are each independently a carboxylic acid residue having one or more selected from the group consisting of an aliphatic structure containing 2 to 20 carbon atoms, an alicyclic structure containing 4 to 20 carbon atoms, and an aromatic structure containing 6 to 30 carbon atoms and/or a derivative residue thereof in the form of a divalent to decavalent organic group, more preferably a carboxylic acid residue having one or more selected from the group consisting of an aliphatic structure containing 4 to 15 carbon atoms, an alicyclic structure containing 4 to 15 carbon atoms, and an aromatic structure containing 6 to 25 carbon atoms and/or a derivative residue thereof in the form of a tetravalent to decavalent organic group. Furthermore, it is preferable that $W^1$ to $W^4$ are each independently a substituent group as represented by any of general formulae (51) to (56). It is preferable that $R^{130}$ to $R^{137}$ are each independently a hydrogen atom or an alkyl group containing 1 to 4 carbon atoms, and also preferable that $R^{170}$ to $R^{175}$, $R^{177}$ and $R^{178}$ are each independently a substituent group as represented by general formula (57). Also, $R^{176}$ is preferably a hydrogen atom or an alkyl group containing 1 to 6 carbon atoms. The above organic groups each having an alkyl chain, aliphatic structure, alicyclic structure, aromatic structure, monocyclic or fused polycyclic aromatic hydrocarbon ring, or ethylenically unsaturated double bond group may have heteroatoms and may each be either a substitution product or a non-substitution product.

[Chemical formula 22]

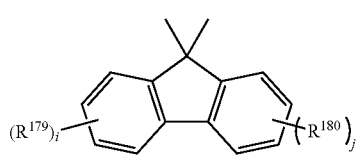

(51)

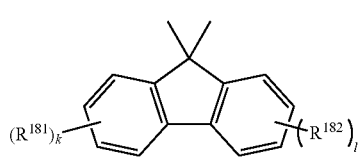

(52)

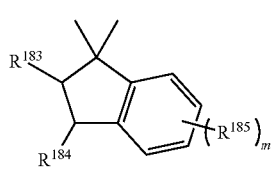

(53)

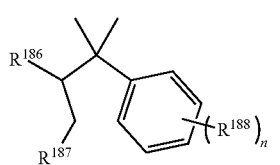

(54)

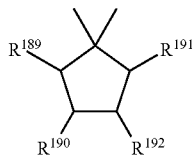
(55)

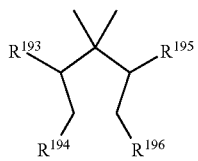
(56)

In general formulae (51) to (56), $R^{179}$ to $R^{182}$, $R^{185}$ and $R^{188}$ are each independently an alkyl group containing 1 to 10 carbon atoms. $R^{183}$, $R^{184}$, $R^{186}$, $R^{187}$, $R^{189}$, $R^{191}$ and $R^{193}$ to $R^{196}$ are each independently a hydrogen atom, an alkyl group containing 1 to 10 carbon atoms, a cycloalkyl group containing 4 to 10 carbon atoms, or an aryl group containing 6 to 15 carbon atoms. $R^{190}$ and $R^{192}$ are each independently a hydrogen atom, an alkyl group containing 1 to 10 carbon atoms, a cycloalkyl group containing 4 to 10 carbon atoms, or an aryl group containing 6 to 15 carbon atoms, and $R^{190}$ and $R^{192}$ may together form a ring. The ring formed by $R^{190}$ and $R^{192}$ is, for example, a benzene ring or a cyclohexane ring. At least either $R^{183}$ or $R^{184}$ is an aryl group containing 6 to 15 carbon atoms. At least either $R^{186}$ or $R^{187}$ is an aryl group containing 6 to 15 carbon atoms. At least either $R^{189}$ or $R^{190}$ is an aryl group containing 6 to 15 carbon atoms, and at least either $R^{191}$ or $R^{192}$ is an aryl group containing 6 to 15 carbon atoms. $R^{190}$ and $R^{192}$ may together form a ring. At least either $R^{193}$ or $R^{194}$ is an aryl group containing 6 to 15 carbon atoms, and at least either $R^{195}$ or $R^{196}$ is an aryl group containing 6 to 15 carbon atoms. Furthermore, i, j, k, l, m, and n are each independently an integer of 0 to 4. In general formulae (51) to (56), it is preferable that $R^{179}$ to $R^{182}$, $R^{185}$ and $R^{188}$ are each independently an alkyl group containing 1 to 6 carbon atoms. Furthermore, it is preferable that $R^{183}$, $R^{184}$, $R^{186}$, $R^{187}$, $R^{189}$, $R^{191}$ and $R^{193}$ to $R^{196}$ are each independently a hydrogen atom, an alkyl group containing 1 to 6 carbon atoms, a cycloalkyl group containing 4 to 7 carbon atoms, or an aryl group containing 6 to 10 carbon atoms. It is preferable that $R^{190}$ and $R^{192}$ are each independently a hydrogen atom, an alkyl group containing 1 to 6 carbon atoms, a cycloalkyl group containing 4 to 7 carbon atoms, or an aryl group containing 6 to 10 carbon atoms, and also preferable that the ring formed by $R^{190}$ and $R^{192}$ is a benzene ring. The above alkyl group, cycloalkyl group, and aryl group may each be either a substitution product or a non-substitution product.

[Chemical formula 23]

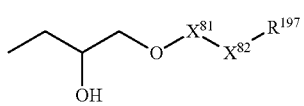
(57)

In general formula (57), $X^{81}$ is a direct bond, an alkylene chain containing 1 to 10 carbon atoms, a cycloalkylene chain containing 4 to 10 carbon atoms, or an arylene chain containing 6 to 15 carbon atoms, and $X^{82}$ is a direct bond or an arylene chain containing 6 to 15 carbon atoms. $R^{197}$ is a vinyl group, an aryl group, or a (meth)acrylic group. In general formula (57), $X^{81}$ is preferably a direct bond, an alkylene chain containing 1 to 6 carbon atoms, a cycloalkylene chain containing 4 to 7 carbon atoms, or an arylene chain containing 6 to 10 carbon atoms. Furthermore, $X^{82}$ is preferably a direct bond or an arylene chain containing 6 to 10 carbon atoms. The above alkylene chain, cycloalkylene chain, arylene group, vinyl group, aryl group, and (meth) acrylic group may each be either a substitution product or a non-substitution product.

<Synthesis Method for Polycyclic Side Chain-Containing Aromatic Resin>

The polycyclic side chain-containing aromatic resin (A2c-1) used for the present invention is preferably a polycyclic side chain-containing aromatic resin (A2c-1) produced by one or more synthesis methods selected from (I) to (IV) described below.

Polycyclic side chain-containing aromatic resin (I): This category includes polycyclic side chain-containing aromatic resins that can be produced by reacting a compound as represented by general formula (58) that contains two or more aromatic groups and a hydroxyl group in the molecule with an polyfunctional active carboxylic acid derivative (one or more selected from tetracarboxylic acid dianhydride, dicarboxylic acid dichloride, and dicarboxylic acid active diester) to prepare a resin and then subjecting it to a ring-opening addition reaction with an unsaturated compound as represented by general formula (60) that contains an ethylenically unsaturated double bond group and an epoxy group. The polyfunctional active carboxylic acid derivative is preferably a tetracarboxylic acid dianhydride. In addition to the polyfunctional active carboxylic acid derivative, the reaction components may also contain a tricarboxylic acid anhydride, dicarboxylic acid anhydride, monocarboxylic acid chloride, or monocarboxylic acid active ester as end-capping agents.

Polycyclic side chain-containing aromatic resin (II): This category includes polycyclic side chain-containing aromatic resins that can be produced by subjecting a compound as represented by general formula (58) that contains two or more aromatic groups and a hydroxyl group in the molecule with an unsaturated compound as represented by general formula (60) that contains an ethylenically unsaturated double bond group and an epoxy group to a ring-opening addition reaction to prepare a resin and then reacting it with a polyfunctional active carboxylic acid derivative (one or more selected from tetracarboxylic acid dianhydride, dicarboxylic acid dichloride, and dicarboxylic acid active diester). The polyfunctional active carboxylic acid derivative is preferably a tetracarboxylic acid dianhydride. In addition to the polyfunctional active carboxylic acid derivative, the reaction components may also contain a tricarboxylic acid anhydride, dicarboxylic acid anhydride, monocarboxylic acid chloride, or monocarboxylic acid active ester as end-capping agents.

Polycyclic side chain-containing aromatic resin (III): This category includes polycyclic side chain-containing aromatic resins that can be produced by subjecting a compound as represented by general formula (59) that contains two or more aromatic groups and an epoxy group in the molecule to a ring-opening addition reaction with an polyfunctional carboxylic acid (one or more selected from tetracarboxylic acid, tricarboxylic acid, and dicarboxylic acid) to prepare a resin and then subjecting it to a ring-opening addition reaction with an unsaturated compound as represented by general formula (60) that contains an ethylenically unsaturated double bond group and an epoxy group. The polyfunctional carboxylic acid is preferably a tetracarboxylic acid or a tricarboxylic acid. In addition to the polyfunctional carboxylic acid, the reaction components may also contain a monocarboxylic acid as end-capping agents.

Polycyclic side chain-containing aromatic resin (IV): This category includes polycyclic side chain-containing aromatic resins that can be produced by subjecting a compound as represented by general formula (59) that contains two or more aromatic groups and an epoxy group in the molecule to a ring-opening addition reaction with an unsaturated carboxylic acid that contains an ethylenically unsaturated double bond group to prepare a resin and then reacting it with a polyfunctional active carboxylic acid derivative (one or more selected from tetracarboxylic acid dianhydride, dicarboxylic acid dichloride, and dicarboxylic acid active diester). The polyfunctional active carboxylic acid derivative is preferably a tetracarboxylic acid dianhydride. In addition to the polyfunctional active carboxylic acid derivative, the reaction components may also contain a tricarboxylic acid anhydride, dicarboxylic acid anhydride, monocarboxylic acid chloride, or monocarboxylic acid active ester as end-capping agents.

[Chemical formula 24]

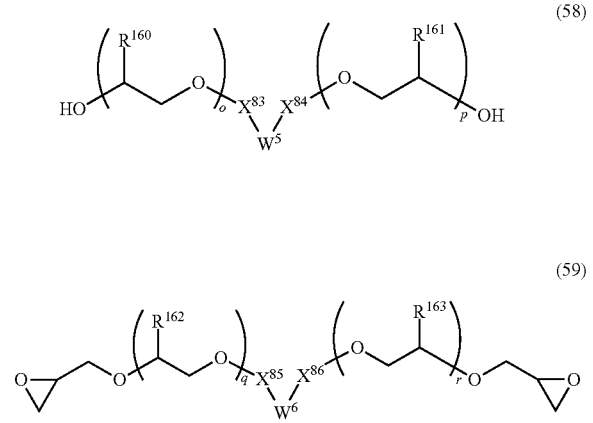

(58)

(59)

In general formulae (58) and (59), $X^{83}$ to $X^{86}$ are each independently a monocyclic or fused polycyclic aromatic hydrocarbon ring, and $W^5$ and $W^6$ are each independently an organic group having two or more aromatic groups. $R^{166}$ to $R^{163}$ are each independently a hydrogen atom or an alkyl group containing 1 to 6 carbon atoms. Furthermore, o, p, q, and r are each independently an integer of 0 to 10. In general formula (58) to (59), it is preferable that $X^{83}$ to $X^{86}$ are each independently a monocyclic or fused polycyclic tetravalent to decavalent aromatic hydrocarbon ring containing 6 to 15 carbon atoms, more preferably a monocyclic or fused polycyclic tetravalent to decavalent aromatic hydrocarbon ring containing 6 to 10 carbon atoms. Furthermore, it is preferable that $W^5$ and $W^6$ are each independently a substituent group as represented by any of general formulae (51) to (56) given above. It is preferable that $R^{166}$ to $R^{163}$ are each independently a hydrogen atom or an alkyl group containing 1 to 4 carbon atoms. The aforementioned monocyclic or fused polycyclic aromatic hydrocarbon ring may each contain a heteroatom and may each be a substitution product or a non-substitution product.

[Chemical formula 25]

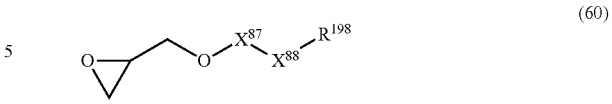

(60)

In general formula (60), $X^{87}$ is a direct bond, an alkylene chain containing 1 to 10 carbon atoms, a cycloalkylene chain containing 4 to 10 carbon atoms, or an arylene chain containing 6 to 15 carbon atoms. When $X^{87}$ is a direct bond or an arylene chain containing 6 to 15 carbon atoms, $X^{88}$ is a direct bond. When $X^{87}$ is an alkylene chain containing 1 to 10 carbon atoms or a cycloalkylene chain containing 4 to 10 carbon atoms, $X^{88}$ is a direct bond or an arylene chain containing 6 to 15 carbon atoms. $R^{198}$ is a vinyl group, an aryl group, or a (meth)acrylic group. In general formula (60), $X^{87}$ is preferably a direct bond, an alkylene chain containing 1 to 6 carbon atoms, a cycloalkylene chain containing 4 to 7 carbon atoms, or an arylene chain containing 6 to 10 carbon atoms. Furthermore, $X^{88}$ is preferably a direct bond or an arylene chain containing 6 to 10 carbon atoms. The above alkylene chain, cycloalkylene chain, arylene group, vinyl group, aryl group, and (meth)acrylic group may each have a heteroatom and may each be either a substitution product or a non-substitution product.

Examples of the compound as represented by general formula (58) that contains two or more aromatic groups and a hydroxyl group in the molecule include 9,9-bis[4-(2-hydroxyethoxy)phenyl] fluorene, 9,9-bis[4-(3-hydroxypropoxy)phenyl] fluorene, 9,9-bis[4-(2-hydroxyethoxy)-3-methylphenyl] fluorene, 9,9-bis[4-(2-hydroxyethoxy)-3,5-dimethylphenyl] fluorene, 9,9-bis(4-hydroxyphenyl) fluorene, 9,9-bis(4-hydroxy-3-methylphenyl) fluorene, 9,9-bis(4-hydroxy-3,5-dimethylphenyl) fluorene, 1,1-bis(4-hydroxyphenyl)-1,1-diphenyl methane, 1,1-bis(4-hydroxyphenyl)-3-phenyl-2,3-dihydroindene, 1,1-bis(4-hydroxyphenyl)-1,3-diphenyl propane, 1,1-bis(4-hydroxyphenyl)-2,4-diphenyl cyclopentane, 2,2-bis(4-hydroxyphenyl)-2,3-dihydroindene, and 3,3-bis(4-hydroxyphenyl)-2,5-diphenyl pentane.

Examples of the compound as represented by general formula (59) that contains two or more aromatic groups and an epoxy group in the molecule include 9,9-bis[4-(2-glycidoxyethoxy)phenyl] fluorene, 9,9-bis[4-(3-glycidoxypropoxy)phenyl] fluorene, 9,9-bis[4-(2-glycidoxyethoxy)-3-methylphenyl] fluorene, 9,9-bis[4-(2-glycidoxyethoxy)-3,5-dimethylphenyl] fluorene, 9,9-bis(4-glycidoxyphenyl) fluorene, 9,9-bis(4-glycidoxy-3-methylphenyl) fluorene, 9,9-bis(4-glycidoxy-3,5-dimethylphenyl) fluorene, 1,1-bis(4-glycidoxyphenyl)-1,1-diphenyl methane, 1,1-bis(4-glycidoxyphenyl)-3-phenyl-2,3-dihydroindene, 1,1-bis(4-glycidoxyphenyl)-1,3-diphenyl propane, 1,1-bis(4-glycidoxyphenyl)-2,4-diphenyl too cyclopentane, 2,2-bis(4-glycidoxyphenyl)-2,3-dihydroindene, and 3,3-bis(4-glycidoxyphenyl)-2,5-diphenyl pentane, as well as OGSOL (registered trademark) PG, PG-100, EG, EG-200, and EG-210 (all manufactured by Osaka Gas Chemicals Co., Ltd.).

Examples of the unsaturated compound as represented by general formula (60) that contains an ethylenically unsaturated double bond group and an epoxy group include glycidyl (meth)acrylate, (α-ethyl)glycidyl (meth)acrylate, (α-n-propyl)glycidyl (meth)acrylate, (3,4-epoxy)heptyl (meth)acrylate, glycidyl 2-vinylacetate, glycidyl 4-vinylcyclohexane carboxylate, glycidyl 4-vinylbenzoate, allylglycidyl ether, vinylglycidyl ether, 4-vinylbenzylglycidyl ether, α-methyl-4-vinylbenzylglycidyl ether, 2,4-bis (glycidyloxymethyl) styrene, and 2,4,6-tris-(glycidyloxymethyl styrene).

Examples of the unsaturated carboxylic acid that contains an ethylenically unsaturated double bond group include (meth)acrylic acid, itaconic acid, maleic acid, fumaric acid, mono(2-acryloxyethyl) succinate, mono(2-acryloxyethyl) phthalate, mono(2-acryloxyethyl) tetrahydrophthalate, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, 4-vinylbenzoic acid, 4-hydroxyphenyl (meth)acrylate, and 2-hydroxyphenyl (meth)acrylate.

Examples of the tetracarboxylic acid, tetracarboxylic acid dianhydride, tricarboxylic acid, tricarboxylic acid anhydride, dicarboxylic acid, dicarboxylic acid anhydride, dicarboxylic acid dichloride, dicarboxylic acid active diester, monocarboxylic acid, monocarboxylic acid chloride, and monocarboxylic acid active ester include the aforementioned compounds such as tetracarboxylic acids and/or derivatives thereof, tricarboxylic acids and/or derivatives thereof, dicarboxylic acids and/or derivatives thereof, monocarboxylic acids, monocarboxylic acid chlorides, or monocarboxylic acid active esters.

Examples of catalysts used for the ring-opening addition reactions of the compound as represented by general formula (59) that contains two or more aromatic groups and an epoxy group in the molecule, the unsaturated compound as represented by general formula (60) that contains an ethylenically unsaturated double bond group and an epoxy group, or the unsaturated carboxylic acid that contains an ethylenically unsaturated double bond group include amine based catalysts such as triethyl amine, dimethyl aniline, tetramethylethylene diamine, 2,4,6-tris-(dimethylaminomethyl) phenol, dimethylbenzyl amine, and tri-n-octyl-7-amine; quaternary ammonium salts such as tetramethyl ammonium chloride, tetramethyl ammonium bromide, an tetramethyl ammonium fluoride; alkyl ureas such as tetramethyl urea; alkyl guanidines such as tetramethyl guanidine; tin based catalysts such as tin(II) bis(2-ethylhexanoate) and di-n-butyltin(IV) dilaurate; titanium based catalysts such as titanium(IV) tetrakis(2-ethylhexanoate); phosphorus based catalysts such as triphenyl phosphine and triphenyl phosphine oxide; chromium based catalysts such as tris(acetylacetonato)chromium(III), chromium(III) chloride, chromium(III) octenoate, and chromium(III) naphthenate; and cobalt based catalysts such as cobalt(II) octenoate.

<Structural Units Derived from One or More Selected from Tetracarboxylic Acid Having Fluorine Atom, Tetracarboxylic Acid Dianhydride Having Fluorine Atom, Tricarboxylic Acid Having Fluorine Atom, and Dicarboxylic Acid Having Fluorine Atom>

The polycyclic side chain-containing aromatic resin (A2c-1) used for the present invention preferably contains a structural unit derived from one or more selected from the group consisting of tetracarboxylic acid having a fluorine atom, tetracarboxylic acid dianhydride having a fluorine atom, tricarboxylic acid having a fluorine atom, and dicarboxylic acid having a fluorine atom. If the polycyclic side chain-containing aromatic resin (A2c-1) used for the present invention contains a structural unit derived from one or more selected from the group consisting of tetracarboxylic acid having a fluorine atom, tetracarboxylic acid dianhydride having a fluorine atom, tricarboxylic acid having a fluorine atom, and dicarboxylic acid having a fluorine atom, it ensures an improved transparency and an improved sensitivity in the light exposure step. It also works to allow the film surface to have water repellency and depress the infiltration through the film surface in the alkali development step.

Examples of the tetracarboxylic acid having a fluorine atom, tetracarboxylic acid dianhydride having a fluorine atom, tricarboxylic acid having a fluorine atom, and dicarboxylic acid having a fluorine atom include the aforementioned compounds such as tetracarboxylic acid having a fluorine atom, tetracarboxylic acid derivative having a fluorine atom, dicarboxylic acid having a fluorine atom, and dicarboxylic acid derivative having a fluorine atom.

In the polycyclic side chain-containing aromatic resin (A2c-1), those structural units derived from one or more selected from the group consisting of tetracarboxylic acid having a fluorine atom, tetracarboxylic acid dianhydride having a fluorine atom, tricarboxylic acid having a fluorine atom, and dicarboxylic acid having a fluorine atom preferably account for 30 to 100 mol %, more preferably 50 to 100 mol %, and still more preferably 70 to 100 mol %, of all structural units derived from a tetracarboxylic acid, a dicarboxylic acid, or a derivative thereof. A content in the above range ensures improved sensitivity in the light exposure step.

<Structural Units Derived from One or More Selected from Tetracarboxylic Acid Having Aromatic Group, Tetracarboxylic Acid Dianhydride Having Aromatic Group, Tricarboxylic Acid Having Aromatic Group, and Dicarboxylic Acid Having Aromatic Group>

The polycyclic side chain-containing aromatic resin (A2c-1) used for the present invention preferably contains a structural unit derived from one or more selected from the group consisting of tetracarboxylic acid having an aromatic group, tetracarboxylic acid dianhydride having an aromatic group, tricarboxylic acid having an aromatic group, and dicarboxylic acid having an aromatic group. If the polycyclic side chain-containing aromatic resin (A2c-1) used for the present invention contains a structural unit derived from one or more selected from the group consisting of tetracarboxylic acid having an aromatic group, tetracarboxylic acid dianhydride having an aromatic group, tricarboxylic acid having an aromatic group, and dicarboxylic acid having an aromatic group, the heat resistance of the aromatic group serves to produce a cured film with an improved heat resistance.

If a pigment (D1) in particular is added as the coloring agent (D) which will be described later, and if in that case the polycyclic side chain-containing aromatic resin contains a structural unit derived from a copolymerization component having an aromatic group, the steric hindrance of the aromatic group serves to improve the dispersion stability of the pigment (D1). If the pigment (D1) is an organic pigment (D1-2), the aromatic group in the polycyclic side chain-containing aromatic resin interacts with the aromatic group in the organic pigment (D1-2), thereby serving to improve the dispersion stability of the organic pigment (D1-2).

Examples of the tetracarboxylic acid having an aromatic group, tetracarboxylic acid dianhydride having an aromatic group, tricarboxylic acid having an aromatic group, and dicarboxylic acid having an aromatic group include the aforementioned compounds such as aromatic tetracarboxylic acids and/or derivatives thereof, aromatic tricarboxylic acids and/or derivatives thereof, and aromatic dicarboxylic acids and/or derivatives thereof.

In the polycyclic side chain-containing aromatic resin (A2c-1), those structural units derived from one or more selected from the group consisting of tetracarboxylic acid having an aromatic group, tetracarboxylic acid dianhydride having an aromatic group, tricarboxylic acid having an aromatic group, and dicarboxylic acid having an aromatic group preferably account for 10 to 100 mol %, more preferably 20 to 100 mol %, and still more preferably 30 to 100 mol %, of all structural units derived from a tetracarboxylic acid, a dicarboxylic acid, or a derivative thereof. A content in the above range ensures the production of a cured film having an improved heat resistance.

<Structural Units Derived from One or More Selected from Tetracarboxylic Acid Having Alicyclic Group, Tetracarboxylic Acid Dianhydride Having Alicyclic Group, Tricarboxylic Acid Having Alicyclic Group, and Dicarboxylic Acid Having Alicyclic Group>

The polycyclic side chain-containing aromatic resin (A2c-1) used for the present invention preferably contains a structural unit derived from one or more selected from the group consisting of tetracarboxylic acid having an alicyclic group, tetracarboxylic acid dianhydride having an alicyclic group, tricarboxylic acid having an alicyclic group, and dicarboxylic acid having an alicyclic group. If the polycyclic side chain-containing aromatic resin (A2c-1) used for the present invention contains a structural unit derived from one or more selected from the group consisting of tetracarboxylic acid having an alicyclic group, tetracarboxylic acid dianhydride having an alicyclic group, tricarboxylic acid having an alicyclic group, and dicarboxylic acid having an alicyclic group, the heat resistance and transparency of the alicyclic group serves to produce a cured film with an improved heat resistance and an improved transparency.

Examples of the tetracarboxylic acid having an alicyclic group, tetracarboxylic acid dianhydride having an alicyclic group, tricarboxylic acid having an alicyclic group, and dicarboxylic acid having an alicyclic group include the aforementioned compounds such as alicyclic tetracarboxylic acids and/or derivatives thereof, alicyclic tricarboxylic acids and/or derivatives thereof, and alicyclic dicarboxylic acids and/or derivatives thereof.

In the polycyclic side chain-containing aromatic resin (A2c-1), those structural units derived from one or more selected from the group consisting of tetracarboxylic acid having a alicyclic group, tetracarboxylic acid dianhydride having a alicyclic group, tricarboxylic acid having a alicyclic group, and dicarboxylic acid having an alicyclic group preferably account for 5 mol % or more, more preferably 10 mol % or more, still more preferably 15 mol % or more, of all structural units derived from a tetracarboxylic acid, a dicarboxylic acid, or a derivative thereof. A content in the above range ensures the production of a cured film having an improved heat resistance and an improved transparency. On the other hand, the content is preferably 90 mol % or less, more preferably 85 mol % or less, and still more preferably 75 mol % or less. A content in the above range ensures the production of a cured film having improved mechanical characteristics.

<Acidic Group Derived from Tetracarboxylic Acid, Tetracarboxylic Acid Dianhydride, Tricarboxylic Acid, Tricarboxylic Acid Anhydride, or Dicarboxylic Acid Dianhydride>

The polycyclic side chain-containing aromatic resin (A2c-1) used for the present invention contains a structural unit derived from a tetracarboxylic acid, tetracarboxylic acid dianhydride, tricarboxylic acid, tricarboxylic acid anhydride, or dicarboxylic acid dianhydride, and it is preferable that the polycyclic side chain-containing aromatic resin (A2c-1) has an acidic group. If the polycyclic side chain-containing aromatic resin contains an acidic group, it ensures an improved pattern processability in an alkaline developer and an improved resolution after the development step.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, and hydroxyimide group. From the viewpoint of ensuring an improved pattern processability in an alkaline developer and an improved resolution after the development step, the carboxylic group, carboxylic acid anhydride group, and phenolic hydroxyl group are preferable, and the carboxyl group and carboxylic acid anhydride group are more preferable.

Examples of the tetracarboxylic acid, tetracarboxylic acid dianhydride, tricarboxylic acid, tricarboxylic acid anhydride, and dicarboxylic acid dianhydride include the compounds described above.

The contents of structural units derived from various monomer components in a polycyclic side chain-containing aromatic resin can be determined by a combination of methods such as $^1$H-NMR, $^{13}$C-NMR, $^{29}$Si-NMR, IR, TOF-MS, elementary analysis, and ash content measurement.

<Properties of Polycyclic Side Chain-Containing Aromatic Resin>

The polycyclic side chain-containing aromatic resin (A2c-1) used for the present invention preferably has a polystyrene based Mw of 500 or more, more preferably 1,000 or more, and still more preferably 1,500 or more, as determined by GPC. A Mw in the above range ensures an improved resolution after the development step. On the other hand, the Mw is preferably 100,000 or less, more preferably 50,000 or less, and still more preferably 20,000 or less. A Mw in the above range ensures an improved leveling property in the coating step and an improved pattern processability in an alkaline developer.

<Acrylic Resin>

The negative type photosensitive resin composition according to the present invention may contain an acrylic resin (A2c-2) as a component of the unsaturated group-containing resin (A2). The acrylic resin (A2c-2) is a common acrylic resin as described below.

Examples of the acrylic resin (A2c-2) used for the present invention include acrylic resins obtainable through radical copolymerization of one or more copolymerization components selected from the group consisting of copolymerization components having acidic groups, copolymerization components derived from (meth)acrylic esters, and other copolymerization components.

The acrylic resin (A2c-2) used for the present invention has an ethylenically unsaturated double bond group. For the acrylic resin, ethylenically unsaturated double bond groups can be introduced easily into side chains branched from the backbone chain of the resin. An acrylic resin having an ethylenically unsaturated double bond group is a photocuring resin which develops a three dimensional crosslinked structure through carbon-carbon bonds when cured by UV exposure. Accordingly, a resin composition that contains an acrylic resin having an ethylenically unsaturated double bond group in side chains shows an improved sensitivity in the light exposure step. Furthermore, the three dimensional crosslinked structure formed has an alicyclic structure or an aliphatic structure as primary component and accordingly, the softening point of the resin is prevented from rising, allowing a small-tapered pattern shape to be formed and enabling the production of a cured film with improved mechanical characteristics. Therefore, such a cured film is suited to applications that require good mechanical characteristics.

From the viewpoint of ensuring an improved sensitivity in the light exposure step and a cured film with improved mechanical characteristics, it is preferable for the acrylic resin (A2c-2) used for the present invention to contain a structural unit as represented by general formula (61) and/or a structural unit as represented by general formula (62).

[Chemical formula 26]

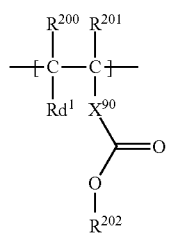

(61)

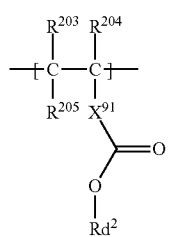

(62)

In general formulas (61) and (62), $Rd^1$ and $Rd^2$ are each independently an alkyl group containing 1 to 10 carbon atoms, a cycloalkyl group containing 4 to 15 carbon atoms, or an aryl group containing 6 to 15 carbon atoms, each also containing an ethylenically unsaturated double bond group. $R^{200}$ to $R^{205}$ are each independently a hydrogen atom, an alkyl group having 1 to 10 carbon atoms, a cycloalkyl group having 4 to 10 carbon atoms, or an aryl group having 6 to 15 carbon atoms. $X^{90}$ and $X^{91}$ are each independently a direct bond, an alkylene chain containing 1 to 10 carbon atoms, a cycloalkylene chain containing 4 to 10 carbon atoms, or an arylene chain containing 6 to 15 carbon atoms. In general formulas (61) and (62), it is preferable that $Rd^1$ and $Rd^2$ are each independently an alkyl group containing 1 to 6 carbon atoms, a cycloalkyl group containing 4 to 10 carbon atoms, or an aryl group containing 6 to 10 carbon atoms, each also containing an ethylenically unsaturated double bond group. Furthermore, it is preferable that $R^{200}$ to $R^{205}$ are each independently a hydrogen atom, an alkyl group having 1 to 6 carbon atoms, a cycloalkyl group having 4 to 7 carbon atoms, or an aryl group having 6 to 10 carbon atoms. It is also preferable that $X^{90}$ and $X^{91}$ are each independently a direct bond, an alkylene chain containing 1 to 6 carbon atoms, an cycloalkylene chain containing 4 to 7 carbon atoms, or an arylene chain containing 6 to 10 carbon atoms. The above alkyl group, cycloalkyl group, aryl group, alkylene chain, cycloalkylene chain, and arylene chain may each contain a heteroatom and may each be either a substitution product or a non-substitution product.

The acrylic resin (A2c-2) used for the present invention is preferably an acrylic resin (A2c-2) obtainable through a radical copolymerization of a copolymerization component having an acidic group or other copolymerization components. Such other copolymerization components are each preferably a copolymerization component having an aromatic group or a copolymerization component having an alicyclic group.

<Structural Unit Derived from Copolymerization Component Having Acidic Group>

The acrylic resin (A2c-2) used for the present invention contains a structural unit derived from a copolymerization component having an acidic group and it is preferable that the acrylic resin has an acidic group. If the acrylic resin contains an acidic group, it ensures an improved pattern processability in an alkaline developer and an improved resolution after the development step.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, and hydroxyimide group. From the viewpoint of ensuring an improved pattern processability in an alkaline developer and an improved resolution after the development step, the carboxylic group, carboxylic acid anhydride group, and phenolic hydroxyl group are preferable, and the carboxyl group and carboxylic acid anhydride group are more preferable.

Examples of the copolymerization component having an acidic group include (meth)acrylic acid, (meth)acrylic acid anhydride, itaconic acid, itaconic acid anhydride, maleic acid, fumaric acid, mono(2-acryloxyethyl) succinate, mono (2-acryloxyethyl) phthalate, mono(2-acryloxyethyl) tetrahydrophthalate, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, 4-vinylbenzoic acid, 4-hydroxyphenyl (meth)acrylate, and 2-hydroxyphenyl (meth)acrylate. From the viewpoint of ensuring an improved pattern processability in an alkaline developer and an improved resolution after the development step, (meth)acrylic acid, (meth)acrylic acid anhydride, itaconic acid, itaconic acid anhydride, maleic acid, fumaric acid, mono(2-acryloxyethyl) succinate, mono (2-acryloxyethyl) phthalate, and mono(2-acryloxyethyl) tetrahydrophthalate are preferable, and (meth)acrylic acid, (meth)acrylic acid anhydride, itaconic acid, itaconic acid anhydride, maleic acid, fumaric acid, and mono(2-acryloxyethyl) succinate are more preferable.

The acrylic resin (A2c-2) used for the present invention preferably has an acid equivalent of 280 g/mol or more, more preferably 300 g/mol or more, and still more preferably 400 g/mol or more. An acid equivalent of 280 g/mol or more ensures a decreased film loss in the alkali development step. On the other hand, the acid equivalent is preferably 1,400 g/mol or less, more preferably 1,100 g/mol or less, and still more preferably 950 g/mol or less. An acid equivalent of 1,400 g/mol or less ensures an improved pattern processability in an alkali developer and an improved resolution after the development step. From the viewpoint of ensuring an improved pattern processability in an alkaline developer and an improved resolution after the development step, the acid equivalent is preferably the carboxylic acid equivalent.

Regarding the acrylic resin (A2c-2) used for the present invention, it is preferable for the acrylic resin not to have an epoxy group when the acrylic resin has a carboxyl group. If the acrylic resin has both a carboxyl group and an epoxy group, the carboxyl group and the epoxy group can react with each other during storage of a coating liquid prepared from the resin composition. Therefore, the coating liquid prepared from the resin composition will have a decrease storage stability. A preferable example of such an acrylic resin that has no epoxy group is one produced through a radical copolymerization of a copolymerization component that has a carboxyl group or a carboxylic acid anhydride group and another copolymerization component that has no epoxy group.

<Structural Unit Derived from Copolymerization Component Having Aromatic Group>

The acrylic resin (A2c-2) used for the present invention preferably contains a structural unit derived from a copolymerization component having an aromatic group. If the acrylic resin contains a structural unit derived from a copolymerization component having an aromatic group, the heat resistance of the aromatic group serves to produce a cured film with an improved heat resistance.

If a pigment (D1) in particular is added as the coloring agent (D) which will be described later, and if in that case the acrylic resin contains a structural unit derived from a copolymerization component having an aromatic group, the steric hindrance of the aromatic group serves to improve the dispersion stability of the pigment (D1). If the pigment (D1) is an organic pigment (D1-2), the aromatic group in the acrylic resin interacts with the aromatic group in the organic pigment (D1-2), thereby serving to improve the dispersion stability of the organic pigment (D1-2).

Examples of the copolymerization component having an aromatic group include mono(2-acryloxyethyl) phthalate, 4-hydroxyphenyl (meth)acrylate, 2-hydroxyphenyl (meth)acrylate, phenyl (meth)acrylate, 4-tolyl (meth)acrylate, 4-styryl (meth)acrylate, 1-naphthyl (meth)acrylate, 2-naphthyl (meth)acrylate, 4-biphenyl (meth)acrylate, benzyl (meth)acrylate, phenylethyl (meth)acrylate, styrene, 4-methylstyrene, 2-methylstyrene, 3-methylstyrene, and α-methylstyrene. From the viewpoint of producing a cured film with an improved heat resistance, mono(2-acryloxyethyl) phthalate, 4-hydroxyphenyl (meth)acrylate, 2-hydroxyphenyl (meth)acrylate, phenyl (meth)acrylate, 4-tolyl (meth)acrylate, 4-styryl (meth)acrylate, 1-naphthyl (meth)acrylate, 2-naphthyl (meth)acrylate, 4-biphenyl (meth)acrylate, styrene, 4-methylstyrene, 2-methylstyrene, 3-methylstyrene, and α-methylstyrene are preferable, and 1-naphthyl (meth)acrylate, 2-naphthyl (meth)acrylate, and styrene are more preferable.

In the acrylic resin, the structural units derived from copolymerization components having aromatic groups preferably account for 10 mol % or more, more preferably 20 mol % or more, and still more preferably 30 mol % or more, of all structural units derived from copolymerization components. A content in the above range ensures the production of a cured film having an improved heat resistance. On the other hand, it is preferable for the structural units derived from copolymerization components containing aromatic groups to account for 80 mol % or less, more preferably 75 mol % or less, and still more preferably 70 mol % or less. A content in the above range ensures improved sensitivity in the light exposure step.

<Structural Unit Derived from Copolymerization Component Containing Alicyclic Group>

The acrylic resin (A2c-2) used for the present invention preferably contains a structural unit derived from a copolymerization component having an alicyclic group. If the acrylic resin contains a structural unit derived from a copolymerization component having an alicyclic group, the heat resistance and transparency of the alicyclic group serves to produce a cured film with an improved heat resistance and an improved transparency.

Examples of the copolymerization component having an alicyclic group include mono(2-acryloxyethyl) tetrahydrophthalate, cyclopentyl (meth)acrylate, cyclohexyl (meth)acrylate, cyclohexenyl (meth)acrylate, (4-methoxy)cyclohexyl (meth)acrylate, (2-isopropyloxycarbonyl)ethyl (meth)acrylate, (2-cyclopentyloxycarbonyl)ethyl (meth)acrylate, (2-cyclohexyloxycarbonyl)ethyl (meth)acrylate, (2-cyclohexenyloxycarbonyl)ethyl (meth)acrylate, [2-(4-methoxycyclohexyl)oxycarbonyl]ethyl (meth)acrylate, 2-norbornyl (meth)acrylate, isobornyl (meth)acrylate, tricyclodecanyl (meth)acrylate, tetracyclodecanyl (meth)acrylate, dicyclopentenyl (meth)acrylate, adamanthyl (meth)acrylate, adamanthylmethyl (meth)acrylate, and [(1-methyl) adamanthyl] (meth)acrylate. From the viewpoint of ensuring the production of a cured film with an improved heat resistance and improved transparency, 2-norbornyl (meth)acrylate, isobornyl (meth)acrylate, tricyclodecanyl (meth)acrylate, tetracyclodecanyl (meth)acrylate, dicyclopentenyl (meth)acrylate, adamanthyl (meth)acrylate, adamanthylmethyl (meth)acrylate, and [(1-methyl) adamanthyl] (meth)acrylate are preferable.

In the acrylic resin, the structural units derived from copolymerization components having alicyclic groups preferably account for 5 mol % or more, more preferably 10 mol % or more, and still more preferably 15 mol % or more, of all structural units derived from copolymerization components. A content in the above range ensures the production of a cured film having an improved heat resistance and an improved transparency. On the other hand, it is preferable for the structural units derived from copolymerization components containing alicyclic groups to account for 90 mol % or less, more preferably 85 mol % or less, and still more preferably 75 mol % or less. A content in the above range ensures the production of a cured film having improved mechanical characteristics.

<Structural Unit Derived from Copolymerization Component Containing Fluorine Atom>

The acrylic resin (A2c-2) used for the present invention preferably contains a structural unit derived from a copolymerization component having an fluorine atom. The use of an acrylic resin containing a structural unit derived from a copolymerization component having a fluorine atom ensures an improved transparency and an improved sensitivity in the light exposure step. It also works to allow the film surface to have water repellency and depress the infiltration through the film surface in the alkali development step.

Examples of the copolymerization component containing a fluorine atom include trifluoromethyl (meth)acrylate, (2,2, 2-trifluoro)ethyl (meth)acrylate, (3,3,3-trifluoro)propyl (meth)acrylate, trifluoromethoxypropyl (meth)acrylate, (6,6, 6,5,5,4,4,3,3-nonafluoro)-n-hexyl (meth)acrylate, (1,2,3,4, 5-pentafluoro)phenyl (meth)acrylate, and 3-(1,2,3,4,5-pentafluorophenyl)propyl (meth)acrylate.

In the acrylic resin, the structural units derived from copolymerization components having fluorine atoms preferably account for 5 mol % or more, more preferably 10 mol % or more, and still more preferably 15 mol % or more, of all structural units derived from copolymerization components. A content in the above range ensures improved sensitivity in the light exposure step. On the other hand, it is preferable for the structural units derived from copolymerization components having fluorine atoms to account for 60 mol % or less, more preferably 50 mol % or less, and still more preferably 40 mol % or less. A content in the above range ensures the production of a cured film having improved mechanical characteristics.

The acrylic resin (A2c-2) used for the present invention is preferably a resin obtainable through a ring-opening addition reaction of an acrylic resin (A2c-2) obtainable through a radical copolymerization of a copolymerization component having an acidic group or other copolymerization components with an unsaturated compound as represented by general formula (60) that contains an ethylenically unsaturated double bond group and an epoxy group. Features of general formula (60) are described above.

Examples of catalysts used for the ring-opening addition reaction of the unsaturated compound as represented by general formula (60) that contains an ethylenically unsaturated double bond group and an epoxy group include amine based catalysts such as triethyl amine, dimethyl aniline, tetramethylethylene diamine, 2,4,6-tris-(dimethylaminomethyl) phenol, dimethylbenzyl amine, and tri-n-octyl-7-amine; quaternary ammonium salts such as tetramethyl ammonium chloride, tetramethyl ammonium bromide, an tetramethyl ammonium fluoride; alkyl ureas such as tetramethyl urea; alkyl guanidines such as tetramethyl guanidine; tin based catalysts such as tin(II) bis(2-ethylhexanoate) and di-n-butyltin(IV) dilaurate; titanium based catalysts such as titanium(IV) tetrakis(2-ethylhexanoate); phosphorus based catalysts such as triphenyl phosphine and triphenyl phosphine oxide; chromium based catalysts such as tris(acetylacetonato)chromium(III), chromium(III) chloride, chromium(III) octenoate, and chromium(III) naphthenate; and cobalt based catalysts such as cobalt(II) octenoate.

The contents of structural units derived from various copolymerization components in an acrylic resin can be determined by a combination of methods such as $^1$H-NMR, $^{13}$C-NMR, $^{29}$Si-NMR, IR, TOF-MS, elementary analysis, and ash content measurement.

<Properties of Acrylic Resin>

The acrylic resin (A2-3) used for the present invention preferably has a double bond equivalent of 150 g/mol or more, more preferably 200 g/mol or more, and still more preferably 250 g/mol or more. A double bond equivalent of 150 g/mol or more ensures improved adhesion to the underlying substrate. On the other hand, the double bond equivalent is preferably 10,000 g/mol or less, more preferably 5,000 g/mol or less, and still more preferably 2,000 g/mol or less. A double bond equivalent of 10,000 g/mol or less ensures improved sensitivity in the light exposure step.

The acrylic resin used for the present invention preferably has a polystyrene based Mw of 1,000 or more, more preferably 3,000 or more, and still more preferably 5,000 or more, as determined by GPC. A Mw in the above range ensures an improved resolution after the development step. On the other hand, the Mw is preferably 100,000 or less, more preferably 70,000 or less, and still more preferably 50,000 or less. A Mw in the above range ensures an improved leveling property in the coating step and an improved pattern processability in an alkaline developer.

The acrylic resin (A2c-2) can be synthesized by a generally known method. For example, a good method is to perform radical copolymerization of copolymerization components in air or nitrogen in the presence of a radical polymerization initiator. As a process for such radical copolymerization, a reaction container is placed in air or sufficiently purged with nitrogen by bubbling, reduced pressure deaeration, etc., and then copolymerization components and a radical polymerization initiator are added to a reaction solvent, followed by continuing the reaction at 60° C. to 110° C. for 30 to 500 minutes. In addition, a chain transfer agent such as thiol compounds and/or a polymerization terminator such as phenol compounds may be used as required.

<Carboxylic Acid-Modified Epoxy Resin>

The negative type photosensitive resin composition according to the present invention may contain an carboxylic acid-modified epoxy resin (A2c-3) as a component of the unsaturated group-containing resin (A2). The carboxylic acid-modified epoxy resin (A2c-3) is a common carboxylic acid-modified epoxy resin as described below.

Examples of the carboxylic acid-modified epoxy resin (A2c-3) used for the present invention include (I) a carboxylic acid-modified epoxy resin produced by reacting a phenol compound, a carboxylic acid anhydride, and an epoxy compound, (II) a carboxylic acid-modified epoxy resin produced by reacting an alcohol compound, a carboxylic acid anhydride, and an epoxy compound, (III) a carboxylic acid-modified epoxy resin produced by reacting an epoxy compound, a carboxylic acid compound, and an epoxy compound, and (IV) a carboxylic acid-modified epoxy resin produced by reacting an epoxy compound, a carboxylic acid compound, and a carboxylic acid anhydride.

The carboxylic acid-modified epoxy resin (A2c-3) is a thermosetting resin and its epoxy resin backbone, which forms the skeleton, has a highly heat resistant aromatic ring structure. Accordingly, the incorporation of a carboxylic acid-modified epoxy resin in the resin composition ensures the production of a cured film with an improved heat resistance. Therefore, such a cured film is suited to applications that require heat resistance.

The carboxylic acid-modified epoxy resin (A2c-3) used for the present invention has an ethylenically unsaturated double bond group. For the carboxylic acid-modified epoxy resin (A2c-3), ethylenically unsaturated double bond groups can be introduced easily into side chains branched from the backbone chain of the resin. Having an ethylenically unsaturated double bond group, the carboxylic acid-modified epoxy resin is a photo-curing resin which develops a three dimensional crosslinked structure of carbon-carbon bonds when cured by UV exposure. Accordingly, a resin composition that contains a carboxylic acid-modified epoxy resin having an ethylenically unsaturated double bond group in side chains shows an improved sensitivity in the light exposure step. Furthermore, the three dimensional crosslinked structure formed has an alicyclic structure or an aliphatic structure as primary component and accordingly, the softening point of the resin is prevented from rising, allowing a small-tapered pattern shape to be formed and enabling the production of a cured film with improved mechanical characteristics. Therefore, such a cured film is suited to applications that require good mechanical characteristics.

The carboxylic acid-modified epoxy resin (A2c-3) used for the present invention has a carboxyl group and/or a carboxylic acid anhydride group to act as alkali-soluble groups. The existence of a carboxyl group and/or a carboxylic acid anhydride group ensures an improved resolution after the development step.

From the viewpoint of producing a cured film with an improved heat resistance, the carboxylic acid-modified epoxy resin (A2c-3) used for the present invention preferably contains one or more selected from the group consisting of a structural unit as represented by general formula (26), a structural unit as represented by general formula (27), a structural unit as represented by general formula (28), a structural unit as represented by general formula (29), a structural unit as represented by general formula (32), a structural unit as represented by general formula (33), and a structural unit as represented by general formula (34). Furthermore, the carboxylic acid-modified epoxy resin (A2c-3) used for the present invention has an ethylenically unsaturated double bond group, and from the viewpoint of ensuring an improved sensitivity in the light exposure step and producing a cured film with improved mechanical characteristics, it is preferable for an ethylenically unsaturated double bond group to be contained at one or more positions selected from the backbone chain, side chain, and chain end.

[Chemical formula 27]

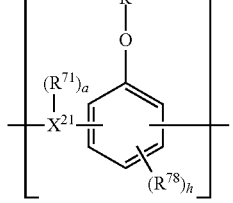
(26)

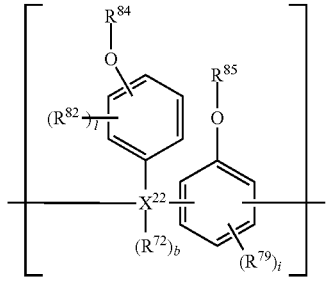
(27)

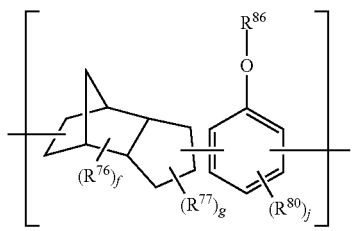
(28)

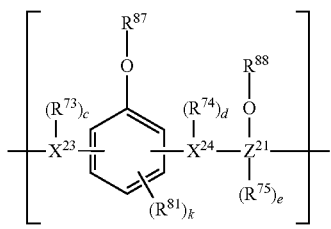
(29)

In general formulae (26) to (29), $X^{21}$ to $X^{24}$ are each independently an aliphatic structure containing 1 to 6 carbon atoms. $Z^{21}$ is a tetravalent to decavalent fused polycyclic aromatic hydrocarbon ring containing 10 to 15 carbon atoms. $R^{71}$ to $R^{75}$ are each independently an alkyl group containing 1 to 10 carbon atoms, a cycloalkyl group containing 4 to 10 carbon atoms, or an aryl group containing 6 to 15 carbon atoms; $R^{76}$ and $R^{77}$ are each independently an alkyl group containing 1 to 10 carbon atoms; $R^{78}$ to $R^{82}$ are each independently a halogen, an alkyl group containing 1 to 10 carbon atoms, a cycloalkyl group containing 4 to 10 carbon atoms, or an aryl group containing 6 to 15 carbon atoms; and $R^{83}$ to $R^{88}$ are each independently a substituent group as represented by general formula (30). Furthermore, a, b, c, d, and e are each independently an integer of 0 to 10; f is an integer of 0 to 8, g is an integer of 0 to 6; h, i, j, and k are each independently an integer of 0 to 3; and l is an integer of 0 to 4. In general formulae (26) to (29), it is preferable that $X^{21}$ to $X^{24}$ are each independently an aliphatic structure containing 1 to 4 carbon atoms. It is preferable that $R^{71}$ to $R^{75}$ are each independently an alkyl group containing 1 to 6 carbon atoms, a cycloalkyl group containing 4 to 7 carbon atoms, or an aryl group containing 6 to 10 carbon atoms; it is preferable that $R^{76}$ and $R^{77}$ are each independently an alkyl group containing 1 to 6 carbon atoms; and it is preferable that $R^{78}$ to $R^{82}$ are each independently a halogen, an alkyl group containing 1 to 6 carbon atoms, a cycloalkyl group containing 4 to 7 carbon atoms, or an aryl group containing 6 to 10 carbon atoms. The above alkyl group, cycloalkyl group, aryl group, aliphatic structure, and fused polycyclic aromatic hydrocarbon ring may each have a heteroatom, and may each be either a substitution product or a non-substitution product.

[Chemical formula 28]

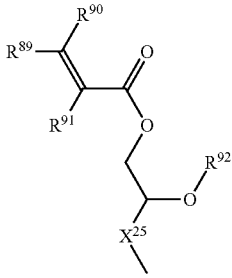
(30)

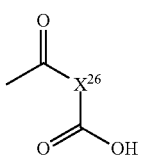
(31)

In general formula (30), $X^{25}$ is an alkylene chain containing 1 to 6 carbon atoms or an cycloalkylene chain containing 4 to 10 carbon atoms. $R^{89}$ to $R^{91}$ are each independently a hydrogen atom, an alkyl group containing 1 to 10 carbon atoms, or an aryl group containing 6 to 15 carbon atoms. $R^{92}$ is a hydrogen atom or a substituent group as represented by general formula (31). In general formula (30), it is preferable that $X^{25}$ is an alkylene chain containing 1 to 4 carbon atoms or a cycloalkylene chain containing 4 to 7 carbon atoms. It is more preferable that $R^{89}$ and $R^{90}$ are each independently a hydrogen atom or an alkyl group containing 1 to 4 carbon atoms. $R^{91}$ is preferably a hydrogen atom or an alkyl group containing 1 to 4 carbon atoms, and more preferably a hydrogen atom or a methyl group. In general formula (31), $X^{26}$ is an alkylene chain containing 1 to 6 carbon atoms or an cycloalkylene chain containing 4 to 10 carbon atoms. In general formula (31), it is preferable that $X^{26}$ is an alkylene chain containing 1 to 4 carbon atoms or a cycloalkylene chain containing 4 to 7 carbon atoms. The above alkylene chains, cycloalkylene chains, alkyl groups, and aryl group may each be either a substitution product or a non-substitution product.

[Chemical formula 29]

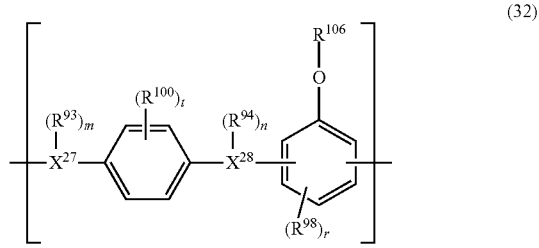

(32)

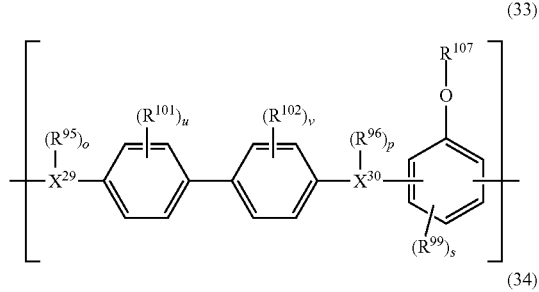

(33)

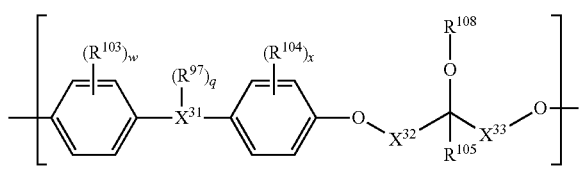

(34)

In general formula (32) to (34), $X^{27}$ to $X^{31}$ are each independently an aliphatic structure containing 1 to 6 carbon atoms, and $X^{32}$ and $X^{33}$ are each independently an alkylene chain containing 1 to 6 carbon atoms, or a cycloalkylene chain containing 4 to 10 carbon atoms. $R^{93}$ to $R^{97}$ are each independently an alkyl group containing 1 to 10 carbon atoms, a cycloalkyl group containing 4 to 10 carbon atoms, or an aryl group containing 6 to 15 carbon atoms; $R^{98}$ to $R^{104}$ are each independently a halogen, an alkyl group containing 1 to 10 carbon atoms, a cycloalkyl group containing 4 to 10 carbon atoms, or an aryl group containing 6 to 15 carbon atoms; $R^{108}$ is a hydrogen atom or an alkyl group containing 1 to 6 carbon atoms; $R^{106}$ and $R^{107}$ are each independently a substituent group as represented by general formula (30); and $R^{108}$ is a hydrogen atom, a substituent group as represented by general formula (30), or a substituent group as represented by general formula (31). Furthermore, m, n, o, p, and q are each independently an integer of 0 to 10, and r, s, t, u, v, w, and x are each independently an integer of 0 to 3. In general formula (32) to (34), it is preferable that $X^{27}$ to $X^{31}$ are each independently an aliphatic structure containing 1 to 4 carbon atoms, and it is preferable that $X^{32}$ and $X^{33}$ are each independently an alkylene chain containing 1 to 4 carbon atoms or a cycloalkylene chain containing 4 to 7 carbon atoms. It is preferable that $R^{93}$ to $R^{97}$ are each independently an alkyl group containing 1 to 6 carbon atoms, a cycloalkyl group containing 4 to 7 carbon atoms, or an aryl group containing 6 to 10 carbon atoms; it is preferable that $R^{98}$ to $R^{104}$ are each independently a halogen, an alkyl group containing 1 to 6 carbon atoms, a cycloalkyl group containing 4 to 7 carbon atoms, or an aryl group containing 6 to 10 carbon atoms; and it is preferable that $R^{108}$ is a hydrogen atom or an alkyl group containing 1 to 4 carbon atoms. The above alkylene chain, cycloalkylene chain, alkyl group, cycloalkyl group, aryl group, and aliphatic structure may each have a heteroatom and may each be either a substitution product or a non-substitution product.

Of the various carboxylic acid-modified epoxy resins (A2c-3) used for the present invention, those carboxylic acid-modified epoxy resins (A2c-3) having structural units as represented by general formula (34) preferably have a substituent group as represented by general formula (35) and/or a substituent group as represented by general formula (36) at chain ends.

[Chemical formula 30]

(35)

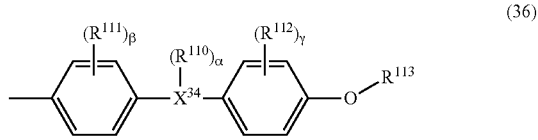

(36)

In general formula (35), $R^{109}$ is a substituent group as represented by general formula (30). In general formula (36), $X^{34}$ is an aliphatic structure containing 1 to 6 carbon atoms. $R^{110}$ is an alkyl group containing 1 to 10 carbon atoms, a cycloalkyl group containing 4 to 10 carbon atoms, or an aryl group containing 6 to 15 carbon atoms, and $R^{111}$ and $R^{112}$ are each independently a halogen, an alkyl group containing 1 to 10 carbon atoms, a cycloalkyl group containing 4 to 10 carbon atoms, or an aryl group containing 6 to 15 carbon atoms. $R^{113}$ is a substituent group as represented by general formula (30). Here, α is an integer of 0 to 10. Furthermore, β and γ are each an integer of 0 to 4. In general formula (36), it is preferable that $X^{34}$ is an aliphatic structure containing 1 to 4 carbon atoms. It is preferable that $R^{110}$ is an alkyl group containing 1 to 6 carbon atoms, a cycloalkyl group containing 4 to 7 carbon atoms, or an aryl group containing 6 to 10 carbon atoms, and it is preferable that $R^{111}$ and $R^{112}$ are each independently a halogen, an alkyl group containing 1 to 6 carbon atoms, a cycloalkyl group containing 4 to 7 carbon atoms, or an aryl group containing 6 to 10 carbon atoms.

<Synthesis Method for Carboxylic Acid-Modified Epoxy Resin>

The carboxylic acid-modified epoxy resin (A2c-3) used for the present invention is preferably a carboxylic acid-modified epoxy resin (A2c-3) produced by one or more synthesis methods selected from (I) to (IV) described below.

Carboxylic acid-modified epoxy resin (I): This category includes carboxylic acid-modified epoxy resins that can be produced by reacting a compound having a phenolic hydroxyl group and/or a hydroxyl group as well as an aromatic group with an active carboxylic acid derivative (one or more selected from tricarboxylic acid anhydride, tricarboxylic acid chloride, tricarboxylic acid active ester, dicarboxylic acid anhydride, dicarboxylic acid chloride, and dicarboxylic acid active ester) to prepare a resin, and then subjecting the resin to a ring-opening addition reaction with an unsaturated compound as represented by general formula (60) that has an ethylenically unsaturated double bond group and an epoxy group. The active carboxylic acid derivative is preferably a tricarboxylic acid anhydride or a dicarboxylic acid anhydride.

Carboxylic acid-modified epoxy resin (II): This category includes carboxylic acid-modified epoxy resins that can be produced by subjecting a compound having a phenolic hydroxyl group and/or a hydroxyl group as well as an aromatic group to a ring-opening addition reaction with an unsaturated compound as represented by general formula (60) that has an ethylenically unsaturated double bond group and an epoxy group to prepare a resin, and then reacting it with an active carboxylic acid derivative (one or more selected from tricarboxylic acid anhydride, tricarboxylic acid chloride, tricarboxylic acid active ester, dicarboxylic acid anhydride, dicarboxylic acid chloride, and dicarboxylic acid active ester). The active carboxylic acid derivative is preferably a tricarboxylic acid anhydride or a dicarboxylic acid anhydride.

Carboxylic acid-modified epoxy resin (III): This category includes carboxylic acid-modified epoxy resins that can be produced by subjecting a compound having an aromatic group and an epoxy group to a ring-opening addition reaction with an polyfunctional carboxylic acid (one or more selected from tetracarboxylic acid, tricarboxylic acid, and dicarboxylic acid) to prepare a resin and then subjecting it to a ring-opening addition reaction with an unsaturated compound as represented by general formula (60) that contains an ethylenically unsaturated double bond group and an epoxy group.

Carboxylic acid-modified epoxy resin (IV): This category includes carboxylic acid-modified epoxy resins that can be produced by subjecting a compound having an aromatic group and an epoxy group to a ring-opening addition reaction with an unsaturated carboxylic acid having an ethylenically unsaturated double bond group to prepare a resin, and then reacting it with an active carboxylic acid derivative (one or more selected from tricarboxylic acid anhydride, tricarboxylic acid chloride, tricarboxylic acid active ester, dicarboxylic acid anhydride, dicarboxylic acid chloride, and dicarboxylic acid active ester). The active carboxylic acid derivative is preferably a tricarboxylic acid anhydride or a dicarboxylic acid anhydride.

Examples of the unsaturated compound as represented by general formula (60) that has an ethylenically unsaturated double bond group and an epoxy group include glycidyl (meth)acrylate, (α-ethyl)glycidyl (meth)acrylate, (α-n-propyl)glycidyl (meth)acrylate, and (3,4-epoxy)heptyl (meth) acrylate.

Examples of the unsaturated carboxylic acid having an ethylenically unsaturated double bond group include, as described above, (meth)acrylic acid, itaconic acid, maleic acid, fumaric acid, and mono(2-acryloxyethyl) succinate.

Examples of the tetracarboxylic acid, tricarboxylic acid, tricarboxylic acid anhydride, tricarboxylic acid chloride, tricarboxylic acid active ester, dicarboxylic acid, dicarboxylic acid anhydride, dicarboxylic acid chloride, and dicarboxylic acid active ester include the aforementioned compounds such as tetracarboxylic acids, tricarboxylic acids and/or derivatives thereof, dicarboxylic acids and/or derivatives thereof.

Examples of catalysts used for the ring-opening addition reaction of the compound having an aromatic group and an epoxy group, the unsaturated compound as represented by general formula (60) that has an ethylenically unsaturated double bond group and an epoxy group, or the unsaturated carboxylic acid having an ethylenically unsaturated double bond group include, as described above, amine based catalysts, quaternary ammonium salts, alkyl ureas, alkyl guanidines, tin based catalysts, titanium based catalysts, phosphorus based catalysts, chromium based catalysts, and cobalt based catalysts.

<Structural Units Derived from One or More Selected from Tetracarboxylic Acid Having Fluorine Atom, Tricarboxylic Acid Having Fluorine Atom, Tricarboxylic Acid Anhydride Having Fluorine Atom, Dicarboxylic Acid Having Fluorine Atom, and Dicarboxylic Acid Anhydride Having Fluorine Atom>

The carboxylic acid-modified epoxy resin (A2c-3) used for the present invention preferably contains a structural unit derived from one or more selected from the group consisting of tetracarboxylic acid having a fluorine atom, tricarboxylic acid having a fluorine atom, tricarboxylic acid anhydride having a fluorine atom, dicarboxylic acid having a fluorine atom, and dicarboxylic acid anhydride having a fluorine atom. If the carboxylic acid-modified epoxy resin (A2c-3) used for the present invention contains a structural unit derived from one or more selected from the group consisting of tetracarboxylic acid having a fluorine atom, tricarboxylic acid having a fluorine atom, tricarboxylic acid anhydride having a fluorine atom, dicarboxylic acid having a fluorine atom, and dicarboxylic acid anhydride having a fluorine atom, it ensures an improved transparency and an improved sensitivity in the light exposure step. It also works to allow the film surface to have water repellency and depress the infiltration through the film surface in the alkali development step.

Examples of the tetracarboxylic acid having a fluorine atom, tricarboxylic acid having a fluorine atom, tricarboxylic acid anhydride having a fluorine atom, dicarboxylic acid having a fluorine atom, and dicarboxylic acid anhydride having a fluorine atom include compounds such as the aforementioned tetracarboxylic acids having a fluorine atom and/or derivatives thereof, tricarboxylic acids having a fluorine atom and/or derivatives thereof, and dicarboxylic acids having a fluorine atom and/or derivatives thereof.

In the carboxylic acid-modified epoxy resin (A2c-3), those structural units derived from one or more selected from the group consisting of tetracarboxylic acid having a fluorine atom, tricarboxylic acid having a fluorine atom, tricarboxylic acid anhydride having a fluorine atom, dicarboxylic acid having a fluorine atom, and dicarboxylic acid anhydride having a fluorine atom preferably account for 30 to 100 mol %, more preferably 50 to 100 mol %, and still more preferably 70 to 100 mol %, of all structural units derived from a tetracarboxylic acid, a dicarboxylic acid, or a derivative thereof. A content in the above range ensures improved sensitivity in the light exposure step.

<Structural Unit Derived from One or More Selected from Tetracarboxylic Acid Having Aromatic Group, Tricarboxylic Acid Having Aromatic Group, Tricarboxylic Acid Anhydride Having Aromatic Group, Dicarboxylic Acid Having Aromatic Group, and Dicarboxylic Acid Anhydride Having Aromatic Group>

The carboxylic acid-modified epoxy resin (A2c-3) used for the present invention preferably contains a structural unit derived from one or more selected from the group consisting of tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group. If the carboxylic acid-modified epoxy resin (A2c-3) used for the present invention contains a structural unit derived from one or more selected from the group consisting of tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group, the heat resistance of the aromatic group serves to produce a cured film with an improved heat resistance.

If a pigment (D1) in particular is added as the coloring agent (D) which will be described later, and if in that case the carboxylic acid-modified epoxy resin (A2c-3) contains a structural unit derived from a copolymerization component having an aromatic group, the steric hindrance of the aromatic group serves to improve the dispersion stability of the pigment (D1). If the pigment (D1) is an organic pigment (D1-2), the aromatic group in the carboxylic acid-modified epoxy resin (A2c-3) interacts with the aromatic group in the organic pigment (D1-2), thereby serving to improve the dispersion stability of the organic pigment (D1-2).

Examples of the tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group include compounds such as the aforementioned aromatic tetracarboxylic acids and/or derivatives thereof, aromatic tricarboxylic acids and/or derivatives thereof, or aromatic dicarboxylic acids and/or derivatives thereof.

In the carboxylic acid-modified epoxy resin (A2c-3), those structural units derived from one or more selected from the group consisting of tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group preferably account for 10 to 100 mol %, more preferably 20 to 100 mol %, and still more preferably 30 to 100 mol %, of all structural units derived from a tetracarboxylic acid, a dicarboxylic acid, or a derivative thereof. A content in the above range ensures the production of a cured film having an improved heat resistance.

<Structural Unit Derived from One or More Selected from Tetracarboxylic Acid Having Alicyclic Group, Tricarboxylic Acid Having Alicyclic Group, Tricarboxylic Acid Anhydride Having Alicyclic Group, Dicarboxylic Acid Having Alicyclic Group, and Dicarboxylic Acid Anhydride Having Alicyclic Group>

The carboxylic acid-modified epoxy resin (A2c-3) used for the present invention preferably contains a structural unit derived from one or more selected from the group consisting of tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having a an alicyclic group. If the carboxylic acid-modified epoxy resin (A2c-3) used for the present invention contains a structural unit derived from one or more selected from the group consisting of tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having an alicyclic group, the heat resistance and transparency of the alicyclic group serve to produce a cured film with an improved heat resistance and an improved transparency.

Examples of the tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having an alicyclic group include compounds such as the aforementioned alicyclic tetracarboxylic acids and/or derivatives thereof, alicyclic tricarboxylic acids and/or derivatives thereof, or alicyclic dicarboxylic acids and/or derivatives thereof.

In the carboxylic acid-modified epoxy resin (A2c-3), those structural units derived from one or more selected from the group consisting of tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having an alicyclic group preferably account for 5 mol % or more, more preferably 10 mol % or more, still more preferably 15 mol % or more, of all structural units derived from a tetracarboxylic acid, a dicarboxylic acid, or a derivative thereof. A content in the above range ensures the production of a cured film having an improved heat resistance and an improved transparency. On the other hand, the content is preferably 90 mol % or less, more preferably 85 mol % or less, and still more preferably 75 mol % or less. A content in the above range ensures the production of a cured film having improved mechanical characteristics.

<Acidic Group Derived from Tetracarboxylic Acid, Tricarboxylic Acid, Tricarboxylic Acid Anhydride, or Dicarboxylic Acid Anhydride>

The carboxylic acid-modified epoxy resin (A2c-3) used for the present invention preferably contains a structural unit derived from a tetracarboxylic acid, tricarboxylic acid, tricarboxylic acid anhydride, or dicarboxylic acid anhydride, and the carboxylic acid-modified epoxy resin (A2c-3) preferably has an acidic group. If the carboxylic acid-modified epoxy resin (A2c-3) contains an acidic group, it ensures an improved pattern processability in an alkaline developer and an improved resolution after the development step.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, and hydroxyimide group. From the viewpoint of ensuring an improved pattern processability in an alkaline developer and an improved resolution after the development step, the carboxylic group, carboxylic acid anhydride group, and phenolic hydroxyl group are preferable, and the carboxyl group and carboxylic acid anhydride group are more preferable.

Examples of the tetracarboxylic acid, tricarboxylic acid, tricarboxylic acid anhydride, and dicarboxylic acid anhydride include the compounds described above.

The contents of structural units derived from various monomer components in the carboxylic acid-modified epoxy resin (A2c-3) can be determined by a combination of methods such as $^1$H-NMR, $^{13}$C-NMR, $^{29}$Si-NMR, IR, TOF-MS, elementary analysis, and ash content measurement.

<Specific Examples of Carboxylic Acid-Modified Epoxy Resin>

Examples of the carboxylic acid-modified epoxy resin (A2c-3) used for the present invention include KAYARAD (registered trademark) PCR-1222H, PCR-1173H, PCR-1221H, PCR-1220H, CCR-1171H, CCR-1307H, CCR-1309H, CCR-1291H, CCR-1235, TCR-1348H, TCR-1323H, TCR-1347H, TCR-1338H, TCR-1352H, TCR-1353H, TCR-1354H, TCR-1355H, TCR-1356H, ZAR-1494H, ZAR-2001H, ZAR-1035, ZAR-2000, ZFR-1401H, ZFR-1491H, ZCR-1797H, ZCR-1798H, ZCR-1569H, ZCR-1798H, ZCR-1761H, ZCR-1601H, ZXR-1807H, ZXR-1816H, ZXR-1810H, ZCR-6001H, ZCR-6002H, ZCR-8001H, and ZCR-8002H (all manufactured by Nippon Kayaku Co., Ltd.); and NK OLIGO (registered trademark)

EA-6340, EA-7140, and EA-7340 (all manufactured by Shin-Nakamura Chemical Co., Ltd.).

<Properties of Carboxylic Acid-Modified Epoxy Resin>

The carboxylic acid-modified epoxy resin (A2c-3) used for the present invention preferably has a polystyrene based Mw of 500 or more, more preferably 1,000 or more, and still more preferably 1,500 or more, as determined by GPC. A Mw in the above range ensures an improved resolution after the development step. On the other hand, the Mw is preferably 100,000 or less, more preferably 50,000 or less, and still more preferably 20,000 or less. A Mw in the above range ensures an improved leveling property in the coating step and an improved pattern processability in an alkaline developer.

<Novolac Resin>

For the negative type photosensitive resin composition according to the present invention may contain a novolac resin (A1b-4) as a component of the weakly acidic group-containing resin (A1). The novolac resin (A1b-4) is a common novolac resin as described below.

For the negative type photosensitive resin composition according to the present invention may contain a resol resin (A1b-4b) as a component of the weakly acidic group-containing resin (A1). The resol resin (A1b-4b) is a common resol resin and has the same properties, excluding the polymerization catalyst properties, as those of the novolac resin (A1b-4) that is described below.

The novolac resin (A1b-4) used for the present invention is a resin obtainable through a reaction of a phenol compound with an aldehyde compound or a ketone compound and has an aromatic structure derived from the phenol compound. If the aldehyde compound and/or the ketone compound has an aromatic structure, an aromatic structure derived from them will persist. Accordingly, the incorporation of a novolac resin (A1b-4) in the resin composition ensures the production of a cured film with an improved heat resistance. Therefore, such a cured film is suited to applications that require heat resistance.

The novolac resin (A1b-4) used for the present invention has a phenolic hydroxyl group as alkali-soluble group. The existence of a phenolic hydroxyl group ensures improved halftone characteristics. In addition to the phenolic hydroxyl group, a weakly acidic group such as hydroxyimide group may also be contained.

The carboxylic acid-modified novolac resin (A1a-4) used for the present invention has a carboxyl group and/or a carboxylic acid anhydride group, in addition to the phenolic hydroxyl group, to act as alkali-soluble groups. The existence of a carboxyl group and/or a carboxylic acid anhydride group ensures not only improved halftone characteristics, but also an improved resolution after the development step.

Examples of the phenol compound include phenol, o-cresol, m-cresol, p-cresol, 2,5-xylenol, 3,5-xylenol, 2-ethylphenol, 3-ethylphenol, 4-ethylphenol, 4-n-propylphenol, 4-n-butylphenol, 4-t-butylphenol, 1-naphthol, 2-naphthol, 4,4'-dihydroxybiphenyl, 2,2-bis(4-hydroxyphenyl) propane, catechol, resorcinol, 1,4-hydroquinone, pyrogallol, 1,2,4-benzene triol, or phloroglucinol.

Examples of the aldehyde compound include formaldehyde, para-formaldehyde, acetaldehyde, para-aldehyde, propione aldehyde, benzaldehyde, or salicyl aldehyde.

Examples of the ketone compound include acetone, methyl ethyl ketone, methyl isobutyl ketone, acetophenone, and benzophenone.

The novolac resin used for the present invention is preferably a novolac resin obtainable through a reaction of a phenol compound with an aldehyde compound and/or a ketone compound in the presence of an acid catalyst. The reaction of a phenol compound with an aldehyde compound and/or a ketone compound is performed in a solvent or under solvent-free conditions.

Furthermore, the novolac resin may be a resol resin (A1b-4b) obtainable through a reaction under the same conditions except for using an alkali catalyst instead of an acid catalyst.

Examples of the acid catalyst include hydrochloric acid, nitric acid, sulfuric acid, hydrofluoric acid, phosphoric acid, acetic acid, trifluoroacetic acid, formic acid, and multivalent carboxylic acids, as well as anhydrides and ion exchange resins thereof. Examples of the basic catalyst include triethyl amine, tri-n-propyl amine, tri-n-butyl amine, tri-n-pentyl amine, tri-n-hexyl amine, tri-n-heptyl amine, tri-n-octyl amine, diethyl amine, triethanol amine, diethanol amine, N,N-dimethyl-4-aminopyridine, sodium hydroxide, potassium hydroxide, and ion exchange resins.

The carboxylic acid-modified novolac resin (A1a-4) used for the present invention is preferably a carboxylic acid-modified novolac resin (A1a-4) in category (I) and/or (II) described below.

Carboxylic acid-modified novolac resin (A1a-4) (I): A carboxylic acid-modified novolac resin (A1a-4) in this category is obtainable through a reaction of part of the phenolic hydroxyl groups in a novolac resin (A1b-4) with a polyfunctional carboxylic acid anhydride (one or more selected from tetracarboxylic acid dianhydride, tricarboxylic acid anhydride, and dicarboxylic acid anhydride) and/or a polyfunctional carboxylic acid (one or more selected from tetracarboxylic acid, tricarboxylic acid, and dicarboxylic acid).

Carboxylic acid-modified novolac resin (A1a-4) (II): A carboxylic acid-modified novolac resin (A1a-4) in this category is obtainable through a reaction of a phenol compound having a carboxyl group and/or a carboxylic acid anhydride group with an aldehyde compound and/or a ketone compound in the presence of an acid catalyst.

Furthermore, the carboxylic acid-modified novolac resin (A1a-4) may be a carboxylic acid-modified resol resin (A1a-4b) obtainable through a reaction using a resol resin (A1b-4b).

Examples of the tetracarboxylic acid, tetracarboxylic acid dianhydride, tricarboxylic acid, tricarboxylic acid anhydride, dicarboxylic acid, and dicarboxylic acid anhydride include compounds such as the aforementioned tetracarboxylic acids and/or derivatives thereof, tricarboxylic acids and/or derivatives thereof, and dicarboxylic acids and/or derivatives thereof.

Examples of the phenol compound having a carboxyl group and/or a carboxylic acid anhydride group include 2-hydroxybenzoic acid, 3-hydroxybenzoic acid, 4-hydroxybenzoic acid, 4-hydroxy-3-methyl benzoic acid, 4-hydroxy-2-methyl benzoic acid, 5-hydroxy-2-methyl benzoic acid, 4-carboxy-1-naphthol, 3,3'-dicarboxy-4,4'-dihydroxybiphenyl, 4-carboxycatechol, 2-carboxyhydroquinone, 4-hydroxyphenyl acetic acid, and salicylic acid.

<Properties of Novolac Resin>

The novolac resin used for the present invention preferably has a polystyrene based Mw of 500 or more, more preferably 1,000 or more, and still more preferably 1,500 or more, as determined by GPC. A Mw in the above range ensures an improved resolution after the development step. On the other hand, the Mw is preferably 100,000 or less, more preferably 50,000 or less, and still more preferably 20,000 or less. A Mw in the above range ensures an improved leveling property in the coating step and an improved pattern processability in an alkaline developer.

<Polyhydroxystyrene>

The negative type photosensitive resin composition according to the present invention may contain a polyhydroxystyrene (A1b-5) as a component of the weakly acidic group-containing resin (A1). The polyhydroxystyrene (A1b-5) is a common polyhydroxystyrene as described below.

The polyhydroxystyrene (A1b-5) used for the present invention is a resin that can be produced by subjecting one or more copolymerization components selected from the group consisting of hydroxystyrene compound copolymerization components, styrene compound copolymerization components, and other copolymerization components to radical copolymerization and has an aromatic structure derived from the hydroxystyrene compound copolymerization components or styrene compound copolymerization components. Accordingly, the incorporation of polyhydroxystyrene in the resin composition ensures the production of a cured film with an improved heat resistance. Therefore, such a cured film is suited to applications that require heat resistance.

The polyhydroxystyrene (A1b-5) used for the present invention has a phenolic hydroxyl group as alkali-soluble group. The existence of a phenolic hydroxyl group ensures improved halftone characteristics. In addition to the phenolic hydroxyl group, a weakly acidic group such as hydroxyimide group may also be contained.

The carboxylic acid-modified polyhydroxystyrene (A1a-5) used for the present invention has a carboxyl group and/or a carboxylic acid anhydride group, in addition to the phenolic hydroxyl group, to act as alkali-soluble groups. The existence of a carboxyl group and/or a carboxylic acid anhydride group ensures not only improved halftone characteristics, but also an improved resolution after the development step.

Examples of the hydroxystyrene compound copolymerization components include 2-hydroxystyrene, 3-hydroxystyrene, 4-hydroxystyrene, 2,4-dihydroxystyrene, 2,6-dihydroxystyrene, 2,4,6-trihydroxystyrene, 2,3,4,5-tetrahydroxystyrene, pentahydroxystyrene, 2-hydroxy-α-methyl styrene, 3-hydroxy-α-methyl styrene, 4-hydroxy-α-methyl styrene, 1-(2-hydroxyphenyl) propylene, 1-(3-hydroxyphenyl) propylene, and 1-(4-hydroxyphenyl) propylene.

Examples of the styrene compound copolymerization components include styrene, 4-methyl styrene, 2-methyl styrene, 3-methyl styrene, α-methyl styrene, 1-phenyl propylene, and 4-styryl (meth)acrylate.

Examples of the other copolymerization components include methyl (meth)acrylate, ethyl (meth)acrylate, (2-hydroxy)ethyl (meth)acrylate, cyclohexyl (meth)acrylate, tricyclodecanyl (meth)acrylate, tetracyclodecanyl (meth)acrylate, phenyl (meth)acrylate, and benzyl (meth)acrylate.

The polyhydroxystyrene used for the present invention is preferably a polyhydroxystyrene that can be produced by subjecting one or more copolymerization components selected from the group consisting of hydroxystyrene compound copolymerization components, styrene compound copolymerization components, and other copolymerization components to radical copolymerization in the presence of a radical polymerization initiator or an anionic polymerization initiator.

Examples of the radical polymerization initiator include azo compounds such as 2,2'-azobis(isobutyronitrile), 2,2'-azobis(2,4-dimethyl valeronitrile), and 2,2'-azobis(4-methoxy-2,4-dimethyl valeronitrile); and organic peroxides such as lauroyl peroxide, di-tert-butyl peroxide, bis(4-t-butylcyclohexane-1-yl) peroxydicarbonate, t-butyl 2-ethylperoxyhexanoate, methyl ethyl ketone peroxide, benzoyl peroxide, and cumene hydroperoxide.

Regarding the conditions for the radical copolymerization, it is preferable that a reaction container is placed in air or sufficiently purged with nitrogen by bubbling, reduced pressure deaeration, etc., and then copolymerization components and a radical polymerization initiator are added to a reaction solvent, followed by continuing the reaction at 60° C. to 110° C. for 30 to 500 minutes. If a (meth)acrylic compound having a carboxylic acid anhydride group is used as a copolymerization component, it is preferable to add a theoretical quantity of water and continue the reaction at 30° C. to 60° C. for 30 to 60 minutes. In addition, a chain transfer agent such as thiol compounds and/or a polymerization terminator such as phenol compounds may be used as required.

Examples of the anionic polymerization initiator include organic alkali compounds such as n-butyllithium, s-butyllithium, t-butyllithium, ethyllithium, ethyl sodium, 1,1-diphenylhexyllithium, and 1,1-diphenyl-3-methylpentyllithium.

Regarding the conditions for the anionic copolymerization, it is preferable that a reaction container is sufficiently purged with nitrogen by bubbling, reduced pressure deaeration, etc., and then copolymerization components and an anionic polymerization initiator are added to a reaction solvent, followed by continuing the reaction at −100° C. to 50° C. for 30 to 500 minutes.

The carboxylic acid-modified polyhydroxystyrene (A1a-5) used for the present invention is preferably a carboxylic acid-modified polyhydroxystyrene (A1a-5) in category (I) and/or (II) described below.

Carboxylic acid-modified polyhydroxystyrene (A1a-5) (I): A carboxylic acid-modified polyhydroxystyrene (A1a-5) in this category is obtainable through a reaction of part of the phenolic hydroxyl groups in a polyhydroxystyrene (A1b-5) with a polyfunctional carboxylic acid anhydride (one or more selected from tetracarboxylic acid dianhydride, tricarboxylic acid anhydride, and dicarboxylic acid anhydride) and/or a polyfunctional carboxylic acid (one or more selected from tetracarboxylic acid, tricarboxylic acid, and dicarboxylic acid).

Carboxylic acid-modified polyhydroxystyrene (A1a-5) (II): A carboxylic acid-modified polyhydroxystyrene (A1a-5) can be produced by subjecting one or more copolymerization components selected from the group consisting of hydroxystyrene compound copolymerization components, styrene compound copolymerization components, other copolymerization components, and copolymerization components having carboxyl groups and/or carboxylic acid anhydride groups to radical copolymerization.

Examples of the tetracarboxylic acid, tetracarboxylic acid dianhydride, tricarboxylic acid, tricarboxylic acid anhydride, dicarboxylic acid, and dicarboxylic acid anhydride include compounds such as the aforementioned tetracarboxylic acids and/or derivatives thereof, tricarboxylic acids and/or derivatives thereof, and dicarboxylic acids and/or derivatives thereof.

Examples of the copolymerization components having carboxyl groups and/or carboxylic acid anhydride groups include hydroxystyrene compounds such as 2-hydroxy-4-vinyl benzoic acid, 3-hydroxy-4-vinyl benzoic acid, 4-hydroxy-2-vinyl benzoic acid, 4-hydroxy-3-vinyl benzoic acid, 3-hydroxy-4-vinyl benzoic acid, 2-hydroxy-4-carboxy-α-methyl styrene, and 1-(2-hydroxy-4-carboxy) phenyl propylene; styrene compounds such as 2-vinyl benzoic acid, 3-vinyl benzoic acid, and 4-vinyl benzoic acid; and other copolymerization components such as (meth)acrylic acid, (meth)acrylic acid anhydride, itaconic acid, itaconic acid anhydride, maleic acid, fumaric acid, mono(2-acryloxyethyl) succinate, mono(2-acryloxyethyl) phthalate, tetrahydromono(2-acryloxyethyl) phthalate, 2-vinyl acetic acid, 2-vinylcyclohexane carboxylic acid, 3-vinylcyclohexane carboxylic acid, and 4-vinylcyclohexane carboxylic acid.

<Properties of Polyhydroxystyrene>

The polyhydroxystyrene used for the present invention preferably has a polystyrene based Mw of 500 or more, more preferably 1,000 or more, and still more preferably 1,500 or more, as determined by GPC. A Mw in the above range ensures an improved resolution after the development step. On the other hand, the Mw is preferably 100,000 or less, more preferably 50,000 or less, and still more preferably 20,000 or less. A Mw in the above range ensures an improved leveling property in the coating step and an improved pattern processability in an alkaline developer.

<Contents of Polyimide, Polyimide Precursor, Polybenzoxazole, Polybenzoxazole Precursor, Polysiloxane, Polycyclic Side Chain-Containing Resin, and Carboxylic Acid-Modified Epoxy Resin>

In the negative type photosensitive resin composition according to the present invention, the one or more resins selected from the group consisting of polyimide (A1a-1), polyimide precursor (A1a-2), carboxylic acid-modified polysiloxane (A1a-3), polybenzoxazole (A1b-1), polybenzoxazole precursor (A1b-2), and polysiloxane (A1b-3) preferably account for 50 to 100 mass %, more preferably 60 to 100 mass %, still more preferably 70 to 100 mass %, still more preferably 80 to 100 mass %, and particularly preferably 90 to 100 mass %, of the weakly acidic group-containing resin (A1) which accounts for 100 mass %. A content in the above range ensures the production of a cured film having an improved heat resistance.

In the negative type photosensitive resin composition according to the present invention, the one or more resins selected from the group consisting of unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), unsaturated group-containing polysiloxane (A2b-3), polycyclic side chain-containing aromatic resin (A2c-1), and carboxylic acid-modified epoxy resin (A2c-3) preferably account for 50 to 100 mass %, more preferably 60 to 100 mass %, still more preferably 70 to 100 mass %, still more preferably 80 to 100 mass %, and particularly preferably 90 to 100 mass %, of the unsaturated group-containing resin (A2) which accounts for 100 mass %. A content in the above range ensures the production of a cured film having an improved heat resistance.

If the contents of the weakly acidic group-containing resin (A1) and the unsaturated group-containing resin (A2) are in the above ranges in the negative type photosensitive resin composition according to the present invention, it ensures not only the production of a cured film with an improved heat resistance, but also an improved sensitivity and improved halftone characteristics in the light exposure step. Accordingly, a step-shaped cured film with a sufficiently large difference in film thickness between the thick parts and the thin parts can be formed while maintaining a high sensitivity. Thus, a cured film produced from the negative type photosensitive resin composition according to the present invention can be used suitably in components that require a high heat resistance and a stepped shape such as insulation layers in, for example, pixel dividing layers of organic EL display devices. If a cured film of the negative type photosensitive resin composition according to the present invention is used in components that are considered to suffer problems related to heat resistance such as defects and characteristics deterioration in elements due to degassing caused by heat decomposition, it will be possible to produce a high reliability element that is free from such problems. In addition, if the negative type photosensitive resin composition according to the present invention contains the coloring agent (D) which will be described later, it serves for prevention of the electrode wiring from becoming visible and for reduction of external light reflection, leading to an improved contrast in image displaying.

<Radical-Polymerizable Compound (B)>

It is preferable for the negative type photosensitive resin composition according to the present invention to further contain a radical-polymerizable compound (B).

The radical-polymerizable compound (B) is a compound that has an ethylenically unsaturated double bond group in the molecule. In the light exposure step, radicals are generated from the photo-initiator (C1) which will be described later, to cause radical polymerization of the radical-polymerizable compound (B), and the light-exposed part of the film of the resin composition becomes insoluble in the alkaline developer, thereby serving to form a negative type pattern.

The incorporation of the radical polymerizable compound (B) serves to accelerate the UV curing in the light exposure step to ensure an improved sensitivity in the light exposure step. In addition, the crosslink density after the heat curing step will increase, leading to a cured film with an improved hardness.

It is preferable for the radical-polymerizable compound (B) to be a (meth)acrylic group-containing compound because such a compound will be radically polymerized easily. It is more preferable for the compound to have two or more (meth)acrylic groups in the molecule from the viewpoint of ensuring an improved sensitivity in the light exposure step and production of a cured film with an increased hardness. The radical-polymerizable compound (B) preferably has a double bond equivalent of 80 to 400 g/mol from the viewpoint of ensuring an improved sensitivity in the light exposure step and production of a cured film with an increased hardness.

Examples of the radical polymerizable compound (B) include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipenta erythritol penta(meth)acrylate, dipenta erythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy) phenyl] propane, 1,3,5-tris-((meth)acryloxyethyl) isocyanuric acid, 1,3-bis((meth)acryloxyethyl) isocyanuric acid, 9,9-bis[4-(2-(meth)acryloxyethoxy) phenyl] fluorene, 9,9-bis[4-(3-(meth)acryloxypropoxy) phenyl] fluorene, and 9,9-bis(4-(meth)acryloxy phenyl) fluorene, as well as acid-modified forms thereof, ethylene oxide-modified forms thereof, and propylene oxide-modified forms thereof. From the viewpoint of ensuring an improved sensitivity in the light exposure step and production of a cured film with an increased hardness, preferable are trimethylolpropane tri (meth)acrylate, ditrimethylolpropane tri(meth)acrylate, ditrimethylolpropane tetra(meth)acrylate, pentaerythritol tri (meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy) phenyl] propane, 1,3,5-tris-((meth)acryloxyethyl) isocyanuric acid, 1,3-bis((meth) acryloxyethyl) isocyanuric acid, 9,9-bis[4-(2-(meth) acryloxyethoxy) phenyl] fluorene, 9,9-bis[4-(3-(meth) acryloxy propoxy) phenyl] fluorene, and 9,9-bis(4-(meth) acryloxyphenyl) fluorene, as well as acid-modified forms thereof, ethylene oxide-modified forms thereof, and propylene oxide-modified forms thereof, of which acid-modified forms thereof and ethylene oxide-modified forms thereof are more preferable from the viewpoint of ensuring an improved resolution after the development step. From the viewpoint of ensuring an improved resolution after the development step, furthermore, also preferable are compounds that are produced by subjecting a compound having two or more glycidoxy groups in the molecule and an unsaturated carboxylic acid having an ethylenically unsaturated double bond group to a ring-opening addition reaction and then reacting the resulting compound with a polybasic carboxylic acid or a polybasic carboxylic acid anhydride.

In the negative type photosensitive resin composition according to the present invention, the radical-polymerizable compound (B) preferably accounts for 15 parts by mass or more, more preferably 20 parts by mass or more, still more preferably 25 parts by mass or more, and particularly preferably 30 parts by mass or more, relative to the total quantity of the alkali-soluble resin (A) and the radical-polymerizable compound (B) which accounts for 100 parts by mass. A content in the above range ensures an improved sensitivity during exposure and the formation of a pattern shape with a small taper. Furthermore, the content of the radical-polymerizable compound (B) is preferably 65 parts by mass or less, more preferably 60 parts by mass or less, still more preferably 55 parts by mass or less, and particularly preferably 50 parts by mass or less. A content in the above range ensures improved halftone characteristics. It also ensures the production of a cured film with an increased heat resistance and the formation of a pattern shape with a small taper.

<Negative Type Photosensitivity>

The negative type photosensitive resin composition according to the present invention preferably further contains a photosensitive agent (C). It preferably contains a radical-polymerizable compound (B) and a photosensitive agent (C). The photosensitive agent (C) is preferably a photo-initiator (C1) and/or a photo-acid generator (C2).

The incorporation of the photo-initiator (C1) and/or the photo-acid generator (C2) serves to impart a negative type photosensitivity to the resin composition according to the present invention.

<Photo-Initiator (C1)>

A photo-initiator (C1) is a compound that generates radicals as a result of bond cleavage and/or a reaction when exposed to light.

The incorporation of the photo-initiator (C1) acts to cause radical polymerization of the radical-polymerizable compound (B), and the light-exposed part of the film of the resin composition becomes insoluble in the alkaline developer, thereby serving to form a negative type pattern. Furthermore, UV curing in the light exposure step is promoted to improve the sensitivity.

Preferable examples of the photo-initiator (C1) include benzyl ketal based photo-initiator, α-hydroxyketone based photo-initiator, α-aminoketone based photo-initiator, acyl phosphine oxide based photo-initiator, oxime ester based photo-initiator, acridine based photo-initiator, titanocene based photo-initiator, benzophenone based photo-initiator, acetophenone based photo-initiator, aromatic keto ester based photo-initiator, and benzoic acid ester based photo-initiator, of which α-hydroxyketone based photo-initiator, α-aminoketone based photo-initiator, acyl phosphine oxide based photo-initiator, oxime ester based photo-initiator, acridine based photo-initiator, and benzophenone based photo-initiator are more preferable from the viewpoint of ensuring an improved sensitivity in the light exposure step, and among others, α-aminoketone based photo-initiator, acyl phosphine oxide based photo-initiator, and oxime ester based photo-initiator are still more preferable.

Examples of the benzyl ketal based photo-initiator include 2,2-dimethoxy-1,2-diphenyl ethane-1-one.

Examples of the α-hydroxyketone based photo-initiator include 1-(4-isopropyl phenyl)-2-hydroxy-2-methylpropane-1-one, 2-hydroxy-2-methyl-1-phenylpropane-1-one, 1-hydroxycyclohexylphenyl ketone, 1-[4-(2-hydroxyethoxy) phenyl]-2-hydroxy-2-methylpropane-1-one, and 2-hydroxy-1-[4-[4-(2-hydroxy-2-methylpropionyl) benzyl] phenyl]-2-methylpropane-1-one.

Examples of the α-aminoketone based photo-initiator include 2-methyl-1-[4-(methylthio) phenyl]-2-morpholinopropane-1-one, 2-benzyl-2-dimethylamino-1-(4-morpholinophenyl)-butane-1-one, 2-dimethylamino-2-(4-methylbenzyl)-1-(4-morpholinophenyl)-butane-1-one, and 3,6-bis(2-methyl-2-morpholinopropionyl)-9-octyl-9H-carbazole.

Examples of the acyl phosphine oxide based photo-initiator include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester based photo-initiator include 1-phenylpropane-1,2-dione-2-(O-ethoxycarbonyl) oxime, 1-phenylbutane-1,2-dione-2-(O-methoxycarbonyl) oxime, 1,3-diphenylpropane-1,2,3-trione-2-(O-ethoxycarbonyl) oxime, 1-[4-(phenylthio)phenyl] octane-1,2-dione-2-(O-benzoyl) oxime, 1-[4-[4-(carboxyphenyl)thio]phenyl] propane-1,2-dione-2-(O-acetyl) oxime, 1-[9-ethyl-6-(2-methylbenzoyl)-9H-carbazole-3-yl] ethanone-1-(O-acetyl) oxime, 1-[9-ethyl-6-[2-methyl-4-[1-(2,2-dimethyl-1,3-dioxolan-4-yl) methyloxy] benzoyl]-9H-carbazole-3-yl] ethanone-1-(O-acetyl) oxime, and 1-(9-ethyl-6-nitro-9H-carbazole-3-yl)-1-[2-methyl-4-(1-methoxypropane-2-yloxy) phenyl] methanone-1-(O-acetyl) oxime.

Examples of the acridine based photo-initiator include 1,7-bis(acridine-9-yl)-n-heptane.

Examples of the titanocene based photo-initiator include bis($\eta^5$-2,4-cyclopentadiene-1-yl)-bis[2,6-difluoro)-3-(1H- pyrrole-1-yl)phenyl] titanium (IV) and bis($\eta^5$-3-methyl-2,4-cyclopentadiene-1-yl)-bis(2,6-difluorophenyl) titanium (IV).

Examples of the benzophenone based photo-initiator include benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzylketone, and fluorenone.

Examples of the acetophenone based photo-initiator include 2,2-diethoxyacetophenone, 2,3-diethoxyacetophenone, 4-t-butyldichloroacetophenone, benzalacetophenone, and 4-azidebenzalacetophenone.

Examples of the aromatic keto ester based photo-initiator include methyl 2-phenyl-2-oxyacetate.

Examples of the benzoic acid ester based photo-initiator include ethyl 4-(dimethylamino)benzoate, (2-ethyl)hexyl 4-(dimethylamino)benzoate, ethyl 4-(diethylamino)benzoate, and methyl 2-benzoylbenzoate.

In the negative type photosensitive resin composition according to the present invention, the photo-initiator (C1) preferably accounts for 0.1 part by mass or more, more preferably 0.5 part by mass or more, still more preferably 0.7 part by mass or more, and particularly preferably 1 part by mass or more, relative to the total quantity of the alkali-soluble resin (A) and the radical-polymerizable compound (B) which accounts for 100 parts by mass. A content in the above range ensures improved sensitivity during exposure. On the other hand, the content of the photo-initiator (C1) is preferably 25 parts by mass or less, more preferably 20 parts by mass or less, still more preferably 17 parts by mass or less, and particularly preferably 15 parts by mass or less. A content in the above range ensures improved halftone characteristics. It also ensures an improved resolution after the development step and the formation of a pattern shape with a small taper.

<Photo-Acid Generator (C2)>

A photo-acid generator (C2) is a compound that generates an acid as a result of bond cleavage when exposed to light.

The incorporation of the photo-acid generator (C2) serves to accelerate the UV curing in the light exposure step to ensure an improved sensitivity. In addition, the crosslink density after the heat-curing of the resin composition will increase, leading to a cured film with an improved chemical resistance.

There are ionic compounds and nonionic compounds that can work as the photo-acid generator (C2).

The ionic compounds are preferably free of heavy metals or halogen ions, and triorganosulfonium salt based compounds are more preferable. Such triorganosulfonium salt based compounds include, for example, methane sulfonates, trifluoromethane sulfonates, camphor sulfonates, and 4-toluene sulfonates of triphenyl sulfonium; methane sulfonates, trifluoromethane sulfonates, camphor sulfonates, and 4-toluene sulfonates of dimethyl-1-naphthyl sulfonium; methane sulfonates, trifluoromethane sulfonates, camphor sulfonates, and 4-toluene sulfonates of dimethyl(4-hydroxy-1-naphthyl) sulfonium; methane sulfonates, trifluoromethane sulfonates, camphor sulfonates, and 4-toluene sulfonates of dimethyl (4,7-dihydroxy-1-naphthyl) sulfonium; methane sulfonates, trifluoromethane sulfonates, camphor sulfonates, and 4-toluene sulfonates of diphenyl iodonium.

Examples of the nonionic photo-acid generator (C2) include halogen-containing compounds, diazomethane compounds, sulfone compounds, sulfonic acid ester compounds, carboxylic acid ester compounds, sulfone imide compounds, phosphoric acid ester compounds, and sulfone benzotriazole compounds.

Examples of the halogen-containing compounds include haloalkyl group-containing hydrocarbon compounds and haloalkyl group-containing heterocyclic compounds. Preferable ones of the halogen-containing compounds include 1,1-bis(4-chlorophenyl)-2,2,2-trichloroethane, 2-phenyl-4,6-bis(trichloromethyl)-s-triazine, and 2-naphthyl-4,6-bis(trichloromethyl)-s-triazine.

Examples of the diazomethane compounds include bis(trifluoromethylsulfonyl) diazomethane, bis(cyclohexylsulfonyl) diazomethane, bis(phenylsulfonyl) diazomethane, bis(4-tolylsulfonyl) diazomethane, bis(2,4-xylylsulfonyl) diazomethane, bis(4-chlorophenylsulfonyl) diazomethane, methylsulfonyl-4-tolylsulfonyl diazomethane, cyclohexylsulfonyl (1,1-dimethylethylsulfonyl) diazomethane, bis(1,1-dimethylethylsulfonyl) diazomethane, and phenylsulfonyl(benzoyl) diazomethane.

Examples of the sulfone compounds include β-ketosulfone compounds, β-sulfonylsulfone compounds, and diaryldisulfone compounds. Preferable ones of the sulfone compounds include 4-tolylphenacyl sulfone, mesitylphenacyl sulfone, bis(phenylsulfonyl) methane, and 4-chlorophenyl-4-tolyldisulfone compounds.

Examples of the sulfonic acid ester compounds include alkylsulfonic acid esters, haloalkyl sulfonic acid esters, arylsulfonic acid esters, and iminosulfonic acid ester compounds. Preferable ones of the sulfonic acid ester compounds include benzoin-4-tolyl sulfonate, pyrogallol tris(methylsulfonate), nitrobenzyl-9,10-diethoxyanthryl-2-sulfonate, and 2,6-(dinitrobenzyl)phenyl sulfonate.

Examples of the imino sulfonic acid ester compounds include benzylmonooxime-4-tolyl sulfonate, benzylmonooxime-4-dodecylphenyl sulfonate, benzylmonooxime-hexadecyl sulfonate, 4-nitroacetophenoneoxime-4-tolyl sulfonate, 4,4'-dimethylbenzylmonooxime-4-tolyl sulfonate, 4,4'-dimethylbenzylmonooxime-4-dodecylphenyl sulfonate, dibenzylketoneoxime-4-tolyl sulfonate, ethyl α-(4-tolyloxy)imino-α-cyanoacetate, furylmonooxime-4-(aminocarbonyl)phenyl sulfonate, acetoneoxime-4-benzoylphenyl sulfonate, 3-(benzylsulfonyloxy)imino acetylacetone, bis(benzylmonooxide)dioctylnaphthyl disulfonate, α-(4-tolylsulfonyloxy) iminobenzyl cyanide, α-(4-tolylsulfonyloxy)imino-4-methoxybenzyl cyanide, α-(10-camphorsulfonyloxy)imino-4-methoxy benzyl cyanide, and 5-(4-tolylsulfonyloxy)imino-5H-thiophene-2-ylidene-(2-methylphenyl) acetonitrile.

Examples of the carboxylic acid ester compounds include 2-nitrobenzyl carboxylic acid ester.

Examples of the sulfone imide compounds include N-(trifluoromethylsulfonyloxy) succinimide, N-(10-camphorsulfonyloxy) succinimide, N-(4-tolylsulfonyloxy) succinimide, N-(2-trifluoromethylphenylsulfonyloxy) succinimide, N-(4-fluorophenylsulfonyloxy) succinimide, N-(trifluoromethylsulfonyloxy) phthalimide, N-(10-camphorsulfonyloxy) phthalimide, N-(2-trifluoromethylphenylsulfonyloxy) phthalimide, N-(2-fluorophenylsulfonyloxy) phthalimide, N-(trifluoromethylsulfonyloxy)diphenyl maleimide, N-(10-camphorsulfonyloxy)diphenyl maleimide, N-(4-tolylsulfonyloxy)diphenyl maleimide, N-(2-trifluoromethylphenylsulfonyloxy)diphenyl maleimide, N-(4-fluorophenylsulfonyloxy)diphenyl maleimide, N-(4-fluorophenylsulfonyloxy)diphenyl maleimide, N-(trifluoromethylsulfonyloxy)bicyclo[2.2.1]hepto-5-ene-2,3-dicarboxyimide, N-(10-camphorsulfonyloxy)bicyclo[2.2.1]hepto-5-ene-2,3-dicarboxyimide, N-(camphorsulfonyloxy)-7-oxabicyclo[2.2.1]hepto-5-ene-2,3-dicarboxyimide, N-(trifluoromethylsulfonyloxy)-7-oxabicyclo[2.2.1]hepto-5-ene-2,3-dicarboxyimide, N-(4-tolylsulfonyloxy)bicyclo[2.2.1]hepto-5-ene-2,3-dicarboxyimide, N-(4-tolylsulfonyloxy)-7-oxabicyclo[2.2.1]hepto-5-ene-2,3-dicarboxyimide, N-(2-trifluoromethylphenylsulfonyloxy)bicyclo[2.2.1]hepto-5-ene-2,3-dicarboxyimide, N-(2-trifluoromethylphenylsulfonyloxy)-7-oxabicyclo[2.2.1]hepto-5-ene-2,3-dicarboxyimide, N-(4-fluorophenylsulfonyloxy)bicyclo[2.2.1]hepto-5-ene-2,3-dicarboxyimide, N-(4-fluorophenylsulfonyloxy)-7-oxabicyclo[2.2.1]hepto-5-ene-2,3-dicarboxyimide, N-(trifluoromethylsulfonyloxy)bicyclo[2.2.1]heptane-5,6-oxy-2,3-dicarboxyimide, N-(10-camphorsulfonyloxy)bicyclo[2.2.1]heptane-5,6-oxy-2,3-dicarboxyimide, N-(4-tolylsulfonyloxy)bicyclo[2.2.1]heptane-5,6-oxy-2,3-dicarboxyimide, N-(2-trifluoromethylphenylsulfonyloxy)bicyclo[2.2.1]heptane-5,6-oxy-2,3-dicarboxyimide, N-(4-fluorophenylsulfonyloxy)bicyclo[2.2.1]heptane-5,6-oxy-2,3-dicarboxyimide, N-(trifluoromethylsulfonyloxy)naphthyl dicarboxyimide, N-(10-camphorsulfonyloxy)naphthyl dicarboxyimide, N-(4-tolylsulfonyloxy)naphthyl dicarboxyimide, N-(2-trifluoromethylphenylsulfonyloxy)naphthyl dicarboxyimide, N-(4-fluorophenylsulfonyloxy)naphthyl dicarboxyimide, N-(pentafluoroethylsulfonyloxy)naphthyl dicarboxyimide, N-(heptafluoropropylsulfonyloxy)naphthyl dicarboxyimide, N-(nonafluorobutylsulfonyloxy)naphthyl dicarboxyimide, N-(ethylsulfonyloxy)naphthyl dicarboxyimide, N-(propylsulfonyloxy)naphthyl dicarboxyimide, N-(butylsulfonyloxy)naphthyl dicarboxyimide, N-(pentylsulfonyloxy)naphthyl dicarboxyimide, N-(hexylsulfonyloxy)naphthyl dicarboxyimide, N-(heptylsulfonyloxy)naphthyl dicarboxyimide, N-(octylsulfonyloxy)naphthyl dicarboxyimide, and N-(nonylsulfonyloxy)naphthyl dicarboxyimide.

Of these photo-acid generators (C2), nonionic compounds are preferable to ionic compounds from the viewpoint of solubility and cured film's insulation properties. From the viewpoint of the strength of the acid to be generated, more preferable are those which generate benzenesulfonic acid, 4-toluenesulfonic acid, perfluoroalkylsulfonic acid, or phosphoric acid. Sulfonic acid ester compounds, sulfonimide compound, and iminosulfonic acid ester compounds are still more preferable from the viewpoint of high sensitivity in terms of the quantum yield for the j-line (wavelength 313 nm), i-line (wavelength 365 nm), h-line (wavelength 405 nm), and g-line (wavelength 436 nm) and the transparency of the resulting cured films.

In the negative type photosensitive resin composition according to the present invention, the photo-acid generator (C2) preferably accounts for 0.1 part by mass or more, more preferably 0.5 part by mass or more, still more preferably 0.7 part by mass or more, and particularly preferably 1 part by mass or more, relative to the total quantity of the alkali-soluble resin (A) and the radical-polymerizable compound (B) which accounts for 100 parts by mass. A content in the above range ensures improved sensitivity during exposure. On the other hand, the content of the photo-acid generator (C2) is preferably 25 parts by mass or less, more preferably 20 parts by mass or less, still more preferably 17 parts by mass or less, and particularly preferably 15 parts by mass or less. A content in the above range ensures improved halftone characteristics. It also ensures an improved resolution after the development step and the formation of a pattern shape with a small taper.

<Coloring Agent (D)>

The negative type photosensitive resin composition according to the present invention preferably further contains a coloring agent (D).

The coloring agent (D) is a compound that absorbs light in a specific wavelength range and in particular, it is a compound that acts to color a material when absorbing light in the visible light wavelength range (380 to 780 nm).

The incorporation of the coloring agent (D) serves to obtain a colored film from a resin composition and impart coloring capability to the film prepared from a resin composition to allow the light penetrating the film of the resin composition or the light reflected by the film of the resin composition to have a desired color. It also serves to impart light blocking capability so that light in a light in a wavelength range is absorbed by the coloring agent (D) and removed from the light penetrating the film of the resin composition or the light reflected by the film of the resin composition.

The coloring agent (D) may be a compound that absorbs light in a visible light wavelength range for coloring in white, red, orange, yellow, green, blue, or violet. Two or more of such coloring agents may be used in combination to ensure an improved toning capability so that the color coordinates of the light penetrating the film of the resin composition or the light reflected by the film of the resin composition can be adjusted as desired.

For the negative type photosensitive resin composition according to the present invention, the coloring agent (D) preferably contains the pigment (D1) and/or the dye (D2) which will be described later. For the negative type photosensitive resin composition according to the present invention, the coloring agent (D) preferably contains a black coloring agent (Da) and/or a non-black coloring agent (Db).

The black coloring agent (Da) is a compound that acts to color a material black by absorbing light in a visible light wavelength range.

If containing the black coloring agent (Da), the film of a resin composition turns black to improve the light blocking capability so that the light penetrating the film of the resin composition or reflected by the film of the resin composition is blocked efficiently. Thus, such a film can be used suitably in such components as light blocking films for black matrices of color filters, black column spacers of liquid crystal display devices, etc., pixel dividing layers and TFT planarization layers of organic EL display devices, that require increased contrast realized by depression of external light reflection.

From the viewpoint of light blocking capability, the black coloring agent (Da) is preferably a compound that can color a material black by absorbing light over the entire visible light wavelength range. It is also preferable for the coloring agent (D) to be a mixture of two or more selected from coloring agents of white, red, orange, yellow, green, blue, and violet. A combination of two or more of these coloring agents (D) can act to color a material pseudo-black to ensure an improved light blocking capability.

For the negative type photosensitive resin composition according to the present invention, the black coloring agent (Da) preferably contains one or more selected from the group consisting of the black pigment (D1a) which will be described later, the black dye (D2a-1), and/or a mixture of two or more dyes (D2a-2), and the incorporation of the black pigment (D1a) which will be described later, is particularly preferable from the viewpoint of light blocking capability.

The non-black coloring agent (Db) is a compound that acts to color a material by absorbing light in a visible light wavelength range. Examples thereof include coloring agents that serve for coloring in non-black colors including white, red, orange, yellow, green, blue, and violet, as described above.

The incorporation of the black coloring agent (Da) and a non-black coloring agent (Db) serves to impart light blocking capability, and coloring capability and/or toning capability to the film of a resin composition.

For the negative type photosensitive resin composition according to the present invention, the non-black coloring agent (Db) preferably contains the non-black pigment (D1b) and/or the non-black dye (D2b) which will be described later, and more preferably contains the non-black pigment (D1b) which will be described later, from the viewpoint of light blocking capability, and heat resistance or weather resistance.

In the negative type photosensitive resin composition according to the present invention, it is preferable for the coloring agent (D) to account for 15 mass % or more, more preferably 20 mass % or more, still more preferably 25 mass % or more, and particularly preferably 30 mass % or more, of the total quantity of the alkali-soluble resin (A), the coloring agent (D), and the dispersant (E) which will be described later, which accounts for 100 mass %. A content in the above range ensures an improved light blocking capability, coloring capability, or toning capability. On the other hand, it is preferable for the coloring agent (D) to account for 80 mass % or less, more preferably 75 mass % or less, still more preferably 70 mass % or less, and particularly preferably 65 mass % or less. A content in the above range ensures improved sensitivity in the light exposure step.

Furthermore, it is preferable for the coloring agent (D) to account for 5 mass % or more, more preferably 10 mass % or more, still more preferably 15 mass % or more, and particularly more preferably 20 mass % or more, of the total solid content, excluding the solvent, of the negative type photosensitive resin composition according to the present invention. A content in the above range ensures an improved light blocking capability, coloring capability, or toning capability. On the other hand, it is preferable for the coloring agent (D) to account for 70 mass % or less, more preferably 65 mass % or less, still more preferably 60 mass % or less, still more preferably 55 mass % or less, and particularly preferably 50 mass % or less, of the total solid content. A content in the above range ensures improved sensitivity in the light exposure step.

<Pigment (D1)>

For the negative type photosensitive resin composition according to the present invention, the coloring agent (D) preferably contains a pigment (D1). As an embodiment relating to the incorporation of the pigment (D1) in the coloring agent (D), it is preferable that a pigment (D1) is contained as the black coloring agent (Da) and/or the non-black coloring agent (Db).

The pigment (D1) is a compound that works to color a material by physical adsorption of the pigment (D1) on the surface of the material or interaction of the pigment (D1) with the surface of the material, and it is insoluble in most solvents etc. The pigment (D1) serves for coloring with high hiding power and can prevent color fading from being caused by ultraviolet ray etc.

The incorporation of the pigment (D1) ensures coloring in a color with high hiding power and allows the film of the resin composition to have an improved light blocking capability and weather resistance.

The number average particle diameter of the pigment (D1) is preferably 1 to 1,000 nm, more preferably 5 to 500 nm, and still more preferably 10 to 200 nm. If the pigment (D1) has a number average particle diameter in the above range, the film of the resin composition will have an improved light blocking capability and the pigment (D1) will have an improved dispersion stability.

Here, the number average particle diameter of the pigment (D1) can be determined from laser scattering attributed to the Brownian movement of the pigment (D1) in a solution (dynamic light scattering method) that is measured by a submicronic particle size distribution measuring apparatus (N4-PLUS, manufactured by Beckman Coulter K.K.) or a zeta potential/particle diameter/molecular weight measuring apparatus (Zetasizer Nano ZS, manufactured by Sysmex Corporation). On the other hand, the number average particle diameter of the pigment (D1) in a cured film prepared from a resin composition can be measured by SEM and TEM. The number average particle diameter of the pigment (D1) is measured directly at a magnification of 50,000 to 200,000 times. If the pigment (D1) is in the form of perfectly spherical particles, the diameter of the perfect sphere is measured and used as the number average particle diameter. If the pigment (D1) is not in the form of perfectly spherical particles, the longest size across each particle (hereinafter longest diameter) and the longest size in the direction perpendicular to the longest diameter (hereinafter shortest diameter) are measured and the longest diameter and the shortest diameter are averaged to calculate the biaxial average diameter, which is adopted as the number average particle diameter.

Examples of the pigment (D1) include organic pigments and inorganic pigments.

The incorporation of an organic pigment in a resin composition serves to impart coloring capability or toning capability to films of the resin composition. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In addition, organic pigments have better insulation properties and lower dielectricity than most inorganic pigments and accordingly, the incorporation of an organic pigment serves to produce a film with an improved resistance value. In particular, it serves to reduce light emission defects and improve the reliability when applied to insulation layers such as pixel dividing layers in organic EL display devices.

Examples of the organic pigments include phthalocyanine based pigments, anthraquinone based pigments, quinacridone based pigments, pyranthrone based pigments, dioxazine based pigments, thioindigo based pigments, diketopyrrolopyrrole based pigments, quinophtharone based pigments, threne based pigments, indoline based pigments, isoindoline based pigments, isoindolinone based pigments, benzofuranone based pigments, perylene based pigments, aniline based pigments, azo based pigments, azo methine based pigments, condensed azo based pigments, carbon black, metal complex based pigments, lake pigments, toner pigments, and fluorescent pigments. From the viewpoint of heat resistance, anthraquinone based pigments, quinacridone based pigments, pyranthrone based pigments, diketopyrrolopyrrole based pigments, benzofuranone based pigments, perylene based pigments, condensed azo based pigments, and carbon black are preferable.

Examples of the phthalocyanine based pigments include copper phthalocyanine based compounds, halogenated copper phthalocyanine based compounds, and metal-free phthalocyanine based compounds.

Examples of the anthraquinone based pigments include aminoanthraquinone based compounds, diaminoanthraquinone based compounds, anthrapyrimidine based compounds, flavanthrone based compounds, anthanthrone based compounds, indanthrone based compounds, pyranthrone based compounds, and violanthrone based compounds.

Examples of the azo based pigments include disazo based compounds and polyazo based compounds.

The incorporation of an inorganic pigment in a resin composition serves to impart coloring capability or toning capability to films of the resin composition. Being an inorganic substance and higher in heat resistance and weather resistance, furthermore, it will serve to provide a film of the resin composition that has an improved heat resistance and weather resistance.

Examples of the inorganic pigment include titanium oxide, barium carbonate, zirconium oxide, Chinese white, zinc sulfide, lead white, calcium carbonate, barium sulfate, white carbon, alumina white, silicon dioxide, kaolin clay, talc, bentonite, colcothar, molybdenum red, molybdate orange, chrome vermilion, chrome yellow, cadmium yellow, yellow ferric oxide, titanium yellow, chromium oxide, viridian, titanium cobalt green, cobalt green, cobalt chromium green, Victoria green, ultramarine blue, Prussian blue, cobalt blue, cerulean blue, cobalt silica blue, cobalt zinc silica blue, manganese violet, cobalt violet, graphite, and silver tin alloy, as well as fine particles, oxides, composite oxides, sulfides, sulfates, nitrates, carbonates, nitrides, carbides, and acid nitrides of metals such as titanium, copper, iron, manganese, cobalt, chrome, nickel, zinc, calcium, and silver.

For the negative type photosensitive resin composition according to the present invention, the pigment (D1) preferably contains the black pigment (D1a), or the black pigment (D1a) and/or non-black pigment (D1b) which will be described later.

Furthermore, it is preferable for the pigment (D1) to account for 5 mass % or more, more preferably 10 mass % or more, still more preferably 15 mass % or more, and particularly preferably 20 mass % or more, of the total solid content, excluding the solvent, of the negative type photosensitive resin composition according to the present invention. A content in the above range ensures an improved light blocking capability, coloring capability, or toning capability. On the other hand, it is preferable for the pigment (D1) to account for 70 mass % or less, more preferably 65 mass % or less, still more preferably 60 mass % or less, still more preferably 55 mass % or less, and particularly preferably 50 mass % or less, of the total solid content. A content in the above range ensures improved sensitivity in the light exposure step.

<Black Pigment (D1a) and Non-Black Pigment (D2a)>

For the negative type photosensitive resin composition according to the present invention, the pigment (D1) preferably contains a black pigment (D1a), or a black pigment (D1a) and/or a non-black pigment (D1b).

The black pigment (D1a) is a pigment that acts to color a material black by absorbing light in a visible light wavelength range.

The incorporation of the black pigment (D1a) ensures the production of a black film of the resin composition and, since it is also high in hiding power, the film of the resin composition will have an improved light blocking capability.

For the negative type photosensitive resin composition according to the present invention, the black pigment (D1a) is preferably one or more selected from the group consisting of the black organic pigment (D1a-1), the black inorganic pigment (D1a-2), and a mixture of two or more color pigments (D1a-3) which will be described later.

The non-black pigment (D1b) is a pigment that serves for coloring in a non-black color such as violet, blue, green, yellow, orange, red, and white by absorbing light in a visible light wavelength range.

The incorporation of the non-black pigment (D1b) serves to provide a colored film of a resin composition and impart coloring capability or toning capability. The use of a combination of two or more non-black pigments (D1b) serves to provide a film of a resin composition having intended color coordinates to ensure an improved toning capability.

The non-black pigment (D1b) is, for example, a pigment that serves for coloring in a non-black color such as white, red, orange, yellow, green, blue, and violet as described later.

For the negative type photosensitive resin composition according to the present invention, the non-black pigment (D1b) is preferably the non-black organic pigment (D1 b-1) and/or the non-black inorganic pigment (D1b-2) which will be described later.

<Black Organic Pigment (D1a-1), Black Inorganic Pigment (D1a-2), and a Mixture of Two or More Pigments (D1a-3)>

For the negative type photosensitive resin composition according to the present invention, the black pigment (D1a) is preferably one or more selected from the group consisting of a black organic pigment (D1a-1), a black inorganic pigment (D1a-2), and a mixture of two or more color pigments (D1a-3).

The black organic pigment (D1a-1) is an organic pigment that acts to color a material black by absorbing light in a visible light wavelength range.

The incorporation of the black organic pigment (D1a-1) ensures the production of a black film of the resin composition and, since it is also high in hiding power, the film of the resin composition will have an improved light blocking capability. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In addition, the black organic pigment (D1a-1) has better insulation properties and lower dielectricity than most inorganic pigments and accordingly, the incorporation of the black organic pigment (D1a-1) serves to produce a film with an improved resistance value. In particular, it serves to reduce light emission defects and improve the reliability when applied to insulation layers such as pixel dividing layers in organic EL display devices.

Examples of the black organic pigment (D1a-1) include anthraquinone based black pigments, benzofuranone based black pigments, perylene based black pigments, aniline based black pigments, azomethine based black pigments, and carbon black.

Examples of carbon black include channel black, furnace black, thermal black, acetylene black, and lamp black. Channel black is preferable from the viewpoint of light blocking capability.

<Surface-Treated Carbon Black>

The carbon black is preferably in the form of carbon black particles having treated surfaces. Preferable examples of the surface treatment include surface treatment for introducing an acidic group, surface treatment with a silane coupling agent, and treatment for coating with resin.

Performing surface treatment for introducing an acidic group or surface treatment with a silane coupling agent serves to modify the surface conditions of the particles by making the surfaces of the carbon black particles acidic, hydrophilic, hydrophobic, etc., allowing the resin contained in the resin composition and the dispersant (E) which will be described later to work for improving the dispersion stability.

The acidic group to be introduced into carbon black by the surface treatment for acidic group introduction is a substituent group having an acidity as Broensted acid. Examples of the acidic group include carboxyl group, sulfonic acid group, and phosphoric acid group.

The acidic group to be introduced into carbon black may be a part of a salt. Examples of a cation that can form a salt with an acidic group include various metal ions, cations of nitrogen-containing compounds, arylammonium ions, alkylammonium ions, and ammonium ions. From the viewpoint of insulation properties of the cured film, arylammonium ions, alkylammonium ions, and ammonium ions are preferable.

The quantity (number of moles) of the acidic group introduced into carbon black is preferably 1 mmol or more, more preferably 5 mmol or more, in 100 g of the carbon black. A quantity (number of moles) in the above range ensures an improved dispersion stability of the carbon black. On the other hand, the quantity (number of moles) is preferably 200 mmol or less, more preferably 150 mmol or less. A quantity (number of moles) in the above range ensures an improved dispersion stability of the carbon black.

Examples of substituent groups to be introduced into carbon black by the surface treatment with a silane coupling agent (hereinafter surface-treating organosilane) for modifying the surface conditions of carbon black particles include acidic groups, basic groups, hydrophilic groups, and hydrophobic groups. Examples of the acidic groups, basic groups, hydrophilic groups, and hydrophobic groups include alkylsilyl groups and arylsilyl groups, as well as alkylsilyl groups and arylsilyl groups having hydroxyl groups, carboxyl groups, or amino groups.

Good methods for surface treatment with a surface-treating organosilane include mixing and treating a surface-treating organosilane and carbon black. Furthermore, a reaction solvent, water, or catalyst may be added as required.

Examples of the surface-treating organosilane include generally known ones such as methyl trimethoxysilane, methyl triethoxysilane, methyl tri-n-butoxysilane, methyl trichlorosilane, methyl triacetoxysilane, ethyl trimethoxysilane, n-propyl trimethoxysilane, n-hexyl trimethoxysilane, n-decyl trimethoxysilane, phenyl trimethoxysilane, 4-hydroxyphenyl trimethoxysilane, 3-aminopropyl trimethoxysilane, 4-aminophenyl trimethoxysilane, and 3-trimethoxysilylpropyl succinic acid anhydride.

The surface-treating organosilane preferably accounts for 0.01 part by mass or more, more preferably 0.05 part by mass or more, relative to the total quantity of the carbon black and the surface-treating organosilane, which accounts for 100 parts by mass. A content in the above range ensures an improved dispersion stability of the carbon black. On the other hand, the surface-treating organosilane preferably accounts for 20 parts by mass or less, more preferably 15 parts by mass or less. A content in the above range ensures an improved dispersion stability of the carbon black.

It is also preferable for the carbon black to be in the form of carbon black particles having surfaces coated with resin. Coating treatment using a resin (hereinafter coating resin) that can coat carbon black serves to coat the surfaces of the carbon black particles with a low-conductivity coating resin having insulation properties that can modify the surface conditions of the particles, thereby serving to produce a cured film with an improved light blocking capability and insulation properties. This also serves to reduce the leak current to ensure the production of display devices with an improved reliability. Therefore, such a cured film is suited to applications that require insulation properties.

Examples of the coating resin include polyamide, polyamide-imide, epoxy resin, novolac resin, phenol resin, urea resin, melamine resin, polyurethane, diallylphthalate resin, alkylbenzene resin, polystyrene, polycarbonate, polybutylene terephthalate, and modified polyphenylene oxide.

The coating resin preferably accounts for 0.1 part by mass or more, more preferably 0.5 part by mass or more, relative to the total quantity of the carbon black and the coating resin, which accounts for 100 parts by mass. A content in the above range ensures the production of a cured film having an improved light blocking capability and insulation properties. On the other hand, the coating resin preferably accounts for 40 parts by mass or less, more preferably 30 parts by mass or less. A content in the above range ensures the production of a cured film having an improved light blocking capability and insulation properties.

The black inorganic pigment (D1a-2) is an inorganic pigment that acts to color a material black by absorbing light in a visible light wavelength range.

The incorporation of the black inorganic pigment (D1a-2) ensures the production of a black film of the resin composition and, since it is also high in hiding power, the film of the resin composition will have an improved light blocking capability. Being an inorganic substance and higher in heat resistance and weather resistance, furthermore, it will serve to provide a film of the resin composition that has an improved heat resistance and weather resistance.

Examples of the black inorganic pigment (D1a-2) include fine particles, oxides, composite oxides, sulfides, sulfates, nitrates, carbonates, nitrides, carbides, and acid nitrides of graphite, silver tin alloy, and metals such as titanium, copper, iron, manganese, cobalt, chrome, nickel, zinc, calcium, and silver. From the viewpoint of improving the light blocking capability, fine particles, oxides, composite oxides, sulfides, nitrides, carbides, and acid nitrides of titanium or silver are preferable, and nitrides and acid nitrides of titanium are more preferable.

Examples of the black organic pigments and the black inorganic pigments include Pigment Black 1, 6, 7, 12, 20, 31, or 32. (Each figure shows a color index number (hereinafter C. I. number)).

The mixture of two or more pigments (D1a-3) is a combination of two or more pigments selected from pigments of white, red, orange, yellow, green, blue, and violet to work as a pigment mixture for coloring in pseudo-black.

The incorporation of the mixture of two or more pigments (D1a-3) ensures the production of a black film of the resin composition and, since it is also high in hiding power, the film of the resin composition will have an improved light blocking capability. Being a mixture of two or more pigments, furthermore, it can work to permit transmission or blocking of light in an intended specific wavelength range and therefore, its toning capability can be improved by varying the transmission spectrum or absorption spectrum of the film of the resin composition.

Examples of pigments serving for coloring in red include Pigment Red 9, 48, 97, 122, 123, 144, 149, 166, 168, 177, 179, 180, 192, 209, 215, 216, 217, 220, 223, 224, 226, 227, 228, 240, and 250 (each figure shows a C. I. number).

Examples of pigments serving for coloring in orange include Pigment Orange 12, 36, 38, 43, 51, 55, 59, 61, 64, 65, and 71 (each figure shows a C. I. number).

Examples of pigments serving for coloring in yellow include Pigment Yellow 12, 13, 17, 20, 24, 83, 86, 93, 95, 109, 110, 117, 125, 129, 137, 138, 139, 147, 148, 150, 153, 154, 166, 168, and 185 (each figure shows a C. I. number).

Examples of pigments serving for coloring in green include Pigment Green 7, 10, 36, and 58 (each figure shows a C. I. number).

Examples of pigments serving for coloring in blue include Pigment Blue 15, 15:3, 15:4, 15:6, 22, 60, and 64 (each figure shows a C. I. number).

Examples of pigments serving for coloring in violet include Pigment Violet 19, 23, 29, 30, 32, 37, 40, and 50 (each figure shows a C. I. number).

Examples of pigments serving for coloring in white include titanium oxide, barium carbonate, zirconium oxide, Chinese white, zinc sulfide, lead white, calcium carbonate, barium sulfate, white carbon, alumina white, silicon dioxide, kaolin clay, talc, and bentonite.

<Non-Black Organic Pigment (D1 b-1) and Non-Black Inorganic Pigment (D1b-2)>

For the negative type photosensitive resin composition according to the present invention, the non-black pigment (D1b) is preferably a non-black organic pigment (D1b-1) and/or a non-black inorganic pigment (D1b-2).

The non-black organic pigment (D1b-1) is an organic pigment that serves for coloring in a non-black color such as white, red, orange, yellow, green, blue, and violet by absorbing light in a visible light wavelength range.

The incorporation of the non-black organic pigment (D1 b-1) serves to provide a colored film of a resin composition and impart coloring capability or toning capability. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. The use of a combination of two or more non-black organic pigments (D1b-1) serves to provide a film of a resin composition having intended color coordinates to ensure an improved toning capability.

The non-black organic pigment (D1b-1) is an organic pigment that serves for coloring in a non-black color such as white, red, orange, yellow, green, blue, and violet.

Examples of the non-black organic pigment (D1b-1) include phthalocyanine based pigments, anthraquinone based pigments, quinacridone based pigments, pyranthrone based pigments, dioxazine based pigments, thioindigo based pigments, diketopyrrolopyrrole based pigments, quinophtharone based pigments, threne based pigments, indoline based pigments, isoindoline based pigments, isoindolinone based pigments, benzofuranone based pigments, perylene based pigments, aniline based pigments, azo based pigments, azo methine based pigments, metal complex based pigments, lake pigments, toner pigments, and fluorescent pigments.

The non-black inorganic pigment (D1b-2) is an inorganic pigment that serves for coloring in a non-black color such as white, red, orange, yellow, green, blue, and violet by absorbing light in a visible light wavelength range.

The incorporation of the non-black inorganic pigment (D1b-2) serves to provide a colored film of a resin composition and impart coloring capability or toning capability. Being an inorganic substance and higher in heat resistance and weather resistance, furthermore, it will serve to provide a film of the resin composition that has an improved heat resistance and weather resistance. The use of a combination of two or more non-black inorganic pigments (D1b-2) serves to provide a film of a resin composition having intended color coordinates to ensure an improved toning capability.

The use of a combination of two or more non-black inorganic pigments (D1b-2) serves to provide a film of a resin composition having intended color coordinates to ensure an improved toning capability.

The non-black inorganic pigments (D1b-2) is an inorganic pigment that serves for coloring in a non-black color such as white, red, orange, yellow, green, blue, and violet.

Examples of the non-black inorganic pigments (D1b-2) include titanium oxide, barium carbonate, zirconium oxide, Chinese white, zinc sulfide, lead white, calcium carbonate, barium sulfate, white carbon, alumina white, silicon dioxide, kaolin clay, talc, bentonite, colcothar, molybdenum red, molybdenum orange, chrome vermilion, chrome yellow, cadmium yellow, yellow ferric oxide, titanium yellow, chrome oxide, viridian, titanium cobalt green, cobalt green, cobalt chrome green, Victoria green, ultramarine blue, Prussian blue, cobalt blue, cerulean blue, cobalt silica blue, cobalt zinc silica blue, manganese violet, and cobalt violet.

<Benzofuranone Based Black Pigment (D1a-1a) and Perylene Based Black Pigment (D1a-1b)>

For the negative type photosensitive resin composition according to the present invention, the black organic pigment (D1a-1) is preferably a benzofuranone based black pigment (D1a-1a) and/or a perylene based black pigment (D1a-1b).

The benzofuranone based black pigment (D1a-1a) is a compound having a benzofuran-2(3H)-one structure or a benzofuran-3(2H)-one structure in the molecule and serving for coloring in black by absorbing light in a visible light wavelength range.

The incorporation of the benzofuranone based black pigment (D1a-1a) ensures the production of a black film of the resin composition and, since it is also high in hiding power, the film of the resin composition will have an improved light blocking capability. In particular, as compared with common organic pigments, it is higher in light blocking capability per unit pigment content in a resin composition and accordingly, a smaller quantity of it can be as effective in imparting light blocking capability. The incorporation of the benzofuranone based black pigment (D1a-1a), therefore, ensures the production of a film with an improved light blocking capability, and also ensures an improved sensitivity in the light exposure step. Furthermore, it absorbs light in a visible light wavelength range while transmitting light in an ultraviolet wavelength range (for example, 400 nm or less), thereby ensuring an improved sensitivity in the light exposure step. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In particular, being able to improve the transmittance in a near-infrared wavelength range (for example, 700 nm or more), it can be applied suitably to uses that require light blocking capability and utilize light in a near-infrared wavelength range. In addition, having better insulation properties and lower dielectricity than most inorganic pigments and organic pigments and accordingly, the incorporation of the benzofuranone based black pigment (D1a-1a) serves to produce a film with an improved resistance value. In particular, it serves to reduce light emission defects and improve the reliability when applied to insulation layers such as pixel dividing layers in organic EL display devices.

The benzofuranone based black pigment (D1a-1a) is preferably a benzofuranone compound as represented by any of general formulae (63) to (68), a geometrical isomer thereof, a salt thereof, or a geometrical isomer salt thereof.

[Chemical formula 31]

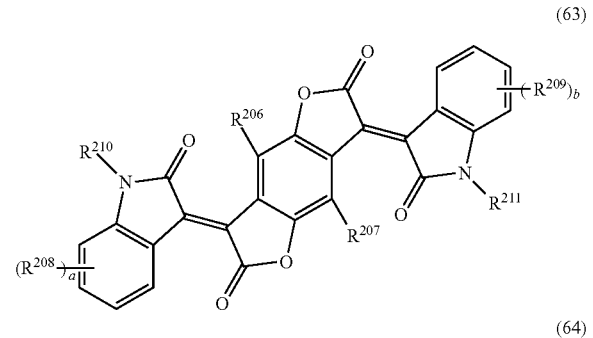
(63)

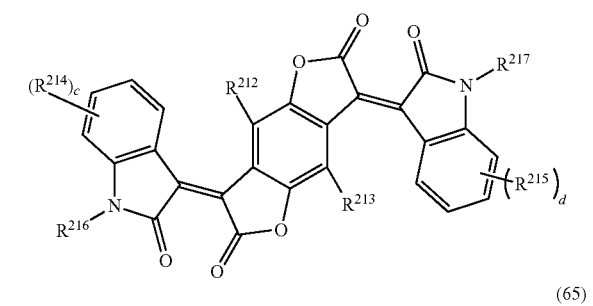
(64)

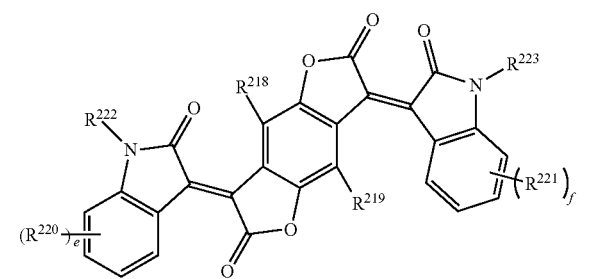
(65)

In general formulae (63) to (65), $R^{206}$, $R^{207}$, $R^{212}$, $R^{213}$, $R^{218}$, and $R^{219}$ are each independently a hydrogen atom, a halogen atom, an alkyl group containing 1 to 10 carbon atoms, or an alkyl group containing 1 to 10 carbon atoms and 1 to 20 fluorine atoms. $R^{208}$, $R^{209}$, $R^{214}$, $R^{215}$, $R^{220}$, and $R^{221}$ are each independently a hydrogen atom, a halogen atom, $R^{251}$, COOH, COOR$^{251}$, COO—, CONH$_2$, CONHR$^{251}$, CONR$^{251}$R$^{252}$, CN, OH, OR$^{251}$, OCOR$^{251}$, OCONH$_2$, OCONHR$^{251}$, OCONR$^{251}$R$^{252}$, NO$_2$, NH$_2$, NHR$^{251}$, NR$^{251}$R$^{252}$, NHCOR$^{251}$, NR$^{251}$COR$^{252}$, N=CH$_2$, N=CHR$^{251}$, N=CR$^{251}$R$^{252}$, SH, SR$^{251}$, SOR$^{251}$, SO$_2$R$^{251}$, SO$_3$R$^{251}$, SO$_3$H, SO$_3^-$, SO$_2$NH$_2$, SO$_2$NHR$^{251}$, or SO$_2$NR$^{251}$R$^{252}$, and $R^{251}$ and $R^{252}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing carbon atoms 2 to 10. A plurality selected from $R^{208}$, $R^{209}$, $R^{214}$, $R^{215}$, $R^{220}$, and $R^{221}$ may be connected by a direct bond, oxygen atom bridge, sulfur atom bridge, NH bridge, or NR$^{251}$ bridge to form a ring. $R^{210}$, $R^{211}$, $R^{216}$, $R^{217}$, $R^{222}$, and $R^{223}$ are each independently a hydrogen atom, an alkyl group containing 1 to 10 carbon atoms, or an aryl group containing 6 to 15 carbon atoms. Furthermore, a, b, c, d, e, and f are each independently an integer of 0 to 4. In general formulae (63) to (65), it is preferable that $R^{206}$, $R^{207}$, $R^{212}$, $R^{213}$, $R^{218}$, and $R^{219}$ are each independently a hydrogen atom, a halogen atom, an alkyl group containing 1 to 6 carbon atoms, or an alkyl group containing 1 to 6 carbon atoms and 1 to 12 fluorine atoms. Furthermore, $R^{251}$ and $R^{252}$ are each independently an alkyl group containing 1 to 6 carbon atoms, a cycloalkyl group containing 4 to 7 carbon atoms, an alkenyl group containing 2 to 6 carbon atoms, an cycloalkenyl group containing 4 to 7 carbon atoms, or an alkynyl group containing 2 to 6 carbon atoms. Moreover, $R^{210}$, $R^{211}$, $R^{216}$, $R^{217}$, $R^{222}$, and $R^{223}$ are each independently a hydrogen atom, an alkyl group containing 1 to 6 carbon atoms, or an aryl group containing 6 to 10 carbon atoms. The above alkyl group, cycloalkyl group, alkenyl group, cycloalkenyl group, alkynyl group, and aryl group may have a heteroatom, and may each be either a substitution product or a non-substitution product.

[Chemical formula 32]

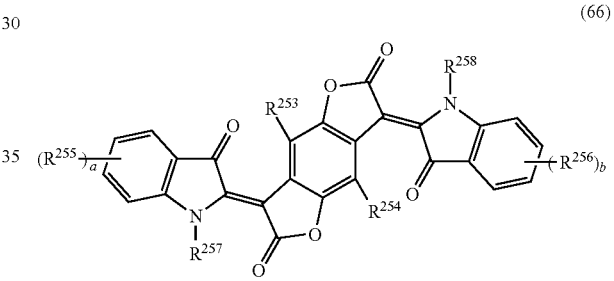
(66)

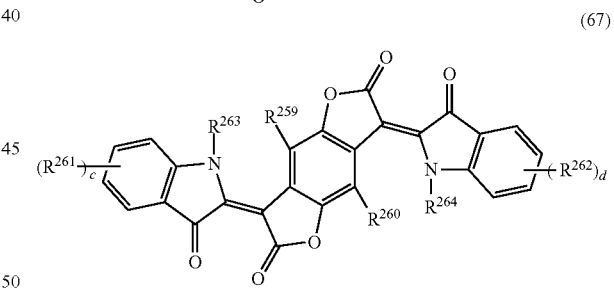
(67)

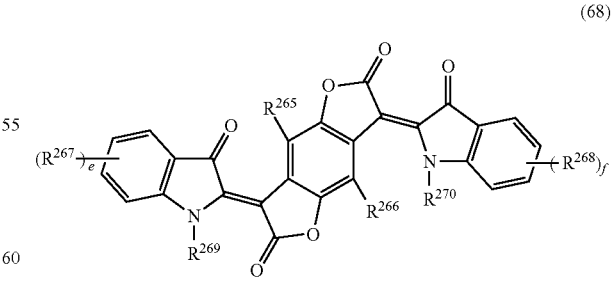
(68)

In general formulae (66) to (68), $R^{253}$, $R^{254}$, $R^{259}$, $R^{260}$, $R^{265}$, and $R^{266}$ are each independently a hydrogen atom, a halogen atom, an alkyl group containing 1 to 10 carbon atoms, or an alkyl group containing 1 to 10 carbon atoms and 1 to 20 fluorine atoms. $R^{255}$, $R^{256}$, $R^{261}$, $R^{262}$, $R^{267}$, and $R^{268}$ are each independently a hydrogen atom, a halogen atom, $R^{271}$, COOH, COOR$^{271}$, COO—, CONH$_2$, CONHR$^{271}$, CONR$^{271}$R$^{272}$, CN, OH, OR$^{271}$, OCOR$^{271}$, OCONH$_2$, OCONHR$^{271}$, OCONR$^{271}$R$^{272}$, NO$_2$, NH$_2$, NHR$^{271}$, NR$^{271}$R$^{272}$, NHCOR$^{271}$, NR$^{271}$COR$^{272}$, N=CH$_2$, N=CHR$^{271}$, N=CR$^{271}$R$^{272}$, SH, SR$^{271}$, SOR$^{271}$, SO$_2$R$^{271}$, SO$_3$R$^{271}$, SO$_3$H, SO$_3^-$, SO$_2$NH$_2$, SO$_2$NHR$^{271}$, or SO$_2$NR$^{271}$R$^{272}$, and $R^{271}$ and $R^{272}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing 2 to 10 carbon atoms. A plurality selected from $R^{255}$, $R^{256}$, $R^{261}$, $R^{262}$, $R^{267}$, and $R^{268}$ may be connected by a direct bond, oxygen atom bridge, sulfur atom bridge, NH bridge, or NR$^{271}$ bridge to form a ring. $R^{287}$, $R^{258}$, $R^{263}$, $R^{264}$, $R^{269}$, and $R^{270}$ are each independently a hydrogen atom, an alkyl group containing 1 to 10 carbon atoms, or an aryl group containing 6 to 15 carbon atoms. Furthermore, a, b, c, d, e, and f are each independently an integer of 0 to 4. In general formulae (66) to (68), it is preferable that $R^{253}$, $R^{254}$, $R^{259}$, $R^{260}$, $R^{265}$, and $R^{266}$ are each independently a hydrogen atom, a halogen atom, an alkyl group containing 1 to 6 carbon atoms, or an alkyl group containing 1 to 6 carbon atoms and 1 to 12 fluorine atoms. Furthermore, $R^{271}$ and $R^{272}$ are each independently an alkyl group containing 1 to 6 carbon atoms, a cycloalkyl group containing 4 to 7 carbon atoms, an alkenyl group containing 2 to 6 carbon atoms, an cycloalkenyl group containing 4 to 7 carbon atoms, or an alkynyl group containing 2 to 6 carbon atoms. Moreover, $R^{257}$, $R^{258}$, $R^{263}$, $R^{264}$, $R^{269}$, and $R^{270}$ are each independently a hydrogen atom, an alkyl group containing 1 to 6 carbon atoms, or an aryl group containing 6 to 10 carbon atoms. The above alkyl group, cycloalkyl group, alkenyl group, cycloalkenyl group, alkynyl group, and aryl group may have a heteroatom, and may each be either a substitution product or a non-substitution product.

Examples of the benzofuranone based black pigment (D1a-1a) include IRGAPHOR (registered trademark) BLACK S0100CF (manufactured by BASF), black pigments as described in International Publication WO 2010-081624, and black pigments as described in International Publication WO 2010-081756.

The perylene based black pigment (D1a-1b) is a compound having a perylene structure in the molecule and serving for coloring in black by absorbing light in a visible light wavelength range.

The incorporation of the perylene based black pigment (D1a-1b) ensures the production of a black film of the resin composition and, since it is also high in hiding power, the film of the resin composition will have an improved light blocking capability. In particular, as compared with common organic pigments, it is higher in light blocking capability per unit pigment content in a resin composition and accordingly, a smaller quantity of it can be as effective in imparting light blocking capability. The incorporation of the perylene based black pigment (D1a-1b), therefore, ensures the production of a film with an improved light blocking capability, and also ensures an improved sensitivity in the light exposure step. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In particular, being able to improve the transmittance in a near-infrared wavelength range (for example, 700 nm or more), it can be applied suitably to uses that require light blocking capability and utilize light in a near-infrared wavelength range. In addition, having better insulation properties and lower dielectricity than most inorganic pigments and organic pigments and accordingly, the incorporation of the perylene based black pigment (D1a-1b) serves to produce a film with an improved resistance value. In particular, it serves to reduce light emission defects and improve the reliability when applied to insulation layers such as pixel dividing layers in organic EL display devices.

The perylene based black pigment (D1a-1b) is preferably a perylene compound as represented by any of general formulae (69) to (71), a geometrical isomer thereof, a salt thereof, or a geometrical isomer salt thereof.

[Chemical formula 33]

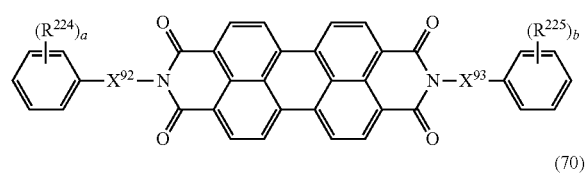

(69)

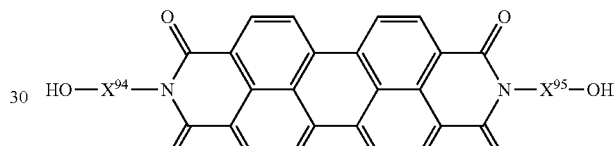

(70)

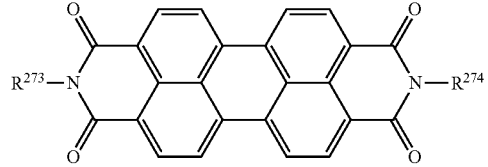

(71)

In general formulae (69) to (71), $X^{92}$, $X^{93}$, $X^{94}$, and $X^{95}$ are each independently an alkylene chain containing 1 to 10 carbon atoms. $R^{224}$ and $R^{225}$ are each independently a hydrogen atom, a hydroxyl group, an alkoxy group containing 1 to 6 carbon atoms, or an acyl group containing 2 to 6 carbon atoms. $R^{273}$ and $R^{274}$ are each independently a hydrogen atom or an alkyl group containing 1 to 10 carbon atoms. Furthermore, a and b are each an integer of 0 to 5. In general formulae (69) to (71), it is preferable that $X^{92}$, $X^{93}$, $X^{94}$, and $X^{95}$ are each independently an alkylene chain containing 1 to 6 carbon atoms. Furthermore, it is preferable that $R^{224}$ and $R^{225}$ are each independently a hydrogen atom, a hydroxyl group, an alkoxy group containing 1 to 4 carbon atoms, or an acyl group containing 2 to 4 carbon atoms. It is preferable that $R^{273}$ and $R^{274}$ are each independently a hydrogen atom or an alkyl group containing 1 to 6 carbon atoms. The above alkylene chain, alkoxy group, acyl group, and alkyl group may have a heteroatom, and may each be either a substitution product or a non-substitution product.

Examples of the perylene based black pigment (D1a-1b) include Pigment Black 21, 30, 31, 32, 33, and 34 (each figure shows a C. I. number).

In addition to the above ones, other examples include PALIOGEN (registered trademark) BLACK S0084, K0084, L0086, K0086, EH0788, and FK4281 (all manufactured by BASF).

Furthermore, it is preferable for the benzofuranone based black pigment (D1a-1a) and/or perylene based black pigment (D1a-1b) to account for 5 mass % or more, more preferably 10 mass % or more, still more preferably 15 mass % or more, and particularly preferably 20 mass % or more, of the total solid content, excluding the solvent, of the negative type photosensitive resin composition according to the present invention. A content in the above range ensures an improved light blocking capability and toning capability. On the other hand, it is preferable for the benzofuranone based black pigment (D1a-1a) and/or perylene based black pigment (D1a-1b) to account for 70 mass % or less, more preferably 65 mass % or less, still more preferably 60 mass % or less, still more preferably 55 mass % or less, and particularly preferably 50 mass % or less, of the total solid content. A content in the above range ensures improved sensitivity in the light exposure step.

Furthermore, it is preferable for the perylene based black pigment (D1a-1b) to account for 5 mass % or more, more preferably 10 mass % or more, and still more preferably 15 mass % or more, of the solid content, excluding the solvent, of the negative type photosensitive resin composition according to the present invention. A content in the above range ensures an improved light blocking capability and toning capability. On the other hand, it is preferable for the perylene based black pigment (D1a-1b) to account for 70 mass % or less, more preferably 65 mass % or less, and still more preferably 60 mass % or less, of the solid content. A content in the above range ensures improved sensitivity in the light exposure step.

<Dye (D2)>

For the negative type photosensitive resin composition according to the present invention, the coloring agent (D) preferably contains a dye (D2). As an embodiment relating to the incorporation of the dye (D2) in the coloring agent (D), it is preferable that a dye (D2) is contained as the black coloring agent (Da) and/or the non-black coloring agent (Db).

The dye (D2) is a compound that works to color a material as a result of a substituent group such as an ionic group and hydroxyl group in the dye (D2) being chemically adsorbed on or strongly interacting with the surface structure of the material, and it is soluble in most solvents etc. The coloring by the dye (D2) is achieved as a result of the adsorption of individual molecules on the material, leading to a high coloring power and a high color development efficiency.

The incorporation of the dye (D2) ensures coloring in a color with high coloring power and allows the film of the resin composition to have an improved coloring capability and toning capability.

Examples of the dye (D2) include direct dye, reactive dye, sulfur dye, vat dye, acidic dye, metallized dye, metallized acidic dye, basic dye, mordant dye, acidic mordant dye, disperse dye, cation dye, or fluorescent whitening dye.

Examples of the dye (D2) include anthraquinone based dye, azo based dye, azine based dye, phthalocyanine based dye, methine based dye, oxazine based dye, quinoline based dye, indigo based dye, indigoid based dye, carbonium based dye, threne based dye, perinone based dye, perylene based dye, friaryl methane based dye, and xanthene based dye. From the viewpoint of the solubility in the solvents described later and heat resistance, preferable are anthraquinone based dye, azo based dye, azine based dye, methine based dye, friaryl methane based dye, and xanthene based dye.

The incorporation of the dye (D2) serves to impart coloring capability or toning capability to films of the resin composition.

For the negative type photosensitive resin composition according to the present invention, the dye (D2) preferably contains the black dye (D2a-1), mixture of two or more dyes (D2a-2) and/or non-black dye (D2b) that will be described later.

Furthermore, it is preferable for the dye (D2) to account for 0.01 mass % or more, more preferably 0.05 mass % or more, and still more preferably 0.1 mass % or more, of the total solid content, excluding the solvent, of the negative type photosensitive resin composition according to the present invention. A content in the above range ensures an improved coloring capability or toning capability. On the other hand, it is preferable for the dye (D2) to account for 50 mass % or less, more preferably 45 mass % or less, and still more preferably 40 mass % or less, of the total solid content. A content in the above range ensures the production of a cured film having an improved heat resistance.

<Black Dye (D2a-1), Mixture of Two or More Dyes (D2a-2), and Non-Black Dye (D2b)>

For the negative type photosensitive resin composition according to the present invention, the dye (D2) preferably contains a black dye (D2a-1), a mixture of two or more dyes (D2a-2) and/or a non-black dye (D2b).

The black dye (D2a-1) is a dye that acts to color a material black by absorbing light in a visible light wavelength range.

The incorporation of the black dye (D2a-1) ensures the production of a black film of the resin composition and, since it is also high in coloring capability, the film of the resin composition will have an improved light blocking capability.

Useful examples of the black dye (D2a-1) include generally known ones such as Solvent Black 3, 5, 7, 22, 27, 29, and 34, Mordant Black 1, 11, and 17, Acid Black 2 and 52, and Direct Black 19 and 154 (each figure shows a C. I. number).

The mixture of two or more dyes (D2a-2) is a combination of two or more dyes selected from dyes of white, red, orange, yellow, green, blue, and violet to work as a dye mixture for coloring in pseudo-black.

The incorporation of the mixture of two or more dyes (D2a-2) ensures the production of a black film of the resin composition and, since it is also high in coloring capability, the film of the resin composition will have an improved light blocking capability. Being a mixture of two or more dyes, furthermore, it can work to permit transmission or blocking of light in an intended specific wavelength range and therefore, its toning capability can be improved by varying the transmission spectrum or absorption spectrum of the film of the resin composition.

Examples of dyes serving for coloring in red include generally known ones such as Direct Red 2, 23, 62, 111, 207, and 247, Acid Red 35, 80, 111, 143, 211, and 397, Reactive Red 3, 21, 35, 40, and 55, and Basic Red 12, 22, 35, 45, and 46 (each figure shows a C. I. number).

Examples of dyes serving for coloring in orange include Basic Orange 21 and 23 (each figure shows a C. I. number).

Examples of dyes serving for coloring in yellow include generally known ones such as Direct Yellow 8, 27, 87, 100, 130, and 163, Acid Yellow 17, 40, 76, 110, 222, and 227, Reactive Yellow 2, 13, 23, 35, and 42, and Basic Yellow 1, 11, 21, 32, and 40 (each figure shows a C. I. number).

Examples of dyes serving for coloring in green include generally known ones such as Acid Green 16 (each figure shows a C. I. number).

Examples of dyes serving for coloring in blue include generally known ones such as Acid Blue 9, 45, 80, 83, 90, and 185 (each figure shows a C. I. number).

Examples of dyes serving for coloring in violet include generally known ones such as Direct Violet 7, 47, 66, 90, and 101, Acid Violet 5, 11, 34, 75, and 126, Reactive Violet 1, 16, 22, 27, and 34, and Basic Violet 1, 10, 20, 35, and 48 (each figure shows a C. I. number).

The non-black dye (D2b) is a dye that serves for coloring in a non-black color such as white, red, orange, yellow, green, blue, and violet by absorbing light in a visible light wavelength range.

The incorporation of a non-black dye (D2b) serves to provide a colored film of a resin composition and impart coloring capability or toning capability. The use of a combination of two or more non-black dyes (D2b) serves to provide a film of a resin composition having intended color coordinates to ensure an improved toning capability.

The non-black dye (D2b) is a dye that serves for coloring in a non-black color such as white, red, orange, yellow, green, blue, and violet as described above.

A cured film prepared by curing the negative type photosensitive resin composition according to the present invention preferably has an optical density of 0.3 or more, more preferably 0.5 or more, still more preferably 0.7 or more, and particularly preferably 1.0 or more, per micrometer of film thickness. If the optical density per micrometer of film thickness is in the above range, the resulting cured film will serve to improve the light blocking capability, thereby preventing the electrode wiring from becoming visible and reducing the external light reflection to ensure an improved contrast in image displaying in display apparatuses such as organic EL display devices and liquid crystal display devices. Thus, such a film can be used suitably in such components as light blocking films for black matrices of color filters, black column spacers of liquid crystal display devices, etc., pixel dividing layers and TFT planarization layers of organic EL display devices, that require increased contrast realized by depression of external light reflection. On the other hand, a cured film prepared by curing the negative type photosensitive resin composition preferably has an optical density of 5.0 or less, more preferably 4.0 or less, and still more preferably 3.0 or less, per micrometer of film thickness. If the optical density per micrometer of film thickness is in the above range, it ensures an improved sensitivity in the light exposure step and the formation of a pattern shape with a small taper. The optical density per micrometer of film thickness of a cured film can be controlled by varying the components and their contents of the coloring agent (D) described above.

<Dispersant (E)>

The negative type photosensitive resin composition according to the present invention preferably further contains a dispersant (E).

The dispersant (E) is a compound that has a surface affinity group to interact with the surface of the aforementioned pigment (D1) or disperse dye or a dispersion stabilization structure to improve the dispersion stability of the pigment (D1) or disperse dye. Such dispersion stabilization structures of the dispersant (E) include polymer chains and/or substituent groups with electrostatic charges.

If the resin composition contains a disperse dye as the pigment (D1) and/or the dye (D2), the incorporation of the dispersant (E) serves to improve its dispersion stability to ensure an improved resolution after the development step. In particular, if for example the pigment (D1) is in the form of particles crushed to a number average particle diameter of 1 µm or less, the surface area of the particles of the pigment (D1) will increase and the particles of the pigment (D1) will undergo aggregation easily. On the other hand, if the pigment (D1) is contained, the surface of the crushed pigment (D1) will interact with the surface affinity group in the dispersant (E), and the dispersion stabilization structure of the dispersant (E) will give rise to steric hindrance and/or electrostatic repulsion, which can work to impede the aggregation of the particles of the pigment (D1) to ensure an improved dispersion stability.

Examples of the dispersant (E) having a surface affinity group include a dispersant (E) having only an amine value, a dispersant (E) having both an amine value and an acid value, a dispersant (E) having only an acid value, and a dispersant (E) having neither an amine value nor an acid value. From the viewpoint of improving the dispersion stability of the particles of the pigment (D1), it is preferable to adopt a dispersant (E) having only an amine value or a dispersant (E) having both an amine value and an acid value.

It is preferable for the dispersant (E) having a surface affinity group to have a structure in which the amino group and/or the acidic group working as surface affinity groups form a salt with an acid and/or a base.

Examples of the dispersant (E) having only an amine value include DISPERBYK (registered trademark) -108, -109, -160, -161, -162, -163, -164, -166, -167, -168, -182, -184, -185, -2000, -2008, -2009, -2022, -2050, -2055, -2150, -2155, -2163, -2164, and -2061; BYK (registered trademark) -9075, -9077, -LP-N6919, -LP-N21116, and -LP-N21324 (all manufactured by BYK-Chemie Japan); EFKA (registered trademark) 4015, 4020, 4046, 4047, 4050, 4055, 4060, 4080, 4300, 4330, 4340, 4400, 4401, 4402, 4403, and 4800 (all manufactured by BASF); Ajisper (registered trademark) PB711 (manufactured by Ajinomoto Fine-Techno Co., Inc.); and SOLSPERSE (registered trademark) 13240, 13940, 20000, 71000, and 76500 (all manufactured by Lubrizol).

Examples of the dispersant (E) having both an amine value and an acid value include ANTI-TERRA (registered trademark) -U100 and -204; DISPERBYK (registered trademark) -106, -140, -142, -145, -180, -2001, -2013, -2020, -2025, -187, and -191; BYK (registered trademark) -9076 (manufactured by BYK-Chemie Japan); Ajisper (registered trademark) PB821, PB880, and PB881 (all manufactured by Ajinomoto Fine-Techno Co., Inc.); and SOLSPERSE (registered trademark) 9000, 11200, 13650, 24000, 32000, 32500, 32500, 32600, 33000, 34750, 35100, 35200, 37500, 39000, 56000, and 76500 (all manufactured by Lubrizol).

Examples of the dispersant (E) having only an acid value include DISPERBYK (registered trademark) -102, -110, -111, -118, -170, -171, -174, -2060, and -2096; BYK (registered trademark) -P104, -P105, and -220S (all manufactured by BYK-Chemie Japan); and SOLSPERSE (registered trademark) 3000, 16000, 17000, 18000, 21000, 26000, 28000, 36000, 36600, 38500, 41000, 41090, 53095, and 55000 (all manufactured by Lubrizol).

Examples of the dispersant (E) having neither an amine value nor an acid value include DISPERBYK (registered trademark) -103, -2152, -2200, and -192 (all manufactured by BYK-Chemie Japan); and SOLSPERSE (registered trademark) 27000, 54000, and X300 (all manufactured by Lubrizol).

The amine value of a dispersant (E) is preferably 5 mgKOH/g or more, more preferably 8 mgKOH/g or more, and still more preferably 10 mgKOH or more. An amine value in the above range ensures an improved dispersion stability of the pigment (D1). On the other hand, the amine value of a dispersant (E) is preferably 150 mgKOH/g or less, more preferably 120 mgKOH/g or less, and still more preferably 100 mgKOH/g or less. An amine value in the above range ensures an improved storage stability of the resin composition.

The amine value referred to herein is the mass of the equivalent amount of potassium hydroxide to an acid that reacts with 1 g of the dispersant (E) and it is expressed in mgKOH/g. It can be determined by neutralizing 1 g of the dispersant (E) with an acid, followed by titration with an aqueous potassium hydroxide solution. From the amine value, the amine equivalent (in g/mol), which represents the mass of resin per mol of amino group, can be calculated and then the number of amino groups in the dispersant (E) can be determined, The acid value of a dispersant (E) is preferably 5 mgKOH/g or more, more preferably 8 mgKOH/g or more, and still more preferably 10 mgKOH or more. An acid value in the above range ensures an improved dispersion stability of the pigment (D1). On the other hand, the acid value of a dispersant (E) is preferably 200 mgKOH/g or less, more preferably 170 mgKOH/g or less, and still more preferably 150 mgKOH/g or less. An acid value in the above range ensures an improved storage stability of the resin composition.

The acid value referred to herein is the mass of potassium hydroxide that reacts with 1 g of the dispersant (E) and expressed in mgKOH/g. It can be determined by titrating 1 g of the dispersant (E) with an aqueous potassium hydroxide solution. From the acid value, the acid equivalent (in g/mol), which represents the mass of resin per mol of acid group, can be calculated and then the number of acid groups in the dispersant (E) can be determined, Examples of a dispersant (E) having a polymer chain include acrylic resin based dispersants, polyoxyalkylene ether based dispersants, polyester based dispersants, polyurethane based dispersants, polyol based dispersants, polyethylene imine based dispersants, and polyallyl amine based dispersants. From the viewpoint of pattern processability in an alkaline developer, acrylic resin based dispersants, polyoxyalkylene ether based dispersants, polyester based dispersants, polyurethane based dispersants, and polyol based dispersants are preferable.

If the negative type photosensitive resin composition according to the present invention contains a disperse dye as the pigment (D1) and/or the dye (D2), it is preferable for the dispersant (E) to account for 1 mass % or more, more preferably 5 mass % or more, and still more preferably 10 mass % or more, of the total quantity of the pigment (D1) and/or the disperse dye and the dispersant (E), which accounts for 100 mass %, in the negative type photosensitive resin composition according to the present invention. A content in the above range ensures an improved dispersion stability of the pigment (D1) and/or disperse dye and an improved resolution after the development step. On the other hand, the content of the dispersant (E) is preferably 60 mass % or less, more preferably 55 mass % or less, and still more preferably 50 mass % or less. A content in the above range ensures the production of a cured film having an improved heat resistance.

<Sensitizer>

The negative type photosensitive resin composition according to the present invention preferably further contains a sensitizer.

The sensitizer is a compound that absorbs energy obtained from light exposure, generates excited triplet electrons through internal conversion and intersystem crossing, and acts for energy transfer to the aforementioned photo-initiator (C1) or photo-acid generator (C2).

The incorporation of the sensitizer serves to improve the sensitivity in the light exposure step. Regarding the mechanism, it is inferred as follows: the sensitizer absorbs long-wavelength light that is not absorbed by the photo-initiator (C1) or the photo-acid generator (C2) and its energy is transferred from the sensitizer to the photo-initiator (C1) or the photo-acid generator (C2), leading to an improved efficiency of photo-reaction.

The sensitizer is preferably a thioxanthone based one. Examples of the thioxanthone based sensitizer include thioxanthone, 2-methyl thioxanthone, 2-chlorothioxanthone, 2-isopropyl thioxanthone, 2,4-dimethyl thioxanthone, 2,4-diethyl thioxanthone, and 2,4-dichlorothioxanthone.

In the negative type photosensitive resin composition according to the present invention, the sensitizer preferably accounts for 0.01 part by mass or more, more preferably 0.1 part by mass or more, still more preferably 0.5 part by mass or more, and particularly preferably 1 part by mass or more, relative to the total quantity of the alkali-soluble resin (A) and the radical-polymerizable compound (B), which accounts for 100 parts by mass. A content in the above range ensures an improved sensitivity in the light exposure step. On the other hand, the content of the sensitizer is preferably 15 parts by mass or less, more preferably 13 parts by mass or less, still more preferably 10 parts by mass or less, and particularly preferably 8 parts by mass or less. A content in the above range ensures an improved resolution after development and the formation of a pattern shape with a small taper.

<Chain Transfer Agent>

The negative type photosensitive resin composition according to the present invention preferably further contains a chain transfer agent.

The chain transfer agent is a compound that receives radicals from growing polymer chain ends of polymer chains resulting from radical polymerization in the light exposure step and transfers the radicals to other polymer chains.

The incorporation of the chain transfer agent serves to improve the sensitivity in the light exposure step. Regarding the mechanism, it is inferred that radical crosslinking progresses deeply into the film as the radicals generated by light exposure are transferred to other polymer chains by the chain transfer agent. In particular, if for example the resin composition contains a black coloring agent (Da) as the aforementioned coloring agent (D), the light applied for exposure may be absorbed significantly by the black coloring agent (Da), possibly preventing the light from reaching deep portions of the film. On the other hand, if a chain transfer agent is contained, radicals will be transferred by the chain transfer agent to allow radical crosslinking to reach deep portions of the film, thereby ensuring an improved sensitivity in the light exposure step.

Furthermore, the inclusion of a chain transfer agent makes it possible to form a pattern shape with a small taper. Regarding the mechanism, it is inferred that the transfer of radicals caused by the chain transfer agent serves to control the molecular weight of the polymer chains resulting from the radical polymerization in the light exposure step. If a chain transfer agent is contained, therefore, it prevents significantly high-molecular weight polymer chains from being produced by excessive radical polymerization in the light exposure step, thereby resulting in a film having an appropriately depressed softening point. It is considered that this serves to improve the reflow property of the pattern in the heat-curing step, leading to the formation of a pattern shape with a small taper.

The chain transfer agent is preferably a thiol based chain transfer agent. Examples of the thiol based chain transfer agent include β-mercaptopropionic acid, methyl β-mercaptopropionate, 2-ethylhexyl β-mercaptopropionate, stearyl β-mercaptopropionate, β-mercaptobutanoic acid, methyl thioglycolate, 1,4-bis(3-mercaptobutanoyloxy)butane, ethylene glycol bis(thioglycolate), trimethylol ethane tris-(3-mercaptopropionate), trimethylol ethane tris-(3-mercaptobutyrate), trimethylolpropane tris-(3-mercaptopropionate), trimethylolpropane tris-(3-mercaptobutyrate), trimethylolpropane tris-(thioglycolate), 1,3,5-tris-[(3-mercaptopropionyloxy)ethyl] isocyanuric acid, 1,3,5-tris-[(3-mercaptobutanoyloxy) ethyl] isocyanuric acid, pentaerythritol tetrakis(3-mercaptopropionate), pentaerythritol tetrakis(3-mercaptobutyrate), pentaerythritol tetrakis(thioglycolate), dipentaerythritol hexakis(3-mercaptopropionate), and dipentaerythritol hexakis(3-mercaptobutyrate). From the viewpoint of improving the sensitivity in the light exposure step and forming a small-tapered pattern shape, preferable are trimethylol ethane tris-(3-mercaptopropionate), trimethylol ethane tris-(3-mercaptobutyrate), trimethylolpropane tris-(3-mercaptopropionate), trimethylolpropane tris-(3-mercaptobutyrate), 1,3,5-tris-[(3-mercaptopropionyloxy) ethyl] isocyanuric acid, 1,3,5-tris-[(3-mercaptobutanoyloxy) ethyl] isocyanuric acid, pentaerythritol tetrakis(3-mercaptopropionate), pentaerythritol tetrakis(3-mercaptobutyrate), dipentaerythritol hexakis(3-mercaptopropionate), and dipentaerythritol hexakis(3-mercaptobutyrate).

In the negative type photosensitive resin composition according to the present invention, the chain transfer agent preferably accounts for 0.01 part by mass or more, more preferably 0.1 part by mass or more, still more preferably 0.5 part by mass or more, and particularly preferably 1 part by mass or more, relative to the total quantity of the alkali-soluble resin (A) and the radical-polymerizable compound (B), which accounts for 100 parts by mass. A content in the above range ensures an improved sensitivity during exposure and the formation of a pattern shape with a small taper. On the other hand, the content of the chain transfer agent is preferably 15 parts by mass or less, more preferably 13 parts by mass or less, still more preferably 10 parts by mass or less, and particularly preferably 8 parts by mass or less. A content in the above range ensures an improved resolution after the development step and the production of a cured film with an improve heat resistance.

<Polymerization Terminator>

The negative type photosensitive resin composition according to the present invention preferably further contains a polymerization terminator.

A polymerization terminator is a compound that can work to terminate radical polymerization by capturing radicals generated in the light exposure step or radicals located at growing polymer chain ends of polymer chains formed by the radical polymerization in the light exposure step and holding the radicals in a stable state.

The inclusion of a polymerization terminator in an appropriate quantity serves to reduce the quantity of residue left after the development step to ensure an improved resolution after the development step. Regarding the mechanism, it is inferred that the excess radicals generated in the light exposure step or the excess radicals located at growing chain ends of high-molecular weight polymers are captured by the polymerization terminator to arrest excessive progress of the radical polymerization.

The polymerization terminator is preferably a phenolic polymerization terminator. Examples of the phenolic polymerization terminator include 4-t-butyl phenol, 4-methoxyphenol, 1,4-hydroquinone, 1,4-benzoquinone, 2-t-butyl-4-methoxyphenol, 3-t-butyl-4-methoxyphenol, 4-t-butyl catechol, 2-t-butyl-1,4-hydroquinone, 2,6-di-t-butyl phenol, 2,4,6-tri-t-butyl phenol, 2,6-di-t-butyl-4-methyl phenol, 2,6-di-t-butyl-4-methoxyphenol, 2,5-di-t-butyl-1,4-hydroquinone, 2,5-di-t-amyl-1,4-hydroquinone, 2-nitroso-1-naphthol, and IRGANOX (registered trademark) 1010, 1035, 1076, 1098, 1135, 1330, 1726, 1425, 1520, 245, 259, 3114, 565, and 295 (all manufactured by BASF).

In the negative type photosensitive resin composition according to the present invention, the polymerization terminator preferably accounts for 0.01 part by mass or more, more preferably 0.03 part by mass or more, still more preferably 0.05 part by mass or more, and particularly preferably 0.1 part by mass or more, relative to the total quantity of the alkali-soluble resin (A) and the radical-polymerizable compound (B), which accounts for 100 parts by mass. A content in the above range ensures an improved resolution after the development step and the production of a cured film with an improve heat resistance. Furthermore, the content of the polymerization terminator is preferably 10 parts by mass or less, more preferably 8 parts by mass or less, still more preferably 5 parts by mass or less, and particularly preferably 3 parts by mass or less. A content in the above range ensures an improved sensitivity in the light exposure step.

<Crosslinking Agent>

The negative type photosensitive resin composition according to the present invention preferably further contains a crosslinking agent.

The crosslinking agent is a compound that has a crosslinkable group to form a bond with resin.

The incorporation of the crosslinking agent ensures the production of a cured film with an improved hardness and chemical resistance. Regarding the mechanism, it is inferred that the crosslinking agent serves to introduce new cross-linked structures in the cured film of the resin composition to improve the crosslink density.

The crosslinking agent is preferably a compound that has, in its molecule, two or more thermally crosslinking groups such as alkoxymethyl group, methylol group, epoxy group, and oxetanyl group.

Examples of a compound having two or more of alkoxy methyl groups and methylol groups in the molecule include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all manufactured by Honshu Chemical Industry Co., Ltd.); and NIKALAC (registered trademark) MX-290, MX-280, MX-270, MX-279, MW-100LM, MW-30HM, MW-390, and MX-750LM (all manufactured by Sanwa Chemical Co., Ltd.).

Examples of a compound having two or more epoxy groups in the molecule include Epolite (registered trademark) 40E, 100E, 200E, 400E, 70P, 200P, 400P, 1500NP, 80MF, 4000, and 3002 (all manufactured by Kyoeisha Chemical Co., Ltd.), Denacol (registered trademark) EX-212L, EX-214L, EX-216L, EX-321L, and EX-850L (all manufactured by Nagase ChemteX Corporation), jER (registered trademark) 828, 1002, 1750, 1007, YX8100-BH30, E1256, E4250, and E4275 (all manufactured by Mitsubishi Chemical Corporation), GAN, GOT, EPPN-502H, NC-3000, and NC-6000 (all manufactured by Nippon Kayaku Co., Ltd.), EPICLON (registered trademark) EXA-9583, HP4032, N695, and HP7200 (all manufactured by DIC Corporation), TECHMORE (registered trademark) VG-3101L (manufactured by Printec, Inc.), TEPIC (registered trademark) S, G, and P (all manufactured by Nissan Chemical Industries, Ltd.), and Epotohto (registered trademark) YH-434L (manufactured by Tohto Kasei Co., Ltd.).

Examples of a compound having two or more oxetanyl groups in the molecule include ETERNACOLL (registered trademark) EHO, OXBP, OXTP, and OXMA (all manufactured by Ube Industries, Ltd.), and oxetanized phenol novolacs.

In the negative type photosensitive resin composition according to the present invention, the crosslinking agent preferably accounts for 0.1 part by mass or more, more preferably 0.5 part by mass or more, and still more preferably 1 part by mass or more, relative to the total quantity of the alkali-soluble resin (A) and the radical-polymerizable compound (B), which accounts for 100 parts by mass. A content in the above range ensures the production of a cured film having an improved hardness and chemical resistance. On the other hand, the content of the crosslinking agent is preferably 70 parts by mass or less, more preferably 60 parts by mass or less, and still more preferably 50 parts by mass or less. A content in the above range ensures the production of a cured film having an improved hardness and chemical resistance.

<Silane Coupling Agent>

The negative type photosensitive resin composition according to the present invention preferably further contains a silane coupling agent.

The silane coupling agent is a compound that has a hydrolysable silyl group or silanol group.

The incorporation of a silane coupling agent serves to increase the interaction at the interface between the cured film of the resin composition and the underlying substrate, thereby ensuring an improved adhesion to the underlying substrate and the production of a cured film with an improved chemical resistance.

The silane coupling agent is preferably a trifunctional organosilane, a tetrafunctional organosilane, or a silicate compound.

Examples of the trifunctional organosilane include methyl trimethoxysilane, methyl triethoxysilane, methyl tri-n-propoxysilane, ethyl trimethoxysilane, n-propyl trimethoxysilane, isopropyl trimethoxysilane, n-butyl trimethoxysilane, n-hexyl trimethoxysilane, n-octyl trimethoxysilane, n-decyl trimethoxysilane, cyclopentyl trimethoxysilane, cyclohexyl trimethoxysilane, vinyl trimethoxysilane, vinyl triethoxysilane, 3-methacryloxypropyl trimethoxysilane, 3-methacryloxypropyl triethoxysilane, 3-acryloxypropyl trimethoxysilane, 3-acryloxypropyl triethoxysilane, phenyl trimethoxysilane, phenyl triethoxysilane, 4-tolyl trimethoxysilane, 4-hydroxyphenyl trimethoxysilane, 4-methoxyphenyl trimethoxysilane, 4-t-butylphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, 1-(4-hydroxyphenyl) ethyl trimethoxysilane, 2-(4-hydroxyphenyl)ethyl trimethoxysilane, 4-hydroxy-5-(4-hydroxyphenylcarbonyloxy)pentyl trimethoxysilane, 3-glycidoxypropyl trimethoxysilane, 3-glycidoxypropyl triethoxysilane, 2-(3,4-epoxycyclohexyl)ethyl trimethoxysilane, 2-(3,4-epoxycyclohexyl) ethyl triethoxysilane, 2-(3-trimethoxysilylpropyl)-4-(N-t-butyl) amino-4-oxobutanoic acid, 3-(3-trimethoxysilylpropyl)-4-(N-t-butyl) amino-4-oxobutanoic acid, 3-trimethoxysilylpropyl succinic acid, 3-triethoxysilylpropyl succinic acid, 3-trimethoxysilyl propionic acid, 4-trimethoxysilyl butyric acid, 5-trimethoxysilyl valeric acid, 3-trimethoxysilylpropyl succinic acid anhydride, 3-triethoxysilylpropyl succinic acid anhydride, 4-(3-trimethoxysilylpropyl) cyclohexane-1,2-dicarboxylic acid anhydride, 4-(3-trimethoxysilylpropyl) phthalic acid anhydride, trifluoromethyl trimethoxysilane, trifluoromethyl triethoxysilane, 3,3,3-trifluoropropyl trimethoxysilane, 3-[(3-ethyl-3-oxetanyl)methoxy]propyl trimethoxysilane, 3-[(3-ethyl-3-oxetanyl)methoxy]propyl triethoxysilane, 3-aminopropyl trimethoxysilane, 3-aminopropyl triethoxysilane, N-(2-aminoethyl)-3-aminopropyl trimethoxysilane, N-(2-aminoethyl)-3-aminopropyl triethoxysilane, N-phenyl-3-aminopropyl trimethoxysilane, N-(vinylbenzyl)-2-aminoethyl-3-aminopropyl trimethoxysilane hydrochloride, 3-(4-aminophenyl)propyl trimethoxysilane, 1-[4-(3-trimethoxysilylpropyl)phenyl] urea, 1-(3-trimethoxysilylpropyl) urea, 1-(3-triethoxysilylpropyl) urea, 3-trimethoxysilyl-N-(1,3-dimethylbutylidene)propyl amine, 3-triethoxysilyl-N-(1,3-dimethylbutylidene)propyl amine, 3-mercaptopropyl trimethoxysilane, 3-mercaptopropyl triethoxysilane, 3-isocyanate propyl trimethoxysilane, 3-isocyanate propyl triethoxysilane, 1,3,5-tris-(3-trimethoxysilylpropyl) isocyanuric acid, 1,3,5-tris-(3-triethoxysilylpropyl) isocyanuric acid, N-t-butyl-2-(3-trimethoxysilylpropyl) succinimide, and N-t-butyl-2-(3-triethoxysilylpropyl) succinimide.

Examples of a tetrafunctional organosilane or silicate compound include organosilanes as represented by general formula (72).

[Chemical formula 34]

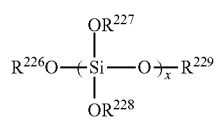

(72)

In general formula (72), $R^{226}$ to $R^{229}$ are each independently a hydrogen atom, an alkyl group, an acyl group, or an aryl group, and x is an integer of 1 to 15. In general formula (72), it is preferable for $R^{226}$ to $R^{229}$ to be each independently a hydrogen atom, an alkyl group containing 1 to 6 carbon atoms, an acyl group containing 2 to 6 carbon atoms, or an aryl group containing 6 to 15 carbon atoms, more preferably a hydrogen atom, an alkyl group containing 1 to 4 carbon atoms, an acyl group containing 2 to 4 carbon atoms, or an aryl group containing 6 to 10 carbon atoms. The above alkyl group, acyl group, and aryl group may each be either a substitution product or a non-substitution product.

Examples of organosilanes as represented by general formula (72) include tetrafunctional organosilanes such as tetramethoxysilane, tetraethoxysilane, tetra-n-propoxysilane, tetraisopropoxysilane, tetra-n-butoxysilane, and tetraacetoxysilane; and silicate compounds such as Methyl Silicate 51 (manufactured by Fuso Chemical Co., Ltd.), M Silicate 51, Silicate 40, and Silicate 45 (all manufactured by Tama Chemicals Co., Ltd.), and Methyl Silicate 51, Methyl Silicate 53A, Ethyl Silicate 40, and Ethyl Silicate 48 (all manufactured by Colcoat Co., Ltd.).

In the negative type photosensitive resin composition according to the present invention, the silane coupling agent preferably accounts for 0.01 part by mass or more, more preferably 0.1 part by mass or more, still more preferably 0.5 part by mass or more, and particularly preferably 1 part by mass or more, relative to the total quantity of the alkali-soluble resin (A) and the radical-polymerizable compound (B), which accounts for 100 parts by mass. A content in the above range ensures an improved adhesion to the underlying substrate and the production of a cured film with an improved chemical resistance. On the other hand, the content of the silane coupling agent is preferably 15 parts by mass or less, more preferably 13 parts by mass or less, still more preferably 10 parts by mass or less, and particularly preferably 8 parts by mass or less. A content in the above range ensures an improved resolution after the development step.

<Surfactant>

The negative type photosensitive resin composition according to the present invention may further contains a surfactant.

The surfactant is a compound that has a hydrophilic structure and a hydrophobic structure.

The incorporation of an appropriate quantity of a surfactant serves to allow the resin composition to have an appropriately controlled surface tension, thereby ensuring an improved leveling property in the coating step and an improved film thickness uniformity of the coating film.

The surfactant is preferably a fluorine resin based surfactant, silicone based surfactant, polyoxyalkylene ether based surfactant, or acrylic resin based surfactant.

Examples of the fluorine resin based surfactant include Megafac (registered trademark) F-142D, F-172, F-173, F-183, F-444, F-445, F-470, F-475, F-477, F-555, F-558, and F-559 (all manufactured by DIC Corporation), Eftop (registered trademark) EF301, EF303, and EF352 (all manufactured by Mitsubishi Materials Electronic Chemicals Co., Ltd.), Fluorad (registered trademark) FC-430 and FC-431 (both manufactured by Sumitomo 3M Limited), AsahiGuard (registered trademark) AG710 (manufactured by Asahi Glass Co., Ltd.), Surflon (registered trademark) S-382, SC-101, SC-102, SC-103, SC-104, SC-105, and SC-106 (all manufactured by AGC Seimi Chemical Co., Ltd.), BM-1000 and BM-1100 (both manufactured by Yusho Co., Ltd.), and Futargent (registered trademark) 710FM and 730LM (both manufactured by Neos Co., Ltd.).

Examples of the silicone based surfactant include SH28PA, SH7PA, SH21PA, SH30PA, and ST94PA (all manufactured by Dow Corning Toray Co., Ltd.) and BYK (registered trademark) -301, -306, -307, -331, -333, -337, and -345 (all manufactured by BYK-Chemie Japan).

Examples of the polyoxyalkylene ether based surfactant include Futargent (registered trademark) 212M, 209F, 208G, 240G, 212P, 220P, 228P, NBX-15, FTX-218, and DFX-218 (all manufactured by Neos Co., Ltd.).

Examples of the acrylic resin based surfactant include BYK (registered trademark) -350, -352, -354, -355, -356, -358N, -361N, -392, -394, and -399 (all manufactured by BYK-Chemie Japan).

In the negative type photosensitive resin composition according to the present invention, the surfactant preferably accounts for 0.001 mass % or more, more preferably 0.005 mass % or more, and still more preferably 0.01 mass % or more, of the total quantity of the negative type photosensitive resin composition. A content in the above range ensures an improved leveling property in the coating step. On the other hand, the surfactant preferably accounts for 1 mass % or less, more preferably 0.5 mass % or less, and still more preferably 0.03 mass % or less. A content in the above range ensures an improved leveling property in the coating step.

<Solvent>

The negative type photosensitive resin composition according to the present invention preferably further contains a solvent.

The solvent is a compound that can dissolve the various resins and various additives added to the resin composition.

The incorporation of the solvent ensures uniform dissolution of the various resins and various additives added to the resin composition and the production of a cured film with an improved transmittance. Furthermore, it will be possible to control the viscosity of the resin composition appropriately, allowing a film with a desired film thickness to be formed on the substrate. In addition, it will be possible to appropriately control the surface tension of the resin composition or the drying speed in the coating step, thereby ensuring an improved leveling property in the coating step and an improved film thickness uniformity of the coated film.

From the viewpoint of the solubilities of the various resins and various additives, the solvent is preferably a compound having an alcoholic hydroxyl group, a compound having a carbonyl group, or a compound having three or more ether bonds. In addition, it is also preferable for the compound to have a boiling point of 110° C. to 250° C. under atmospheric pressure. A boiling point of 110° C. or more allows the solvent to volatilize moderately in the coating step to cause drying of the coating film, thereby preventing uneven coating and ensuring an improved film thickness uniformity. On the other hand, a boiling point of 250° C. or less serves to reduce the quantity of the solvent remaining in the coating film. Accordingly, the film shrinkage in the heat-curing step can be reduced to ensure the production of a cured film with a higher flatness and an improved film thickness uniformity.

Examples of a compound having an alcoholic hydroxyl group and a boiling point of 110° C. to 250° C. under atmospheric pressure include hydroxyacetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (also called diacetone alcohol), methyl lactate, ethyl lactate, n-propyl lactate, n-butyl lactate, methyl 2-hydroxy-2-methyl-propionate, methyl 2-hydroxy-3-methyl-butanoate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, 3-methoxy-1-butanol, 3-methoxy-3-methyl-1-butanol, 1,3-butanediol, 1,4-butanediol, tetrahydrofurfuryl alcohol, n-butanol, and n-pentanol. From the viewpoint of improving the leveling property in the coating step, preferable are diacetone alcohol, ethyl lactate, ethylene glycol monomethyl ether, propylene glycol monomethyl ether, diethylene glycol monomethyl ether, dipropylene glycol monomethyl ether, 3-methoxy-1-butanol, 3-methoxy-3-methyl-1-butanol, and tetrahydrofurfuryl alcohol.

Examples of a compound having an carbonyl group and a boiling point of 110° C. to 250° C. under atmospheric pressure include n-butyl acetate, isobutyl butyl acetate, methyl 3-methoxy-propionate, methyl 3-ethoxy-propionate, ethoxy ethyl acetate, 3-methoxy-n-butyl acetate, 3-methyl-3-methoxy-n-butyl acetate, 3-methyl-3-methoxy-n-butyl propionate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, 1,4-butanediol diacetate, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methyl-2-pyrrolidone, N,N'-dimethyl formamide, N,N'-dimethyl acetamide, and 1,3-dimethyl-2-imidazolidinone. From the viewpoint of improving the leveling property in the coating step, preferable are 3-methoxy-n-butyl acetate, 3-methyl-3-n-butyl acetate, propylene glycol monomethyl ether acetate, dipropylene glycol monomethyl ether acetate, and γ-butyrolactone.

Examples of a compound having three or more ether bonds and a boiling point of 110° C. to 250° C. under atmospheric pressure include diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol methyl-n-propyl ether, dipropylene glycol ethyl methyl ether, and dipropylene glycol di-n-propyl ether. From the viewpoint of improving the leveling property in the coating step, preferable are diethylene glycol dimethyl ether, diethylene glycol ethyl methyl ether, and dipropylene glycol dimethyl ether.

For the negative type photosensitive resin composition according to the present invention, the content of the solvent may be adjusted appropriately to suite the coating method to be used etc. For example, a content in the range of 50 to 95 mass % of the total quantity of the negative type photosensitive resin composition is commonly adopted when the spin coating technique is used to form a coating film.

If a pigment (D1) or a disperse dye is to be added as the coloring agent (D), it is preferable to use a solvent having a carbonyl group or an ester bond. The incorporation of a solvent having a carbonyl group or an ester bond ensures an improved dispersion stability of the pigment (D1) or the disperse dye. Regarding the solvent to be used for the negative type photosensitive resin composition, furthermore, the use of a solvent having an acetate bond is more preferable from the viewpoint of dispersion stability. The incorporation of a solvent having an acetate bond ensures an improved dispersion stability of the pigment (D1) or the disperse dye.

Examples of the solvent having an acetate bond include n-butyl acetate, isobutyl acetate, 3-methoxy-n-butyl acetate, 3-methyl-3-methoxy-n-butyl acetate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, and 1,4-butanediol diacetate.

In the negative type photosensitive resin composition according to the present invention, the solvent having a carbonyl group or an ester bond preferably accounts for 30 to 100 mass %, more preferably 50 to 100 mass %, and still more preferably 70 to 100 mass %, of the total solvent quantity. A content in the above range ensures an improved dispersion stability of the pigment (D1).

<Other Resins or Additives>

The negative type photosensitive resin composition according to the present invention may further contains another resin or a precursor thereof. Examples of such another resin or a precursor thereof include polyamide, polyamide-imide, epoxy resin, urea resin, polyurethane, and precursors thereof. Such another resin or a precursor thereof may be contained as a component of the alkali-soluble resin (A).

<Production Method for the Negative Type Photosensitive Resin Composition According to the Present Invention>

Described below is a typical production method for the negative type photosensitive resin composition according to the present invention. When the coloring agent (D) contains a pigment (D1), for example, a dispersant (E) is added to a solution of the alkali-soluble resin (A), and the pigment (D1) is dispersed in this mixed solution using a dispersing machine to prepare a pigment dispersion liquid. Subsequently a radical-polymerizable compound (B), a photo-initiator (C1) and/or a photo-acid generator (C2), other additives, and an appropriate solvent are added to this pigment dispersion liquid and stirred for 20 minutes to 3 hours to prepare a uniform solution. After the stirring, the resulting solution is filtered to produce the negative type photosensitive resin composition according to the present invention.

Examples of the dispersing machine include ball mill, bead mill, sand grinder, triple roll mill, and high-speed impact mill. From the viewpoint of ensuring an improved dispersion efficiently and finer dispersion, it is preferable to use a bead mill. Examples of the bead mill include CoBall Mill, basket mill, pin mill, and DYNO mill. Examples of the beads for bead mills include titania beads, zirconia beads, and zircon beads. These bead mills preferably have a bead diameter of 0.01 to 6 mm, more preferably 0.015 to 5 mm, and still more preferably 0.03 to 3 mm. If both the diameter of the primary particles of the pigment (D1) and that of the secondary particles formed through aggregation of the primary particles are several hundreds of nanometers or less, it is preferable to use fine beads of 0.015 to 0.1 mm. In this case, it is desirable to adopt a bead mill equipped with a centrifugal separation type separator that can separate the fine beads from the pigment dispersion liquid. If the pigment (D1) contains large particles of several hundreds of nanometers or more, it is preferable to use beads of 0.1 to 6 mm from the viewpoint of improving the dispersion efficiently.

<Processes Using the Negative Type Photosensitive Resin Composition According to the Present Invention>

Cured films formed from the negative type photosensitive resin composition according to the present invention can serve suitably for applications such as pixel dividing layers in organic EL display devices, color filters, black matrices of color filters, black column spacers of liquid crystal display devices, gate insulation films of semiconductors, interlaminar insulation films of semiconductors, protection films for metal wiring, insulation films for metal wiring, and planarization films for TFTs.

<Cured Pattern Having a Pattern Shape with a Small Taper>

The negative type photosensitive resin composition according to the present invention serves to produce a cured film having a step-shaped cured pattern. Such a step-shaped cured pattern can be designed to have a cross section that is tapered at the edges. The negative type photosensitive resin composition according to the present invention serves to produce a cured film having a pattern shape with a small taper. In the cross section of a cured pattern prepared from the negative type photosensitive resin composition according to the present invention, each inclined slope preferably have a taper angle of 1° or more, more preferably 5° or more, still more preferably 10° or more, still more preferably 12° or more, and particularly preferably 15° or more. A taper angle in the above range ensures the production of a display device with an improved resolution because it permits high density integration and arrangement of light emitting elements. In the cross section of a cured pattern, each inclined slope preferably have a taper angle of 60° or less, more preferably 55° or less, still more preferably 50° or less, still more preferably 45° or less, and particularly preferably 40° or less. A taper angle in the above range serves to prevent disconnection when forming electrodes such as transparent electrodes and reflecting electrodes. It also serves to depress the electric field concentration along edges of electrodes, thereby decreasing the degradation of the light emitting elements.

<Production Processes for Organic EL Display Device>

As an example of processes that use the negative type photosensitive resin composition according to the present invention, a process that uses a cured film of the composition as a step-shaped pixel dividing layer in an organic EL display device is described below with reference to the schematic cross section shown in FIG. 1. First, (1) a thin film transistor (hereinafter TFT) 2 is formed on a glass substrate 1, followed by forming a film of a photosensitivity material for a TFT planarization film, performing pattern processing by photolithography, and heat-curing it to form a cured film 3 for TFT planarization. Next, (2) a film of a silver-palladium-copper alloy (hereinafter APC) is formed by sputtering, followed by etching it through a photoresist for pattern processing to form an APC layer, forming a film of indium tin oxide (hereinafter ITO) on the APC layer by sputtering, and etching it through a photoresist for pattern processing to form a reflecting electrode 4 as a first electrode. Subsequently, (3) the negative type photosensitive resin composition according to the present invention is spread and prebaked to form a prebaked film 5*a*. Next, (4) active actinic ray 7 is applied through a halftone photomask 6 that has an intended pattern containing transparent portions, light blocking portions and translucent portions. Then, (5) development is performed for pattern processing, followed by performing bleaching light exposure and middle-baking as required and heat-curing to form a step-shaped cured pattern 5*b* having an intended pattern for a pixel dividing layer. Subsequently, (6) a film of an EL luminescence material is formed by deposition through a mask to produce an EL luminescence layer 8, forming a film of a magnesium-silver alloy (hereinafter MgAg) by deposition, and etching it through a photoresist for pattern processing to form a transparent electrode 9 as a second electrode. Then, (7) a film of a photosensitive material is formed as a planarization film, followed by performing pattern processing by photolithography, heat-curing it to form a cured film 10 for planarization, and subsequently joining a cover glass 11 to produce an organic EL display device having a step-shaped pixel dividing layer of the negative type photosensitive resin composition according to the present invention.

<Production Processes for Liquid Crystal Display Device>

Figure 2:
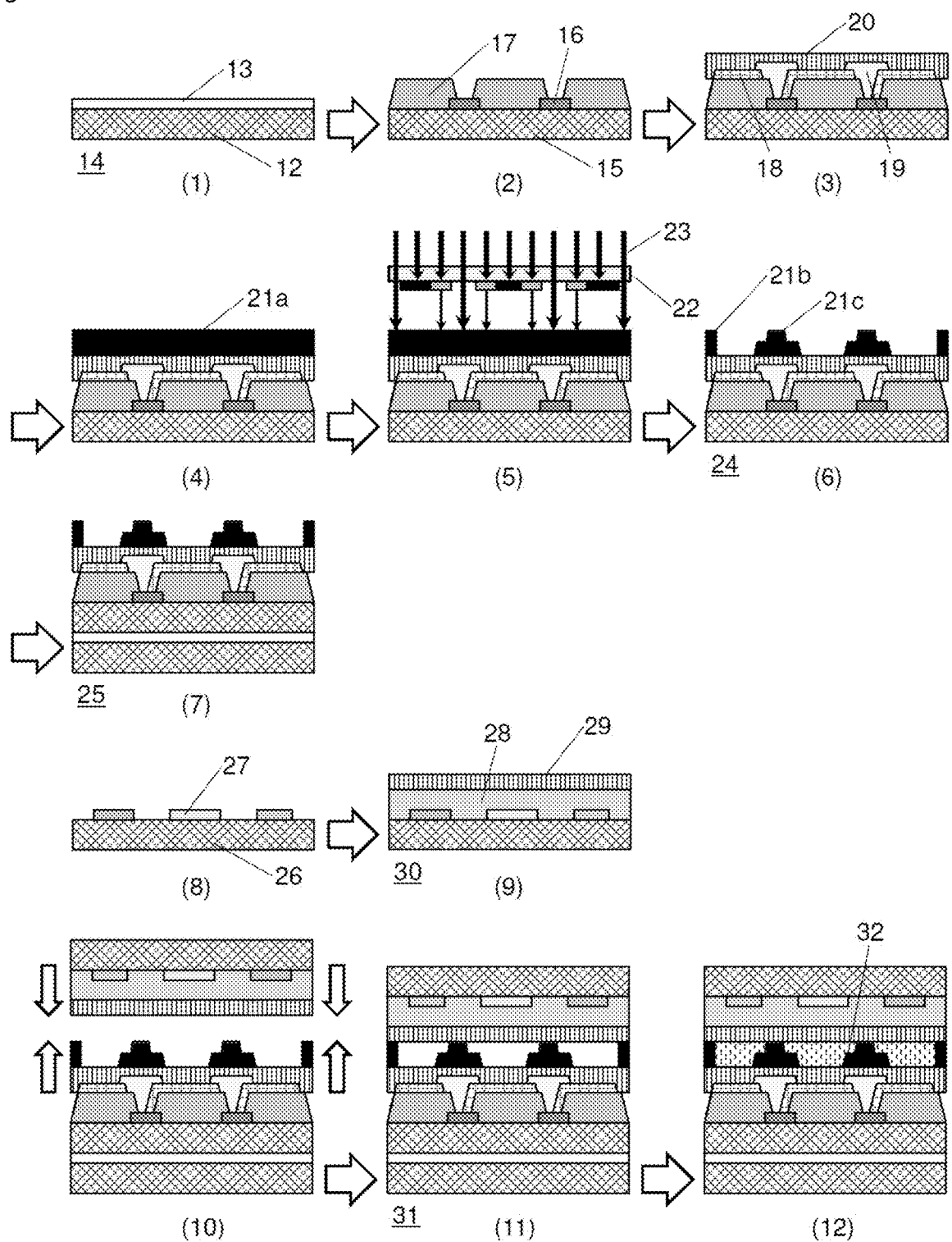
FIGS. 2 (1) to (12) show a flow chart illustrating schematic cross sections in a typical production process for a liquid crystal display device using a cured film of the negative type photosensitive resin composition according to the present invention.

As another example of processes that use the negative type photosensitive resin composition according to the present invention, a process that uses a cured film of the composition as a black column spacer (hereinafter BCS) for liquid crystal display device and a black matrix (hereinafter BM) of a color filter is described below with reference to the schematic cross section shown in FIG. 2. First, (1) a backlight unit (hereinafter BLU) 13 is formed on a glass substrate 12 to prepare a glass substrate 14 having a BLU.

In addition, (2) a TFT 16 is formed on another glass substrate 15, followed by forming a film of a photosensitivity material for a TFT planarization film, performing pattern processing by photolithography, and heat-curing it to form a cured film 17 for TFT planarization. Then, (3) an ITO film is formed by sputtering, etching it through a photoresist for pattern processing, forming a transparent electrode 18, and forming thereon a planarization film 19 and an alignment layer 20. Subsequently, (4) the negative type photosensitive resin composition according to the present invention is spread and prebaked to form a prebaked film 21*a*. Next, (5) active actinic ray 23 is applied through a halftone photomask 22 that has an intended pattern. Then, (6) development is performed for pattern processing, followed by performing bleaching light exposure and middle-baking as required, and heat-curing to form a cured pattern 21*b* having an intended pattern for a BCS with light blocking capability, and forming a step-shaped cured pattern 21*c* having an intended pattern to form a glass substrate 24 having a step-shaped BCS. Subsequently, (7) the glass substrate 14 having a BLU and the glass substrate 24 are joined together to produce a glass substrate 25 having a BLU and a step-shaped BCS.

In addition, (8) a three-color (red, green, and blue) filter (hereinafter CF) 27 is formed on another glass substrate 26. Then, (9) a film photosensitive material for planarization is formed, followed by performing pattern processing by photolithography, and heat-curing it to form a cured film 28 for planarization, and forming an alignment layer 29 to produce a CF substrate 30. Next, (10) the glass substrate 25 having a BLU and a step-shaped BCS and the CF substrate 30 are joined together so that (11) a glass substrate 31 having a BLU, a CF, and a step-shaped BCS is obtained. Subsequently, (12) liquid crystal is injected to form a liquid crystal layer 32 to produce a liquid crystal display device having a BCS and a BM made of the negative type photosensitive resin composition according to the present invention.

In this way, a method as described above that uses the negative type photosensitive resin composition according to the present invention for producing an organic EL display device or a liquid crystal display device serves to provide a step-shaped cured film with a sufficiently large difference in film thickness between thick portions and thin portions that is pattern-processed in a batch process using a halftone photomask. This ensures an improved yield and a shortened processing time in producing an organic EL display device or a liquid crystal display device.

Cured films prepared from the negative type photosensitive resin composition according to the present invention serve suitably as insulation film in a display device having an EL luminescence layer, a display device having a liquid crystal layer, and a display device having an EL luminescence layer and a liquid crystal layer. Examples of such display devices include organic EL display devices and liquid crystal display devices.

<Display Device Using Cured Film Prepared from the Negative Type Photosensitive Resin Composition According to the Present Invention>

The negative type photosensitive resin composition according to the present invention can be processed, while maintaining a high sensitivity, into a step-shaped, small-tapered, cured pattern with a sufficiently large difference in film thickness between thick portions and thin portions. Thus, a cured film produced from the negative type photosensitive resin composition according to the present invention can be used suitably in components that require a high heat resistance and a stepped shape such as insulation layers in, for example, pixel dividing layers of organic EL display devices. In addition, if the negative type photosensitive resin composition according to the present invention contains a coloring agent (D), it serves for prevention of the electrode wiring from becoming visible and for reduction of external light reflection, leading to an improved contrast in image displaying. Therefore, if a cured film prepared from the negative type photosensitive resin composition according to the present invention is used as the pixel dividing layer in an organic EL display device, the contrast can be improved without forming a polarizing plate and a quarter wave plate on the light extraction side of the light emitting element.

In conventional organic EL display devices, a polarizing plate, quarter wave plate, antireflection layer, etc., are formed on the light extraction side of the light emitting element to reduce the external light reflection. However, the light coming out of the light emitting element is changed in phase by the quarter wave plate and partly cut off by the polarizing plate, and only the polarized light penetrating them is emitted outside, resulting in a decrease in the brightness of the organic EL display device.

Compared with this, an organic EL display device that uses a cured film prepared from the negative type photosensitive resin composition according to the present invention does not contain a polarizing plate or a quarter wave plate, thereby ensuring an improved brightness of the organic EL display device.

Since no polarizing plate or quarter wave plate is contained in an organic EL display device that uses a cured film prepared from the negative type photosensitive resin composition according to the present invention, the light coming out of the light emitting element does not suffer changes in phase or partial cutoff that would be caused by a polarizing plate or a quarter wave plate. If a display device using a cured film prepared from the composition has no liquid crystal layer, the light emitted from the display device is not polarized and suffers no changes in phase after coming out of the light emitting element. On the other hand, if a display device using a cured film prepared from the composition has a liquid crystal layer, the light emitted from the display device is polarized light coming through the liquid crystal layer, which means that the light coming out of the light emitting element is emitted outside after suffering changes in phase in the liquid crystal layer.

<Flexible Organic EL Display Device Using Cured Film Prepared from the Negative Type Photosensitive Resin Composition According to the Present Invention>

Figure 3:
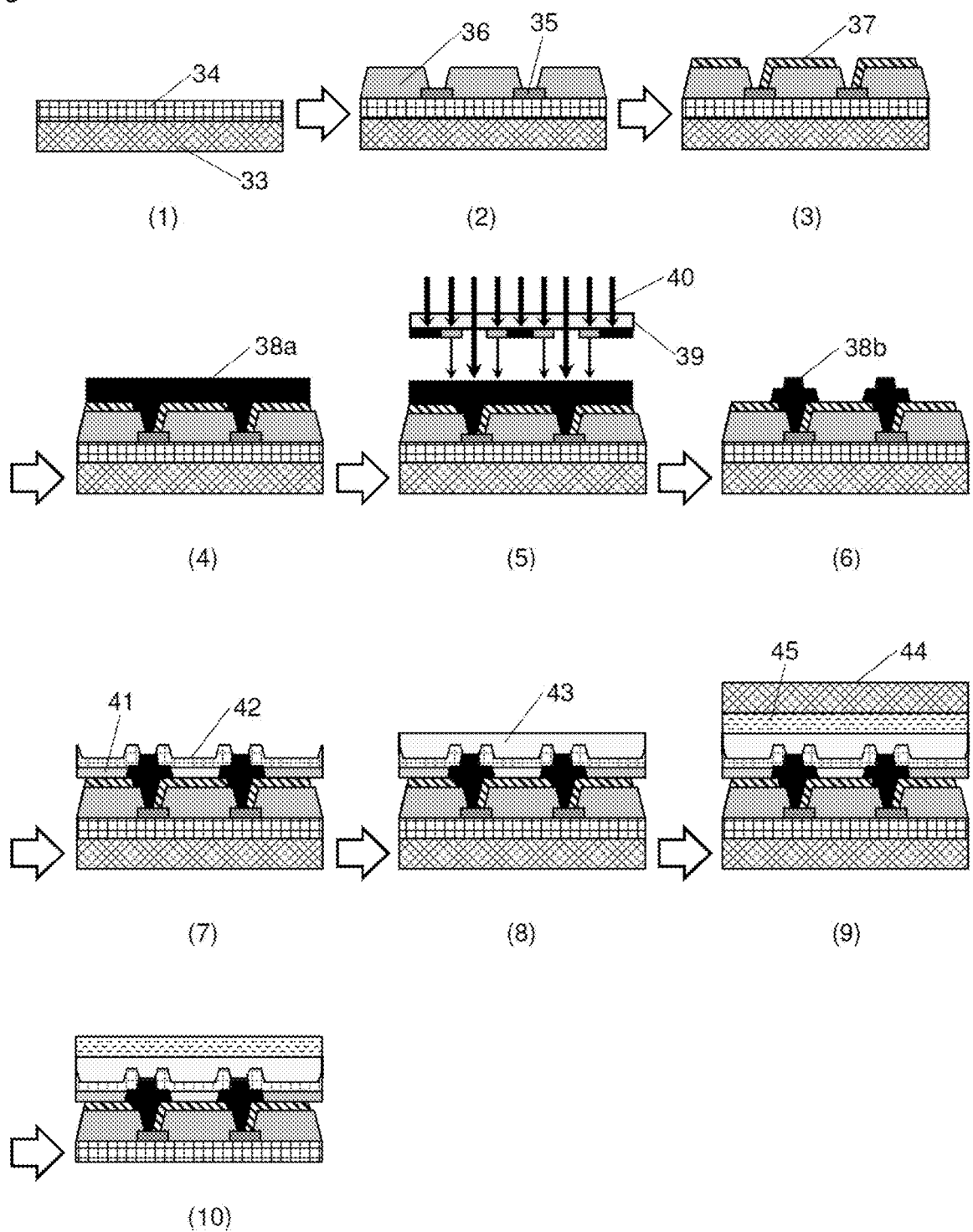
FIGS. 3 (1) to (10) show a flow chart illustrating schematic cross sections in a typical production process for a flexible organic EL display device using a cured film of the negative type photosensitive resin composition according to the present invention.

As an example of processes that use the negative type photosensitive resin composition according to the present invention, a process that uses a cured film prepared from the composition as a light-blocking, pixel dividing layer in a flexible organic EL display device is described below with reference to the schematic cross section shown in FIG. 3. First, (1) a polyimide (hereinafter PI) film substrate 34 is fixed temporarily on a glass substrate 33. Next, (2) an oxide TFT 35 is formed on the PI film substrate 34, followed by forming a film of a photosensitivity material for a TFT planarization film, performing pattern processing by photolithography, and heat-curing it to form a cured film 36 for TFT planarization. Subsequently, (3) a film of an alloy of magnesium and silver is formed by sputtering and etched through a photoresist for pattern processing to form a reflecting electrode 37 as a first electrode. Then, (4) the negative type photosensitive resin composition according to the present invention is spread and prebaked to form a prebaked film 38a. Next, (5) active actinic ray 40 is applied through a halftone photomask 39 that has an intended pattern. Then, (6) development is performed for pattern processing, followed by performing bleaching light exposure and middle-baking as required and heat-curing to form a step-shaped cured pattern 38b having an intended pattern for a flexible, light-blocking, pixel dividing layer. Next, (7) a film of an EL luminescence material is formed by deposition through a mask to produce an EL luminescence layer 41, forming a film of ITO by sputtering, and etching it through a photoresist for pattern processing to form a transparent electrode 42 as a second electrode. Subsequently, (8) a film of a photosensitive material is formed as planarization film, performing pattern processing by photolithography, and heat-curing it to form a cured film 43 for planarization. Next, (9) a polyethylene terephthalate (hereinafter PET) film substrate 45 fixed temporarily on another glass substrate 44 is joined. Subsequently, (10) the glass substrate 33 is removed from the PI film substrate 34, and the glass substrate 44 is removed from the PET film substrate 45 to produce a flexible organic EL display device having a flexible, light-blocking, pixel dividing layer made of the negative type photosensitive resin composition according to the present invention.

In this way, a method as described above that uses the negative type photosensitive resin composition according to the present invention for producing a flexible organic EL display device serves to provide a step-shaped cured film with a sufficiently large difference in film thickness between thick portions and thin portions that is pattern-processed in a batch process using a halftone photomask. This ensures an improved yield and a shortened processing time in producing a flexible organic EL display device.

The negative type photosensitive resin composition according to the present invention can be processed, while maintaining a high sensitivity, into a step-shaped, small-tapered, cured pattern with a sufficiently large difference in film thickness between thick portions and thin portions and also can be processed into a flexible cured film. Thus, the cured film can serve to form a layered structure on a flexible substrate and can be used suitably in components that require flexibility and a stepped shape such as insulation layers in, for example, pixel dividing layers of flexible organic EL display devices.

The flexible substrate is preferably one that contains the carbon atom as primary component.

The incorporation of the carbon atom as primary component serves to allow the substrate to become flexible. Furthermore, since the cured film prepared from the negative type photosensitive resin composition according to the present invention also has the carbon atom as primary component, the cured film will undergo strong interaction with the flexible substrate which lies below, leading to an improved adhesion to the substrate. In addition, the cured film will have an increased flexibility to move in conformity to the underlying substrate.

In such a flexible substrate, the carbon atom preferably accounts for 20 mass % or more, more preferably 25 mass % or more, and still more preferably 30 mass % or more. A content in the above range ensures an improved adhesion to the underlying substrate and the production of a cured film with an improved flexibility. On the other hand, in the flexible substrate, the carbon atom preferably accounts for 100 mass % or less, more preferably 95 mass % or less, and still more preferably 90 mass % or less. A content in the above range ensures an improved adhesion to the underlying substrate and the production of a cured film with an improved flexibility.

<Step-Shaped Cured Pattern>

The negative type photosensitive resin composition according to the present invention can be processed, while maintaining a high sensitivity, into a step-shaped, small-tapered, cured pattern with a sufficiently large difference in film thickness between thick portions and thin portions.

Figure 4:
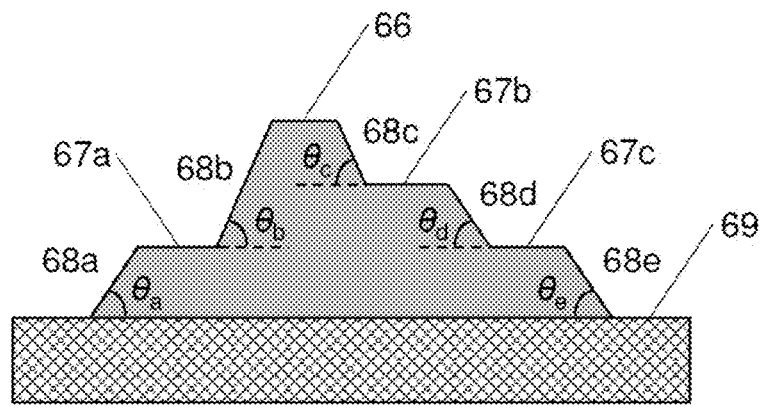
FIG. 4 shows a cross-sectional view of a typical cross section of a step-shaped cured pattern.

An example of the cross section of a step-shaped cured pattern that can be prepared from the negative type photosensitive resin composition according to the present invention is shown in FIG. 4. The thick part 66 in the stepped shape shows a part that is cured in the light exposure step and has the maximum film thickness in the cured pattern. The thin parts 67a, 67b, and 67c in the stepped shape show parts that are halftone-exposed in the light exposure step and are smaller in thicknesses than the thick part 66. In the cross section of a step-shaped cured pattern, the taper angles of $\theta_a$, $\theta_b$, $\theta_c$, $\theta_d$, and $\theta_e$ of the slopes 68a, 68b, 68c, 68d, and 68e are preferably small.

The taper angles of $\theta_a$, $\theta_b$, $\theta_c$, $\theta_d$, and $\theta_e$ referred to here are the angles contained in the cross section of the step-shaped cured pattern and formed between the horizontal face of the underlying substrate 69 or the horizontal face of the thin part 67a, 67b, or 67c and the slope 68a, 68b, 68c, 68d, or 68e that cross the horizontal faces in the cross section of the step-shaped cured pattern. A forward taper has a taper angle in the range from 1° to less than 90° whereas a backward taper has a taper angle in the range from 91° to less than 180°. The term "rectangular" refers to a taper angle of 90°, and the term "small-tapered" means the relevant taper angle is in the range from 1° to 60°.

A step-shaped cured pattern prepared from the negative type photosensitive resin composition according to the present invention preferably has 1 or more steps, more preferably 2 or more steps. On the other hand, the number of steps is preferably 10 or less, more preferably 7 or less, and still more preferably 5 or less. If the number of steps is in the above range, a sufficiently large film thickness difference can be ensured between the thick parts and the thin parts and between any two thin parts that are adjacent to each other with a step interposed therebetween so that the area of contact with the vapor deposition mask used for forming a light emitting layer can be decreased, thereby preventing a decrease in yield in panel production that would be caused by particle generation and also preventing degradation of the light emitting element.

In a step-shaped cured pattern prepared from the negative type photosensitive resin composition according to the present invention, the region having a maximum thickness between the plane of the bottom surface and the plane of the top surface is referred to as the thick part 66, whereas the region having a thickness smaller than that of the thick part 66 is referred to as the thin part 67. When the film thickness of the thick part 66 is denoted by ($T_{FT}$) μm and the film thickness of the thin parts 67a, 67b, and 67c located with at least one step from the thick part 66 is denoted by ($T_{HT}$) μm, the film thickness difference between ($T_{FT}$) and ($T_{HT}$), i.e. ($\Delta T_{FT-HT}$) μm is preferably 0.5 μm or more, more preferably 1.0 μm or more, still more preferably 1.5 μm or more, still more preferably 2.0 μm or more, particularly preferably 2.5 μm or more, and most preferably 3.0 μm or more. If the film thickness difference is in the above range, the area of contact with the vapor deposition mask used for forming a light emitting layer can be decreased, thereby preventing a decrease in yield in panel production that would be caused by particle generation and also preventing degradation of the light emitting element. Furthermore, one layer alone in the step-shaped cured pattern can have a sufficiently large film thickness difference to permit a shortened process time. On the other hand, the film thickness difference ($\Delta T_{FT-HT}$) μm is preferably 10.0 μm or less, more preferably 9.5 μm or less, still more preferably 9.0 μm or less, still more preferably 8.5 μm or less, and particularly preferably 8.0 μm or less. If the film thickness difference is in the above range, the light exposure required for forming a step-shaped cured pattern can be reduced to permit a shortened tact time.

The film thickness ($T_{FT}$) of the thick part 66 is preferably 2.0 μm or more, more preferably 2.5 μm or more, still more preferably 3.0 μm or more, still more preferably 3.5 μm or more, and particularly preferably 4.0 μm or more. This ensures depression of degradation of the light emitting element and permits a shortened process time.

The film thickness ($T_{FT}$) of the thick part 66 is preferably 10.0 μm or less, more preferably 9.5 μm or less, still more preferably 9.0 μm or less, still more preferably 8.5 μm or less, and particularly preferably 8.0 μm or less. If the ($T_{FT}$) is in the above range, the light exposure required for forming a step-shaped cured pattern can be reduced to permit a shortened tact time.

The film thickness ($T_{HT}$) of the thin parts 67a, 67b, and 67c located with at least one step from the thick part 66 is preferably 0.10 μm or more, more preferably 0.15 μm or more, still more preferably 0.20 μm or more, still more preferably 0.25 μm or more, and particularly preferably 0.30 μm or more. This ensures depression of degradation of the light emitting element and permits a shortened process time.

The film thickness ($T_{HT}$) of the thin parts 67a, 67b, and 67c is preferably 7.5 μm or less, more preferably 7.0 μm or less, still more preferably 6.5 μm or less, still more preferably 6.0 μm or less, and particularly preferably 5.5 μm or less. If the ($TH_{HT}$) is in the above range, the light exposure required for forming a step-shaped cured pattern can be reduced to permit a shortened tact time.

Furthermore, it is also preferable that the film thickness ($T_{FT}$) μm of the thick part 66 and the film thickness ($T_{HT}$) μm of the thin parts 67a, 67b, and 67c meet the relations represented by general formulae (α) to (γ).

$$2.0 \leq (T_{FT}) \leq 10 \quad (\alpha)$$

$$0.10 \leq (T_{HT}) \leq 7.5 \quad (\beta)$$

$$0.10 \times (T_{FT}) \leq (T_{HT}) \leq 0.75 \times (T_{FT}) \quad (\gamma)$$

It is more preferable that the film thickness ($T_{FT}$) μm of the thick part 66 and the film thickness ($T_{HT}$) μm of the thin parts 67a, 67b, and 67c further meet the relations represented by general formulae (δ) to (ζ).

$$3.0 \leq (T_{FT}) \leq 9.0 \quad (\delta)$$

$$0.20 \leq (T_{HT}) \leq 7.0 \quad (\varepsilon)$$

$$0.20 \times (T_{FT}) \leq (T_{HT}) \leq 0.70 \times (T_{FT}) \quad (\zeta)$$

If the film thickness ($T_{FT}$) μm of the thick part 66 and that ($T_{HT}$) μm of the thin parts 67a, 67b, and 67c are in the above ranges, it ensures depression of degradation of the light emitting element and permits a shortened process time.

In the cross section of a step-shaped cured pattern prepared from the negative type photosensitive resin composition in the display device according to the present invention, each inclined slope preferably have a taper angle of 1° or more, more preferably 5° or more, still more preferably 10° or more, still more preferably 12° or more, and particularly preferably 15° or more. A tapered angle in the above range ensures the production of a display device with an improved resolution because it permits high density integration and arrangement of light emitting elements. In the cross section of a cured pattern, each inclined slope preferably have a taper angle of 60° or less, more preferably 55° or less, still more preferably 50° or less, still more preferably 45° or less, and particularly preferably 40° or less. A taper angle in the above range serves to prevent disconnection when forming electrodes such as transparent electrodes and reflecting electrodes. It also serves to depress the electric field concentration along edges of electrodes, thereby reducing the degradation of the light emitting elements.

The display device may have a curved display portion. The curvature radius of this curved surface is preferably 0.1 mm or more, more preferably 0.3 mm or more, from the viewpoint of reducing display defects attributed to disconnection in curved display portions of the display device. It is preferable for the curvature radius of the curved surface to be 10 mm or less, more preferably 7 mm or less, and still more preferably 5 mm or less, from the viewpoint of reducing the size and increasing the resolution of the display device.

A typical production method for a display device that uses the negative type photosensitive resin composition according to the present invention may include the steps of (1) to (4) described below.

(1) A step for forming a coating film of the negative type photosensitive resin composition according to the present invention on a substrate, (2) A step for applying active actinic ray to the resin composition through a photomask, (3) A step for developing it with an alkaline solution to form a step-shaped pattern of the resin composition, and, (4) A step for heating the pattern to produce a step-shaped cured pattern of the resin composition.

The photomask is preferably one that has a pattern containing transparent portions and light blocking portions and that also has translucent portions, which are lower in transmittance than the transparent portions and higher in transmittance than the light blocking portions, located between the transparent portions and the light blocking portions.

<Step for Forming Coating Film>

The production method for a display device that uses the negative type photosensitive resin composition according to the present invention includes: (1) a step for forming a coating film of a negative type photosensitive resin composition on a substrate.

Available methods for forming a coating film of the negative type photosensitive resin composition according to the present invention include, for example, a method in which the resin composition is spread over a substrate and a method in which the resin composition is spread in a pattern over a substrate.

The substrate may be in the form of a substrate having electrodes and wiring of an oxide containing one or more selected from the group consisting of indium, tin, zinc, aluminum, and gallium, a metal (molybdenum, silver, copper, aluminum, chrome, titanium, etc.), or CNT (carbon nanotube) formed on a glass plate.

Oxides that contain one or more selected from the group consisting of indium, tin, zinc, aluminum, and gallium include indium tin oxide (ITO), indium zinc oxide (IZO), aluminum zinc oxide (AZO), indium gallium zinc oxide (IGZO), and zinc oxide (ZnO).

<Method for Spreading the Negative Type Photosensitive Resin Composition According to the Present Invention on a Substrate>

Available methods for spreading the negative type photosensitive resin composition according to the present invention on a substrate include, for example, micro gravure coating, spin coating, dip coating, curtain flow coating, roll coating, spray coating, and slit coating. The coating thickness depends on the coating method used, solid content in the resin composition, viscosity thereof, and the like, but commonly, coating is performed in such a manner that the film thickness will be 0.1 to 30 μm after spreading and prebaking.

It is preferable to spread the negative type photosensitive resin composition according to the present invention on a substrate and then prebake it. The prebaking can be achieved by using an oven, hot plate, infrared ray, flash annealing device, laser annealing device, or the like. The prebaking temperature is preferably in the range of 50° C. to 150° C. The prebaking time is preferably in the range of 30 seconds to several hours. The prebaking may be performed in two or more stages such as prebaking at 80° C. for 2 minutes, followed by prebaking at 120° C. for 2 minutes.

<Method for Spreading the Negative Type Photosensitive Resin Composition According to the Present Invention in a Pattern on a Substrate>

Available methods for spreading the negative type photosensitive resin composition according to the present invention in a pattern on a substrate include, for example, letterpress printing, intaglio printing, stencil printing, planographic printing, screen printing, ink jet printing, offset printing, and laser printing. The coating thickness depends on the coating method used, solid content in the photosensitive resin composition according to the present invention, viscosity thereof, and the like, but commonly, coating is performed in such a manner that the film thickness will be 0.1 to 30 μm after spreading and prebaking.

It is preferable to spread the negative type photosensitive resin composition according to the present invention in a pattern on a substrate and then prebake it. The prebaking can be achieved by using an oven, hot plate, infrared ray, flash annealing device, laser annealing device, or the like. The prebaking temperature is preferably in the range of 50° C. to 150° C. The prebaking time is preferably in the range of 30 seconds to several hours. The prebaking may be performed in two or more stages such as prebaking at 80° C. for 2 minutes, followed by prebaking at 120° C. for 2 minutes.

<Method for Pattern Processing of Coating Film Formed on Substrate>

Available methods for pattern processing of a coating film of the negative type photosensitive resin composition according to the present invention formed on a substrate include, for example, direct pattern processing by photolithography and pattern processing by etching. The method of direct pattern processing by photolithography is preferable from the viewpoint of decreasing the number of steps to ensure an improved productivity and a shortened process time.

<Step for Applying Active Actinic Ray Through Photomask>

The production method for a display device that uses the negative type photosensitive resin composition according to the present invention includes: (2) a step for applying active actinic ray to the resin composition through a photomask.

The negative type photosensitive resin composition according to the present invention is spread on a substrate and prebaked to form a film, which is then exposed to light by using a light exposure device such as stepper, mirror projection mask aligner (MPA), and parallel light mask aligner (PLA). Available active actinic rays used for light exposure include ultraviolet light, visible light, electron beam, X-ray, KrF (wavelength 248 nm) laser, and ArF (wavelength 193 nm) laser. It is preferable to use the j-line (wavelength 313 nm), i-line (wavelength 365 nm), h-line (wavelength 405 nm), or g-line (wavelength 436 nm) of a mercury lamp. The quantity of light exposure is commonly about 100 to 40,000 $J/m^2$ (10 to 4,000 $mJ/cm^2$) (as measured by i-line illuminance meter), and light may be exposed through a photomask having a desired pattern as required.

The production method for a display device that uses the negative type photosensitive resin composition according to the present invention preferably uses a halftone photomask as the photomask.

The halftone photomask is preferably one that has a pattern containing transparent portions and light blocking portions and that also has translucent portions, which are lower in transmittance than the transparent portions and higher in transmittance than the light blocking portions, located between the transparent portions and the light blocking portions. The use of a halftone photomask for light exposure allows a step-shaped pattern to be formed after the development and heat-curing steps. Here, the parts cured by exposure to active actinic ray through the transparent portions correspond to the thick parts, whereas the halftone-exposed parts where active actinic ray is applied through the translucent portions correspond to the thin parts.

For a halftone photomask in which the transparent portions have a transmittance of (% $T_{FT}$), the transmittance (% $T_{HT}$) of the translucent portions is preferably 10% or more, more preferably 15% or more, still more preferably 20% or more, and particularly preferably 25% or more, of (% $T_{FT}$). If the transmittance (% $T_{HT}$) of the translucent portions is in the above range, the light exposure required for forming a step-shaped cured pattern can be reduced to permit a shortened tact time. On the other hand, the transmittance (% $T_{HT}$) of the translucent portions is preferably 60% or less, more preferably 55% or less, still more preferably 50% or less, and particularly preferably 45% or less, of (% $T_{FT}$). If the transmittance (% $T_{HT}$) of the translucent portions is in the above range, a sufficiently large film thickness difference can be ensured between the thick parts and the thin parts and between any two thin parts that are adjacent to each other with a step interposed therebetween, thereby preventing degradation of the light emitting element. Furthermore, one layer alone in the step-shaped cured pattern can have a sufficiently large film thickness difference to permit a shortened process time.

When for step-shaped cured patterns prepared by applying active actinic ray through halftone photomasks, the film thickness of the thin parts formed when the transmittance (% $T_{HT}$) of the translucent portions is 30% of (% $T_{FT}$) is denoted by ($T_{HT30}$) μm whereas the film thickness of the thin parts formed when the transmittance (% $T_{HT}$) of the translucent portions is 20% of (% $T_{FT}$) is denoted by ($T_{HT20}$) μm, the film thickness difference between ($T_{HT30}$) and ($T_{HT20}$), which is denoted by ($\Delta T_{HT30-HT20}$) μm, is preferably 0.5 μm or more, more preferably 0.6 μm or more, still more preferably 0.7 μm or more, and particularly preferably 0.8 μm or more. If the film thickness difference is in the above range, a sufficiently large film thickness difference can be ensured between the thick parts and the thin parts and between any two thin parts that are adjacent to each other with a step interposed therebetween, thereby preventing degradation of the light emitting element. Furthermore, one layer alone in the step-shaped cured pattern can have a sufficiently large film thickness difference to permit a shortened process time. On the other hand, the film thickness difference ($\Delta T_{HT30-HT20}$) μm is preferably 1.5 μm or less, more preferably 1.4 μm or less, still more preferably 1.3 μm or less, and particularly preferably 1.2 μm or less. If the film thickness difference is in the above range, it serves to reduce the generation of a film thickness variation that can result from slight fluctuations in light exposure attributed to the equipment, leading to an improved film thickness uniformity and an improved yield in production of organic EL display devices.

Regarding the photomask, the method applied to the production of a display device using the negative type photosensitive resin composition according to the present invention may use two or more photomasks in which transparent portions are located in different regions.

Light exposure performed in two or more stages using two or more photomasks in which transparent portions are located in different regions serves to form two or more light-exposed parts that correspond to the cured parts and the halftone-exposed parts that are formed when a halftone photomask is used. This allows a step-shaped pattern to be formed after the development and heat-curing steps.

Another good procedure is to apply active actinic ray and then perform post-exposure baking. Post-exposure baking can serve effectively for improving the resolution after the development step, and widening the allowable range of the development conditions. The post-exposure baking can be achieved by using an oven, hot plate, infrared ray, flash annealing device, laser annealing device, or the like. The post-exposure baking temperature is preferably 50° C. to 180° C., more preferably 60° C. to 150° C. The post-exposure baking time is preferably in the range of 10 seconds to several hours. A post-exposure baking time in the above range can ensure smooth progress of the reaction and a shortened development time.

<Step for Development with Alkaline Solution to Form Pattern>

The production method for a display device that uses the negative type photosensitive resin composition according to the present invention includes: (3) a step for development with an alkaline solution to form a step-shaped pattern of the resin composition.

After light-exposure, development is performed using an automatic development apparatus. Since the negative type photosensitive resin composition according to the present invention has a negative type photosensitivity, the unexposed parts are removed by the developer in the development step to produce a relief pattern.

Alkaline developers are generally used for development. Preferable alkaline developers include, for example, organic alkaline solutions and aqueous solutions of compounds that show alkalinity, of which aqueous solutions of compounds that show alkalinity, that is, alkaline aqueous solutions are more preferable from an environmental viewpoint.

Such organic alkaline solutions and compounds that show alkalinity include, for example, 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethylammonium hydroxide, tetraethylammonium hydroxide, sodium hydroxide, potassium hydroxide, magnesium hydroxide, calcium hydroxide, barium hydroxide, sodium carbonate, and potassium carbonate, of which tetramethylammonium hydroxide and tetraethylammonium hydroxide are more preferable from the viewpoint of decreasing the metal impurities in the cured film and ensuring the production of display devices with fewer display defects.

An organic solvent may be used as the developer. Examples of the organic solvent include the aforementioned solvents, ethyl acetate, ethyl pyruvate, ethyl 3-methoxypropionate, ethyl 3-ethoxypropionate, N-methyl-2-pyrolidone, dimethyl sulfoxide, and hexamethyl phosphortriamide.

The developer to be used may be a mixed solution that contains both an organic solvent as given above and a poor solvent for the negative type photosensitive resin composition according to the present invention. Examples of the poor solvent for the negative type photosensitive resin composition according to the present invention include water, methanol, ethanol, isopropyl alcohol, toluene, and xylene.

Examples of good development methods include paddle development, spray development, and dip development. Good procedures for paddle development include, for example, a procedure in which a developer as given above is spread on the light-exposed film, followed by leaving it to stand for an appropriate period of time and a procedure in which a developer as given above is sprayed for an appropriate period of time to coat the light-exposed film, followed by leaving it to stand for an appropriate period of time. Good procedures for spray development include, for example, a procedure in which a developer as given above is sprayed continuously for an appropriate period of time to the light-exposed film. Good procedures for dip development include, for example, a procedure in which the light-exposed film is dipped in a developer as given above for an appropriate period of time and a procedure in which the light-exposed film is dipped in a developer as given above, followed by applying ultrasonic wave continuously for an appropriate period of time. It is preferable to adopt paddle development as the development method from the viewpoint of the prevention of apparatus contamination in the development step and the reduction of the developer consumption to achieve a decrease in process cost. The prevention of apparatus contamination in the development step serves for preventing substrate contamination in the development step to ensure the production of display devices with fewer display defects. On the other hand, it is preferable to adopt spray development as the development method from the viewpoint of decreasing residues remaining after the development step. It is preferable to adopt dip development as the development method from the viewpoint of recycling the developer to ensure a reduction in the developer consumption and a decrease in process cost.

The development time is preferably 5 seconds or more, more preferably 10 seconds or more, still more preferably 30 seconds or more, and particularly preferably 1 minute or more. A development time in the above range ensures a decreased residue formation in the alkaline development step. On the other hand, from the viewpoint of shortening the tact time, the development time is preferably 30 minutes or less, more preferably 15 minutes or less, still more preferably 10 minutes or less, and particularly preferably 5 minutes or less.

It is preferable for the relief pattern resulting from the development step to be washed with a rinsing liquid. The rinsing liquid is preferably water when an alkaline aqueous solution is used as developer.

Examples of the rinsing liquid include aqueous solutions of alcohols such as ethanol and isopropyl alcohol, aqueous solutions of esters such as propylene glycol monomethyl ether acetate, and aqueous solutions of compounds that show acidity such as carbon dioxide gas, hydrochloric acid, and acetic acid.

An organic solvent may be used as the rinsing liquid. From the viewpoint of the affinity with developers, preferable examples of the organic solvent include methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, and 2-heptanone.

The production method for a display device that uses the negative type photosensitive resin composition according to the present invention is designed to form a step-shaped pattern after the development step. The use of a halftone photomask as the photomask for light exposure as described above, followed by development, allows a step-shaped pattern to be obtained after the development step.

After obtaining a pattern of the negative type photosensitive resin composition according to the present invention, photolithography may be performed to achieve bleaching light exposure. Bleaching light exposure serves to control the pattern shape of the heat-cured film as desired. It also serves to produce a cured film with a higher transparency.

Bleaching light exposure can be performed using an exposure machine such as stepper, mirror projection mask aligner (MPA), and parallel light mask aligner (PLA). Available active actinic rays used for bleaching light exposure include ultraviolet light, visible light, electron beam, X-ray, KrF (wavelength 248 nm) laser, and ArF (wavelength 193 nm) laser. It is preferable to use the j-line (wavelength 313 nm), i-line (wavelength 365 nm), h-line (wavelength 405 nm), or g-line (wavelength 436 nm) of a mercury lamp. The quantity of light exposure is commonly about 500 to 500, 000 J/m$^2$ (50 to 50,000 mJ/cm$^2$) (as measured by i-line illuminance meter), and light may be exposed through a mask having a desired pattern as required.

Middle-baking may be performed after producing a pattern of the negative type photosensitive resin composition according to the present invention. Middle-baking serves to ensure an improved resolution after the heat-curing step and also allow a desired pattern shape to be obtained after the heat-curing step. The middle-baking can be achieved by using an oven, hot plate, infrared ray, flash annealing device, laser annealing device, or the like. The middle-baking temperature is preferably 50° C. to 250° C., more preferably 70° C. to 220° C. The prebaking time is preferably in the range of 10 seconds to several hours. The middle-baking may be performed in two or more stages such as middle-baking at 100° C. for 5 minutes, followed by middle-baking at 150° C. for 5 minutes.

<Step for Heating Pattern to Produce Cured Pattern>

The production method for a display device that uses the negative type photosensitive resin composition according to the present invention includes: (4) a step for heating the pattern of the resin composition to produce a step-shaped cured pattern of the resin composition.

The heating of the patterned film of the negative type photosensitive resin composition according to the present invention formed on a substrate can be carried out by using an oven, hot plate, infrared ray, flash anneal device, laser anneal device, or the like. The heating to heat-cure the pattern film of the negative type photosensitive resin composition according to the present invention serves to ensure the production of a cured film with an improved heat resistance and also ensure a small-tapered pattern shape.

The heat-curing temperature is preferably 150° C. or more, more preferably 200° C. or more, and still more preferably 250° C. or more. A heat-curing temperature in the above range ensures the formation of a cured film with an increased heat resistance and the formation of a cured film with a pattern shape with a smaller taper. On the other hand, from the viewpoint of shortening the tact time, the heat-curing temperature is preferably 500° C. or less, more preferably 450° C. or less, and still more preferably 400° C. or less.

The heat-curing time is preferably 1 minute or more, more preferably 5 minutes or more, still more preferably 10 minutes or more, and particularly preferably 30 minutes or more. A heat-curing time in the above range ensures a pattern shape with a smaller taper after heat-curing. On the other hand, from the viewpoint of shortening the tact time, the heat-curing time is preferably 300 minutes or less, more preferably 250 minutes or less, still more preferably 200 minutes or less, and particularly preferably 150 minutes or less. The heat-curing may be performed in two or more stages such as heat-curing at 150° C. for 30 minutes, followed by heat-curing at 250° C. for 30 minutes.

The production method for a display device that uses the negative type photosensitive resin composition according to the present invention is designed to form a step-shaped pattern after the heat-curing step. The use of a halftone photomask as the photomask for light exposure as described above, followed by development and subsequent heat-curing, allows a step-shaped pattern to be obtained after the heat-curing step.

<Step for Pattern Processing of Transparent Electrode or Reflecting Electrode>

The production method for a display device that uses the negative type photosensitive resin composition according to the present invention may include a step for pattern processing of a transparent electrode and/or a step for pattern processing of a reflecting electrode.

The step for pattern processing of a transparent electrode or a reflecting electrode may be designed, for example, to carry out the pattern processing by etching.

A transparent electrode or a reflecting electrode is formed first to produce a layered structure on a substrate and then a photoresist is spread on the electrode to form a film by a method as described above. After the spreading, it is preferable to perform prebaking by a method as described above.

A photoresist may be spread and prebaked on the transparent electrode or reflecting electrode, followed by light exposure and development by methods as described above, allows a photoresist pattern to be formed by photolithography on the electrode.

After the development, it is preferable to heat the resulting pattern to heat-cure it. The heat-curing serves to improve the chemical resistance and the dry etching resistance of the cured film of the photoresist to allow the photoresist pattern to work suitably as an etching mask. The heating of the pattern can be achieved by using an oven, hot plate, infrared ray, flash annealing device, laser annealing device, or the like. The heat-curing temperature is preferably 70° C. to 200° C. The heat-curing time is preferably in the range of 30 seconds to several hours.

After the development and heat-curing, the photoresist pattern is used as etching mask to carry out pattern-processing of the transparent electrode or reflecting electrode located under the pattern by etching.

The etching solution can be performed by, for example, wet etching using an etching solution or dry etching using an etching gas. The etching is preferably an acidic or alkaline etching solution or organic solvent <Method for Pattern Processing by Wet Etching>

Useful examples of the acidic etching solution include solutions of generally known acidic compounds such as hydrofluoric acid, hydrochloric acid, sulfuric acid, nitric acid, phosphoric acid, phosphorous acid, acetic acid, and oxalic acid.

The alkaline etching solution is preferably an organic alkaline solution or an aqueous solution of an alkaline compound.

Useful examples of the organic alkaline solution and alkaline compound include generally known ones such as 2-aminoethanol, 2-(diethylamino)ethanol, diethanolamine, triethylamine, ammonia, tetramethylammonium hydroxide, sodium hydroxide, potassium hydroxide, and potassium carbonate.

Useful examples of the organic solvent include generally known ones such as the aforementioned solvents, diethylene glycol mono-n-butyl ether, ethyl 3-methoxypropionate, N-methyl-2-pyrrolidone, and isopropyl alcohol.

The etching solution to be used may be a mixed solution containing both an alkaline etching solution and an organic solvent.

Available methods for wet etching include, for example, spreading an etching solution as described above or spraying an etching solution as described above on a substrate having a transparent electrode or a reflecting electrode and a photoresist pattern formed thereon; immersing a substrate having a transparent electrode or a reflecting electrode and a photoresist pattern formed thereon in an etching solution as described above; and immersing a substrate having a transparent electrode or a reflecting electrode and a photoresist pattern formed thereon in an etching solution as described above, followed by applying ultrasonic wave.

After the wet etching, the transparent electrode or the reflecting electrode pattern-processed with a wet etching is preferably washed with a rinsing liquid.

Useful examples of the rinsing liquid include generally known ones such as water, methanol, ethanol, isopropyl alcohol, and ethyl lactate. When an acidic etching solution or an aqueous solution of an alkaline compound is used as the etching solution, it is preferable to use a rinsing liquid that contains water.

<Method for Pattern Processing by Dry Etching>

Available methods for dry etching include the reactive gas etching method in which a substrate having a transparent electrode or a reflecting electrode and a photoresist pattern formed thereon is exposed to an etching gas as described above; the plasma etching method in which a substrate having a transparent electrode or a reflecting electrode and a photoresist pattern formed thereon is exposed to an etching gas that is ionized or radicalized by electromagnetic wave; and the reactive ion etching method in which an etching gas that is ionized or radicalized by electromagnetic wave and biased for acceleration is collided against a substrate having a transparent electrode or a reflecting electrode and a photoresist pattern formed thereon.

Examples of the etching gas include fluoromethane, difluoromethane, trifluoromethane, tetrafluoromethane, chlorofluoromethane, chlorodifluoromethane, chlorotrifluoromethane, dichlorofluoromethane, dichlorodifluoromethane, trichlorofluoromethane, sulfur hexafluoride, xenon difluoride, oxygen, ozone, argon, and fluorine.

After the etching, the photoresist remaining on the transparent electrode or reflecting electrode is removed to produce a patterned transparent electrode or reflecting electrode.

<Removal of Photoresist>

Available methods for removing the photoresist include the use of a resist stripping liquid for removal and ashing for removal. Preferable resist stripping liquids include acidic and alkaline resist stripping liquids and organic solvents including generally known ones. Examples of the acidic resist stripping liquids include acidic solutions and mixed solutions of acidic solutions and oxidizing agents, including generally known ones. From the viewpoint of the performance for photoresist removal, it is preferable to use a mixed solution of an acidic solution and an oxidizing agent.

Available gases for removal by ashing include a gas containing one or more selected from the group consisting of oxygen, ozone, argon, fluorine, and chlorine, as components. From the viewpoint of the performance for photoresist removal, it is preferable to use a gas containing oxygen or ozone as a component.

The negative type photosensitive resin composition according to the present invention serves to prepare a alkali-developable coating liquid that is highly sensitive, has excellent halftone characteristics helpful to form a step-shaped pattern in a batch process using a halftone photomask, and serves to produce a small-tapered pattern shape.

Furthermore, the negative type photosensitive resin composition according to the present invention serves to produce cured films that can be used suitably for applications such as pixel dividing layers in organic EL display devices, color filters, black matrices of color filters, black column spacers of liquid crystal display devices, gate insulation films of semiconductors, interlaminar insulation films of semiconductors, protection films for metal wiring, insulation films for metal wiring, and planarization films for TFTs. In particular, the resulting cured film has a stepped shape with a sufficiently large difference in film thickness between thick parts and thin parts and accordingly, can work suitably as step-shaped pixel dividing layers of organic EL display devices and step-shaped black column spacers of liquid crystal display devices. In addition, it will be possible to produce elements and display devices in which the cured film is used for the aforementioned purposes.

Furthermore, the production method for a display device using the negative type photosensitive resin composition according to the present invention serves to provide a step-shaped cured film with a sufficiently large difference in film thickness between thick parts and thin parts that is pattern-processed in a batch process using a halftone photomask. This ensures an improved yield and a shortened processing time in producing a flexible organic EL display device.

EXAMPLES

The present invention will now be illustrated more specifically with reference to Examples and Comparative examples, but it should be understood that the invention is not construed as being limited to the scopes thereof. Some of the compounds used are referred to using abbreviations as listed below.

4HST: 4-hydroxystyrene
6FDA: 2,2-(3,4-dicarboxyphenyl)hexafluoropropane dianhydride;
4,4'-hexafluoropropane-2,2-diyl-bis(1,2-phthalic acid anhydride)
AcrTMS: 3-acryloxypropyl trimethoxysilane
APC: Argentum-Palladium-Cupper (silver-palladium-copper alloy)
ASL: anisole
BAHF: 2,2-bis(3-amino-4-hydroxyphenyl) hexafluoropropane
BFE: 1,2-bis(4-formylphenyl) ethane
BGPF: 9,9-bis(4-glycidoxyphenyl) fluorene
Bis-A-AF: 2,2-bis(4-aminophenyl) hexafluoropropane
Bk-S0100CF: IRGAPHOR (registered trademark) BLACK S0100CF (manufactured by BASF, benzofuranone based black pigments with primary particle diameter of 40 to 80 nm)
CCR-1171H: KAYARAD (registered trademark) CCR-1171H (manufactured by Nippon Kayaku Co., Ltd., carboxylic acid-modified epoxy resin having a structural unit as represented by general formula (26))
D.BYK-167: DISPERBYK (registered trademark)-167 (manufactured by BYK-Chemie Japan, dispersant having an amine value)
DETX-S: KAYACURE (registered trademark) DETX-S (manufactured by Nippon Kayaku Co., Ltd., 2,4-diethyl thioxanthone)
DFA: N,N-dimethylformamide dimethyl acetal
DPHA: KAYARAD (registered trademark) DPHA (manufactured by Nippon Kayaku Co., Ltd., dipentaerythritol hexaacrylate)
ED-900: Jeffamine (registered trademark) ED-900 (manufactured by HUNTSMAN, diamine having an oxyalkylene structure)
GMA: glycidyl methacrylate
HAD: formaldehyde
HFHA: N,N'-bis[5,5'-hexafluoropropane-2,2-diyl-bis(2-hydroxyphenyl)] bis(3-aminobenzoic acid amide)
IGZO: indium gallium zinc oxide
ITO: indium tin oxide
KOH: potassium hydroxide
MAA: methacrylic acid
MAP: 3-aminophenol; meta-aminophenol
MBA: 3-methoxy-n-butyl acetate
MCS: m-cresol
MeTMS: methyl trimethoxysilane
MgAg: Magnesium-Argentum (magnesium-silver alloy)
MIBK: methyl isobutyl ketone
MOI: Karenz (registered trademark) MOI (manufactured by Showa Denko K.K., 2-methacryloxyethyl isocyanate)
MT-PE1: Karenz MT-PE1 (manufactured by Showa Denko K.K., pentaerythritol tetrakis (3-mercaptobutyrate))
NA: 5-norbornene-2,3-dicarboxylic acid anhydride; nadic acid anhydride NC-2000-L: epoxy resin (manufactured by Nippon Kayaku Co., Ltd.) used for synthesis of carboxylic acid-modified epoxy resin having a structural unit as represented by general formula (32)

NC-7300-L: epoxy resin (manufactured by Nippon Kayaku Co., Ltd.) used for synthesis of carboxylic acid-modified epoxy resin having a structural unit as represented by general formula (29)

NCI-831: Adeka ARKLS (registered trademark) NCI-831 (manufactured by Adeka Corporation, oxime ester based photo-initiator)

NMP: N-methyl-2-pyrolidone

ODPA: bis(3,4-dicarboxyphenyl) ether dianhydride; oxydiphthalic acid dianhydride P.B.15:6: C. I. Pigment Blue 15:6

P.R.254: C. I. Pigment Red 254

P.Y.139: C. I. Pigment Yellow 139

PCR-1222H: KAYARAD (registered trademark) PCR-1222H (manufactured by Nippon Kayaku Co., Ltd., carboxylic acid-modified epoxy resin having a structural unit as represented by general formula (26))

PGMEA: propylene glycol monomethyl ether acetate

PHA: phthalic acid anhydride

PhTMS: phenyl trimethoxysilane

S-20000: SOLSPERSE (registered trademark) 20000 (manufactured by Lubrizol, polyether based dispersant)

SiDA: 1,3-bis(3-aminopropyl) tetramethyl disiloxane

STR: styrene

TCDM: tricyclo[5.2.1.0$^{2,6}$]decane-8-yl methacrylate; dimethylol-tricyclodecane dimethacrylate TCR-1348H: KAYARAD (registered trademark) TCR-1348H (manufactured by Nippon Kayaku Co., Ltd., carboxylic acid-modified epoxy resin having a structural unit as represented by general formula (27))

THPHA: 1,2,3,6-tetrahydrophthalic acid anhydride

TMAH: tetramethylammonium hydroxide

TMOS: tetramethoxysilane

TMSSucA: 3-trimethoxysilylpropyl succinic acid anhydride

TPK-1227: carbon black (manufactured by CABOT) surface-treated for introduction of sulfonic acid group TrisP-PA: 1,1-bis(4-hydroxyphenyl)-1-[4-[1-(4-hydroxyphenyl)-1-methylethyl]phenyl] ethane (manufactured by Honshu Chemical Industry Co., Ltd.)

WR-301: ADEKA ARKLS (registered trademark) WR-301 (manufactured by Adeka Corporation, polycyclic side chain-containing aromatic resin obtainable by reacting carboxylic acid anhydride with a resin obtainable through ring opening addition reaction of epoxy group-containing aromatic compound and unsaturated carboxylic acid)

ZAR-1494H: KAYARAD (registered trademark) ZAR-1494H (manufactured by Nippon Kayaku Co., Ltd., carboxylic acid-modified epoxy resin having a structural unit as represented by general formula (34))

ZCR-1797H: KAYARAD (registered trademark) ZCR-1797H (manufactured by Nippon Kayaku Co., Ltd., carboxylic acid-modified epoxy resin having a structural unit as represented by general formula (33))

ZFR-1491H: KAYARAD (registered trademark) ZFR-1491H (manufactured by Nippon Kayaku Co., Ltd., carboxylic acid-modified epoxy resin having a structural unit as represented by general formula (34))

ZXR-1816H: KAYARAD (registered trademark) ZXR-1816H (manufactured by Nippon Kayaku Co., Ltd., carboxylic acid-modified epoxy resin having a structural unit as represented by general formula (28))

Synthesis Example (A)

In a three neck flask, 18.31 g (0.05 mol) of BAHF, 17.42 g (0.3 mol) of propylene oxide, and 100 mL of acetone were weighed out and dissolved. To this liquid, a solution of 20.41 g (0.11 mol) of 3-nitrobenzoyl chloride dissolved in 10 mL of acetone was added dropwise. After the end of dropping, the solution was allowed to react at −15° C. for 4 hours, followed by allowing it to return to room temperature. The resulting white solid precipitate was separated out by filtration and vacuum-dried at 50° C. A 30 g portion of the resulting solid material was put in a 300 mL stainless steel autoclave and dispersed in 250 mL of 2-methoxy ethanol, followed by adding 2 g of 5% palladium-carbon. Then, a balloon was used to introduce hydrogen to allow a reaction to continue for 2 hours at room temperature. After the 2-hour period, it was confirmed that the balloon would deflate no more. After the end of the reaction, the solution was filtrated to remove the palladium compound used as catalyst and concentrated by evaporation under reduced pressure to produce a hydroxyl group-containing diamine compound (HFHA) having a structure as given below.

[Chemical formula 35]

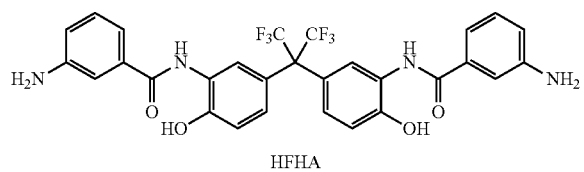

HFHA

Synthesis Example (B)

Synthesis of compound having naphthoquinone diazide structure (QD-1) In a three neck flask in a dry nitrogen flow, 21.23 g (0.05 mole) of TrisP-PA and 37.62 g (0.14 mole) of 5-naphthoquinone diazide sulfonic acid chloride were weighed out and dissolved in 450 g of 1,4-dioxane and maintained at room temperature. To this liquid, a mixed solution of 50 g of 1,4-dioxane and 15.58 g (0.154 mol) of triethyl amine was added dropwise while stirring it to maintain the temperature below 35° C. After the end of dropping, the mixed solution was stirred at 30° C. for 2 hours. After the stirring, the precipitated triethyl amine salt was removed by filtering and the filtrate was poured in water and stirred, followed by separating out the precipitated solid sediment by filtering. The resulting solid was dried by drying under reduced pressure to provide a compound having a naphthoquinone diazide structure as given below (QD-1).

[Chemical formula 36]

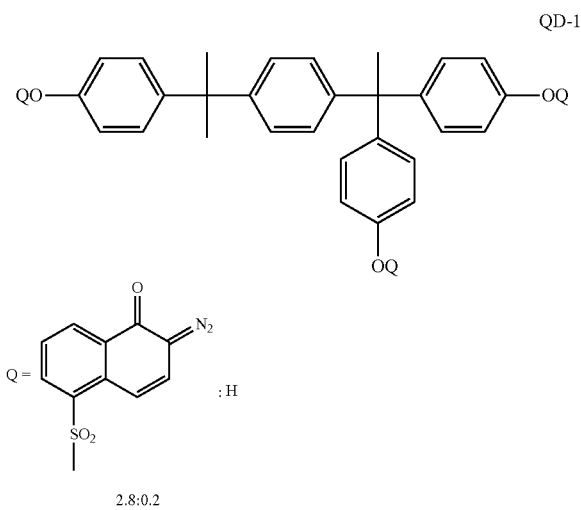

Synthesis Example 1 Synthesis of Polyimide (PI-1)

In a three neck flask in a dry nitrogen flow, 31.13 g of BAHF (0.085 mol; 77.3 mol % relative to total quantity of structural units derived from amines or derivatives thereof), 1.24 g of SiDA (0.0050 mol; 4.5 mol % relative to total quantity of structural units derived from amines or derivatives thereof), 2.18 g of MAP as end capping agent (0.020 mol; 18.2 mol % relative to total quantity of structural units derived from amines or derivatives thereof), and 150.00 g of NMP were weighed out and dissolved. To this liquid, a solution of 31.02 g (0.10 mol; 100 mol % relative to total quantity of structural units derived from carboxylic acids or derivatives thereof) of ODPA dissolved in 50.00 g of NMP was added, stirred at 20° C. for 1 hour, and then stirred at 50° C. for 4 hours. Subsequently, 15 g of xylene was added and stirred at 150° C. for 5 hours while boiling water azeotropically with xylene. After the end of the reaction, the reaction solution was poured in 3 L of water, and the precipitated solid sediment was separated out by filtering. The solid obtained was washed with water three times and dried for 24 hours at 80° C. in a vacuum dryer to provide polyimide (PI-1). The resulting polyimide had a Mw of 27,000, an acid equivalent of 350 g/mol, and a $pK_a$ value of 16.5.

Synthesis Examples 2 to 5 Synthesis of Polyimide (PI-2) to Polyimide (PI-5)

According to Table 1-1 for the types and molar ratios of monomers, the same polymerization procedure as in Synthesis example 1 was carried out to prepare polyimide (PI-2) to polyimide (PI-5). The acid equivalents and $pK_a$ values of the resulting polyimides are shown in Table 1-1.

Synthesis Example 6 Synthesis of Polyimide Solution (PI-6)

According to Table 1-1 for the types and molar ratios of monomers, the same polymerization procedure as in Synthesis example 1 was carried out to prepare a polyimide resin. In a three neck flask in a dry nitrogen flow, 32.79 g of the resulting polyimide resin and 76.51 g of MBA were weighed out and dissolved. The mixed solution was cooled to 0° C., and to this liquid, a solution of 3.16 g (0.45 mole equivalent relative to phenolic hydroxyl group in resin) of MOI dissolved in 3.16 g of MBA was added dropwise. After the end of dropping, stirring was performed at 80° C. for 1 hour to prepare a polyimide solution (PI-6). The resulting polyimide had a Mw of 33,000, an acid equivalent of 760 g/mol, a double bond equivalent of 930 g/mol, and a $pK_a$ value of 16.5.

Synthesis Examples 7 and 8 Synthesis of Polyimide Solution (PI-7) and Polyimide Solution (PI-8)

According to Table 1-1 for the types and molar ratios of monomers, the same polymerization procedure as in Synthesis example 6 was carried out to prepare polyimide solution (PI-7) and polyimide solution (PI-8). The acid equivalents, double bond equivalents, and $pK_a$ values of the resulting polyimides are shown in Table 1-1.

Synthesis Example 9 Synthesis of Polyimide Precursor (PIP-1)

In a three neck flask in a dry nitrogen flow, 44.42 g (0.10 mol; 100 mol % relative to total quantity of structural units derived from carboxylic acids or derivatives thereof) of 6FDA and 150 g of NMP were weighed out and dissolved. To this liquid, a solution of 14.65 g (0.040 mol; 32.0 mol % relative to total quantity of structural units derived from amines or derivatives thereof) of BAHF, 18.14 g (0.030 mol; 24.0 mol % relative to total quantity of structural units derived from amines or derivatives thereof) of HFHA, 1.24 g (0.0050 mol; 4.0 mol % relative to total quantity of structural units derived from amines or derivatives thereof) of SiDA dissolved in 50 g of NMP was added, stirred at 20° C. for 1 hour, and then stirred at 50° C. for 2 hours. Then, a solution of 5.46 g (0.050 mol; 40.0 mol % relative to total quantity of structural units derived from amines or derivatives thereof) of MAP, used as end capping agent, dissolved in 15 g of NMP was added and stirred at 50° C. for 2 hours. Subsequently, a solution of 23.83 g (0.20 mol) of DFA dissolved in 15 g of NMP was added dropwise over 10 minutes. After the end of dropping, stirring was performed at 50° C. for 3 hours. After the end of the reaction, the reaction solution was cooled to room temperature and then the reaction solution was poured in 3 L of water. The precipitated solid sediment was separated out by filtering. The solid obtained was washed with water three times and dried for 24 hours at 80° C. in a vacuum dryer to provide polyimide precursor (PIP-1). The resulting polyimide precursor had a Mw of 20,000, an acid equivalent of 450 g/mol, and a $pK_a$ value of 16.0.

Synthesis Example 10 Synthesis of Polyimide Precursor Solution (PIP-2)

According to Table 1-2 for the types and molar ratios of monomers, the same polymerization procedure as in Synthesis example 9 was carried out to prepare a polyimide precursor. This polyimide precursor was reacted with MOI as in Synthesis example 6 to provide a polyimide precursor solution (PIP-2). The acid equivalent, double bond equivalent, and pKa value of the resulting polyimide precursor are shown in Table 1-2.

Synthesis Example 11 Synthesis of Polybenzoxazole (PBO-1)

In a 500 mL round bottom flask equipped with a toluene-filled Dean-Stark water separator and a cooling pipe, 34.79 g (0.095 mol; 95.0 mol % relative to total quantity of structural units derived from amines or derivatives thereof) of BAHF, 1.24 g (0.0050 mol; 5.0 mol % relative to total quantity of structural units derived from amines or derivatives thereof) of SiDA, and 75.00 g of NMP were weighed out and dissolved. To this liquid, a solution of 19.06 g (0.080 mol; 66.7 mol % relative to total quantity of structural units derived from carboxylic acids or derivatives thereof) of BFE and 6.57 g (0.040 mol; 33.3 mol % relative to total quantity of structural units derived from carboxylic acids or derivatives thereof) of NA, used as end capping agent, dissolved in 25.00 g of NMP was added, stirred at 20° C. for 1 hour, and then stirred at 50° C. for 1 hour. Subsequently, heating and stirring was performed at 200° C. or more for 10 hours in a nitrogen atmosphere to promote dehydration reaction. After the end of the reaction, the reaction solution was poured in 3 L of water, and the precipitated solid sediment was separated out by filtering. The solid obtained was washed with water three times and dried for 24 hours at 80° C. in a vacuum dryer to provide polybenzoxazole (PBO-1). The resulting polybenzoxazole had a Mw of 25,000, an acid equivalent of 330 g/mol, and a $pK_a$ value of 18.5.

Synthesis Example 12 Synthesis of Polybenzoxazole Solution (PBO-2)

According to Table 1-3 for the types and molar ratios of monomers, the same polymerization procedure as in Synthesis example 11 was carried out to prepare polybenzoxazole. This polybenzoxazole was reacted with MOI as in Synthesis example 6 to provide a polybenzoxazole solution (PBO-2). The acid equivalent, double bond equivalent, and $pK_a$ value of the resulting polybenzoxazole are shown in Table 1-3.

Synthesis Example 13 Synthesis of Polybenzoxazole Precursor (PBOP-1)

In a 500 mL round bottom flask equipped with a toluene-filled Dean-Stark water separator and a cooling pipe, 34.79 g (0.095 mol; 95.0 mol % relative to total quantity of structural units derived from amines or derivatives thereof) of BAHF, 1.24 g (0.0050 mol; 5.0 mol % relative to total quantity of structural units derived from amines or derivatives thereof) of SiDA, and 70.00 g of NMP were weighed out and dissolved. To this liquid, a solution of 19.06 g (0.080 mol; 66.7 mol % relative to total quantity of structural units derived from carboxylic acids or derivatives thereof) of BFE dissolved in 20.00 g of NMP was added, stirred at 20° C. for 1 hour, and then stirred at 50° C. for 2 hours. Then, a solution of 6.57 g (0.040 mol; 33.3 mol % relative to total quantity of structural units derived from carboxylic acids or derivatives thereof) of NA, used as end capping agent, dissolved in 10 g of NMP was added and stirred at 50° C. for 2 hours. Then, in a nitrogen atmosphere, stirring was performed at 100° C. for 2 hours. After the end of the reaction, the reaction solution was poured in 3 L of water, and the precipitated solid sediment was separated out by filtering. The solid obtained was washed with water three times and dried for 24 hours at 80° C. in a vacuum dryer to provide a polybenzoxazole precursor (PBOP-1). The resulting polybenzoxazole precursor had a Mw of 20,000, an acid equivalent of 330 g/mol, and a $pK_a$ value of 18.5.

Synthesis Example 14 Synthesis of Polybenzoxazole Precursor Solution (PBOP-2)

According to Table 1-4 for the types and molar ratios of monomers, the same polymerization procedure as in Synthesis example 13 was carried out to prepare a polybenzoxazole precursor. This polybenzoxazole precursor was reacted with MOI as in Synthesis example 6 to provide a polybenzoxazole precursor solution (PBOP-2). The acid equivalent, double bond equivalent, and $pK_a$ value of the resulting polybenzoxazole precursor are shown in Table 1-4.

Synthesis Example 15 Synthesis of Polysiloxane Solution (PS-1)

In a three neck flask, 27.24 g (40 mol %) of MeTMS, 49.57 g (50 mol %) of PhTMS, and 76.60 g of PGMEA were fed. A flow of air was supplied to the flask at 0.05 L/min, and the mixed solution was heated in an oil bath at 40° C. while stirring it. While further continuing the stirring of the mixed solution, an aqueous phosphoric acid solution of 0.450 g of phosphoric acid dissolved in 27.93 g of water was added dropwise over 10 minutes. After the end of dropping, stirring was performed at 40° C. for 30 minutes to hydrolyze the silane compound. After the end of hydrolysis, a solution of 13.12 g (10 mol %) of TMSSucA dissolved in 8.51 g of PGMEA was added. Subsequently, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-1). The resulting polysiloxane had a Mw of 4,000, an acid equivalent of 700 g/mol, and a $pK_a$ value of 21.0.

Synthesis Example 16 Synthesis of Polysiloxane Solution (PS-2)

In a three neck flask, 27.24 g (40 mol %) of MeTMS, 49.57 g (50 mol %) of PhTMS, 7.61 g (10 mol %) of TMOS, and 78.17 g of PGMEA were fed. A flow of nitrogen was supplied to the flask at 0.05 L/min, and the mixed solution was heated in an oil bath at 40° C. while stirring it.

While further continuing the stirring of the mixed solution, an aqueous phosphoric acid solution of 0.253 g of phosphoric acid dissolved in 27.93 g of water was added dropwise over 10 minutes. After the end of dropping, stirring was performed at 40° C. for 30 minutes to hydrolyze the silane compound. After the end of hydrolysis, the bath temperature was increased to 70° C., followed by stirring for 1 hour and then increasing the bath temperature to 115° C. About 2 hours after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-2). The resulting polysiloxane had a Mw of 4,200, an acid equivalent of 840 g/mol, and a $pK_a$ value of 23.0.

Synthesis Example 17 Synthesis of Polysiloxane Solution (PS-3)

In a three neck flask, 13.62 g (20 mol %) of MeTMS, 49.57 g (50 mol %) of PhTMS, 23.43 g (20 mol %) of AcrTMS, and 89.84 g of PGMEA were fed. A flow of air was supplied to the flask at 0.05 L/min, and the mixed solution was heated in an oil bath at 40° C. while stirring it. While further continuing the stirring of the mixed solution, an aqueous phosphoric acid solution of 0.499 g of phosphoric acid dissolved in 27.93 g of water was added over 10 minutes. After the end of addition, stirring was performed at 40° C. for 30 minutes to hydrolyze the silane compound. After the end of hydrolysis, a solution of 13.12 g (10 mol %) of TMSSucA dissolved in 9.98 g of PGMEA was added. Subsequently, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-3). The resulting polysiloxane had a Mw of 5,200, an acid equivalent of 800 g/mol, a double bond equivalent of 800 g/mol, and a $pK_a$ value of 21.0.

Synthesis Example 18 Synthesis of Polysiloxane Solution (PS-4)

In a three neck flask, 13.62 g (20 mol %) of MeTMS, 49.57 g (50 mol %) of PhTMS, 7.61 g (10 mol %) of TMOS, 23.43 g (20 mol %) of AcrTMS, and 91.57 g of PGMEA were fed. A flow of air was supplied to the flask at 0.05 L/min, and the mixed solution was heated in an oil bath at 40° C. while stirring it. While further continuing the stirring of the mixed solution, an aqueous phosphoric acid solution of 0.283 g of phosphoric acid dissolved in 27.93 g of water was added over 10 minutes. After the end of addition, stirring was performed at 40° C. for 30 minutes to hydrolyze the silane compound. After the end of hydrolysis, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-4). The resulting polysiloxane had a Mw of 5,400, an acid equivalent of 970 g/mol, a double bond equivalent of 730 g/mol, and a $pK_a$ value of 23.0.

Synthesis Example 19 Synthesis of Polycyclic Side Chain-Containing Aromatic Resin (CA-1)

In a three neck flask, 46.25 g (0.10 mol) of BGPF and 54.53 g of MBA were weighed out and dissolved. To this liquid, a solution of 17.22 g (0.20 mol) of MAA, 0.135 g (0.0010 mol) of dibenzyl amine, and 0.037 g (0.0003 mol) of 4-methoxyphenol dissolved in 10.00 g of MBA was added and stirred at 90° C. for 4 hours. Subsequently, a solution of 27.92 g (0.090 mol) of ODPA and 2.96 g (0.020 mol) of PHA, used as end capping agent, dissolved in 30.00 g of MBA was added and stirred at 20° C. for 1 hour. Then, in a nitrogen atmosphere, stirring was performed at 150° C. for 5 hours to provide a polycyclic side chain-containing aromatic resin solution (CA-1). The resulting polycyclic side chain-containing aromatic resin had a Mw of 4,700, an acid equivalent of 470 g/mol, a double bond equivalent of 470 g/mol, and a $pK_a$ value of 11.0.

Synthesis Example 20 Synthesis of Acrylic Resin Solution (AC-1)

In a three neck flask, 0.821 g (1 mol %) of 2,2'-azobis (isobutyronitrile) and 29.29 g of PGMEA were fed. Then, 21.52 g (50 mol %) of MAA, 22.03 g (20 mol %) of TCDM, and 15.62 g (30 mol %) of STR were fed and stirred for a while at room temperature, followed by filling the flask with nitrogen sufficiently by bubbling and subsequently stirring at 70° C. for 5 hours. Next, a solution of 14.22 g (20 mol %) of GMA, 0.676 g (1 mol %) of dibenzyl amine, and 0.186 g (0.3 mol %) of 4-methoxyphenol dissolved in 59.47 g of PGMEA was added to the resulting solution, followed by stirring at 90° C. for 4 hours to provide an acrylic resin solution (AC-1). The resulting acrylic resin had a Mw of 15,000, a carboxylic acid equivalent of 490 g/mol, a double bond equivalent of 740 g/mol, and a $pK_a$ value of 12.0.

Synthesis Example 21 Synthesis of Novolac Resin (NV-1)

In a three neck flask, 70.29 g (0.65 mol) of MCS, 37.85 g (0.35 mol) of ASL, 0.62 g (0.005 mol) of oxalic acid dihydrate, and 198.85 g of MIBK were weighed out and dissolved. To this liquid, 243.49 g (3.00 mol) of HAD (37 mass % aqueous solution) was added and stirred at 95° C. for 5 hours. Then, the internal temperature was increased to 180° C. by heating over 1 hour and 30 minutes to remove water out of the system by evaporation. Subsequently, the internal temperature was increased to 195° C. by additional heating and the unreacted monomers were removed by evaporation at a reduced pressure of 150 torr (2.0 kPa). The mixed solution was cooled to room temperature to precipitate the resin dissolved in the mixed solution to provide a novolac resin (NA-1). The resulting novolac resin had a Mw of 5,000, an acid equivalent of 310 g/mol, and a $pK_a$ value of 18.5.

Synthesis Example 22 Synthesis of Novolac Resin Solution (NV-2)

According to Table 1-8 for the types and molar ratios of monomers, the same polymerization procedure as in Synthesis example 21 was carried out to prepare a novolac resin. In a three neck flask in a dry nitrogen flow, 19.82 g of the resulting novolac resin and 46.25 g of MBA were weighed out and dissolved. The mixed solution was cooled to 0° C., and to this liquid, a solution of 0.80 g (0.30 mole equivalent relative to phenolic hydroxyl group in resin) of NA dissolved in 1.87 g of MBA was added dropwise. After the end of dropping, stirring was performed at 80° C. for 1 hour to prepare a novolac resin solution (NV-2). The resulting novolac resin had a Mw of 5,500, an acid equivalent of 360 g/mol, and a pKa value of 16.5.

Synthesis Example 23 Synthesis of Polyhydroxystyrene (PHS-1)

In a three neck flask, 0.821 g (1 mol %) of 2,2'-azobis (isobutyronitrile) and 82.31 g of PGMEA were fed. Then, 21.03 g (35 mol %) of 4HST and 33.85 g (65 mol %) of STR were fed and stirred for a while at room temperature, followed by filling the flask with nitrogen sufficiently by bubbling and subsequently stirring at 70° C. for 5 hours. Then, the reaction solution was poured in 500 mL of methanol, and the precipitated solid sediment was separated out by filtering. The solid obtained was washed with water three times and dried for 24 hours at 80° C. in a vacuum dryer to provide polyhydroxystyrene (PHS-1). The resulting polyhydroxystyrene had a Mw of 15,000, an acid equivalent of 320 g/mol, and a $pK_a$ value of 18.5.

Synthesis Example 24 Synthesis of Polyhydroxystyrene Solution (PHS-2)

According to Table 1-9 for the types and molar ratios of monomers, the same reaction procedure as in Synthesis example 22 was carried out to prepare a polyhydroxystyrene solution (PHS-2). The resulting polyhydroxystyrene had an acid equivalent of 370 g/mol, and a $pK_a$ value of 16.5.

Synthesis Example 25 Synthesis of Carboxylic Acid-Modified Epoxy Resin (AE-1)

In a three neck flask, 42.00 g of NC-7300L (epoxy equivalent 210 g/mol) and 43.91 g of MBA were weighed out and dissolved. To this liquid, a solution of 17.22 g (0.20 mol) of MAA, 0.270 g (0.0020 mol) of dibenzyl amine, and 0.074 g (0.0006 mol) of 4-methoxyphenol dissolved in 10.00 g of MBA was added and stirred at 90° C. for 4 hours. Subsequently, a solution of 24.34 g (0.160 mol) of THPHA dissolved in 30.00 g of MBA was added and stirred at 20° C. for 1 hour. Then, in a nitrogen atmosphere, stirring was performed at 150° C. for 5 hours to provide a carboxylic acid-modified epoxy resin (AE-1). The resulting carboxylic acid-modified epoxy resin had a Mw of 5,000, an acid equivalent of 510 g/mol, a double bond equivalent of 410 g/mol, and a pKa value of 12.0.

Synthesis Example 26 Synthesis of Carboxylic Acid-Modified Epoxy Resin (AE-2)

In a three neck flask, 46.00 g of NC-2000-L (epoxy equivalent 230 g/mol) and 47.91 g of MBA were weighed out and dissolved. To this liquid, a solution of 17.22 g (0.20 mol) of MAA, 0.270 g (0.0020 mol) of dibenzyl amine, and 0.074 g (0.0006 mol) of 4-methoxyphenol dissolved in 10.00 g of MBA was added and stirred at 90° C. for 4 hours. Subsequently, a solution of 24.34 g (0.160 mol) of THPHA dissolved in 30.00 g of MBA was added and stirred at 20° C. for 1 hour. Then, in a nitrogen atmosphere, stirring was performed at 150° C. for 5 hours to provide a carboxylic acid-modified epoxy resin (AE-2). The resulting carboxylic acid-modified epoxy resin had a Mw of 6,000, an acid equivalent of 460 g/mol, a double bond equivalent of 370 g/mol, and a pKa value of 12.0.

The components used in Synthesis examples 1 to 26 are summarized in Table 1-1 to Table 1-10.

TABLE 1-1

| | | Monomer [mole ratio] | | | | | Structural units | | | |
|---|---|---|---|---|---|---|---|---|---|---|
| | Polymer | Tetracarboxylic acid and derivative thereof | | Diamine and derivative thereof | | End capping agent | Compound having ethylenically unsaturated double bond group [mole ratio] | derived from weakly acidic group-containing monomers relative to all structural units [mol %] | Acid equivalent [g/mol] | Double bond equivalent [g/mol] | pKa |
| Synthesis example 1 | polyimide (PI-1) | ODPA (100) | — | BAHF (85) | — | SiDA (5) | MAP (20) | — | 50.0 | 350 | — | 16.5 |
| Synthesis example 2 | polyimide (PI-2) | ODPA (100) | — | BAHF (35) | Bis-A-AF (50) | SiDA (5) | MAP (20) | — | 26.2 | 720 | — | 16.6 |
| Synthesis example 3 | polyimide (PI-3) | ODPA (100) | — | BAHF (20) | Bis-A-AF (65) | SiDA (5) | MAP (20) | — | 19.0 | 1060 | — | 16.7 |
| Synthesis example 4 | polyimide (PI-4) | ODPA (40) | 6FDA (60) | BAHF (85) | — | SiDA (5) | MAP (20) | — | 50.0 | 390 | — | 16.3 |
| Synthesis example 5 | polyimide (PI-5) | ODPA (100) | — | BAHF (60) | ED-900 (25) | SiDA (5) | MAP (20) | — | 38.1 | 570 | — | 16.6 |
| Synthesis example 6 | polyimide (PI-6) | ODPA (100) | — | BAHF (85) | — | SiDA (5) | MAP (20) | MOI (86) | 50.0 | 760 | 930 | 16.5 |
| Synthesis example 7 | polyimide (PI-7) | ODPA (100) | — | BAHF (85) | — | SiDA (5) | MAP (20) | MOI (114) | 50.0 | 1100 | 740 | 16.5 |
| Synthesis example 8 | polyimide (PI-8) | ODPA (100) | — | BAHF (85) | — | SiDA (5) | MAP (20) | MOI (57) | 50.0 | 560 | 1310 | 16.5 |

TABLE 1-2

| | Polymer | Monomer [mole ratio] | | | | | | Structural units derived from weakly acidic group-containing monomers relative to all structural units [mol %] | Acid equivalent [g/mol] | Double bond equivalent [g/mol] | pka |
|---|---|---|---|---|---|---|---|---|---|---|---|
| | | Tetracarboxylic acid and derivative thereof | | Diamine and derivative thereof | | | End capping agent | Compound having ethylenically unsaturated double bond group [mole ratio] | | | | |
| Synthesis example 9 | polyimide precursor (PIP-1) | 6FDA (100) | — | BAHF (40) | HFHA (30) | SiDA (5) | MAP (50) | — | 53.3 | 450 | — | 16.0 |
| Synthesis example 10 | polyimide precursor (PIP-2) | 6FDA (100) | — | BAHF (40) | HFHA (30) | SiDA (5) | MAP (50) | MOI (86) | 53.3 | 930 | 1140 | 16.0 |

TABLE 1-3

| | Polymer | Monomer [mole ratio] | | | | Structural units derived from weakly acidic group-containing monomers relative to all structural units [mol %] | Acid equivalent [g/mol] | Double bond equivalent [g/mol] | pka |
|---|---|---|---|---|---|---|---|---|---|
| | | Dicarboxylic acid and derivative thereof, diformyl compound and derivative thereof | Bisaminophenol compound and derivative thereof, dihydroxydiamine and derivative thereof | End capping agent | Compound having ethylenically unsaturated double bond group [mole ratio] | | | | |
| Synthesis example 11 | polybenzoxazole (PBO-1) | BFE (80) | BAHF (95) | SiDA (5) | NA (40) | — | 43.2 | 330 | — | 18.5 |
| Synthesis example 12 | polybenzoxazole (PBO-2) | BFE (80) | BAHF (95) | SiDA (5) | NA (40) | MOI (86) | 43.2 | 720 | 780 | 18.5 |

TABLE 1-4

| | Polymer | Monomer [mole ratio] | | | | Structural units derived from weakly acidic group-containing monomers relative to all structural units [mol %] | Acid equivalent [g/mol] | Double bond equivalent [g/mol] | pKa |
|---|---|---|---|---|---|---|---|---|---|
| | | Dicarboxylic acid and derivative thereof, diformyl compound and derivative thereof | Bisaminophenol compound and derivative thereof, dihydroxydiamine and derivative thereof | End capping agent | Compound having ethylenically unsaturated double bond group [mole ratio] | | | | |
| Synthesis example 13 | polybenzoxazole precursor (PBOP-1) | BFE (80) | BAHF (95) | SiDA (5) | NA (40) | — | 43.2 | 330 | — | 18.5 |
| Synthesis example 14 | polybenzoxazole precursor (PBOP-2) | BFE (80) | BAHF (95) | SiDA (5) | NA (40) | MOI (86) | 43.2 | 720 | 780 | 18.5 |

TABLE 1-5

| | Polymer | Monomer [mol %] | | | | Structural units derived from weakly acidic group-containing monomers relative to all structural units [mol %] | Acid equivalent [g/mol] | Double bond equivalent [g/mol] | pKa |
|---|---|---|---|---|---|---|---|---|---|
| | | Trifunctional organosilane | Tetrafunctional organosilane, tetrafunctional organosilane oligomer | Acidic group-containing organosilane | Ethylenically unsaturated double bond group-containing organosilane | | | | |
| Synthesis example 15 | polysiloxane solution (PS-1) | MeTMS (40) PhTMS (50) | — | TMSSucA (10) | — | 100.0 | 700 | — | 21.0 |

TABLE 1-5-continued

| | Polymer | Monomer [mol %] | | | | Structural units derived from weakly acidic group-containing monomers relative to all structural units [mol %] | Acid equivalent [g/mol] | Double bond equivalent [g/mol] | pKa |
|---|---|---|---|---|---|---|---|---|---|
| | | Trifunctional organosilane | | Tetrafunctional organosilane, tetrafunctional organosilane oligomer | Acidic group-containing organosilane | Ethylenically unsaturated double bond group-containing organosilane | | | | |
| Synthesis example 16 | polysiloxane solution (PS-2) | MeTMS (40) | PhTMS (50) | TMOS (10) | — | — | 100.0 | 840 | — | 23.0 |
| Synthesis example 17 | polysiloxane solution (PS-3) | MeTMS (20) | PhTMS (50) | — | TMSSucA (10) | AcrTMS (20) | 100.0 | 800 | 800 | 21.0 |
| Synthesis example 18 | polysiloxane solution (PS-4) | MeTMS (20) | PhTMS (50) | TMOS (10) | — | AcrTMS (20) | 100.0 | 970 | 730 | 23.0 |

TABLE 1-6

| | Polymer | Monomer [mole ratio] | | | | Acid equivalent [g/mol] | Double bond equivalent [g/mol] | pKa |
|---|---|---|---|---|---|---|---|---|
| | | Compound having two or more aromatic groups and epoxy group | Tetracarboxylic acid dianhydride, tetracarboxylic acid | End capping agent | Unsaturated carboxylic acid having ethylenically unsaturated double bond group | | | |
| Synthesis example 19 | polycyclic side chain-containing aromatic resin solution (CA-1) | BGPF (100) | ODPA (90) | PHA (20) | MAA (200) | 470 | 470 | 11.0 |

TABLE 1-7

| | Polymer | Monomer [mole ratio] | | | | Acid equivalent [g/mol] | Double bond equivalent [g/mol] | pKa |
|---|---|---|---|---|---|---|---|---|
| | | Acidic group-containing copolymerization component | Aromatic group-containing copolymerization component | Alicyclic group-containing copolymerization component | Ethylenically unsaturated double bond group and epoxy group-containing unsaturated compound | | | |
| Synthesis example 20 | acrylic resin solution (AC-1) | MAA (50) | STR (30) | TCDM (20) | GMA (20) | 490 | 740 | 12.0 |

TABLE 1-8

| | Polymer | Monomer [mole ratio] | | | | Acid equivalent [g/mol] | pKa |
|---|---|---|---|---|---|---|---|
| | | Phenol compound | Active aromatic compound | Aldehyde compound | Tetracarboxylic acid dianhydride, tetracarboxylic acid [mole ratio] | | |
| Synthesis example 21 | novolac resin (NV-1) | MCS (65) | ASL (35) | HAD (300) | — | 310 | 18.5 |
| Synthesis example 22 | novolac resin solution (NV-2) | MCS (65) | ASL (35) | HAD (300) | NA (20) | 360 | 16.5 |

TABLE 1-9

| | Polymer | Monomer [mol %] | | | Acid equivalent [g/mol] | pKa |
|---|---|---|---|---|---|---|
| | | Copolymerization component of hydroxystyrene compound | Copolymerization component of styrene compound | Tetracarboxylic acid dianhydride, tetracarboxylic acid [mole ratio] | | |
| Synthesis example 23 | polyhydroxystyrene solution (PHS-1) | 4HST (35) | STR (65) | — | 320 | 18.5 |
| Synthesis example 24 | Polyhydroxystyrene (PHS-2) | 4HST (35) | STR (65) | NA (10) | 370 | 16.5 |

TABLE 1-10

| | Polymer | Monomer [mass, mol, and, mole ratio] | | | Acid equivalent [g/mol] | Double bond equivalent [g/mol] | pKa |
|---|---|---|---|---|---|---|---|
| | | Aromatic group and epoxy group-containing compound | Dicarboxylic acid anhydride, dicarboxylic acid | Unsaturated carboxylic acid having ethylenically unsaturated double bond group | | | |
| Synthesis example 25 | carboxylic acid-modified epoxy resin (AE-1) | NC-7300L (epoxy equivalent 210 g/mol) 42.00 g (epoxy group based 0.2 mol) (epoxy group based mole ratio 100) | THPHA 24.34 g (0.16 mol) (mole ratio 80) | MAA 17.22 g (0.20 mol) (mole ratio 100) | 510 | 410 | 12.0 |
| Synthesis example 26 | carboxylic acid-modified epoxy resin (AE-2) | NC-2000-L (epoxy equivalent 230 g/mol) 46.00 g (epoxy group based 0.2 mol) (epoxy group based mole ratio 100) | THPHA 24.34 g (0.16 mol) (mole ratio 80) | MAA 17.22 g (0.20 mol) (mole ratio 100) | 460 | 370 | 12.0 |

The structural units of PCR-1222H, CCR-1171H, TCR-1348H, ZXR-1816H, AE-1 synthesized from NC-7300L, AE-2 synthesized from NC-2000-L, ZCR-1797H, ZAR-1494H, and ZFR-1491H are shown below. PCR-1222H has a structural unit as represented by general formula (26a). CCR-1171H has a structural unit as represented by general formula (26b). TCR-1348H has a structural unit as represented by general formula (27a). ZXR-1816H has a structural unit as represented by general formula (28a). AE-1 synthesized from NC-7300L has a structural unit as represented by general formula (29a). AE-2 synthesized from NC-2000-L has a structural unit as represented by general formula (32a). ZCR-1797H has a structural unit as represented by general formula (33a). ZAR-1494H has a structural unit as represented by general formula (34a). ZFR-1491H has a structural unit as represented by general formula (34b).

[Chemical formula 37]

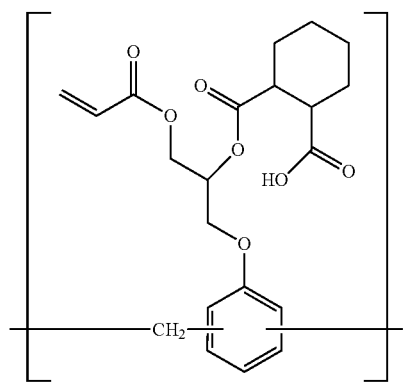

(26a)

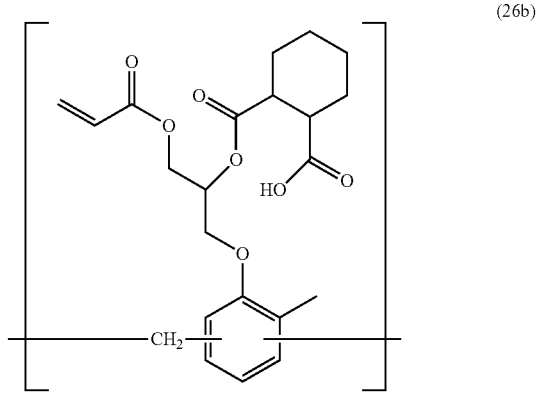

(26b)

(27a)
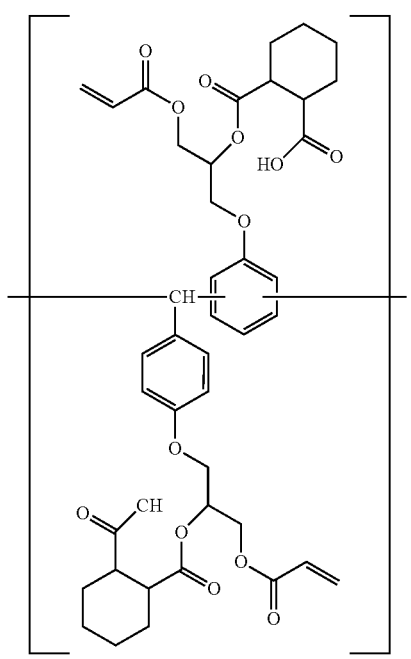
(28a)
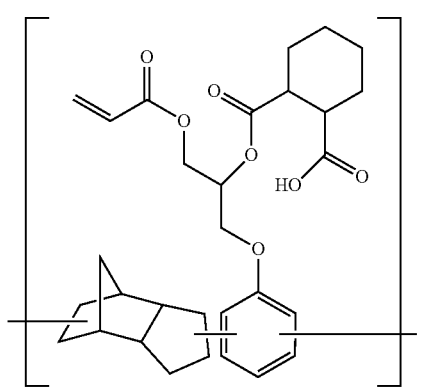
(29a)
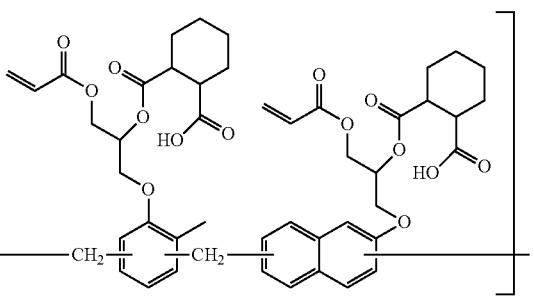
[Chemical formula 38]
(32a)
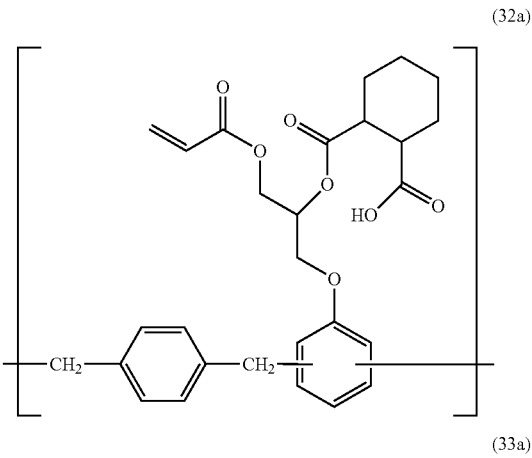
(33a)
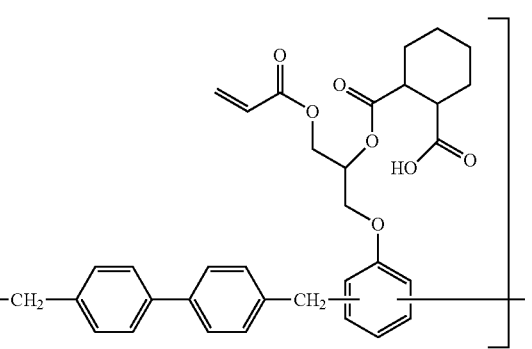
(34a)
(34b)
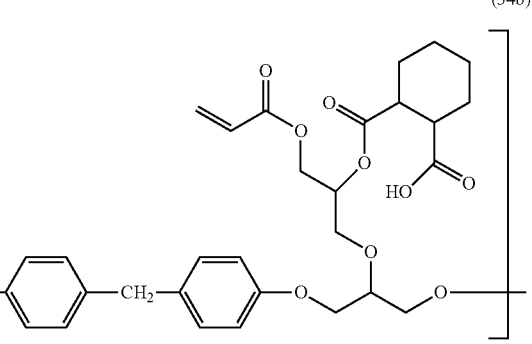

Preparation Example 1 Preparation of Pigment Dispersion Liquid (Bk-1)

First, 34.5 g of S-20000 used as dispersant, 782.0 g of MBA as solvent, and 103.5 g of Bk-S0100CF as coloring agent were weighed, mixed, and stirred for 20 minutes in a high speed disperser (Homodisper, Model 2.5, manufactured by PRIMIX Corporation) to provide a preliminary dispersion liquid. In Ultra Apex Mill (UAM-015, manufactured by Kotobuki Industry Co., Ltd.) equipped with a centrifugal separator filled to 75% with zirconia crushing balls with a diameter of 0.30 mm (YTZ, manufactured by Tosoh Corporation) as ceramic beads for pigment dispersion, the preliminary dispersion liquid obtained above was fed and treated for 3 hours at a rotor's circumferential speed of 7.0 m/s to provide a pigment dispersion liquid (Bk-1) with a solid content of 15 mass % and a coloring agent/dispersant ratio of 75/25 (by mass). The pigment in the resulting pigment dispersion liquid had a number average particle diameter of 100 nm.

Preparation Example 2 Preparation of Pigment Dispersion Liquid (Bk-2)

First, 92.0 g of the 30 mass % polyimide (PI-1) solution in MBA prepared in Synthesis example 1, used as resin, 27.6 g of S-20000 as dispersant, 717.6 g of MBA as solvent, and 82.8 g of Bk-S0100CF as coloring agent were weighed, mixed, and stirred for 20 minutes in a high speed disperser (Homodisper, Model 2.5, manufactured by PRIMIX Corporation) to provide a preliminary dispersion liquid. In Ultra Apex Mill (UAM-015, manufactured by Kotobuki Industry Co., Ltd.) equipped with a centrifugal separator filled to 75% with zirconia crushing balls with a diameter of 0.30 mm (YTZ, manufactured by Tosoh Corporation) as ceramic beads for pigment dispersion, the preliminary dispersion liquid obtained above was fed and treated for 3 hours at a rotor's circumferential speed of 7.0 m/s to provide a pigment dispersion liquid (Bk-2) with a solid content of 15 mass % and a coloring agent/resin/dispersant ratio of 60/20/20 (by mass). The pigment in the resulting pigment dispersion liquid had a number average particle diameter of 100 nm.

Preparation Examples 3 to 7 Preparation of Pigment Dispersion Liquid (Bk-3) to Pigment Dispersion Liquid (Bk-7)

According to the ratios given in Table 2, pigments were dispersed as described in Preparation example 2 to prepare a pigment dispersion liquid (Bk-3) to a pigment dispersion liquid (Bk-7).

The components used and the number average particle diameter of the pigment in the pigment dispersion liquid prepared in Preparation examples 1 to 7 are summarized in Table 2.

TABLE 2

| | Dispersion liquid | Coloring agent | | | Weakly acidic group-containing resin (A1) | Dispersant (e) | Number average particle diameter of pigment in pigment dispersion liquid [nm] |
|---|---|---|---|---|---|---|---|
| Preparation example 1 | pigment dispersion liquid (Bk-1) | Bk-S0100CF (75) | — | — | — | S-20000 (25) | 100 |
| Preparation example 2 | pigment dispersion liquid (Bk-2) | Bk-S0100CF (60) | — | — | polyimide (PI-1) (20) | S-20000 (20) | 100 |
| Preparation example 3 | pigment dispersion liquid (Bk-3) | Bk-S0100CF (60) | — | — | polyimide (PI-2) (20) | S-20000 (20) | 100 |
| Preparation example 4 | pigment dispersion liquid (Bk-4) | Bk-S0100CF (60) | — | — | polyimide (PI-3) (20) | S-20000 (20) | 100 |
| Preparation example 5 | pigment dispersion liquid (Bk-5) | Bk-S0084 (60) | — | — | polyimide (PI-1) (20) | D.BYK-167 (20) | 120 |
| Preparation example 6 | pigment dispersion liquid (Bk-6) | TPK-1227 (60) | — | — | polyimide (PI-1) (20) | D.BYK-167 (20) | 120 |
| Preparation example 7 | pigment dispersion liquid (Bk-7) | P.R.254 (21) | P.Y.139 (9) | P.B.15: 6 (30) | polyimide (PI-1) (20) | D.BYK-167 (20) | 110 |

The evaluation methods used for each Example and Comparative example are described below.

(1) Weight Average Molecular Weight of Resin

Using a GPC analysis apparatus (HLC-8220, manufactured by Tosoh Corporation) containing tetrahydrofuran or NMP as fluidized bed, the polystyrene based weight average molecular weight was determined according to JIS K7252-3 (2008) from measurements taken near room temperature.

(2) Acid Value and Acid Equivalent

Using an automatic potentiometric titration apparatus (AT-510; manufactured by Kyoto Electronics Manufacturing Co., Ltd.) with a 0.1 mol/L sodium hydroxide/ethanol solution as titration reagent and a 1/1 (by mass) xylene/N,N-dimethyl formamide mixture as titration solvent, the acid value (in mgKOH/g) was determined by potentiometric titration according to JIS K2501 (2003). From the measured acid value, the acid equivalent (in g/mol) was calculated.

(3) Double Bond Equivalent

Using an automatic potentiometric titration apparatus (AT-510; manufactured by Kyoto Electronics Manufacturing Co., Ltd.) with an iodine monochloride solution (mixed solution of 7.9 g of iodine trichloride, 8.9 g of iodine, and 1,000 mL of acetic acid) as iodine supply source, 100 g/L of an aqueous potassium iodide solution as aqueous solution for capturing unreacted iodine, and 0.1 mol/L of an aqueous sodium thiosulfate solution as titration reagent, the iodine value of resin was determined by the Wijs method according to Item 6 "Iodine Value" of JIS K0070 (1992) "Test Method for Acid Value, Saponification Value, Ester Value, Iodine Value, Hydroxyl Value, and Unsaponifiable Components of Chemical Products".

From the measured iodine value (in gI/100 g), the double bond equivalent (in g/mol) was calculated.

(4) Contents Various Organosilane Units in Polysiloxane

After performing $^{29}$Si-NMR measurement, the proportion of the integrated value of Si atoms attributed to a specific organosilane unit to the integrated value of Si atoms attributed to all organosilane units was calculated to determine its content. The specimen (liquid) for measurement was put in a Teflon (registered trademark) NMR sample tube with a diameter of 10 mm. The measuring conditions for $^{29}$Si-NMR were as described below.

Apparatus: magnetic nuclear resonance apparatus (JNM-GX270; manufactured by JEOL Ltd.)
Measuring method: gated decoupling
Nuclear frequency: 53.6693 MHz ($^{29}$Si nucleus)
Spectral band width: 20,000 Hz
Pulse width: 12 µs (45° pulse)
Pulse repeating time: 30.0 seconds
Solvent: acetone-d6
Reference substance: tetramethyl silane
Measuring temperature: 23° C.
Specimen rotating speed: 0.0 Hz (5) Number Average Particle Diameter of Pigment A zeta potential/particle diameter/molecular weight measuring apparatus (Zetasizer Nano ZS, manufactured by Sysmex Corporation) was used, and a pigment dispersion liquid was diluted with PGMEA used as dilution solvent to a concentration of $1.0 \times 10^{-5}$ to 40 vol %. Adopting the refractive index of the PGMEA as that of dilution solvent and 1.8 as the refractive index of the specimen, laser beam with a wavelength of 633 nm was applied to determine the number average particle diameter of the pigment in the pigment dispersion liquid.

(6) Acid Dissociation Constant

Using an automatic potentiometric titration apparatus (AT-710; manufactured by Kyoto Electronics Manufacturing Co., Ltd.) with a 0.1 mol/L sodium hydroxide/ethanol solution as titration reagent and dimethyl sulfoxide as titration solvent, the acid dissociation constant was determined by potentiometric titration according to JIS K2501 (2003).

(7) Pre-Treatment of Substrate

The glass substrate used (manufactured by Geomatec Co., Ltd.; hereinafter referred to as ITO/Ag substrate) consists mainly of a 10 nm film of APC (silver/palladium/copper=98.07/0.87/1.06 (by weight)) formed by sputtering on a glass plate and a 100 nm film of ITO formed by sputtering on the APC layer, and it was cleaned before use by subjecting it to UV-$O_3$ cleaning treatment for 100 seconds using a desktop type optical surface treatment apparatus (PL16-110; Sen Lights Co., Ltd.).

(8) Film Thickness Measurement

A surface roughness/contour form measuring machine (SURFCOM 1400D, manufactured by Tokyo Seimitsu Co., Ltd.) was used to measure the film thickness of a prebaked specimen, a developed specimen, and a heat-cured specimen under the measuring conditions of a magnification of 10,000 times, a measuring length of 1.0 mm, and a measuring speed of 0.30 mm/s.

(9) Sensitivity

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) to prepare a developed film of the composition.

The resolution pattern on the developed film prepared above was observed by a FPD/LSI inspection microscope (OPTIPHOT-330; manufactured by Nicon Corporation) and the light exposure (as measured by i-line illuminance meter) required to form a 20 µm line-and-space pattern with a 1 to 1 width ratio was measured to represent the sensitivity. Evaluations were made according to the criteria given below, and samples rated as A+, A, B, or C, which had a sensitivity of 90 mJ/cm$^2$ or less, were judged as acceptable. Those rated as A+, A, or B, which had a sensitivity of 60 mJ/cm$^2$ or less, were judged as having a good sensitivity and those rated as A+ or A, which had a sensitivity of 45 mJ/cm$^2$ or less, were judged as having an excellent sensitivity.

A+: sensitivity of 1 to 30 mJ/cm$^2$
A: sensitivity of 31 to 45 mJ/cm$^2$
B: sensitivity of 46 to 60 mJ/cm$^2$
C: sensitivity of 61 to 90 mJ/cm$^2$
D: sensitivity of 91 to 150 mJ/cm$^2$
E: sensitivity of 151 to 500 mJ/cm$^2$

(10) Resolution

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to prepare a cured film of the composition.

Using a FPD/LSI inspection microscope (OPTIPHOT-330; manufactured by Nicon Corporation), the resolution pattern of the cured film prepared above was observed. The size of the smallest of the line-and-space patterns that were free of residues was adopted to represent the resolution.

(11) Cross-Sectional Shape of Pattern

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to prepare a cured film of the composition.

From the resolution patterns of the cured films prepared, line-and-space patterns with a space width of 20 µm were selected and their cross sections were observed by a field emission-type scanning electron microscope (S-4800, manufactured by Hitachi High-Technologies Corporation) to measure the taper angle of each cross section. Evaluations were made as shown below, and samples rated as A+, A, or B, in which the taper angle in the cross section was 60° or less, were judged as acceptable.

A+: cross section having a taper angle of 1° to 30°
A: cross section having a taper angle of 31° to 45°
B: cross section having a taper angle of 46° to 60°
C: cross section having a taper angle of 61° to 70°
D: cross section having a taper angle of 71° to 80°
E: cross section having a taper angle of 81° to 179°

(12) Light blocking capability (optical density (hereinafter OD)) According to the method described in Example 1 given below, a cured film of the composition was prepared using a high temperature inert gas oven (INH-9CD-S; manufactured by Koyo Thermo Systems Co., Ltd.).

A transmission densitometer (X-Rite 361T (V); manufactured by X-Rite) was used to measure the incident light intensity (I0) and penetrated light intensity (I) for the cured film prepared above. As an indicator of the light blocking capability, the OD value was calculated by the equation given below.

$$\text{OD value} = \log_{10}(I_0/I)$$

(13) Halftone Characteristics According to the method described in Example 1 given below, a prebaked film of the composition with a film thickness of 5 µm was formed on an ITO substrate and then a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to produce a cured film of the composition.

A surface roughness/contour form measuring machine (SURFCOM 1400D, manufactured by Tokyo Seimitsu Co., Ltd.) was used to measure the film thickness of the developed specimen under the measuring conditions of a magnification of 10,000 times, a measuring length of 1.0 mm, and a measuring speed of 0.30 mm/s, followed by determining the thickness $(T_{FT})$ µm of the cured film at the light exposure corresponding to its sensitivity. Here the light exposure corresponding to the sensitivity is represented as $(E_{FT})$ mJ/cm$^2$, and at a light exposure of $0.25 \times (E_{FT})$ mJ/cm$^2$, the thickness $(T_{HT25})$ µm of the heat-cured film was measured. As an indicator of the halftone characteristics, the stepped film thickness was calculated by the equation given below.

$$\text{Stepped film thickness} = (T_{FT}) - (T_{HT25}).$$

Evaluations were made according to the criteria given below, and samples rated as A+, A, B, or C, which had a stepped film thickness of 0.5 µm or more, were judged as acceptable. Those rated as A+, A, or B, which had a stepped film thickness of 1.0 µm or more, were judged as having good halftone characteristics and those rated as A+ or A, which had a stepped film thickness of 1.5 µm or more, were judged as having excellent halftone characteristics.

A+: having a stepped film thickness of 2.0 µm or more
A: having a stepped film thickness of 1.5 µm or more and less than 2.0 µm
B: having a stepped film thickness of 1.0 µm or more and less than 1.5 µm
C: having a stepped film thickness of 0.5 µm or more and less than 1.0 µm
D: having a stepped film thickness of 0.1 µm or more and less than 0.5 µm
E: having a stepped film thickness of less than 0.1 µm or non-measurable because no film remained after development

(14) Luminescence Characteristics of Organic EL Display Device (Production Method for Organic EL Display Device)

Figure 5:
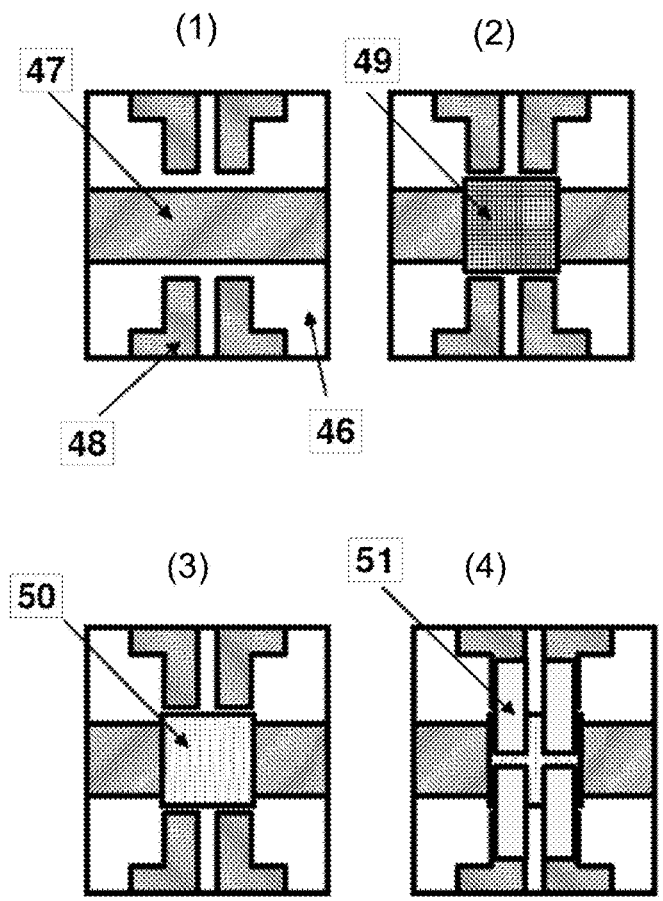
FIGS. 5 (1) to (4) show schematic diagrams illustrating a typical organic EL display device used for evaluation of luminescence characteristics.

FIGS. 5 (1) to (4) show schematic views of the substrates used. First, an ITO transparent conductive coating film of 10 nm was formed by sputtering over the entire surface of a non-alkali glass substrate 46 with a size of 38 mm×46 mm and etched to produce a first electrode 47. An auxiliary electrode 48 was formed simultaneously to produce a second electrode (see FIG. 5 (1)). The resulting substrate was subjected to ultrasonic cleaning for 10 minutes using Semico Clean (registered trademark) 56 (manufactured by Furuuchi Chemical Corporation) and then rinsed with ultrapure water. Then, the negative type photosensitive resin composition according to the present invention was spread on this substrate and prebaked, followed by patterning exposure through a photomask having a predetermined pattern, development, rinsing, and heat-curing. In this way, an insulation layer 49 having openings with a width of 70 µm and a length of 260 µm aligned at intervals of 155 µm in the width direction and 465 µm in the length of direction, each opening exposing the first electrode 47, was formed in an limited effective area of the substrate (see FIG. 5 (2)). These openings would finally form light emitting pixels of an organic EL display device. The limited effective area of the substrate had a size of 16 mm×16 mm and the insulation layer had a thickness of about 1.0 µm.

Then, an organic EL display device was produced using the substrate having a first electrode 47, auxiliary electrode 48, and insulation layer 49 formed thereon. After carrying out nitrogen plasma treatment as pre-treatment, an organic EL layer 50 that included a light emitting layer was formed by vacuum deposition (see FIG. 5 (3)). Here, the degree of vacuum used for deposition was $1 \times 10^{-3}$ Pa or less and the substrate was rotated relative to the deposition source during the deposition step. First, a compound (HT-1) was deposited to a thickness of 10 nm to form a hole injection layer and a compound (HT-2) was deposited to a thickness of 50 nm to form a hole transport layer. Subsequently, a compound (GH-1) and a compound (GD-1) were deposited as host material and dopant material, respectively, on the light emitting layer to a thickness of 40 nm to ensure a doping concentration of 10 wt %. Then, a 40 nm thick layer of compounds (ET-1) and (LiQ) combined at a volume ratio of 1:1, adopted as electron transport materials, was formed thereon. The structures of the compounds used in the organic EL layer are shown blow.

[Chemical formula 39]

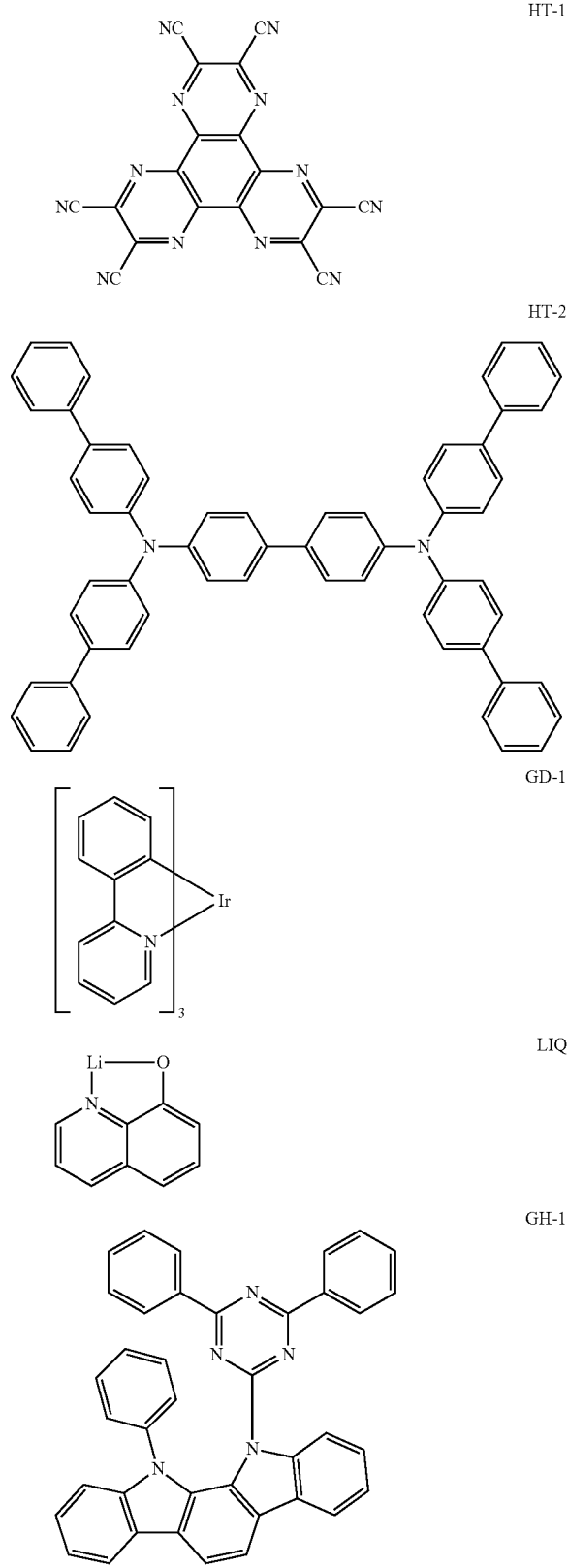

HT-1

HT-2

GD-1

LIQ

GH-1

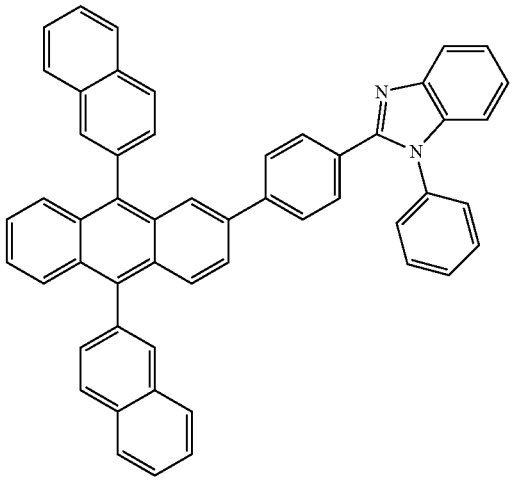

ET-1

Then, a compound (LiQ) was deposited to a thickness of 2 nm and MgAg was deposited at a volume ratio of 10:1 to a thickness of 100 nm to form a second electrode 51, thereby providing a reflecting electrode (see FIG. 5 (4)). Subsequently, in a low-humidity nitrogen atmosphere, a cap-shaped glass plate was adhered with an epoxy resin based adhesion agent to ensure sealing, thus producing four 5 mm×5 mm bottom emission type organic EL display devices on one substrate. The film thickness referred to here is the reading on a crystal oscillation type film thickness monitor.

(Evaluation of Luminescence Characteristics)

The organic EL display devices prepared by the above procedure were caused to emit light by driving it with a direct current of 10 mA/cm$^2$ and observed to check for non-luminescent regions or uneven brightness. The organic EL display devices produced above were held at 80° C. for 500 hours as durability test. After the durability test, the organic EL display devices were caused to emit light by driving it with a direct current of 10 mA/cm$^2$ and observed to check for changes in luminescence characteristics.

(Evaluation of Display Failure Rate)

According to the above method, 20 (5×4) organic EL display devices were prepared using five non-alkali glass substrates with a size of 38×46 mm. The organic EL display devices prepared were driven by a direct current of 10 mA/cm$^2$ to emit light and observed for display device failures including non-light emitting regions, uneven brightness, etc., and the display failure rate was calculated as the proportion of normal ones in the 20 organic EL display devices.

Evaluations were made according to the criteria given below, and samples rated as A+, A, B, or C, which had a display failure rate of 35% or less, were judged as acceptable. Those rated as A+, A, or B, which had a display failure rate of 25% or less, were judged as having a good yield rate and those rated as A+ or A, which had a display failure rate of 15% or less, were judged as having an excellent yield rate.

A+: having a display failure rate of 0% to 5%
A: having a display failure rate of 6% to 15%
B: having a display failure rate of 16% to 25%
C: having a display failure rate of 26% to 35%
D: having a display failure rate of 36% to 65%
E: having a display failure rate of 66% to 100%

[Example 1] (Example not Using a Pigment Dispersion Liquid)

Under yellow light, 0.372 g of NCI-831 was weighed out, and 18.069 g of MBA was added, followed by stirring to ensure dissolution. Then, 8.257 g of a 30 mass % solution of the polyimide (PI-1) obtained in Synthesis example 1 in MBA and 3.303 g of a 50 mass % solution of DPHA in MBA were added and stirred to provide a preparation liquid as a uniform solution. Subsequently, the resulting solution was filtered through a filter with a pore size of 0.45 µm to prepare a composition 1.

The composition 1 prepared was spread on an ITO/Ag substrate by spin coating using a spin coater (MS-A100; manufactured by Mikasa Co., Ltd.) at an appropriate rotating speed and prebaked on a hot plate (SCW-636; manufactured by Dainippon Screen Mfg. Co., Ltd.) at 110° C. for 120 seconds to produce a prebaked film with a thickness of about 1.8 µm.

Then, using a double side alignment type single side aligner (Mask Aligner PEM-6M, manufactured by Union Optical Co., Ltd.), i-line (wavelength 365 nm), h-line (wavelength 405 nm), or g-line (wavelength 436 nm) beam from an ultrahigh pressure mercury lamp was applied to the resulting prebaked film through a gray scale mask designed for sensitivity measurement (MDRM MODEL 4000-5-FS; manufactured by Opto-Line International) to carry out patterning exposure. After the light exposure step, a small development apparatus for photolithography (AD-2000; manufactured by Takizawa Sangyo Co., Ltd.) was used to spread a 2.38 mass % aqueous TMAH solution for 10 seconds, followed by paddle development for 50 seconds and rinsing with water for 30 seconds.

After the development step, a high temperature inert gas oven (INH-9CD-S; manufactured by Koyo Thermo Systems Co., Ltd.) was used to perform heat-curing at 250° C. to produce a cured film with a film thickness of about 1.2 µm. Regarding the heat-curing conditions, the film was heat-cured in a nitrogen atmosphere at 250° C. for 60 minutes.

[Example 2] (Example Using a Pigment Dispersion Liquid)

Under yellow light, 0.263 g of NCI-831 was weighed out, and 12.776 g of MBA was added, followed by stirring to ensure dissolution. Then, 5.838 g of a 30 mass % solution of the polyimide (PI-1) obtained in Synthesis example 1 in MBA and 2.335 g of a 50 mass % solution of DPHA in MBA were added and stirred to provide a preparation liquid as a uniform solution. Then, 7.323 g of the pigment dispersion liquid (Bk-1) obtained in Preparation example 1 was weighed out and 17.677 g of the preparation liquid obtained above was added and stirred to provide a uniform solution. Subsequently, the resulting solution was filtered through a filter with a pore size of 0.45 µm to provide a composition 2.

The composition 2 prepared was spread on an ITO/Ag substrate by spin coating using a spin coater (MS-A100; manufactured by Mikasa Co., Ltd.) at an appropriate rotating speed and prebaked on a hot plate (SCW-636; manufactured by Dainippon Screen Mfg. Co., Ltd.) at 110° C. for 120 seconds to produce a prebaked film with a thickness of about 1.8 µm.

The prebaked film produced was subjected to spray development with a 2.38 mass % aqueous TMAH solution by a small development apparatus for photolithography (AD-2000; manufactured by Takizawa Sangyo Co., Ltd.), and the time period (breaking point; hereinafter referred to as B. P.) required for complete dissolution of the prebaked film (unexposed parts) was measured.

A prebaked film was prepared by the same procedure as above, and then a double side alignment type single side aligner (Mask Aligner PEM-6M; manufactured by Union Optical Co., Ltd.) was used to apply i-line (wavelength 365 nm), h-line (wavelength 405 nm), or g-line (wavelength 436 nm) beam from an ultrahigh pressure mercury lamp to the resulting prebaked film through a gray scale mask designed for sensitivity measurement (MDRM MODEL 4000-5-FS; manufactured by Opto-Line International) to carry out patterning exposure. After the light exposure step, a small development apparatus for photolithography (AD-2000; manufactured by Takizawa Sangyo Co., Ltd.) was used to spread a 2.38 mass % aqueous TMAH solution for 10 seconds, followed by paddle development and rinsing with water for 30 seconds. The development step (including the 10-second period for spreading the 2.38 mass % aqueous TMAH solution) lasted for 1.5 times as long as the B. P.

After the development step, a high temperature inert gas oven (INH-9CD-S; manufactured by Koyo Thermo Systems Co., Ltd.) was used to perform heat-curing at 250° C. to produce a cured film with a film thickness of about 1.2 µm. Regarding the heat-curing conditions, the film was heat-cured in a nitrogen atmosphere at 250° C. for 60 minutes.

Examples 3 to 66 and Comparative Examples 1 to 4

According to the same procedure as in Example 1 or 2, the compositions 3 to 70 were prepared from the components given in Table 3-1, Table 4-1, Table 5-1, Table 6-1, Table 7-1, Table 8-1, Table 9-1, Table 10-1, Table 11-1, Table 12-1, Table 13-1, and Table 14-1. Using each of the compositions obtained, a film of the composition is formed on a substrate and evaluated for photosensitive characteristics and cured film characteristics as in Example 1 or 2. Evaluation results are summarized in Table 3-2, Table 4-2, Table 5-2, Table 6-2, Table 7-2, Table 8-2, Table 9-2, Table 10-2, Table 11-2, Table 12-2, Table 13-2, and Table 14-2. For easy understanding, the components used and evaluation results obtained in Example 8 are included in Table 8-1 and Table 11-1 as well as Table 8-2 and Table 11-2.

TABLE 3-1

| | | | Components [parts by mass] | | | | |
|---|---|---|---|---|---|---|---|
| Composition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
| Example 1 | 1 | — | — | PI-1 (60) | — | DPHA (40) | NCI-831 (9) | — |

TABLE 3-1-continued

| | Compo-sition | | | | | | | |
|---|---|---|---|---|---|---|---|---|
| Example 2 | 2 | Bk-1 | — | PI-1 (60) | — | DPHA (40) | NCI-831 (9) | Bk-S0100CF (33.9) |
| Example 3 | 3 | Bk-1 | — | PS-1 (60) | — | DPHA (40) | NCI-831 (9) | Bk-S0100CF (33.9) |
| Example 4 | 4 | — | — | PI-1 (42) | PI-6 (18) | DPHA (40) | NCI-831 (9) | — |
| Example 5 | 5 | — | — | PI-1 (42) | CA-1 (18) | DPHA (40) | NCI-831 (9) | — |
| Example 6 | 6 | — | — | PS-1 (42) | PI-6 (18) | DPHA (40) | NCI-831 (9) | — |
| Example 7 | 7 | — | — | PS-1 (42) | CA-1 (18) | DPHA (40) | NCI-831 (9) | — |

| | Components [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 1 | — | MBA | 100 | 40 | 0.0 | 0.0 |
| Example 2 | S-20000 (11.3) | MBA PGMEA | 100 | 40 | 22.0 | 32.2 |
| Example 3 | S-20000 (11.3) | MBA PGMEA | 100 | 40 | 22.0 | 32.2 |
| Example 4 | — | MBA | 70 | 40 | 0.0 | 0.0 |
| Example 5 | — | MBA | 70 | 40 | 0.0 | 0.0 |
| Example 6 | — | MBA | 70 | 40 | 0.0 | 0.0 |
| Example 7 | — | MBA | 70 | 40 | 0.0 | 0.0 |

TABLE 3-2

| | Compo-sition | Weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
| | | | | Sensitivity [mJ/cm²] | Resolution [μm] | Cross-sectional shape of pattern [°] | Halftone charac-teristics [μm] | Light blocking capability OD value | Initial charac-teristics | Charac-teristics after durability test | Display failure rate |
| Example 1 | 1 | (A1a-1) | — | 80C | 8 | 36B | 2.1A+ | — | good | good | 0% A+ |
| Example 2 | 2 | (A1a-1) | — | 90C | 8 | 31B | 2.1A+ | 1.0 | good | good | 0% A+ |
| Example 3 | 3 | (A1a-3) | — | 85C | 8 | 30A | 2.1A+ | 1.0 | good | good | 0% A+ |
| Example 4 | 4 | (A1a-1) | (A2a-1) | 25A+ | 8 | 40B | 1.6A | — | good | good | 15% A |
| Example 5 | 5 | (A1a-1) | (A2c-1) | 25A+ | 7 | 38B | 1.5A | — | good | good | 20% B |
| Example 6 | 6 | (A1a-3) | (A2a-1) | 25A+ | 8 | 39B | 1.6A | — | good | good | 15% A |
| Example 7 | 7 | (A1a-3) | (A2c-1) | 25A+ | 8 | 37B | 1.5A | — | good | good | 20% B |

TABLE 4-1

| | Compo-sition | Pigment dispersion liquid | Weakly acidic group-containing resin (A1) derived from preparation liquid added to pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
|---|---|---|---|---|---|---|---|---|
| Example 8 | 8 | Bk-2 | PI-1 (11.3) | PI-1 (30.7) | PI-6 (18) | DPHA (40) | NCI-831 (9) | Bk-S0100CF (33.9) |
| Example 9 | 9 | Bk-2 | PI-1 (11.3) | PI-1 (30.7) | PIP-2 (18) | DPHA (40) | NCI-831 (9) | Bk-S0100CF (33.9) |
| Example 10 | 10 | Bk-2 | PI-1 (11.3) | PI-1 (30.7) | PS-3 (18) | DPHA (40) | NCI-831 (9) | Bk-S0100CF (33.9) |

TABLE 4-1-continued

| | | | | | | | | |
|---|---|---|---|---|---|---|---|---|
| Example 11 | 11 | Bk-2 | PI-1 | PI-1 | PBO-2 | DPHA | NCI-831 | Bk-S0100CF |
| | | | (11.3) | (30.7) | (18) | (40) | (9) | (33.9) |
| Example 12 | 12 | Bk-2 | PI-1 | PI-1 | PBOP-2 | DPHA | NCI-831 | Bk-S0100CF |
| | | | (11.3) | (30.7) | (18) | (40) | (9) | (33.9) |
| Example 13 | 13 | Bk-2 | PI-1 | PI-1 | PS-4 | DPHA | NCI-831 | Bk-S0100CF |
| | | | (11.3) | (30.7) | (18) | (40) | (9) | (33.9) |
| Example 14 | 14 | Bk-2 | PI-1 | PI-1 | CA-1 | DPHA | NCI-831 | Bk-S0100CF |
| | | | (11.3) | (30.7) | (18) | (40) | (9) | (33.9) |
| Example 15 | 15 | Bk-2 | PI-1 | PI-1 | WR-301 | DPHA | NCI-831 | Bk-S0100CF |
| | | | (11.3) | (30.7) | (18) | (40) | (9) | (33.9) |
| Example 16 | 16 | Bk-2 | PI-1 | PI-1 | AC-1 | DPHA | NCI-831 | Bk-S0100CF |
| | | | (11.3) | (30.7) | (18) | (40) | (9) | (33.9) |

| | Components [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 8 | S-20000 (11.3) | MBA PGMEA | 70 | 40 | 22.0 | 32.2 |
| Example 9 | S-20000 (11.3) | MBA PGMEA | 70 | 40 | 22.0 | 32.2 |
| Example 10 | S-20000 (11.3) | MBA PGMEA | 70 | 40 | 22.0 | 32.2 |
| Example 11 | S-20000 (11.3) | MBA PGMEA | 70 | 40 | 22.0 | 32.2 |
| Example 12 | S-20000 (11.3) | MBA PGMEA | 70 | 40 | 22.0 | 32.2 |
| Example 13 | S-20000 (11.3) | MBA PGMEA | 70 | 40 | 22.0 | 32.2 |
| Example 14 | S-20000 (11.3) | MBA PGMEA | 70 | 40 | 22.0 | 32.2 |
| Example 15 | S-20000 (11.3) | MBA PGMEA | 70 | 40 | 22.0 | 32.2 |
| Example 16 | S-20000 (11.3) | MBA PGMEA | 70 | 40 | 22.0 | 32.2 |

TABLE 4-2

| | | | Photosensitive characteristics/cured film characteristics | | | | | Light emitting characteristics of organic EL display device | | |
|---|---|---|---|---|---|---|---|---|---|---|
| | Composition | Weakly acidic group-containing resin (A1) | Unsaturated group-containing resin (A2) | Sensitivity [mJ/cm$^2$] | Resolution [μm] | Cross-sectional shape of pattern [°] | Halftone characteristics [μm] | Light blocking capability OD | Initial characteristics | Characteristics after durability test | Display failure rate |
| Example 8 | 8 | (A1a-1) | (A2a-1) | 45A | 8 | 35B | 1.6A | 1.0 | good | good | 15% A |
| Example 9 | 9 | (A1a-1) | (A2a-2) | 40A | 7 | 37B | 1.6A | 1.0 | good | good | 15% A |
| Example 10 | 10 | (A1a-1) | (A2a-3) | 40A | 8 | 34B | 1.6A | 1.0 | good | good | 15% A |
| Example 11 | 11 | (A1a-1) | (A2b-1) | 45A | 9 | 35B | 1.6A | 1.0 | good | good | 15% A |
| Example 12 | 12 | (A1a-1) | (A2b-2) | 40A | 9 | 37B | 1.6A | 1.0 | good | good | 15% A |
| Example 13 | 13 | (A1a-1) | (A2b-3) | 40A | 9 | 34B | 1.6A | 1.0 | good | good | 15% A |
| Example 14 | 14 | (A1a-1) | (A2c-1) | 45A | 7 | 33B | 1.5A | 1.0 | good | good | 20% B |
| Example 15 | 15 | (A1a-1) | (A2c-1) | 45A | 7 | 33B | 1.5A | 1.0 | good | good | 20% B |
| Example 16 | 16 | (A1a-1) | (A2c-2) | 45A | 7 | 32B | 1.5A | 1.0 | good | good | 30% C |

TABLE 5-1

| | Composition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-Polymerizable compound (B) | Photo-initiator (C1) | Coloring agent (D) derived from pigment dispersion liquid |
|---|---|---|---|---|---|---|---|---|
| Example 17 | 17 | Bk-2 | PI-1 (11.3) | PI-1 (30.7) | PCR-1222H (18) | DPHA (40) | NCI-831 (9) | Bk-S0100CF (33.9) |
| Example 18 | 18 | Bk-2 | PI-1 (11.3) | PI-1 (30.7) | CCR-1171H (18) | DPHA (40) | NCI-831 (9) | Bk-S0100CF (33.9) |
| Example 19 | 19 | Bk-2 | PI-1 (11.3) | PI-1 (30.7) | TCR-1348H (18) | DPHA (40) | NCI-831 (9) | Bk-S0100CF (33.9) |
| Example 20 | 20 | Bk-2 | PI-1 (11.3) | PI-1 (30.7) | ZXR-1816H (18) | DPHA (40) | NCI-831 (9) | Bk-S0100CF (33.9) |
| Example 21 | 21 | Bk-2 | PI-1 (11.3) | PI-1 (30.7) | AE-1 (18) | DPHA (40) | NCI-831 (9) | Bk-S0100CF (33.9) |
| Example 22 | 22 | Bk-2 | PI-1 (11.3) | PI-1 (30.7) | AE-2 (18) | DPHA (40) | NCI-831 (9) | Bk-S0100CF (33.9) |
| Example 23 | 23 | Bk-2 | PI-1 (11.3) | PI-1 (30.7) | ZCR-1797H (18) | DPHA (40) | NCI-831 (9) | Bk-S0100CF (33.9) |
| Example 24 | 24 | Bk-2 | PI-1 (11.3) | PI-1 (30.7) | ZAR-1494H (18) | DPHA (40) | NCI-831 (9) | Bk-S0100CF (33.9) |
| Example 25 | 25 | Bk-2 | PI-1 (11.3) | PI-1 (30.7) | ZFR-1491H (18) | DPHA (40) | NCI-831 (9) | Bk-S0100CF (33.9) |

| | Components [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 17 | S-20000 (11.3) | MBA PGMEA | 70 | 40 | 22.0 | 32.2 |
| Example 18 | S-20000 (11.3) | MBA PGMEA | 70 | 40 | 22.0 | 32.2 |
| Example 19 | S-20000 (11.3) | MBA PGMEA | 70 | 40 | 22.0 | 32.2 |
| Example 20 | S-20000 (11.3) | MBA PGMEA | 70 | 40 | 22.0 | 32.2 |
| Example 21 | S-20000 (11.3) | MBA PGMEA | 70 | 40 | 22.0 | 32.2 |
| Example 22 | S-20000 (11.3) | MBA PGMEA | 70 | 40 | 22.0 | 32.2 |
| Example 23 | S-20000 (11.3) | MBA PGMEA | 70 | 40 | 22.0 | 32.2 |
| Example 24 | S-20000 (11.3) | MBA PGMEA | 70 | 40 | 22.0 | 32.2 |
| Example 25 | S-20000 (11.3) | MBA PGMEA | 70 | 40 | 22.0 | 32.2 |

TABLE 5-2

| | Compo-sition | Weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
| | | | | Sensitivity [mJ/cm²] | Resolution [μm] | Cross-sectional shape of pattern [°] | Halftone charac-teristics [μm] | Light blocking capability OD value | Initial charac-teristics | Charac-teristics after durability test | Display failure rate |
| Example 17 | 17 | (A1a-1) | (A2c-3) | 45A | 7 | 33B | 1.5A | 1.0 | good | good | 20% B |
| Example 18 | 18 | (A1a-1) | (A2c-3) | 45A | 7 | 33B | 1.5A | 1.0 | good | good | 20% B |
| Example 19 | 19 | (A1a-1) | (A2c-3) | 45A | 7 | 33B | 1.5A | 1.0 | good | good | 20% B |
| Example 20 | 20 | (A1a-1) | (A2c-3) | 45A | 7 | 33B | 1.5A | 1.0 | good | good | 20% B |
| Example 21 | 21 | (A1a-1) | (A2c-3) | 45A | 7 | 33B | 1.5A | 1.0 | good | good | 20% B |
| Example 22 | 22 | (A1a-1) | (A2c-3) | 45A | 7 | 33B | 1.5A | 1.0 | good | good | 20% B |
| Example 23 | 23 | (A1a-1) | (A2c-3) | 45A | 7 | 33B | 1.5A | 1.0 | good | good | 20% B |
| Example 24 | 24 | (A1a-1) | (A2c-3) | 45A | 7 | 33B | 1.5A | 1.0 | good | good | 20% B |
| Example 25 | 25 | (A1a-1) | (A2c-3) | 45A | 7 | 33B | 1.5A | 1.0 | good | good | 20% B |

TABLE 6-1

| | Compo-sition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
|---|---|---|---|---|---|---|---|---|
| Example 26 | 26 | Bk-2 | PI-1 (11.3) | PI-1 (22.3) PIP-1 (8.4) | PI-6 (18) | DPHA (40) | NCI-831 (9) | Bk-S0100CF (33.9) |
| Example 27 | 27 | Bk-2 | PI-1 (11.3) | PI-1 (22.3) PS-1 (8.4) | PI-6 (18) | DPHA (40) | NCI-831 (9) | Bk-S0100CF (33.9) |
| Example 28 | 28 | Bk-2 | PI-1 (11.3) | PI-1 (22.3) PBOP-1 (8.4) | PI-6 (18) | DPHA (40) | NCI-831 (9) | Bk-S0100CF (33.9) |
| Example 29 | 29 | Bk-1 | — | PIP-1 (42) | PI-6 (18) | DPHA (40) | NCI-831 (9) | Bk-S0100CF (33.9) |
| Example 30 | 30 | Bk-1 | — | PS-1 (42) | PI-6 (18) | DPHA (40) | NCI-831 (9) | Bk-S0100CF (33.9) |
| Example 31 | 31 | Bk-1 | — | NV-2 (42) | PI-6 (18) | DPHA (40) | NCI-831 (9) | Bk-S0100CF (33.9) |
| Example 32 | 32 | Bk-1 | — | PHS-2 (42) | PI-6 (18) | DPHA (40) | NCI-831 (9) | Bk-S0100CF (33.9) |

| | Components [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 26 | S-20000 (11.3) | MBA PGMEA | 70 | 40 | 22.0 | 32.2 |
| Example 27 | S-20000 (11.3) | MBA PGMEA | 70 | 40 | 22.0 | 32.2 |
| Example 28 | S-20000 (11.3) | MBA PGMEA | 70 | 40 | 22.0 | 32.2 |
| Example 29 | S-20000 (11.3) | MBA PGMEA | 70 | 40 | 22.0 | 32.2 |
| Example 30 | S-20000 (11.3) | MBA PGMEA | 70 | 40 | 22.0 | 32.2 |
| Example 31 | S-20000 (11.3) | MBA PGMEA | 70 | 40 | 22.0 | 32.2 |

TABLE 6-1-continued

| | | | | | | | |
|---|---|---|---|---|---|---|---|
| Example 32 | | S-20000 (11.3) | MBA PGMEA | 70 | 40 | 22.0 | 32.2 |

TABLE 6-2

| | Compo-sition | Weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
| | | | | Sensitivity [mJ/cm²] | Resolution [μm] | Cross-sectional shape of pattern [°] | Halftone charac-teristics [μm] | Light blocking capability OD value | Initial charac-teristics | Characteristics after durability test | Display failure rate |
| Example 26 | 26 | (A1a-1) (A1a-2) | (A2a-1) | 40A | 7 | 35B | 1.6A | 1.0 | good | good | 15% A |
| Example 27 | 27 | (A1a-1) (A1a-3) | (A2a-1) | 40A | 8 | 34B | 1.6A | 1.0 | good | good | 15% A |
| Example 28 | 28 | (A1a-1) (A1b-2) | (A2a-1) | 40A | 8 | 35B | 1.7A | 1.0 | good | good | 10% A |
| Example 29 | 29 | (A1a-2) | (A2a-1) | 35A | 7 | 39B | 1.6A | 1.0 | good | good | 15% A |
| Example 30 | 30 | (A1a-3) | (A2a-1) | 35A | 8 | 34B | 1.6A | 1.0 | good | good | 15% A |
| Example 31 | 31 | (A1a-4) | (A2a-1) | 35A | 8 | 39B | 1.6A | 1.0 | good | good | 15% A |
| Example 32 | 32 | (A1a-5) | (A2a-1) | 35A | 8 | 39B | 1.6A | 1.0 | good | good | 15% A |

TABLE 7-1

| | Compo-sition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
|---|---|---|---|---|---|---|---|---|
| Example 33 | 33 | Bk-1 | — | PBO-1 (42) | PI-6 (18) | DPHA (40) | NCI-831 (9) | Bk-S0100CF (33.9) |
| Example 34 | 34 | Bk-1 | — | PBOP-1 (42) | PI-6 (18) | DPHA (40) | NCI-831 (9) | Bk-S0100CF (33.9) |
| Example 35 | 35 | Bk-1 | — | PS-2 (42) | PI-6 (18) | DPHA (40) | NCI-831 (9) | Bk-S0100CF (33.9) |
| Example 36 | 36 | Bk-1 | — | NV-1 (42) | PI-6 (18) | DPHA (40) | NCI-831 (9) | Bk-S0100CF (33.9) |
| Example 37 | 37 | Bk-1 | — | PHS-1 (42) | PI-6 (18) | DPHA (40) | NCI-831 (9) | Bk-S0100CF (33.9) |
| Example 38 | 38 | Bk-2 | PI-1 (11.3) | PI-1 (30.7) | PI-6 (9) CA-1 (9) | DPHA (40) | NCI-831 (9) | Bk-S0100CF (33.9) |

| | Composition [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 33 | S-20000 (11.3) | MBA PGMEA | 70 | 40 | 22.0 | 32.2 |
| Example 34 | S-20000 (11.3) | MBA PGMEA | 70 | 40 | 22.0 | 32.2 |

TABLE 7-1-continued

|  | | | | | | |
|---|---|---|---|---|---|---|
| Example 35 | S-20000 (11.3) | MBA PGMEA | 70 | 40 | 22.0 | 32.2 |
| Example 36 | S-20000 (11.3) | MBA PGMEA | 70 | 40 | 22.0 | 32.2 |
| Example 37 | S-20000 (11.3) | MBA PGMEA | 70 | 40 | 22.0 | 32.2 |
| Example 38 | S-20000 (11.3) | MBA PGMEA | 70 | 40 | 22.0 | 32.2 |

TABLE 7-2

| | | | Photosensitive characteristics/cured film characteristics | | | | | Light emitting characteristics of organic EL display device | | |
|---|---|---|---|---|---|---|---|---|---|---|
| | Compo-Sition | Weakly acidic group-Containing resin (A1) | Unsaturated group-Containing resin (A2) | Sensitivity [mJ/cm$^2$] | Resolution [μm] | Cross-sectional shape of pattern [°] | Halftone charac-teristics [μm] | Light blocking capability OD value | Initial charac-teristics | Charac-teristics after durability test | Display failure rate |
| Example 33 | 33 | (A1b-1) | (A2a-1) | 45A | 9 | 35B | 1.7A | 1.0 | good | good | 10% A |
| Example 34 | 34 | (A1b-2) | (A2a-1) | 35A | 9 | 39B | 1.7A | 1.0 | good | good | 10% A |
| Example 35 | 35 | (A1b-3) | (A2a-1) | 35A | 9 | 34B | 1.7A | 1.0 | good | good | 10% A |
| Example 36 | 36 | (A1b-4) | (A2a-1) | 35A | 9 | 39B | 1.7A | 1.0 | good | good | 10% A |
| Example 37 | 37 | (A1b-5) | (A2a-1) | 35A | 9 | 39B | 1.7A | 1.0 | good | good | 10% A |
| Example 38 | 38 | (A1a-1) | (A2a-1) (A2c-1) | 40A | 7 | 33B | 1.6A | 1.0 | good | good | 15% A |

TABLE 8-1

| | | Composition [parts by mass] | | | | | | |
|---|---|---|---|---|---|---|---|---|
| | Compo-sition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
| Example 39 | 39 | Bk-2 | PI-1 (11.3) | PI-1 (6.7) | PI-6 (42) | DPHA (40) | NCI-831 (9) | Bk-S0100CF (33.9) |
| Example 40 | 40 | Bk-2 | PI-1 (11.3) | PI-1 (18.7) | PI-6 (30) | DPHA (40) | NCI-831 (9) | Bk-S0100CF (33.9) |
| Example 41 | 41 | Bk-2 | PI-1 (11.3) | PI-1 (18.7) | CA-1 (30) | DPHA (40) | NCI-831 (9) | Bk-S0100CF (33.9) |
| Example 42 | 42 | Bk-2 | PI-1 (11.3) | PI-1 (24.7) | PI-6 (24) | DPHA (40) | NCI-831 (9) | Bk-S0100CF (33.9) |
| Example 8 | 8 | Bk-2 | PI-1 (11.3) | PI-1 (30.7) | PI-6 (18) | DPHA (40) | NCI-831 (9) | Bk-S0100CF (33.9) |
| Example 14 | 14 | Bk-2 | PI-1 (11.3) | PI-1 (30.7) | CA-1 (18) | DPHA (40) | NCI-831 (9) | Bk-S0100CF (33.9) |

| | Composition [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 39 | S-20000 (11.3) | MBA PGMEA | 30 | 40 | 22.0 | 32.2 |
| Example 40 | S-20000 (11.3) | MBA PGMEA | 50 | 40 | 22.0 | 32.2 |
| Example 41 | S-20000 (11.3) | MBA PGMEA | 50 | 40 | 22.0 | 32.2 |

TABLE 8-1-continued

|  |  |  |  |  |  |  |
|---|---|---|---|---|---|---|
| Example 42 | S-20000 (11.3) | MBA PGMEA | 60 | 40 | 22.0 | 32.2 |
| Example 8 | S-20000 (11.3) | MBA PGMEA | 70 | 40 | 22.0 | 32.2 |
| Example 14 | S-20000 (11.3) | MBA PGMEA | 70 | 40 | 22.0 | 32.2 |

TABLE 8-2

|  | Composition | Weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
|  |  |  |  | Sensitivity [mJ/cm²] | Resolution [μm] | Cross-sectional shape of pattern [°] | Halftone characteristics [μm] | Light blocking capability OD value | Initial characteristics | Characteristics after durability test | Display failure rate |
| Example 39 | 39 | (A1a-1) | (A2a-1) | 25A+ | 8 | 43B | 0.8C | 1.0 | good | good | 30% C |
| Example 40 | 40 | (A1a-1) | (A2a-1) | 30A+ | 8 | 39B | 1.2B | 1.0 | good | good | 20% B |
| Example 41 | 41 | (A1a-1) | (A2c-1) | 30A+ | 7 | 37B | 1.1B | 1.0 | good | good | 25% B |
| Example 42 | 42 | (A1a-1) | (A2a-1) | 35A | 8 | 37B | 1.4B | 1.0 | good | good | 20% B |
| Example 8 | 8 | (A1a-1) | (A2a-1) | 45A | 8 | 35B | 1.6A | 1.0 | good | good | 15% A |
| Example 14 | 14 | (A1a-1) | (A2c-1) | 45A | 7 | 33B | 1.5A | 1.0 | good | good | 20% B |

TABLE 9-1

|  | Composition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
|---|---|---|---|---|---|---|---|---|
| Example 43 | 43 | Bk-2 | PI-1 (11.3) | PI-1 (36.7) | PI-6 (12) | DPHA (40) | NCI-831 (9) | Bk-S0100CF (33.9) |
| Example 44 | 44 | Bk-2 | PI-1 (11.3) | PI-1 (36.7) | CA-1 (12) | DPHA (40) | NCI-831 (9) | Bk-S0100CF (33.9) |
| Example 45 | 45 | Bk-2 | PI-1 (11.3) | PI-1 (42.7) | PI-6 (6) | DPHA (40) | NCI-831 (9) | Bk-S0100CF (33.9) |
| Example 46 | 46 | Bk-2 | PI-1 (11.3) | PI-1 (42.7) | CA-1 (6) | DPHA (40) | NCI-831 (9) | Bk-S0100CF (33.9) |
| Example 47 | 47 | Bk-2 | PI-1 (11.3) | PI-1 (45.7) | CA-1 (3) | DPHA (40) | NCI-831 (9) | Bk-S0100CF (33.9) |
| Example 48 | 48 | Bk-2 | PI-1 (11.3) | PI-1 (46.9) | CA-1 (1.8) | DPHA (40) | NCI-831 (9) | Bk-S0100CF (33.9) |
| Example 49 | 49 | Bk-2 | PI-1 (11.3) | PI-1 (48.1) | CA-1 (0.6) | DPHA (40) | NCI-831 (9) | Bk-S0100CF (33.9) |

|  | Composition [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
|  | Dispersant (E) derived from pigment dispersion liquid | Solvent |  |  |  |  |
| Example 43 | S-20000 (11.3) | MBA PGMEA | 80 | 40 | 22.0 | 32.2 |
| Example 44 | S-20000 (11.3) | MBA PGMEA | 80 | 40 | 22.0 | 32.2 |

TABLE 9-1-continued

| | | | | | | | |
|---|---|---|---|---|---|---|---|
| Example 45 | S-20000 (11.3) | MBA PGMEA | 90 | 40 | 22.0 | 32.2 | |
| Example 46 | S-20000 (11.3) | MBA PGMEA | 90 | 40 | 22.0 | 32.2 | |
| Example 47 | S-20000 (11.3) | MBA PGMEA | 95 | 40 | 22.0 | 32.2 | |
| Example 48 | S-20000 (11.3) | MBA PGMEA | 97 | 40 | 22.0 | 32.2 | |
| Example 49 | S-20000 (11.3) | MBA PGMEA | 99 | 40 | 22.0 | 32.2 | |

TABLE 9-2

| | | | Photosensitive characteristics/cured film characteristics | | | | | Light emitting characteristics of organic EL display device | | |
|---|---|---|---|---|---|---|---|---|---|---|
| | Composition | Weakly acidic group-containing resin (A1) | Unsaturated group-containing resin (A2) | Sensitivity [mJ/cm²] | Resolution [μm] | Cross-sectional shape of pattern [°] | Halftone characteristics [μm] | Light blocking capability OD value | Initial characteristics | Characteristics after durability test | Display failure rate |
| Example 43 | 43 | (A1a-1) | (A2a-1) | 50B | 8 | 33B | 1.8A | 1.0 | good | good | 10% A |
| Example 44 | 44 | (A1a-1) | (A2c-1) | 50B | 7 | 31B | 1.7A | 1.0 | good | good | 15% A |
| Example 45 | 45 | (A1a-1) | (A2a-1) | 50B | 8 | 33B | 2.1A+ | 1.0 | good | good | 0% A+ |
| Example 46 | 46 | (A1a-1) | (A2c-1) | 50B | 7 | 31B | 2.0A+ | 1.0 | good | good | 5% A+ |
| Example 47 | 47 | (A1a-1) | (A2c-1) | 50B | 7 | 31B | 2.0A+ | 1.0 | good | good | 5% A+ |
| Example 48 | 48 | (A1a-1) | (A2c-1) | 55B | 7 | 31B | 2.1A+ | 1.0 | good | good | 0% A+ |
| Example 49 | 49 | (A1a-1) | (A2c-1) | 60B | 8 | 31B | 2.1A+ | 1.0 | good | good | 0% A+ |

TABLE 10-1

| | | | Composition [parts by mass] | | | | | |
|---|---|---|---|---|---|---|---|---|
| | Composition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
| Example 50 | 50 | Bk-3 | PI-2 (11.3) | PI-2 (30.7) | PI-6 (18) | DPHA (40) | NCI-831 (9) | Bk-S0100CF (33.9) |
| Example 51 | 51 | Bk-4 | PI-3 (11.3) | PI-3 (30.7) | PI-6 (18) | DPHA (40) | NCI-831 (9) | Bk-S0100CF (33.9) |
| Example 52 | 52 | Bk-2 | PI-1 (11.3) | PI-4 (30.7) | PI-6 (18) | DPHA (40) | NCI-831 (9) | Bk-S0100CF (33.9) |
| Example 53 | 53 | Bk-2 | PI-1 (11.3) | PI-5 (30.7) | PI-6 (18) | DPHA (40) | NCI-831 (9) | Bk-S0100CF (33.9) |
| Example 54 | 54 | Bk-2 | PI-1 (11.3) | PI-1 (30.7) | PI-7 (18) | DPHA (40) | NCI-831 (9) | Bk-S0100CF (33.9) |
| Example 55 | 55 | Bk-2 | PI-1 (11.3) | PI-1 (30.7) | PI-8 (18) | DPHA (40) | NCI-831 (9) | Bk-S0100CF (33.9) |

| | Composition [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Example 50 | S-20000 (11.3) | MBA PGMEA | 70 | 40 | 22.0 | 32.2 |
| Example 51 | S-20000 (11.3) | MBA PGMEA | 70 | 40 | 22.0 | 32.2 |

TABLE 10-1-continued

| | | | | | | | |
|---|---|---|---|---|---|---|---|
| | Example 52 | S-20000 (11.3) | MBA PGMEA | 70 | 40 | 22.0 | 32.2 |
| | Example 53 | S-20000 (11.3) | MBA PGMEA | 70 | 40 | 22.0 | 32.2 |
| | Example 54 | S-20000 (11.3) | MBA PGMEA | 70 | 40 | 22.0 | 32.2 |
| | Example 55 | S-20000 (11.3) | MBA PGMEA | 70 | 40 | 22.0 | 32.2 |

TABLE 10-2

| | | | | Photosensitive characteristics/cured film characteristics | | | | Light emitting characteristics of organic EL display device | | |
|---|---|---|---|---|---|---|---|---|---|---|
| | Composition | Weakly acidic group-containing resin (A1) | Unsaturated group-containing resin (A2) | Sensitivity [mJ/cm$^2$] | Resolution [µm] | Cross-sectional shape of pattern [°] | Halftone characteristics [µm] | Light blocking capability OD value | Initial characteristics | Characteristics after durability test | Display failure rate |
| Example 50 | 50 | (A1a-1) | (A2a-1) | 45A | 9 | 35B | 1.6A | 1.0 | good | good | 15% A |
| Example 51 | 51 | (A1a-1) | (A2a-1) | 45A | 10 | 35B | 1.6A | 1.0 | good | good | 15% A |
| Example 52 | 52 | (A1a-1) | (A2a-1) | 50B | 8 | 35B | 1.6A | 1.0 | good | good | 15% A |
| Example 53 | 53 | (A1a-1) | (A2a-1) | 45A | 8 | 31B | 1.6A | 1.0 | good | good | 15% A |
| Example 54 | 54 | (A1a-1) | (A2a-1) | 40A | 8 | 37B | 1.4B | 1.0 | good | good | 20% B |
| Example 55 | 55 | (A1a-1) | (A2a-1) | 50B | 8 | 33B | 1.8A | 1.0 | good | good | 10% A |

TABLE 11-1

| | | | Composition [parts by mass] | | | | | |
|---|---|---|---|---|---|---|---|---|
| | Composition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
| Example 56 | 56 | Bk-2 | PI-1 (11.3) | PI-1 (41.2) | PI-6 (22.5) | DPHA (25) | NCI-831 (9) | Bk-S0100CF (33.9) |
| Example 57 | 57 | Bk-2 | PI-1 (11.3) | PI-1 (20.2) | PI-6 (13.5) | DPHA (55) | NCI-831 (9) | Bk-S0100CF (33.9) |
| Example 58 | 58 | Bk-2 | PI-1 (19.2) | PI-1 (22.8) | PI-6 (18) | DPHA (40) | NCI-831 (9) | Bk-S0100CF (57.5) |
| Example 8 | 8 | Bk-2 | PI-1 (11.3) | PI-1 (30.7) | PI-6 (18) | DPHA (40) | NCI-831 (9) | Bk-S0100CF (33.9) |
| Example 59 | 59 | Bk-2 | PI-1 (6.8) | PI-1 (35.2) | PI-6 (18) | DPHA (40) | NCI-831 (9) | Bk-S0100CF (20.5) |
| Example 60 | 60 | Bk-5 | PI-1 (11.3) | PI-1 (30.7) | PI-6 (18) | DPHA (40) | NCI-831 (9) | Bk-S0084 (33.9) |
| Example 61 | 61 | Bk-6 | PI-1 (19.2) | PI-1 (22.8) | PI-6 (18) | DPHA (40) | NCI-831 (9) | TPK-1227 (57.5) |
| Example 62 | 62 | Bk-7 | PI-1 (11.3) | PI-1 (30.7) | PI-6 (18) | DPHA (40) | NCI-831 (9) | P.R.254 (11.87) P.Y.139 (5.09) P.B.15: 6 (16.95.) |

TABLE 11-1-continued

| | | Composition [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|---|
| | | Dispersant (E) derived from pigment dispersion liquid | Solvent | | | | |
| | Example 56 | S-20000 (11.3) | MBA PGMEA | 70 | 25 | 22.0 | 28.2 |
| | Example 57 | S-20000 (11.3) | MBA PGMEA | 70 | 55 | 22.0 | 37.6 |
| | Example 58 | S-20000 (19.2) | MBA PGMEA | 70 | 40 | 31.0 | 42.1 |
| | Example 8 | S-20000 (11.3) | MBA PGMEA | 70 | 40 | 22.0 | 32.2 |
| | Example 59 | S-20000 (6.8) | MBA PGMEA | 70 | 40 | 15.0 | 23.5 |
| | Example 60 | S-20000 (11.3) | MBA PGMEA | 70 | 40 | 22.0 | 32.2 |
| | Example 61 | D.BYK-167 (19.2) | MBA PGMEA | 70 | 40 | 31.0 | 42.1 |
| | Example 62 | D.BYK-167 (11.3) | MBA PGMEA | 70 | 40 | 22.0 | 32.2 |

TABLE 11-2

| | | | | Photosensitive characteristics/cured film characteristics | | | | | Light emitting characteristics of organic EL display device | | |
|---|---|---|---|---|---|---|---|---|---|---|---|
| | Composition | Weakly acidic group-containing resin (A1) | Unsaturated group-containing resin (A2) | Sensitivity [mJ/cm²] | Resolution [μm] | Cross-sectional shape of pattern [°] | Halftone characteristics [μm] | Light blocking capability OD value | Initial characteristics | Characteristics after durability test | Display failure rate |
| Example 56 | 56 | (A1a-1) | (A2a-1) | 50B | 8 | 31B | 1.9A | 1.0 | good | good | 10% A |
| Example 57 | 57 | (A1a-1) | (A2a-1) | 40A | 8 | 39B | 1.3B | 1.0 | good | good | 20% B |
| Example 58 | 58 | (A1a-1) | (A2a-1) | 50B | 8 | 39B | 1.6A | 1.5 | good | good | 15% B |
| Example 8 | 8 | (A1a-1) | (A2a-1) | 45A | 8 | 35B | 1.6A | 1.0 | good | good | 15% A |
| Example 59 | 59 | (A1a-1) | (A2a-1) | 35A | 8 | 31B | 1.6A | 0.7 | good | good | 15% A |
| Example 60 | 60 | (A1a-1) | (A2a-1) | 50B | 8 | 35B | 1.6A | 1.0 | good | good | 15% A |
| Example 61 | 61 | (A1a-1) | (A2a-1) | 90C | 8 | 43B | 1.3B | 2.0 | good | good | 25% B |
| Example 62 | 62 | (A1a-1) | (A2a-1) | 50B | 8 | 35B | 1.6A | 0.7 | good | good | 15% A |

TABLE 12-1

| | Composition | Composition [parts by mass] | | | | | | |
|---|---|---|---|---|---|---|---|---|
| | | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid |
| Example 63 | 63 | Bk-1 | — | PS-1 (42) | PI-6 (18) | DPHA (40) | — | Bk-S0100CF (33.9) |
| Example 64 | 64 | Bk-2 | PI-1 (11.3) | PI-1 (30.7) | PI-6 (18) | DPHA (40) | NCI-831 (9) | Bk-S0100CF (33.9) |

TABLE 12-1-continued

| | Composition [parts by mass] | | | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|---|---|
| | Dispersant (E) derived from pigment dispersion liquid | Photo-acid generator (C2) | Coloring agent (D) derived from preparation liquid added to pigment dispersion liquid | Solvent | | | | |
| Example 63 | S-20000 (11.3) | MDT (6) | — | MBA PGMEA | 70 | 40 | 22.4 | 32.2 |
| Example 64 | S-20000 (11.3) | — | S.R.18 (0.7) D.Y.201 (0.7) S.B.63 (3.6) | MBA PGMEA | 70 | 40 | 21.3 | 32.2 |

TABLE 12-2

| | | | | Photosensitive characteristics/cured film characteristics | | | | Light emitting characteristics of organic EL display device | | |
|---|---|---|---|---|---|---|---|---|---|---|
| | Composition | Weakly acidic group-containing resin (A1) | Unsaturated group-containing resin (A2) | Sensitivity [mJ/cm²] | Resolution [μm] | Cross-sectional shape of pattern [°] | Halftone characteristics [μm] | Light blocking capability OD value | Initial characteristics | Characteristics after durability test | Display failure rate |
| Example 63 | 63 | (A1a-3) | (A2a-1) | 35A | 8 | 34B | 1.6A | 1.0 | good | good | 15% A |
| Example 64 | 64 | (A1a-1) | (A2a-1) | 50B | 8 | 35B | 1.6A | 1.1 | good | good | 15% A |

TABLE 13-1

| | Composition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-polymerizable compound (B) | Photo-initiator (C1) | Coloring agent (D) derived from pigment dispersion liquid | Dispersant (E) derived from pigment dispersion liquid |
|---|---|---|---|---|---|---|---|---|---|
| Example 65 | 65 | Bk-2 | PI-1 (11.3) | PI-1 (30.7) | PI-6 (18) | DPHA (40) | NCI-831 (9) | Bk-S0100CF (33.9) | S-20000 (11.3) |
| Example 66 | 66 | Bk-2 | PI-1 (11.3) | PI-1 (30.7) | PI-6 (18) | DPHA (40) | NCI-831 (9) | Bk-S0100CF (33.9) | S-20000 (11.3) |

| | Components [parts by mass] | | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|---|
| | Sensitizer | Chain transfer agent | Solvent | | | | |
| Example 65 | DETX-S (3) | — | MBA PGMEA | 70 | 40 | 21.6 | 32.2 |
| Example 66 | — | MT-PE1 (3) | MBA PGMEA | 70 | 40 | 21.6 | 32.2 |

TABLE 13-2

| | Compo-sition | weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
| | | | | Sensitivity [mJ/cm²] | Resolution [μm] | Cross-sectional shape of pattern [°] | Halftone charac-teristics [μm] | Light blocking capability OD value | Initial charac-teristics | Charac-teristics after durability test | Display failure rate |
| Example 65 | 65 | (A1a-1) | (A2a-1) | 40A | 8 | 35B | 1.6A | 1.0 | good | good | 15% A |
| Example 66 | 66 | (A1a-1) | (A2a-1) | 40A | 8 | 31B | 1.8A | 1.0 | good | good | 10% A |

TABLE 14-1

| | Compo-sition | Pigment dispersion liquid | Weakly acidic group-containing resin (A1) derived from pigment dispersion liquid | Weakly acidic group-containing resin (A1) derived from preparation liquid added to pigment dispersion liquid | Unsaturated group-containing resin (A2) derived from preparation liquid added to pigment dispersion liquid | Radical-Polymerizable compound (B) | Photo-Initiator (C1) | Coloring agent (D) derived from pigment dispersion liquid |
|---|---|---|---|---|---|---|---|---|
| Comparative example 1 | 67 | Bk-1 | — | — | CA-1 (60) | DPHA (40) | NCI-831 (9) | Bk-S0100CF (33.9) |
| Comparative example 2 | 68 | Bk-1 | — | — | AC-1 (60) | DPHA (40) | NCI-831 (9) | Bk-S0100CF (33.9) |
| Comparative example 3 | 69 | Bk-1 | — | PI-1 (12) | PI-6 (48) | DPHA (40) | NCI-831 (9) | Bk-S0100CF (33.9) |
| Comparative example 4 | 70 | Bk-1 | — | PI-1 (12) | CA-1 (48) | DPHA (40) | NCI-831 (9) | Bk-S0100CF (33.9) |

| | Composition [parts by mass] | | Content of weakly acidic group-containing resin (A1) in alkali-soluble resin (A) [mass %] | Content of radical-polymerizable compound (B) in sum of alkali-soluble resin (A) and radical-polymerizable compound (B) [parts by mass] | Content of coloring agent (D) in total solid [mass %] | Content of coloring agent (D) in sum of alkali-soluble resin (A), coloring agent (D), and dispersant (E) [mass %] |
|---|---|---|---|---|---|---|
| | Dispersant (E) derived from pigment dispersion liquid | Solvent | | | | |
| Comparative example 1 | S-20000 (11.3) | MBA PGMEA | 0 | 40 | 22.0 | 32.2 |
| Comparative example 2 | S-20000 (11.3) | MBA PGMEA | 0 | 40 | 22.0 | 32.2 |
| Comparative example 3 | S-20000 (11.3) | MBA PGMEA | 20 | 40 | 22.0 | 32.2 |
| Comparative example 4 | S-20000 (11.3) | MBA PGMEA | 20 | 40 | 22.0 | 32.2 |

TABLE 14-2

| | Compo-sition | Weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
| | | | | Sensitivity [mJ/cm²] | Resolution [μm] | Cross-sectional shape of pattern [°] | Halftone charac-teristics [μm] | Light blocking capability OD value | Initial charac-teristics | Charac-teristics after durability test | Display failure rate |
| Comparative example 1 | 67 | — | (A2c-1) | 25A+ | 7 | 39B | Film disappeared. non-measurable E | 1.0 | good | light emitting area reduced to 50% | 80% E |

TABLE 14-2-continued

| | Compo-sition | Weakly acidic group-containing resin (A1) | Unsaturated group-containing resin (A2) | Photosensitive characteristics/cured film characteristics | | | | | Light emitting characteristics of organic EL display device | | |
|---|---|---|---|---|---|---|---|---|---|---|---|
| | | | | Sensitivity [mJ/cm$^2$] | Resolution [μm] | Cross-sectional shape of pattern [°] | Halftone characteristics [μm] | Light blocking capability OD value | Initial characteristics | Characteristics after durability test | Display failure rate |
| Comparative example 2 | 68 | — | (A2c-2) | 25A+ | 7 | 39B | Film disappeared. non-measurable E | 1.0 | good | light emitting area reduced to 30% | 70% E |
| Comparative example 3 | 69 | (A1a-1) | (A2a-1) | 25A+ | 8 | 45B | 0.2D | 1.0 | good | good | 40% D |
| Comparative example 4 | 70 | (A1a-1) | (A2c-1) | 25A+ | 7 | 43B | 0.1D | 1.0 | good | light emitting area reduced to 80% | 60% D |

Example 67

(Production Method for an Organic EL Display Device not Having a Polarizing Layer)

Figure 6:
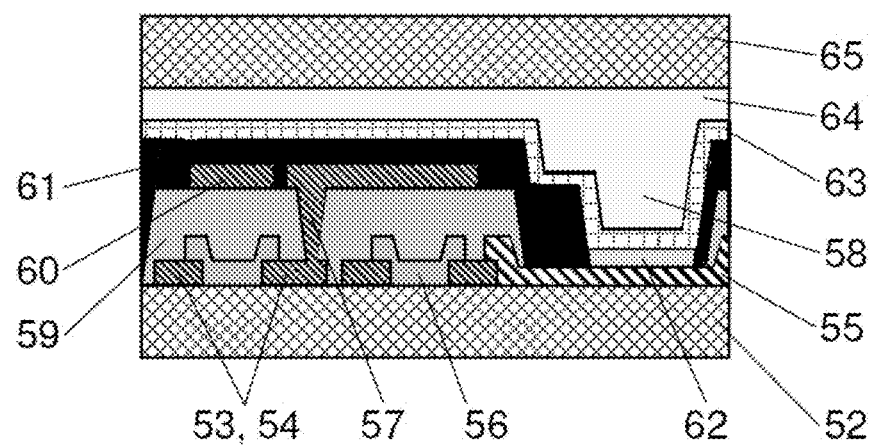
FIG. 6 shows a cross section of a typical organic EL display device having no polarizing layer.

A schematic diagram of the organic EL display device is shown in FIG. 6. First, on a non-alkali glass substrate 52 with a size of 38×46 mm, an overlying film of chromium and gold was formed by electron beam deposition and etched to form a source electrode 53 and a drain electrode 54. Then, a 100 nm film of APC (silver/palladium/copper=98.07/0.87/1.06 (by weight)) was formed by sputtering and etched for pattern processing to form an APC layer, and another 10 nm film of ITO is formed on the APC layer by sputtering and etched to form a reflecting electrode 55 as first electrode. After cleaning the electrode surface with oxygen plasma, a film of amorphous IGZO was formed by sputtering and etched to form an oxide semiconductor layer 56 between the source and drain electrodes. Then, a film of a positive type photosensitivity polysiloxane based material (SP-P2301; manufactured by Toray Industries, Inc.) was formed by spin coating, and a via hole 57 and a pixel region 58 were opened by photolithography, followed by heat-curing to form a gate insulation layer 59. Subsequently, a film of gold is formed by electron beam deposition and etched to form a gate electrode 60, thus producing an oxide TFT array.

By the same method as described in Example 2, a composition 8 (the resin composition prepared in Example 8 given above) was spread on the oxide TFT array, prebaked to form a film, subjected to patterning exposure through a photomask having a predetermined pattern, developed, rinsed to open a pixel region, and heat-cured to form a TFT protection layer/pixel dividing layer 61 having a light blocking capability. In this way, a pixel dividing layer having openings with a width of 70 μm and a length of 260 μm aligned at intervals of 155 μm in the width direction and 465 μm in the length of direction, each opening exposing a reflecting electrode, was formed in an limited effective area of the substrate. These openings would finally form light emitting pixels of an organic EL display device. The limited effective area of the substrate had a size of 16 mm×16 mm and the pixel dividing layer had a thickness of about 1.0 μm.

Then, by the method described in paragraph (14), an organic EL light emitting layer 62 was formed using the compound (HT-1) for a hole injection layer, the compound (HT-2) for a hole transport layer, the compound (GH-1) as host material, the compound (GD-1) as dopant material, and the compound (ET-1) and compound (LiQ) as electronic transport materials.

Subsequently, MgAg was deposited at a volume ratio of 10:1 to form a film with a thickness of 10 nm and etched to form a transparent electrode 63 as second electrode. Then, in a low-humidity nitrogen atmosphere, an organic EL sealing material (Struct Bond (registered trademark) XMF-T; manufactured by Mitsui Chemicals, Inc.) was used to form a sealing film 64. In addition, a non-alkali glass substrate 65 was fixed on the sealing film, and four 5 mm×5 mm top-emission type organic EL display devices having no polarizing layer were formed on one substrate. The film thickness referred to here is the reading on a crystal oscillation type film thickness monitor.

(Evaluation of Luminescence Characteristics)

Organic EL display devices prepared by the above method were driven by a direct current of 10 mA/cm$^2$ to emit light and observed to determine the brightness (Y') in the case where external light was applied to the pixel dividing layer and the brightness ($Y_0$) in the case where no external light was applied. As an indicator of the decrease in external light reflection, the contrast was calculated by the equation given below.

Contrast=$Y_0$/Y'

Evaluations were made according to the criteria given below, and samples rated as A+, A, or B, which had a contrast of 0.80 or more, were judged as acceptable. Those rated as A+ or A, which had a contrast of 0.90 or more, were judged as having a good external light reflection decreasing effect and those rated as A+, which had a contrast of 0.95 or more, were judged as having an excellent external light reflection decreasing effect. The organic EL display devices prepared by the above method had a contrast of 0.90 or more, proving that external light reflection was decreased.

A+: having a contrast of 0.95 to 1.00
A: having a contrast of 0.90 to 0.94
B: having a contrast of 0.80 to 0.89
C: having a contrast of 0.70 to 0.79
D: having a contrast of 0.50 to 0.69
E: having a contrast of 0.01 to 0.49

EXPLANATION OF NUMERALS

1: glass substrate
2: TFT

3: cured film for TFT planarization
4: reflecting electrode
5a: prebaked film
5b: step-shaped cured pattern
6: halftone photomask
7: active actinic ray
8: EL light emitting layer
9: transparent electrode
10: cured film for planarization
11: cover glass
12: glass substrate
13: BLU
14: glass substrate with BLU
15: glass substrate
16: TFT
17: cured film for TFT planarization
18: transparent electrode
19: planarization film
20: alignment layer
21a: prebaked film
21b: cured pattern
21c: step-shaped cured pattern
22: halftone photomask
23: active actinic ray
24: step-shaped glass substrate with BCS
25: step-shaped glass substrate with BLU and BCS
26: glass substrate
27: CF
28: cured film for planarization
29: alignment layer
30: CF substrate
31: step-shaped glass substrate with BLU, CF, and BCS
32: liquid crystal layer
33: glass substrate
34: PI film substrate
35: oxide TFT
36: cured film for TFT planarization
37: reflecting electrode
38a: prebaked film
38b: step-shaped cured pattern
39: halftone photomask
40: active actinic ray
41: EL light emitting layer
42: transparent electrode
43: cured film for planarization
44: glass substrate
45: PET film substrate
46: non-alkali glass substrate
47: first electrode
48: auxiliary electrode
49: insulation layer
50: organic EL layer
51: second electrode
52: non-alkali glass substrate
53: source electrode
54: drain electrode
55: reflecting electrode
56: oxide semiconductor layer
57: via hole
58: pixel region
59: gate insulation layer
60: gate electrode
61: step-shaped TFT protective layer/pixel dividing layer
62: organic EL light emitting layer
63: transparent electrode
64: sealing film
65: non-alkali glass substrate
66: thick part
67a, 67b, 67c: thin part
68a, 68b, 68c, 68d, 68e: oblique side of cross section of cured pattern
69: horizontal side of underlying substrate

The invention claimed is:

1. A negative photosensitive resin composition comprising,
as an alkali-soluble resin (A), at least a weakly acidic group-containing resin (A1), and an unsaturated group-containing resin (A2),
a radical-polymerizable compound (B) and
a photosensitive agent (C),
the weakly acidic group-containing resin (A1) containing an acidic group having an acid dissociation constant in the range of 13.0 to 23.0 in dimethyl sulfoxide, and
the unsaturated group-containing resin (A2) having an ethylenically unsaturated double bond group,
wherein the weakly acidic group-containing resin (A1) includes one or more selected from the group consisting of polyimide (A1a-1), polyimide precursor (A1a-2), carboxylic acid-modified polysiloxane (A1a-3), polybenzoxazole (A1b-1), polybenzoxazole precursor (A1b-2), and polysiloxane (A1b-3).

2. A negative photosensitive resin composition as set forth in claim 1, wherein
the weakly acidic group-containing resin (A1) includes a double acidic group-containing resin (A1a) and a weakly acidic group-containing second resin (A1b),
the double acidic group-containing resin (A1a) includes one or more selected from the group consisting of polyimide (A1a-1), polyimide precursor (A1a-2), carboxylic acid-modified polysiloxane (A1a-3), carboxylic acid-modified novolac resin (A1a-4), and carboxylic acid-modified polyhydroxystyrene (A1a-5), and
the weakly acidic group-containing second resin (A1b) includes one or more selected from the group consisting of polybenzoxazole (A1b-1), polybenzoxazole precursor (A1b-2), polysiloxane (A1b-3), novolac resin (A1b-4), and polyhydroxystyrene (A1b-5).

3. A negative photosensitive resin composition as set forth in claim 1, wherein the weakly acidic group-containing resin (A1) has one or more acidic groups selected from the group consisting of phenolic hydroxyl group, silanol group, hydroxyimide group, and hydroxyamide group.

4. A negative photosensitive resin composition as set forth in claim 1 further comprising a coloring agent (D).

5. A negative photosensitive resin composition as set forth in claim 4, wherein the coloring agent (D) contains a pigment (D1), and the pigment (D1) contains a black pigment (D1a).

6. A negative photosensitive resin composition as set forth in claim 5, wherein
the black pigment (D1a) contains a benzofuranone based black pigment (D1a-1a) and/or a perylene based black pigment (D1a-1b) as a black organic pigment (D1a-1), and
the benzofuranone based black pigment (D1a-1a) includes a benzofuranone compound as represented by any of general formulae (63) to (68), a geometrical isomer thereof, a salt thereof, or a geometrical isomer salt thereof, and
the perylene based black pigment (D1a-1b) includes a perylene compound as represented by any of general formulae (69) to (71), a geometrical isomer thereof, a salt thereof, or a geometrical isomer salt thereof;

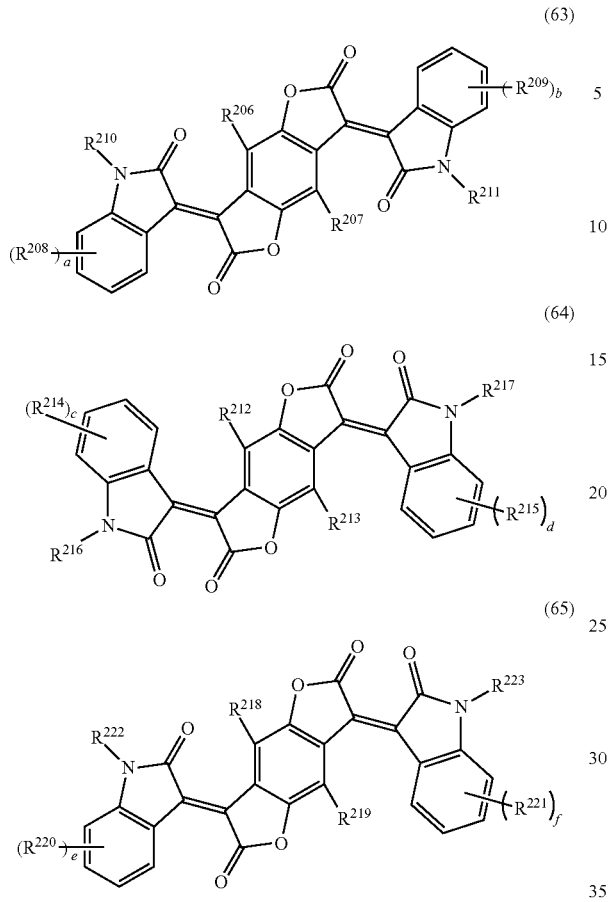

(63)

(64)

(65)

wherein in formulae (63) to (65), $R^{206}$, $R^{207}$, $R^{212}$, $R^{213}$, $R^{218}$, and $R^{219}$ are each independently a hydrogen atom, a halogen atom, an alkyl group containing 1 to 10 carbon atoms, or an alkyl group containing 1 to 10 carbon atoms and 1 to 20 fluorine atoms;

$R^{208}$, $R^{209}$, $R^{214}$, $R^{215}$, $R^{220}$, and $R^{221}$ are each independently a hydrogen atom, a halogen atom, $R^{251}$, COOH, COOR$^{251}$, COO—, CONH$_2$, CONHR$^{251}$, CONR$^{251}$R$^{252}$, CN, OH, OR$^{251}$, OCOR$^{251}$, OCONH$_2$, OCONHR$^{251}$, OCONR$^{251}$R$^{252}$, NO$_2$, NH$_2$, NHR$^{251}$, NR$^{251}$R$^{252}$, NHCOR$^{251}$, NR$^{251}$COR$^{252}$, N=CH$_2$, N=CHR$^{251}$, N=CR$^{251}$R$^{252}$, SH, SR$^{251}$, SOR$^{251}$, SO$_2$R$^{251}$, SO$_3$R$^{251}$, SO$_3$H, SO$_3^-$, SO$_2$NH$_2$, SO$_2$NHR$^{251}$, or SO$_2$NR$^{251}$R$^{252}$, and $R^{251}$ and $R^{252}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing carbon atoms 2 to 10;

a plurality selected from $R^{208}$, $R^{209}$, $R^{214}$, $R^{215}$, $R^{220}$, and $R^{221}$ may be connected by a direct bond, oxygen atom bridge, sulfur atom bridge, NH bridge, or NR$^{251}$ bridge to form a ring;

$R^{210}$, $R^{211}$, $R^{216}$, $R^{217}$, $R^{222}$, and $R^{223}$ are each independently a hydrogen atom, an alkyl group containing 1 to 10 carbon atoms, or an aryl group containing 6 to 15 carbon atoms; and a, b, c, d, e, and f are each independently an integer of 0 to 4;

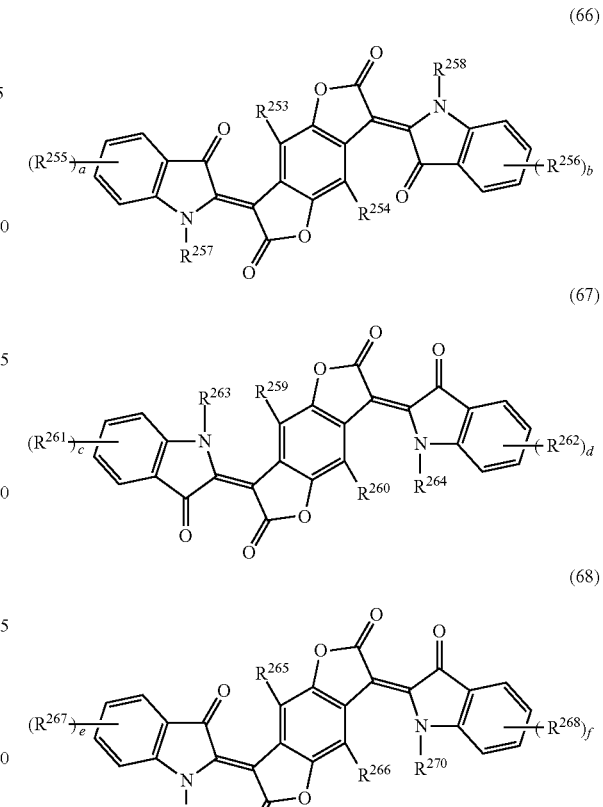

(66)

(67)

(68)

wherein in formulae (66) to (68), $R^{253}$, $R^{254}$, $R^{259}$, $R^{260}$, $R^{265}$, and $R^{266}$ are each independently a hydrogen atom, a halogen atom, an alkyl group containing 1 to 10 carbon atoms, or an alkyl group containing 1 to 10 carbon atoms and 1 to 20 fluorine atoms;

$R^{255}$, $R^{256}$, $R^{261}$, $R^{262}$, $R^{267}$, and $R^{268}$ are each independently a hydrogen atom, a halogen atom, $R^{271}$, COOH, COOR$^{271}$, COO—, CONH$_2$, CONHR$^{271}$, CONR$^{271}$R$^{272}$, CN, OH, OR$^{271}$, OCOR$^{271}$, OCONH$_2$, OCONHR$^{271}$, OCONR$^{271}$R$^{272}$, NO$_2$, NH$_2$, NHR$^{271}$, NR$^{271}$R$^{272}$, NHCOR$^{271}$, NR$^{271}$COR$^{272}$, N=CH$_2$, N=CHR$^{271}$, N=CR$^{271}$R$^{272}$, SH, SR$^{271}$, SOR$^{271}$, SO$_2$R$^{271}$, SO$_3$R$^{271}$, SO$_3$H, SO$_3^-$, SO$_2$NH$_2$, SO$_2$NHR$^{271}$, or SO$_2$NR$^{271}$R$^{272}$, and $R^{271}$ and $R^{272}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing 2 to 10 carbon atoms;

a plurality selected from $R^{255}$, $R^{256}$, $R^{261}$, $R^{262}$, $R^{267}$, and $R^{268}$ may be connected by a direct bond, oxygen atom bridge, sulfur atom bridge, NH bridge, or NR$^{271}$ bridge to form a ring;

$R^{257}$, $R^{258}$, $R^{263}$, $R^{264}$, $R^{269}$, and $R^{270}$ are each independently a hydrogen atom, an alkyl group containing 1 to 10 carbon atoms, or an aryl group containing 6 to 15 carbon atoms; and a, b, c, d, e, and f are each independently an integer of 0 to 4;

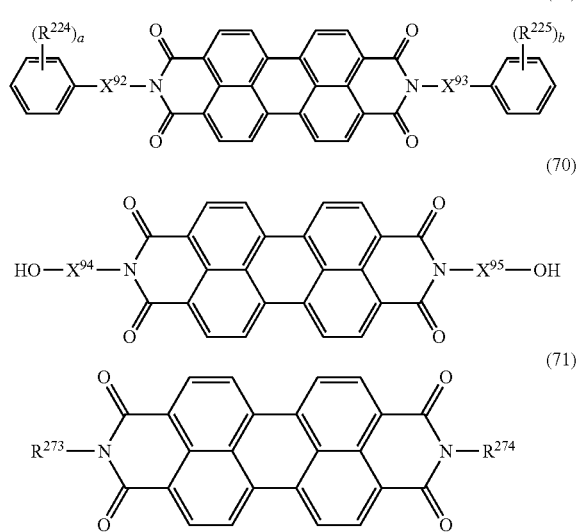

wherein in formulae (69) to (71), $X^{92}$, $X^{93}$, $X^{94}$, and $X^{95}$ are each independently an alkylene chain containing 1 to 10 carbon atoms;

$R^{224}$ and $R^{225}$ are each independently a hydrogen atom, a hydroxyl group, an alkoxy group containing 1 to 6 carbon atoms, or an acyl group containing 2 to 6 carbon atoms;

$R^{273}$ and $R^{274}$ are each independently a hydrogen atom or an alkyl group containing 1 to 10 carbon atoms; and a and b are each an integer of 0 to 5.

7. A negative photosensitive resin composition as set forth in claim 6, wherein the black organic pigment (D1a-1) contains the benzofuranone based black pigment (D1a-1a).

8. A negative photosensitive resin composition as set forth in claim 1, wherein the unsaturated group-containing resin (A2) includes one or more selected from the group consisting of unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), unsaturated group-containing polysiloxane (A2b-3), polycyclic side chain-containing aromatic resin (A2c-1), acrylic resin (A2c-2), and carboxylic acid-modified epoxy resin (A2c-3).

9. A negative photosensitive resin composition as set forth in claim 8, wherein the unsaturated group-containing resin (A2) includes one or more selected from the group consisting of unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), and unsaturated group-containing polysiloxane (A2b-3).

10. A negative photosensitive resin composition as set forth in claim 1, wherein the weakly acidic group-containing resin (A1) has no ethylenically unsaturated double bond group, and the weakly acidic group-containing resin (A1) accounts for 30 to 99 mass % of the alkali-soluble resin (A).

11. A negative photosensitive resin composition as set forth in claim 10, wherein the weakly acidic group-containing resin (A1) accounts for 70 to 97 mass % of the alkali-soluble resin (A).

12. A negative photosensitive resin composition as set forth in claim 1, wherein a step-shaped cured pattern of the resin composition is obtained by a step of forming a coating film of a photosensitive resin composition, a step of applying active actinic ray to the resin composition through halftone photomasks to form an undeveloped pattern, a step of developing the undeveloped pattern with an alkaline solution to form a step-shaped pattern of the resin composition, and, a step for heating the step-shaped pattern, and wherein the film thickness difference ($\Delta T_{FT\text{-}HT}$) µm between ($T_{FT}$) and ($T_{HT}$), wherein ($T_{FT}$) µm denotes the film thickness of the thick parts of the transparent portions of the halftone photomasks and ($T_{HT}$) µm denotes the film thickness of the thin parts of the translucent portions of the halftone photomasks in the stepped shape of the cured pattern, is in the range of 1.0 to 10.0 µm.

13. A negative photosensitive resin composition comprising, as an alkali-soluble resin (A), at least a weakly acidic group-containing resin (A1), and an unsaturated group-containing resin (A2), a radical-polymerizable compound (B), a photosensitive agent (C), and a coloring agent (D), the weakly acidic group-containing resin (A1) containing an acidic group having an acid dissociation constant in the range of 13.0 to 23.0 in dimethyl sulfoxide, and the unsaturated group-containing resin (A2) having an ethylenically unsaturated double bond group, wherein the weakly acidic group-containing resin (A1) includes one or more selected from the group consisting of polyimide (A1a-1), polyimide precursor (A1a-2), carboxylic acid-modified polysiloxane (A1a-3), carboxylic acid-modified novolac resin (A1a-4), carboxylic acid-modified polyhydroxystyrene (A1a-5), polybenzoxazole (A1b-1), polybenzoxazole precursor (A1b-2), polysiloxane (A1b-3), novolac resin (A1b-4), and polyhydroxystyrene (A1b-5), the coloring agent (D) contains a black pigment (D1a) as a pigment (D1), the black pigment (D1a) contains a benzofuranone based black pigment (D1a-1a) and/or a perylene based black pigment (D1a-1b) as a black organic pigment (D1a-1), the benzofuranone based black pigment (D1a-1a) includes a benzofuranone compound as represented by any of general formulae (63) to (68), a geometrical isomer thereof, a salt thereof, or a geometrical isomer salt thereof, and the perylene based black pigment (D1a-1b) includes a perylene compound as represented by any of general formulae (69) to (71), a geometrical isomer thereof, a salt thereof, or a geometrical isomer salt thereof;

(63)

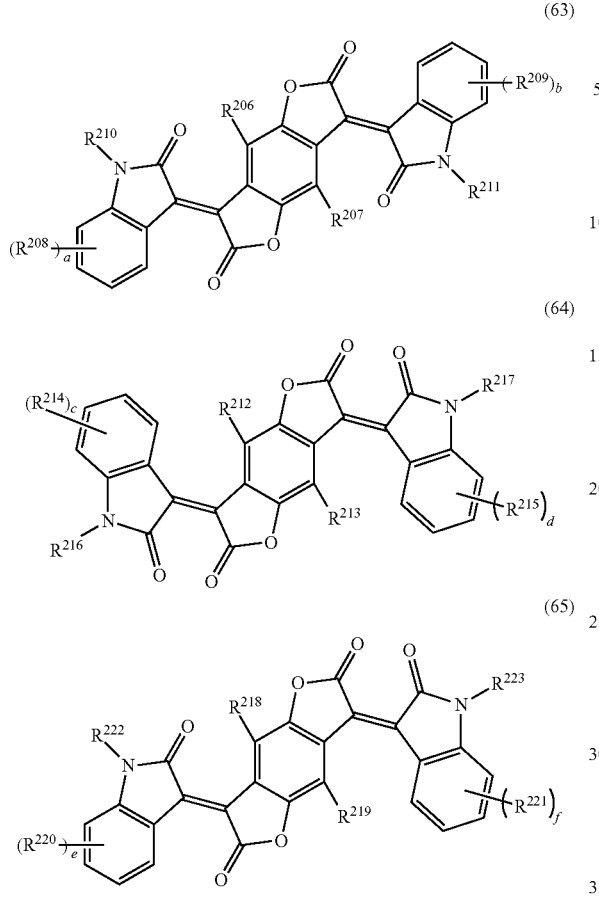

(64)

(65)

(66)

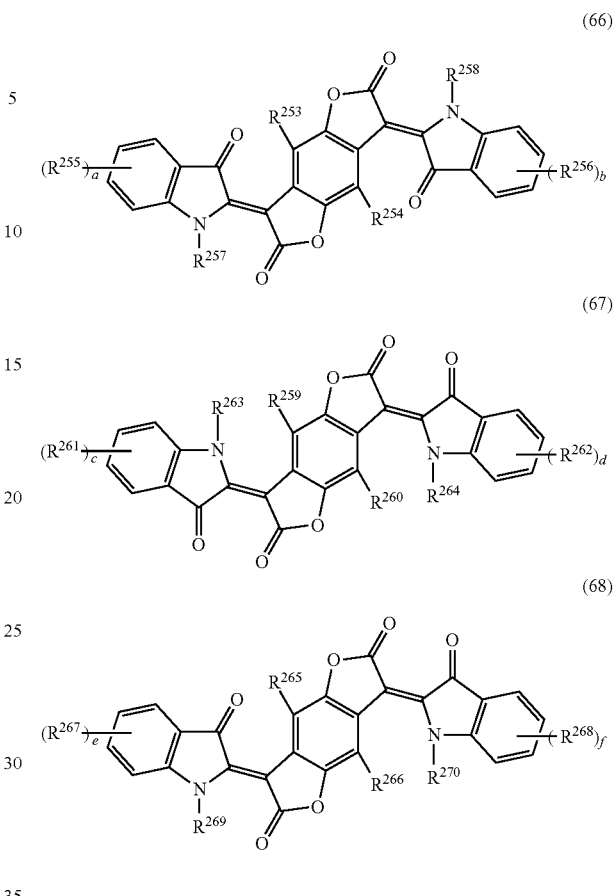

(67)

(68)

wherein in formulae (63) to (65), $R^{206}$, $R^{207}$, $R^{212}$, $R^{213}$, $R^{218}$, and $R^{219}$ are each independently a hydrogen atom, a halogen atom, an alkyl group containing 1 to 10 carbon atoms, or an alkyl group containing 1 to 10 carbon atoms and 1 to 20 fluorine atoms;

$R^{208}$, $R^{209}$, $R^{214}$, $R^{215}$, $R^{220}$, and $R^{221}$ are each independently a hydrogen atom, a halogen atom, $R^{251}$, COOH, COOR$^{251}$, COO—, CONH$_2$, CONHR$^{251}$, CONR$^{251}$R$^{252}$, CN, OH, OR$^{251}$, OCOR$^{251}$, OCONH$_2$, OCONHR$^{251}$, OCONR$^{251}$R$^{252}$, NO$_2$, NH$_2$, NHR$^{251}$, NR$^{251}$R$^{252}$, NHCOR$^{251}$, NR$^{251}$COR$^{252}$, N=CH$_2$, N=CHR$^{251}$, N=CR$^{251}$R$^{252}$, SH, SR$^{251}$, SOR$^{251}$, SO$_2$R$^{251}$, SO$_3$R$^{251}$, SO$_3$H, SO$_3^-$, SO$_2$NH$_2$, SO$_2$NHR$^{251}$, or SO$_2$NR$^{251}$R$^{252}$, and $R^{251}$ and $R^{252}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing carbon atoms 2 to 10;

a plurality selected from $R^{208}$, $R^{209}$, $R^{214}$, $R^{215}$, $R^{220}$, and $R^{221}$ may be connected by a direct bond, oxygen atom bridge, sulfur atom bridge, NH bridge, or NR$^{251}$ bridge to form a ring;

$R^{210}$, $R^{211}$, $R^{216}$, $R^{217}$, $R^{222}$, and $R^{223}$ are each independently a hydrogen atom, an alkyl group containing 1 to 10 carbon atoms, or an aryl group containing 6 to 15 carbon atoms; and a, b, c, d, e, and f are each independently an integer of 0 to 4;

wherein in formulae (66) to (68), $R^{253}$, $R^{254}$, $R^{259}$, $R^{260}$, $R^{265}$, and $R^{266}$ are each independently a hydrogen atom, a halogen atom, an alkyl group containing 1 to 10 carbon atoms, or an alkyl group containing 1 to 10 carbon atoms and 1 to 20 fluorine atoms;

$R^{255}$, $R^{256}$, $R^{261}$, $R^{262}$, $R^{267}$, and $R^{268}$ are each independently a hydrogen atom, a halogen atom, $R^{271}$, COOH, COOR$^{271}$, COO—, CONH$_2$, CONHR$^{271}$, CONR$^{271}$R$^{272}$, CN, OH, OR$^{271}$, OCOR$^{271}$, OCONH$_2$, OCONHR$^{271}$, OCONR$^{271}$R$^{272}$, NO$_2$, NH$_2$, NHR$^{271}$, NR$^{271}$R$^{272}$, NHCOR$^{271}$, NR$^{271}$COR$^{272}$, N=CH$_2$, N=CHR$^{271}$, N=CR$^{271}$R$^{272}$, SH, SR$^{271}$, SOR$^{271}$, SO$_2$R$^{271}$, SO$_3$R$^{271}$, SO$_3$H, SO$_3^-$, SO$_2$NH$_2$, SO$_2$NHR$^{271}$, or SO$_2$NR$^{271}$R$^{272}$, and $R^{271}$ and $R^{272}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing 2 to 10 carbon atoms;

a plurality selected from $R^{255}$, $R^{256}$, $R^{261}$, $R^{262}$, $R^{267}$, and $R^{268}$ may be connected by a direct bond, oxygen atom bridge, sulfur atom bridge, NH bridge, or NR$^{271}$ bridge to form a ring;

$R^{257}$, $R^{258}$, $R^{263}$, $R^{264}$, $R^{269}$, and $R^{270}$ are each independently a hydrogen atom, an alkyl group containing 1 to 10 carbon atoms, or an aryl group containing 6 to 15 carbon atoms; and a, b, c, d, e, and f are each independently an integer of 0 to 4;

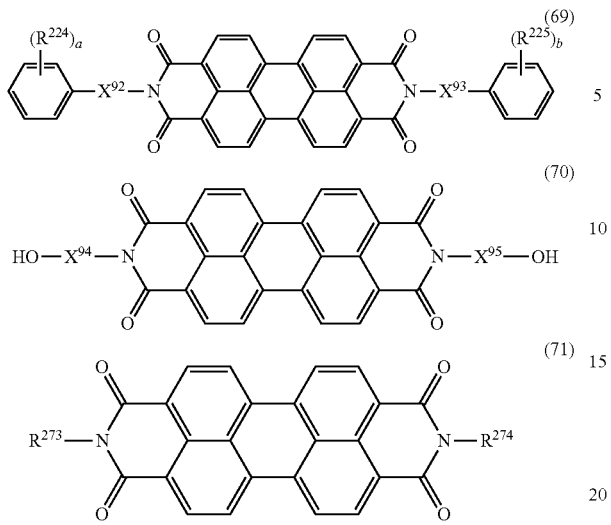

wherein in formulae (69) to (71), $X^{92}$, $X^{93}$, $X^{94}$, and $X^{95}$ are each independently an alkylene chain containing 1 to 10 carbon atoms;

$R^{224}$ and $R^{225}$ are each independently a hydrogen atom, a hydroxyl group, an alkoxy group containing 1 to 6 carbon atoms, or an acyl group containing 2 to 6 carbon atoms;

$R^{273}$ and $R^{274}$ are each independently a hydrogen atom or an alkyl group containing 1 to 10 carbon atoms; and a and b are each an integer of 0 to 5.

14. A negative photosensitive resin composition as set forth in claim 13, wherein the black organic pigment (D1a-1) contains the benzofuranone based black pigment (D1a-1a).

15. A negative photosensitive resin composition comprising, as an alkali-soluble resin (A), at least a weakly acidic group-containing resin (A1), and an unsaturated group-containing resin (A2), a radical-polymerizable compound (B) and a photosensitive agent (C), the weakly acidic group-containing resin (A1) containing an acidic group having an acid dissociation constant in the range of 13.0 to 23.0 in dimethyl sulfoxide, the weakly acidic group-containing resin (A1) including one or more selected from the group consisting of polyimide (A1a-1), polyimide precursor (A1a-2), carboxylic acid-modified polysiloxane (A1a-3), carboxylic acid-modified novolac resin (A1a-4), carboxylic acid-modified polyhydroxystyrene (A1a-5), polybenzoxazole (A1b-1), polybenzoxazole precursor (A1b-2), polysiloxane (A1b-3), novolac resin (A1b-4), and polyhydroxystyrene (A1b-5), and the unsaturated group-containing resin (A2) having an ethylenically unsaturated double bond group, wherein the unsaturated group-containing resin (A2) includes one or more selected from the group consisting of unsaturated group-containing polyimide (A2a-1), unsaturated group-containing polyimide precursor (A2a-2), carboxylic acid-modified unsaturated group-containing polysiloxane (A2a-3), unsaturated group-containing polybenzoxazole (A2b-1), unsaturated group-containing polybenzoxazole precursor (A2b-2), and unsaturated group-containing polysiloxane (A2b-3).

16. A cured film formed by curing the negative photosensitive resin composition as set forth in claim 1.

17. A cured film as set forth in claim 16, wherein the optical density per micrometer of film thickness of the cured film is in the range of 0.3 to 5.0, the cured film includes the step-shaped cured pattern, and the film thickness difference ($\Delta T_{FT\text{-}HT}$) μm between ($T_{FT}$) and ($T_{HT}$), wherein ($T_{FT}$) μm denotes the film thickness of the thick parts and ($T_{HT}$) μm denotes the film thickness of the thin parts in the stepped shape of the cured pattern, is in the range of 1.0 to 10.0 μm.

18. A cured film as set forth in claim 17, wherein ($T_{FT}$) and ($T_{HT}$) further meet the relationships represented by general formulae (δ) to (ζ)

$$3.0 \leq (T_{FT}) \leq 9.0 \quad (\delta)$$

$$0.20 \leq (T_{HT}) \leq 7.0 \quad (\varepsilon)$$

$$0.20 \times (T_{FT}) \leq (T_{HT}) \leq 0.70 \times (T_{FT}) \quad (\zeta).$$

19. An organic EL display device comprising a cured film as set forth in claim 16, wherein the cured film serves as at least one selected from pixel dividing layers, color filters, black matrices of color filters, and planarization films for TFTs.

20. An organic EL production method for display device comprising:

(1) a step for forming a coating film of the negative photosensitive resin composition as set forth in claim 1 on a substrate, (2) a step for applying active actinic ray to the resin composition through a photomask to form an undeveloped pattern, (3) a step for developing the undeveloped pattern of the resin composition with an alkaline solution to form a step-shaped pattern of the resin composition, and, (4) a step for heating the pattern to produce a step-shaped cured pattern of the resin composition, wherein the photomask is halftone photomask that has a pattern containing transparent portions and light blocking portions and that also has translucent portions lower in transmittance than the transparent portions, higher in transmittance than the light blocking portions, and located between the transparent portions and the light blocking portions.

\* \* \* \* \*